(12) United States Patent
Furuta et al.

(10) Patent No.: US 9,336,740 B2
(45) Date of Patent: May 10, 2016

(54) SHIFT REGISTER, DISPLAY DRIVE CIRCUIT, DISPLAY PANEL, AND DISPLAY DEVICE

(75) Inventors: Shige Furuta, Osaka (JP); Yuhichiroh Murakami, Osaka (JP); Makoto Yokoyama, Osaka (JP); Seijirou Gyouten, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 75 days.

(21) Appl. No.: 14/127,525

(22) PCT Filed: Jun. 26, 2012

(86) PCT No.: PCT/JP2012/066301
§ 371 (c)(1),
(2), (4) Date: Dec. 19, 2013

(87) PCT Pub. No.: WO2013/002228
PCT Pub. Date: Jan. 3, 2013

(65) Prior Publication Data
US 2014/0168181 A1  Jun. 19, 2014

(30) Foreign Application Priority Data
Jun. 30, 2011 (JP) .................. 2011-146531

(51) Int. Cl.
*G11C 19/28* (2006.01)
*G09G 3/36* (2006.01)

(52) U.S. Cl.
CPC ............ *G09G 3/3688* (2013.01); *G09G 3/3677* (2013.01); *G11C 19/28* (2013.01); *G09G 2310/0286* (2013.01); *G09G 2310/08* (2013.01)

(58) Field of Classification Search
CPC ....................................................... G11C 19/28
See application file for complete search history.

(56) References Cited

U.S. PATENT DOCUMENTS

| | | | |
|---|---|---|---|
| 2007/0262976 A1 | 11/2007 | Matsuda et al. | |
| 2008/0187089 A1* | 8/2008 | Miyayama | G11C 19/28 377/79 |
| 2009/0121998 A1* | 5/2009 | Ohkawa | G09C 3/3688 345/100 |
| 2012/0092323 A1 | 4/2012 | Murakami et al. | |

FOREIGN PATENT DOCUMENTS

| | | |
|---|---|---|
| JP | 2006-220947 A | 8/2006 |
| JP | 2009-205707 A | 9/2009 |
| WO | 2006/040904 A1 | 4/2006 |
| WO | 2010/146756 A1 | 12/2010 |

OTHER PUBLICATIONS

Official Communication issued in International Patent Application No. PCT/JP2012/066301, mailed on Sep. 25, 2012.

* cited by examiner

*Primary Examiner* — Dwayne Bost
*Assistant Examiner* — Sepehr Azari
(74) *Attorney, Agent, or Firm* — Keating & Bennett, LLP

(57) ABSTRACT

A shift register is disclosed which includes, at respective stages, unit circuits (11) each including (i) a flip-flop (11*a*) including first and second CMOS circuits and (ii) a signal generation circuit (11*b*) for generating an output signal (SROUTk) for the current stage with use of an output (Q, QB) of the flip-flop (11*a*), the shift register including a floating control circuit (11*c*) between a gate terminal of an output transistor (Tr7) of the signal generation circuit (11*b*) and a Q terminal. This makes it possible to reduce a circuit scale of a display driving circuit without causing a shift register to malfunction.

7 Claims, 76 Drawing Sheets

SHIFT REGISTER, DISPLAY DRIVE CIRCUIT, DISPLAY PANEL, AND DISPLAY DEVICE

TECHNICAL FIELD

The present invention relates to a shift register and display driving circuit for use in a display device.

BACKGROUND ART

In recent years, it is required that display driving circuits for driving liquid crystal panels be reduced in scale in order to achieve slim bezel of liquid crystal display devices. Because scales of the display driving circuits largely affect the number of elements of transistors for configuring circuits, it is important to reduce the number of transistors.

The following description will discuss, as an example, a shift register (see, for example, Patent Literature 1) for use in a conventional display driving circuit. FIG. 77 is a block diagram illustrating a schematic configuration of each stage (hereinafter referred to as "unit circuit") of a shift register for use in a scanning signal line driving circuit. The unit circuit 110 includes a set-reset flip-flop circuit 110a and a switch circuit 110b. The flip-flop circuit 110a has (i) a set terminal (S terminal) which is supplied with an output SROUT(k−1) of a preceding unit circuit 110 as a set signal (S signal), (ii) a reset terminal (R terminal) which is supplied with an output SROUT(k+1) of a subsequent unit circuit 110 as a reset signal (R signal), (iii) an initialization terminal (INIT terminal) which is supplied with an initialization signal (INIT signal), (iv) an output terminal (Q terminal) from which a Q signal is outputted, and (v) an inverted output terminal (QB terminal) from which a QB signal is outputted. The switch circuit 110b includes an analog switch ASW. The analog switch ASW has (i) a gate terminal on an N channel side which gate terminal is connected to the Q terminal, (ii) a gate terminal on a P channel side which gate terminal is connected to the QB terminal, (iii) a source terminal which is connected to a clock terminal, and (iv) a drain terminal which is connected to an output terminal OUT.

The shift register, which includes the above unit circuit 110 at each stage, carries out a shift operation to sequentially supply output signals SROUT1 to SRMOUTn to gate lines GL1 to GLn, respectively.

CITATION LIST

Patent Literature 1

PCT International Publication WO2006/040904 (Publication Date: Apr. 20, 2006)

SUMMARY OF INVENTION

Technical Problem

The above unit circuit 110, in which the switch circuit 110b in particular has a large scale, is problematic in that a shift register including unit circuits 110 connected to each other in cascade will have an excessively large circuit area as a whole. Reducing the scale of the analog switch ASW of each switch circuit 110b may be a solution. In such a case, however, the switch circuit 110b will need to be provided with an element such as a buffer as shown in FIG. 78 to maintain a stable operation. This will make it impossible to reduce the area of the shift register as a whole.

In view of the circumstances, an object of the present invention is to reduce a circuit scale of a display driving circuit without causing a shift register to malfunction.

Solution to Problem

In order to solve the above problem, a shift register of the present invention is shift register for use in a display driving circuit, the shift register including flip-flops at respective stages, the flip-flops each including: a first CMOS circuit including a P channel type first transistor and an N channel type second transistor, the first transistor having (i) a gate terminal connected to a gate terminal of the second transistor and (ii) a drain terminal connected to a drain terminal of the second transistor; a second CMOS circuit including a P channel type third transistor and an N channel type fourth transistor, the third transistor having (i) a gate terminal connected to a gate terminal of the fourth transistor and (ii) a drain terminal connected to a drain terminal of the fourth transistor; plural input terminals; a first output terminal; and a second output terminal, a gate side of the first CMOS circuit, a drain side of the second CMOS circuit, and the first output terminal being connected to each other, a drain side of the first CMOS circuit, a gate side of the second CMOS circuit, and the second output terminal being connected to each other, the shift register further including signal generation circuits each for generating an output signal for a corresponding stage with use of an output of a corresponding one of the flip-flops, the signal generation circuits each including an output transistor having a source terminal supplied with a clock signal and a drain terminal connected to an output terminal of the signal generation circuit, the shift register further including floating control circuits each provided between a gate terminal of the output transistor and a source-side terminal of the first or second CMOS circuit.

A display driving circuit of the present invention includes floating control circuits each provided between a gate terminal of the output transistor and a source-side terminal of the first or second CMOS circuit. This configuration allows a bootstrap operation (described later in detail) to increase a signal potential supplied to the gate terminal of the output transistor, and thus allows a signal generation circuit to output a signal having a desired potential level (free from a threshold drop). This in turn makes it possible to reduce a circuit scale of a display driving circuit without causing a shift register to malfunction.

Advantageous Effects of Invention

As described above, a shift register of the present invention includes floating control circuits each provided between a gate terminal of the output transistor and a source-side terminal of the first or second CMOS circuit. This makes it possible to reduce a circuit scale of a display driving circuit without causing a shift register to malfunction.

Figure 8:
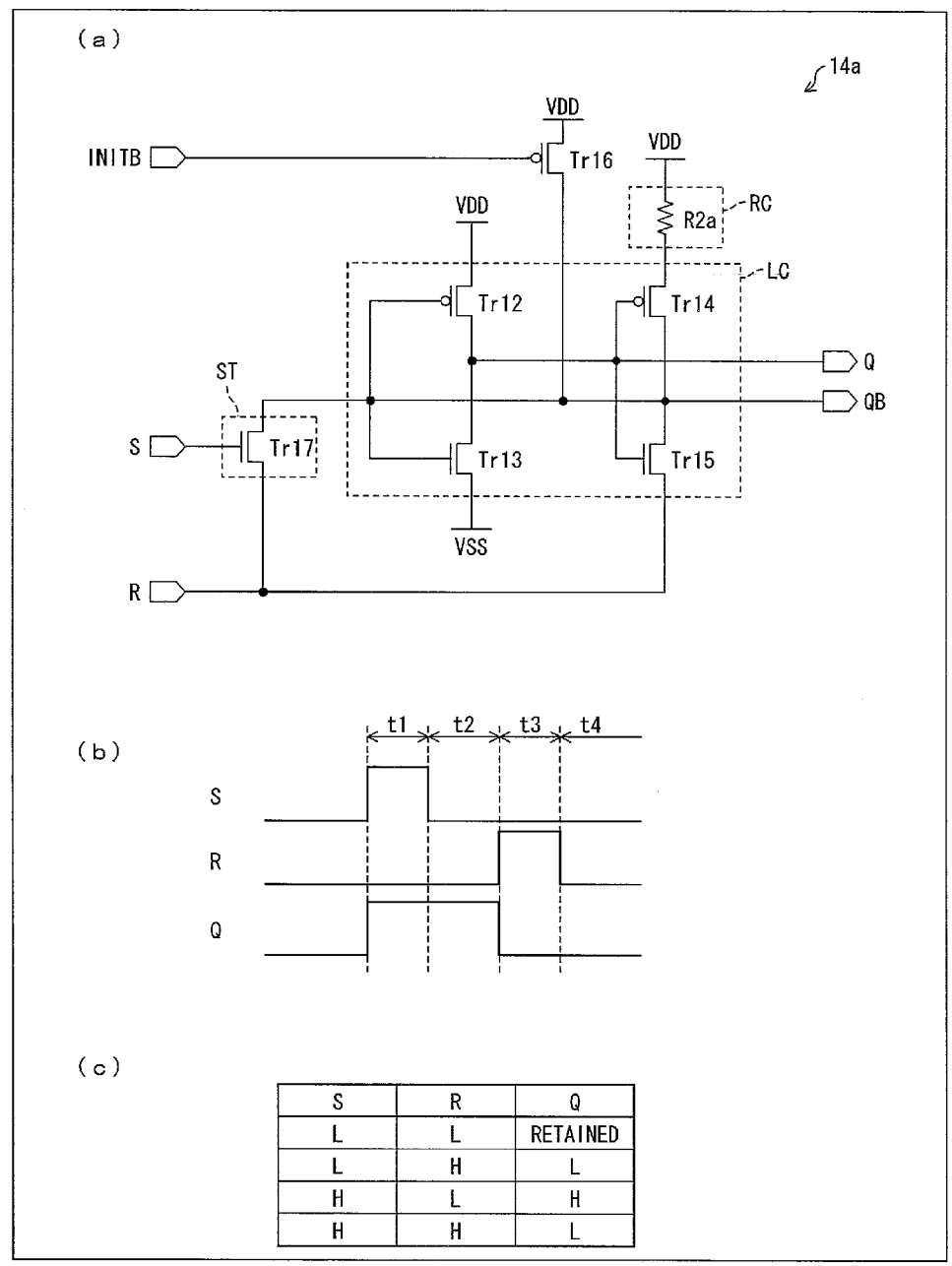

(a) of FIG. 8 is a circuit diagram illustrating a configuration of a flip-flop circuit 14a, (b) of FIG. 8 is a timing chart of an S signal, an R signal, and a Q signal of the flip-flop circuit 14a, and (c) of FIG. 8 is a truth table of the flip-flop circuit 14a (in the case where an INITB signal is non-active).

Figure 9:
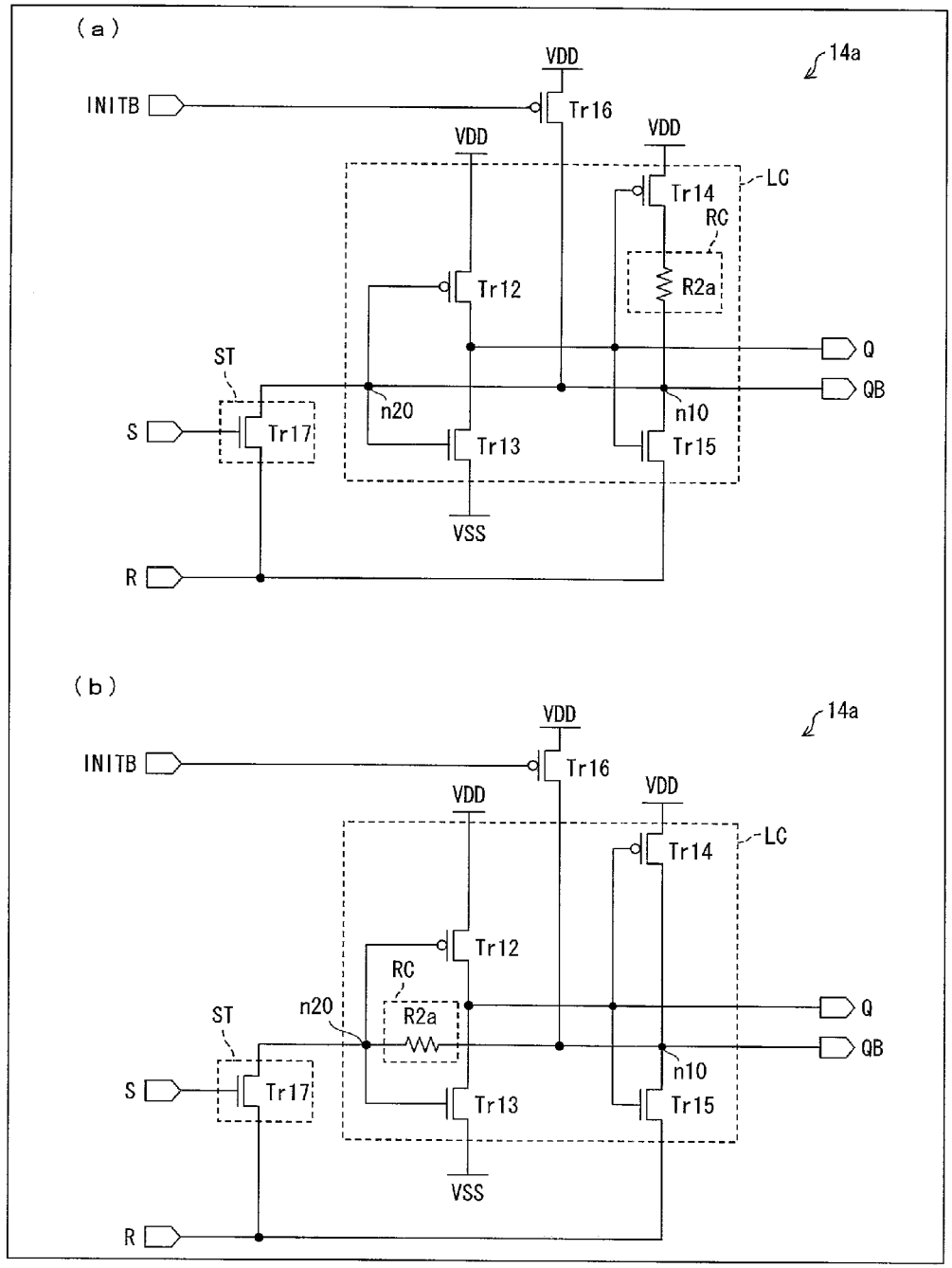

(a) and (b) of FIG. 9 are circuit diagrams illustrating other configurations of the unit circuit included in the shift register of Example 3.

Figure 10:
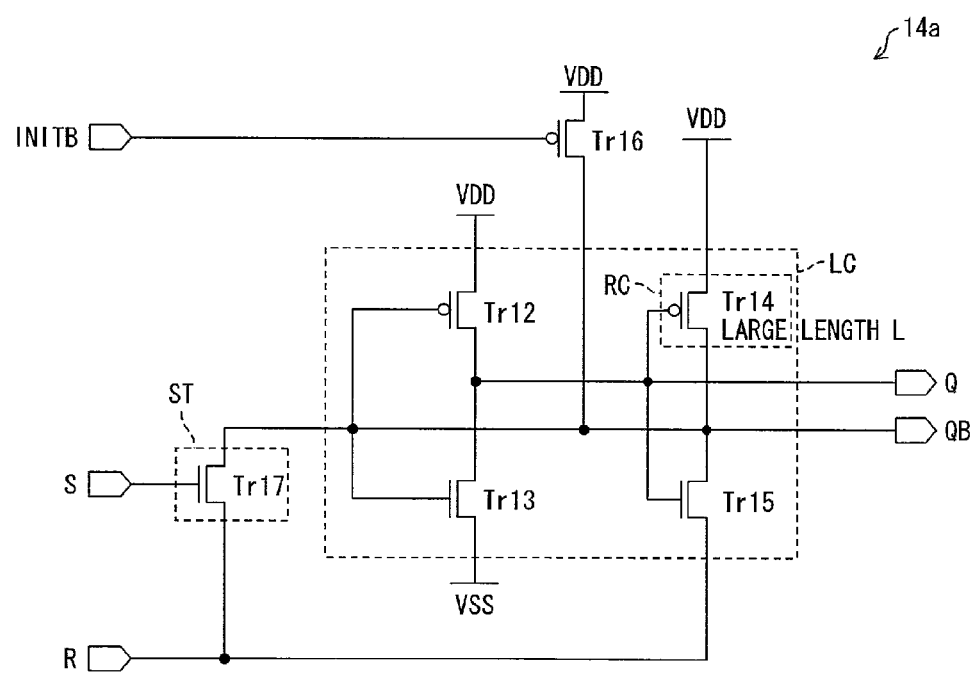

FIG. 10 is a circuit diagram illustrating another configuration of the unit circuit included in the shift register of Example 3.

Figure 11:
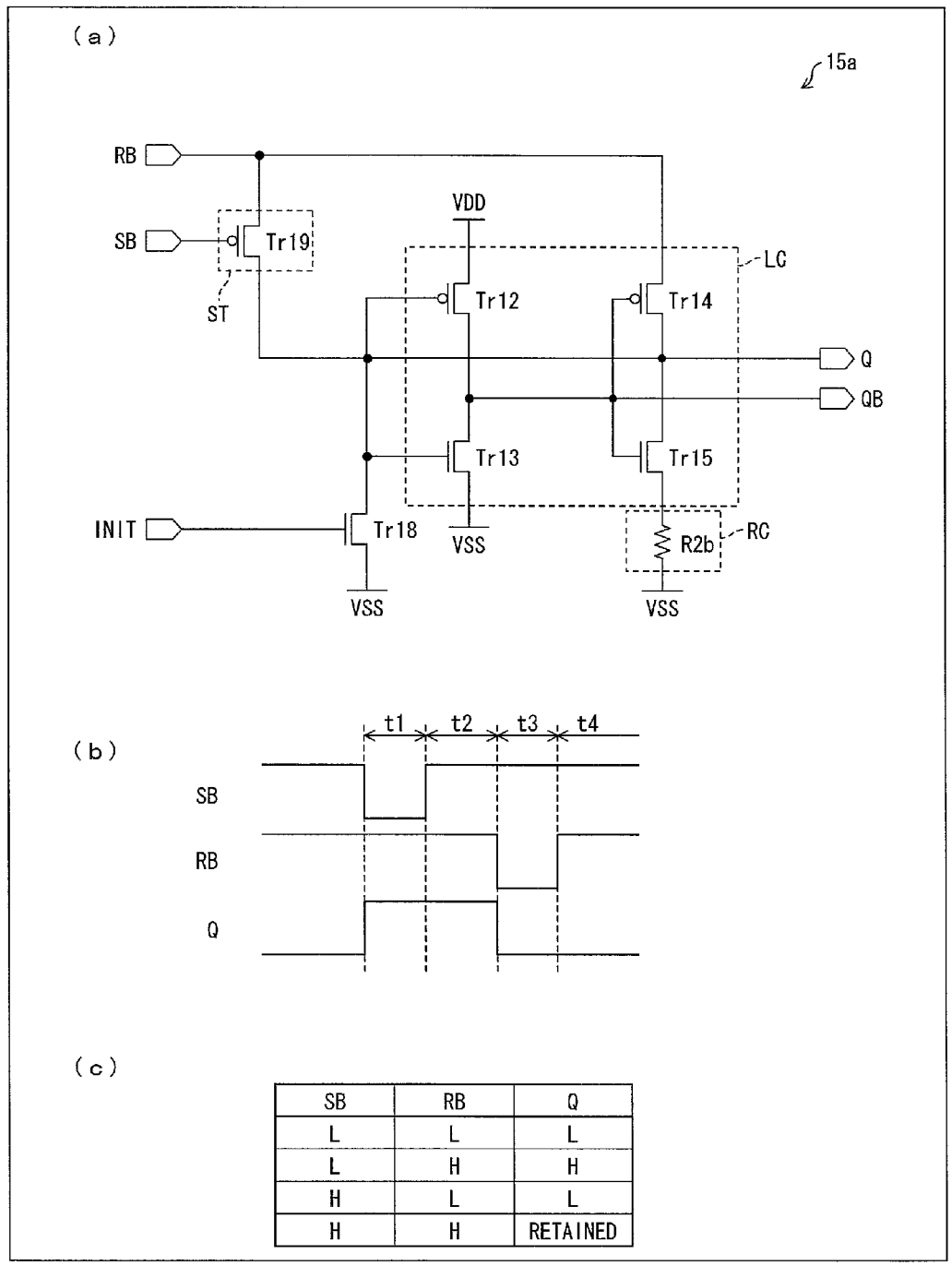

(a) of FIG. 11 is a circuit diagram illustrating a configuration of a flip-flop circuit 15a, (b) of FIG. 11 is a timing chart of an S signal, an R signal, and a Q signal of the flip-flop circuit 15a, and (c) of FIG. 11 is a truth table of the flip-flop circuit 15a (in the case where an INITB signal is non-active).

Figure 12:
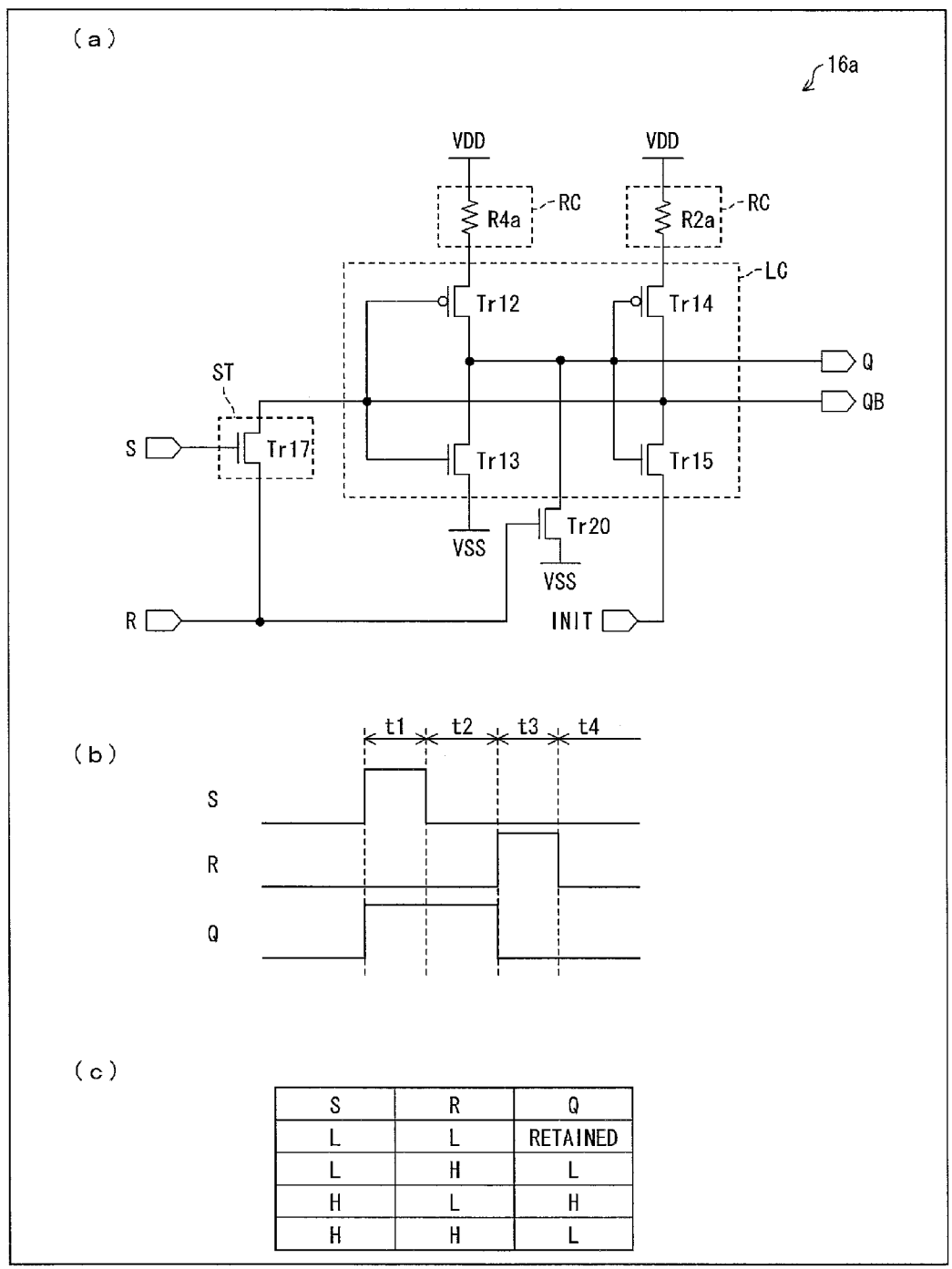

(a) of FIG. 12 is a circuit diagram illustrating a configuration of a flip-flop circuit 16a, (b) of FIG. 12 is a timing chart of an S signal, an R signal, and a Q signal of the flip-flop circuit 16a, and (c) of FIG. 12 is a truth table of the flip-flop circuit 16a (in the case where an INITB signal is non-active).

Figure 13:
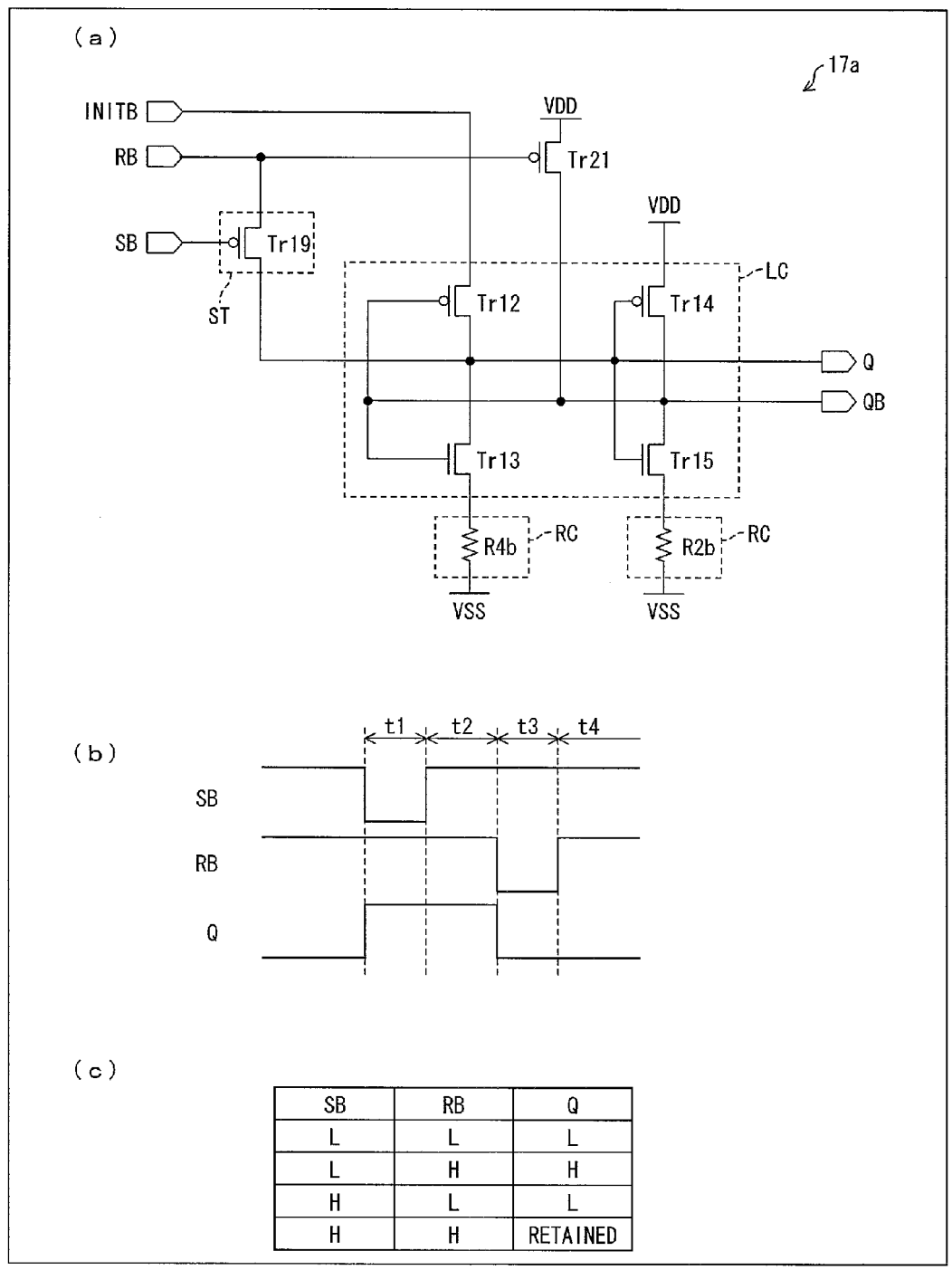

(a) of FIG. 13 is a circuit diagram illustrating a configuration of a flip-flop circuit 17a, (b) of FIG. 13 is a timing chart of an S signal, an R signal, and a Q signal of the flip-flop circuit 17a, and (c) of FIG. 13 is a truth table of the flip-flop circuit 17a (in the case where an INITB signal is non-active).

Figure 14:
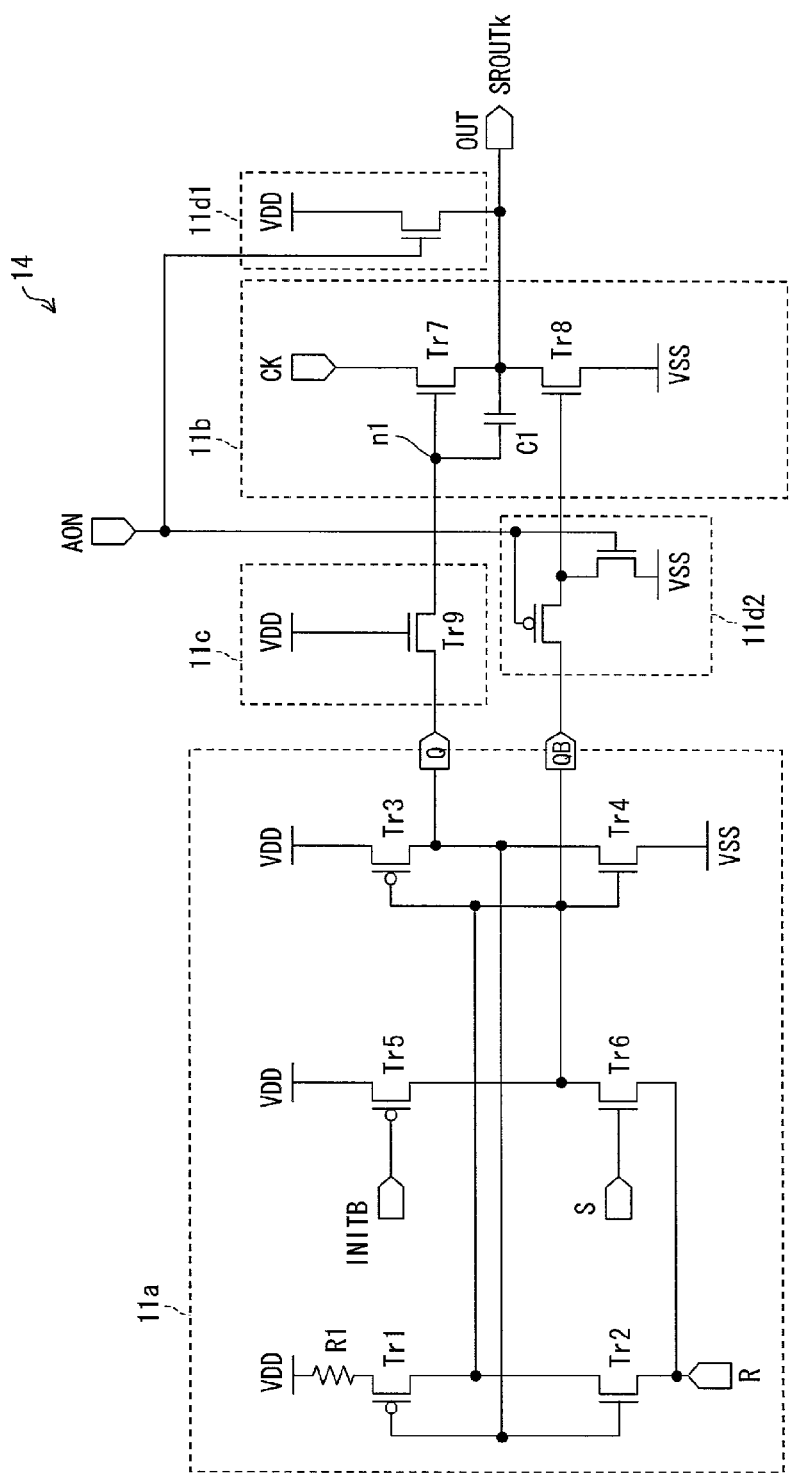

FIG. 14 is a circuit diagram illustrating another configuration of a unit circuit included in a shift register of Example 8.

Figure 15:
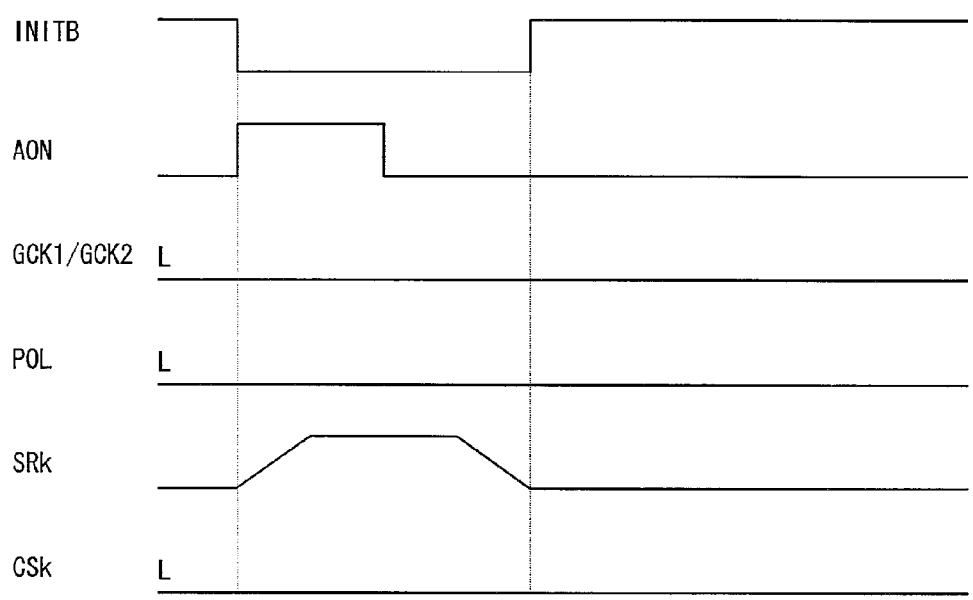

FIG. 15 is a timing chart showing an operation of the unit circuit of FIG. 14 in accordance with an input of all-ON signal AON.

Figure 16:
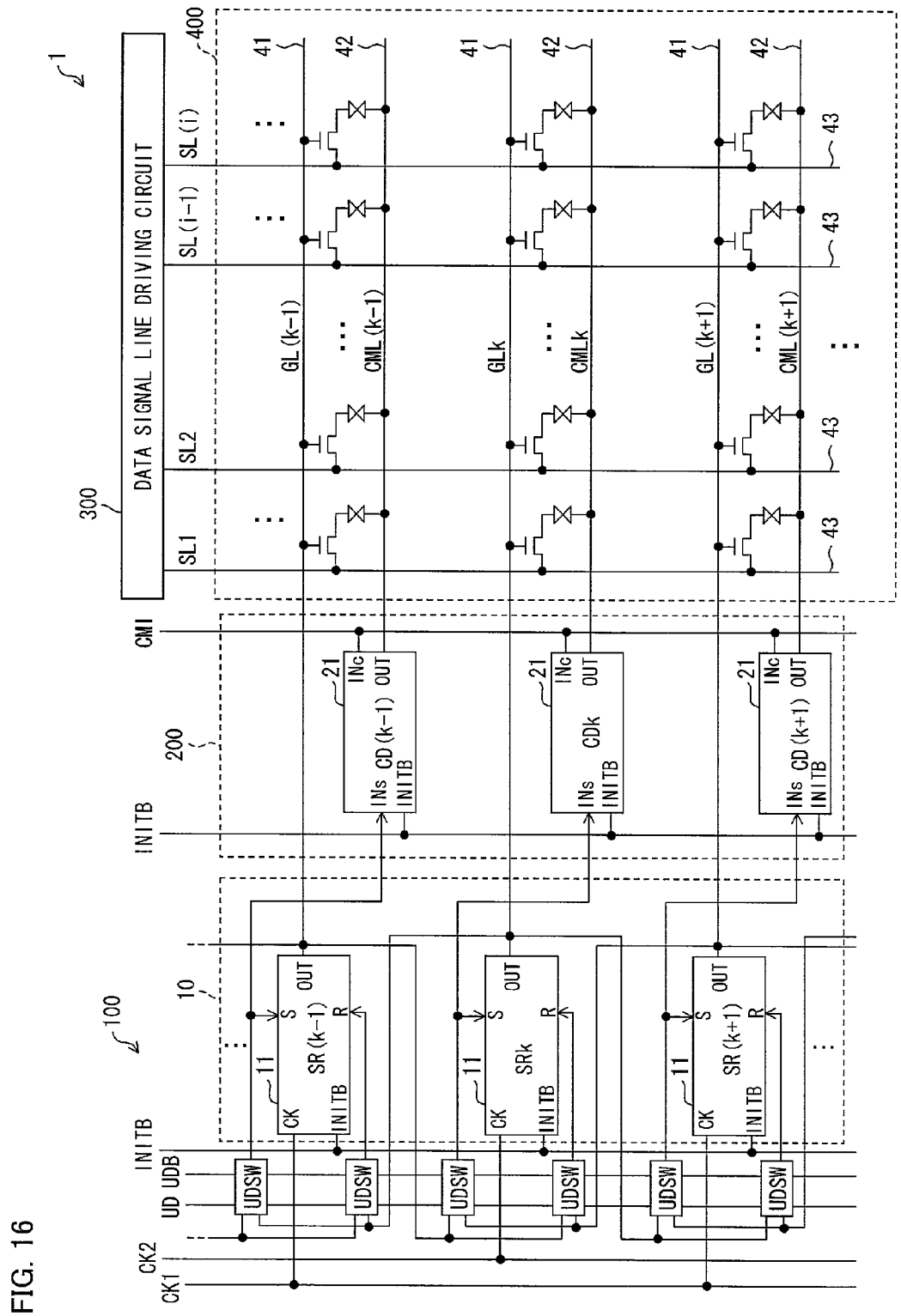

FIG. 16 is a block diagram illustrating a variation of a liquid crystal display device of Embodiment 1.

Figure 17:
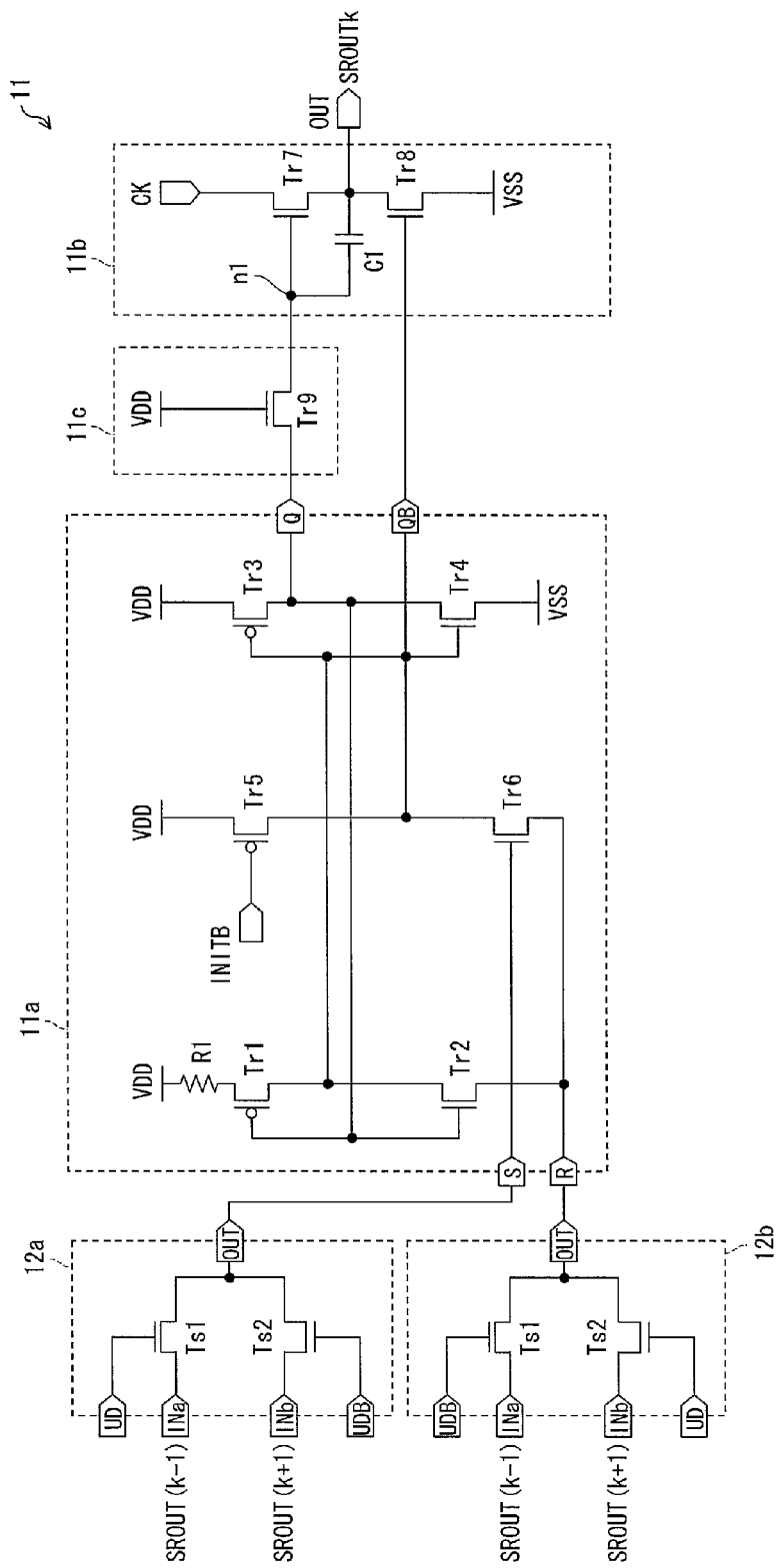

FIG. 17 is a circuit diagram illustrating a connection between a switch circuit UDSW and a kth unit circuit included in the shift register of Example 1.

Figure 18:
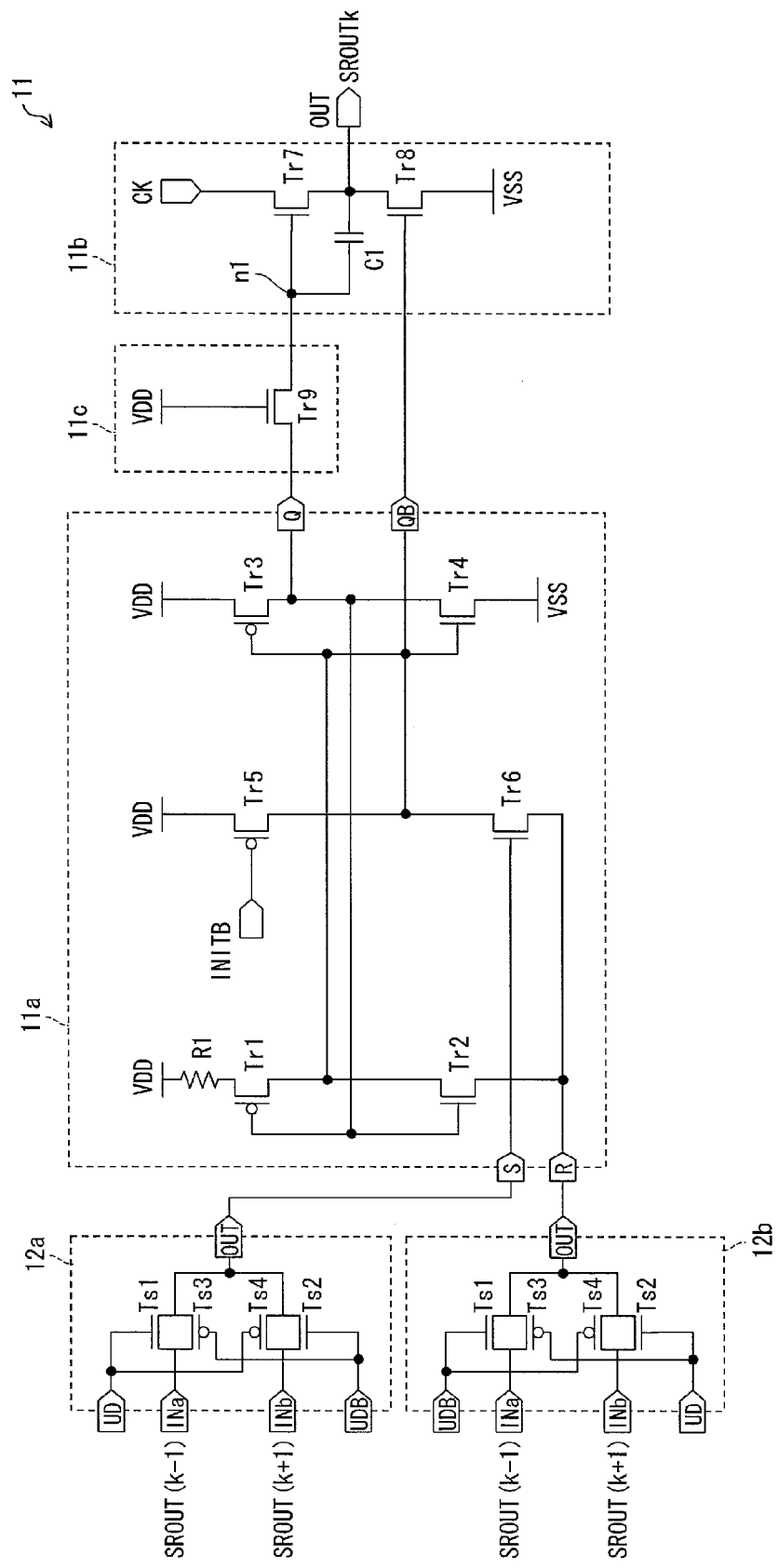

FIG. 18 is a circuit diagram illustrating a variation of the switch circuit UDSW shown in FIG. 17.

Figure 19:
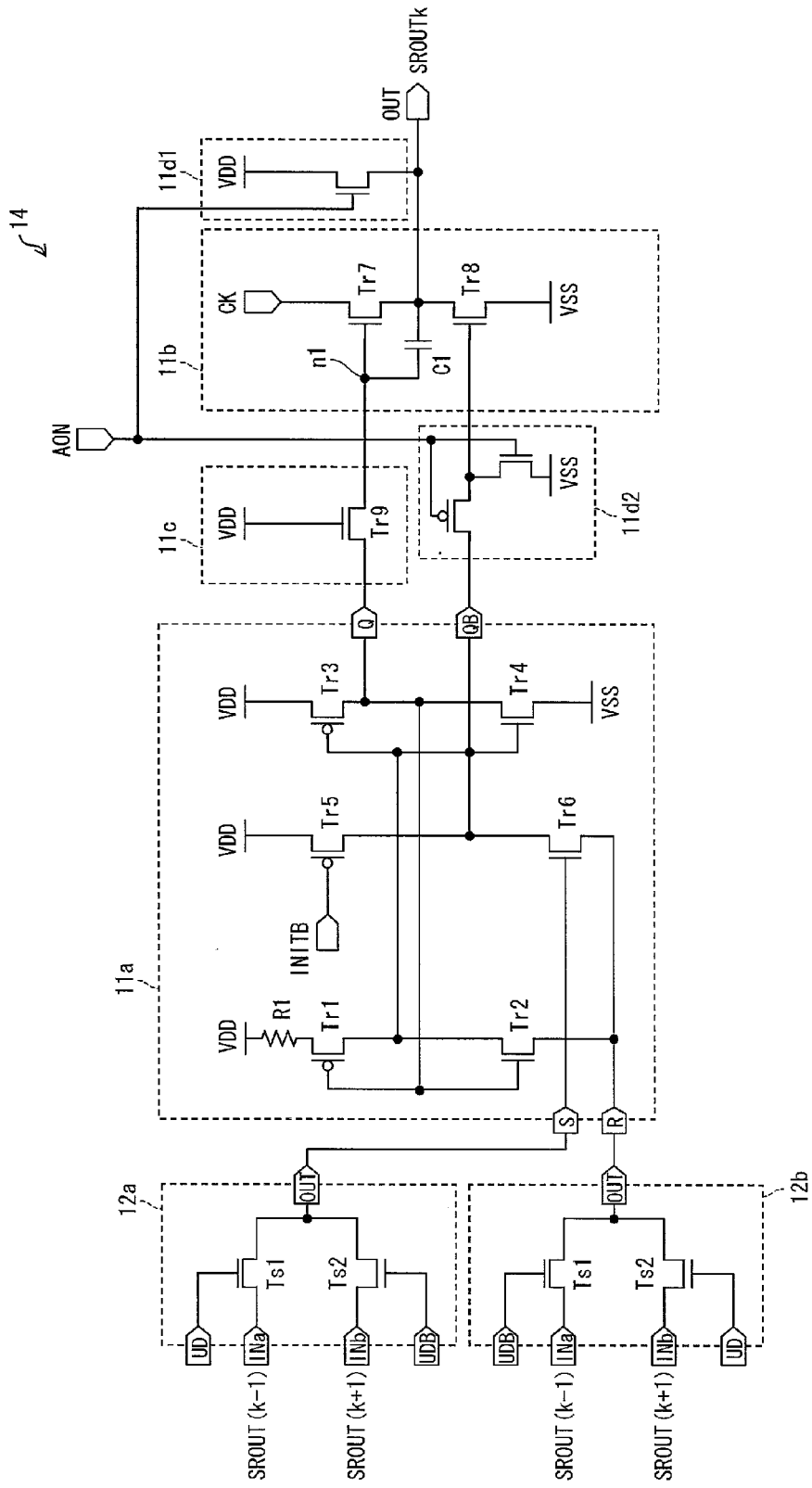

FIG. 19 is a circuit diagram illustrating a configuration where the unit circuit shown in FIG. 14 includes a switch circuit.

Figure 3:
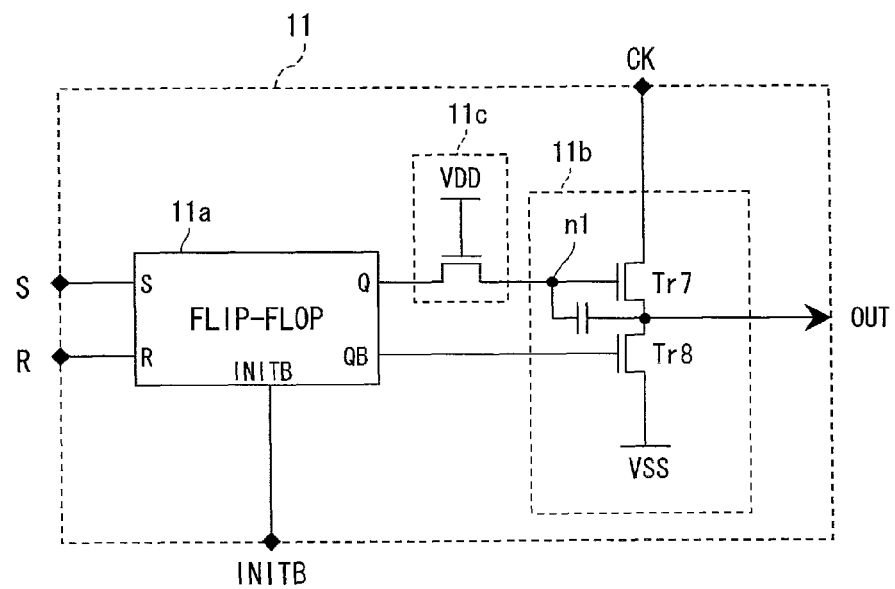
FIG. 3 is a block diagram illustrating a configuration of a unit circuit included in a shift register of Example 1.
Figure 20:
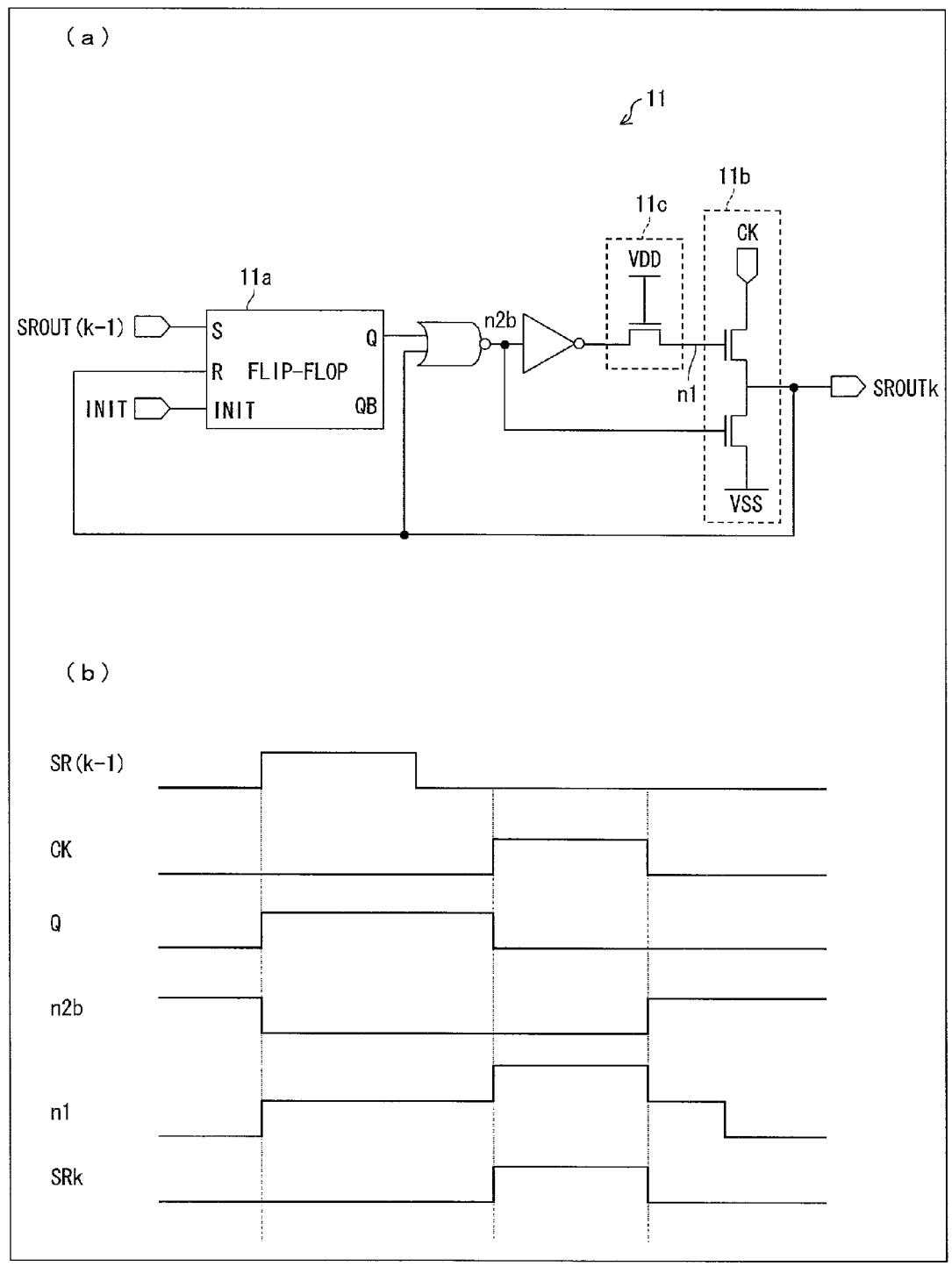

(a) of FIG. 20 is a block diagram illustrating Variation 1 of the unit circuit of FIG. 3, and (b) of FIG. 20 is a timing chart of the unit circuit illustrated in (a) of FIG. 20.

Figure 21:
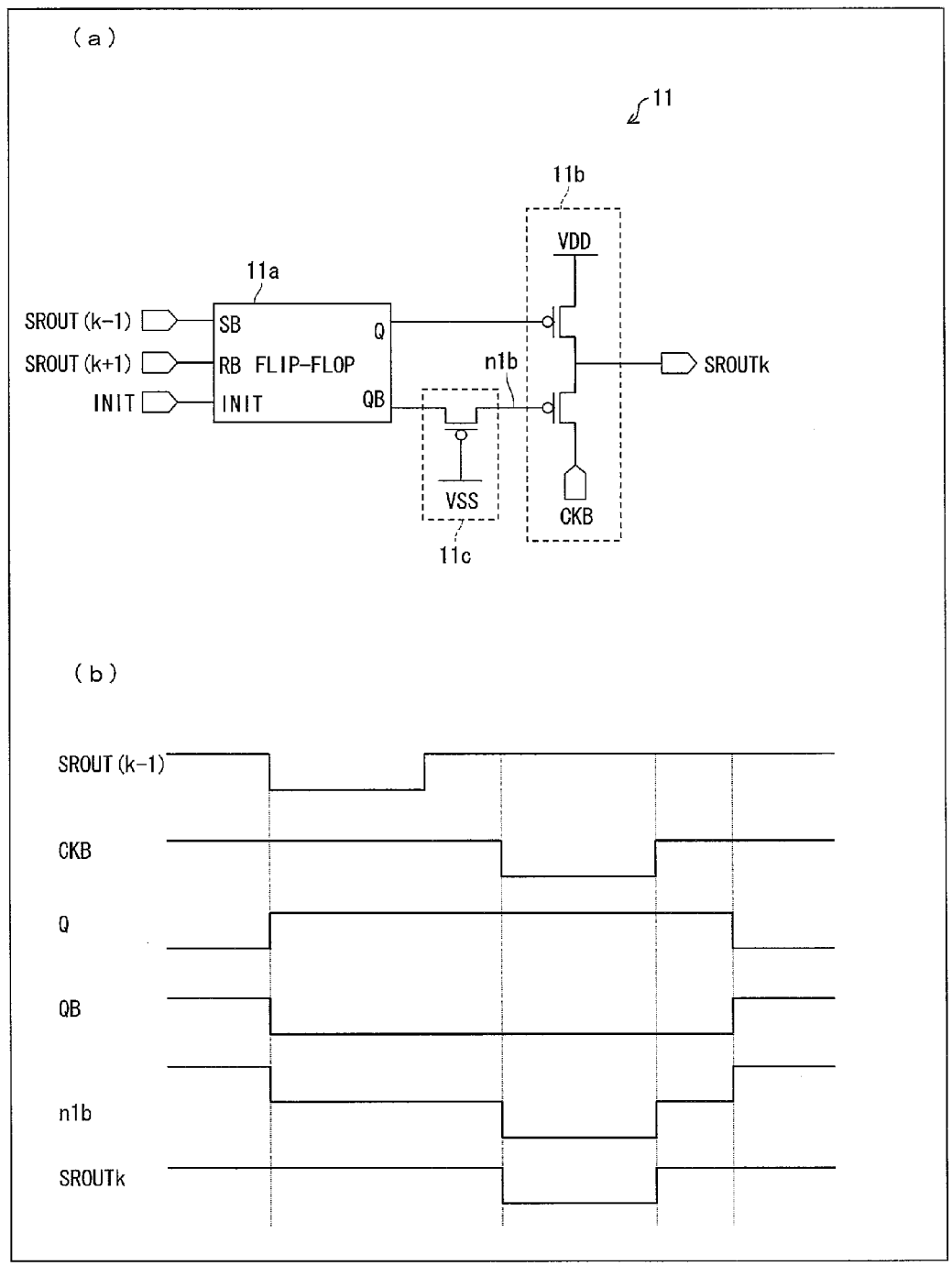

FIG. 21 is a block diagram illustrating Variation 2 of the unit circuit of FIG. 3, and (b) of FIG. 21 is a timing chart of the unit circuit illustrated in (a) of FIG. 21.

Figure 22:
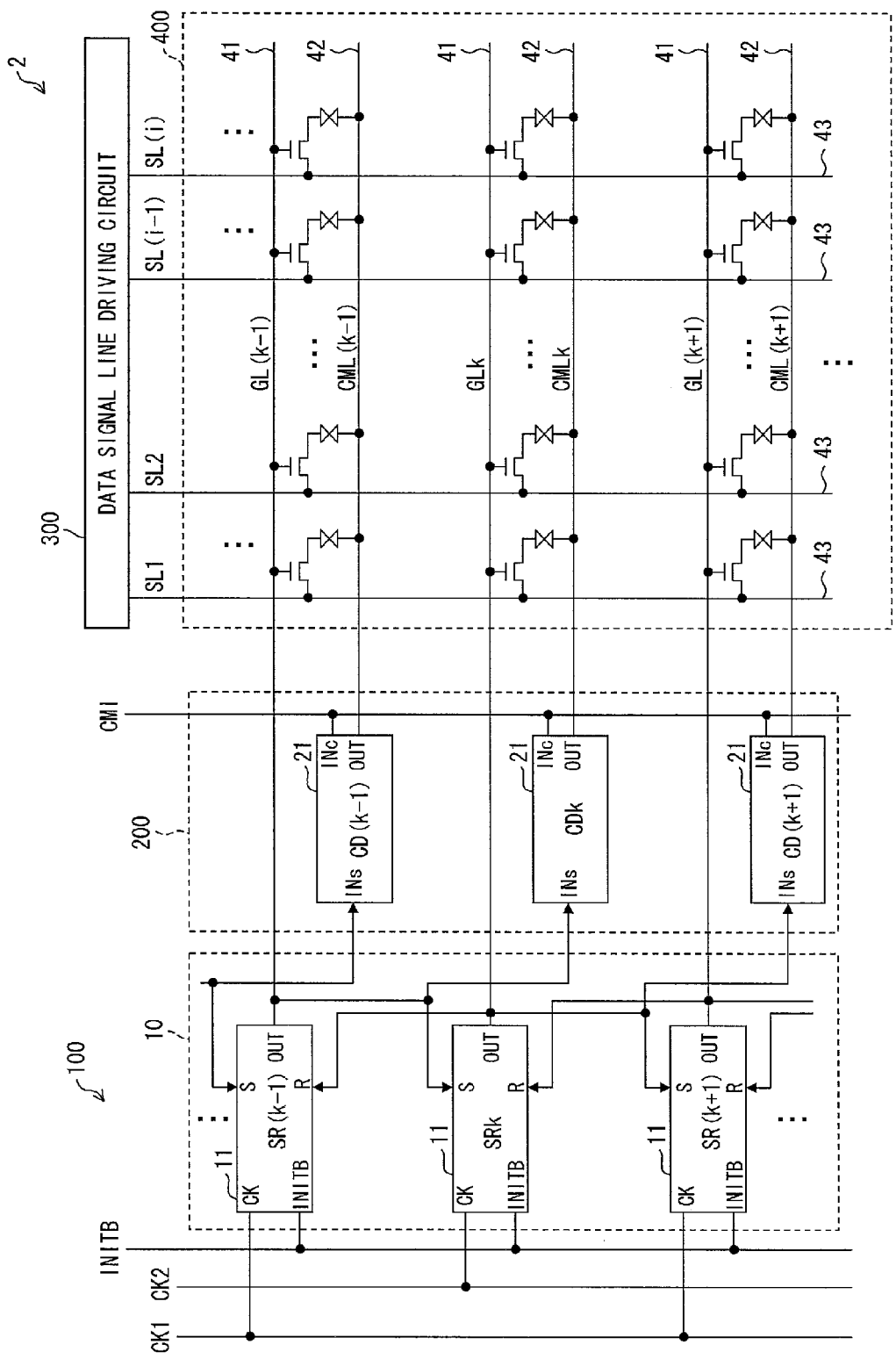

FIG. 22 is a block diagram illustrating a schematic configuration of a liquid crystal display device of Embodiment 2.

Figure 23:
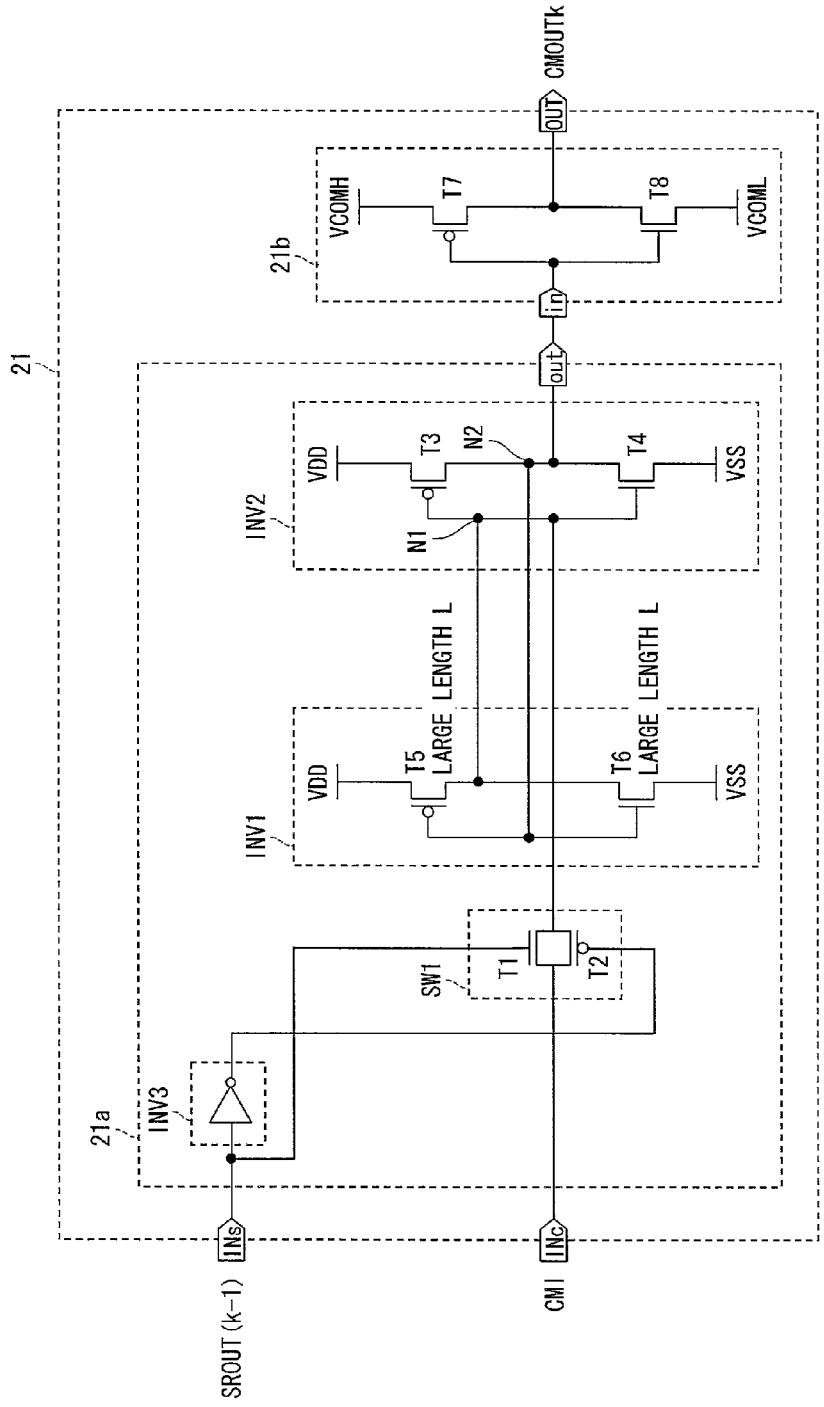

FIG. 23 is a circuit diagram of a unit circuit included in a common electrode driving circuit of Example 1.

Figure 24:
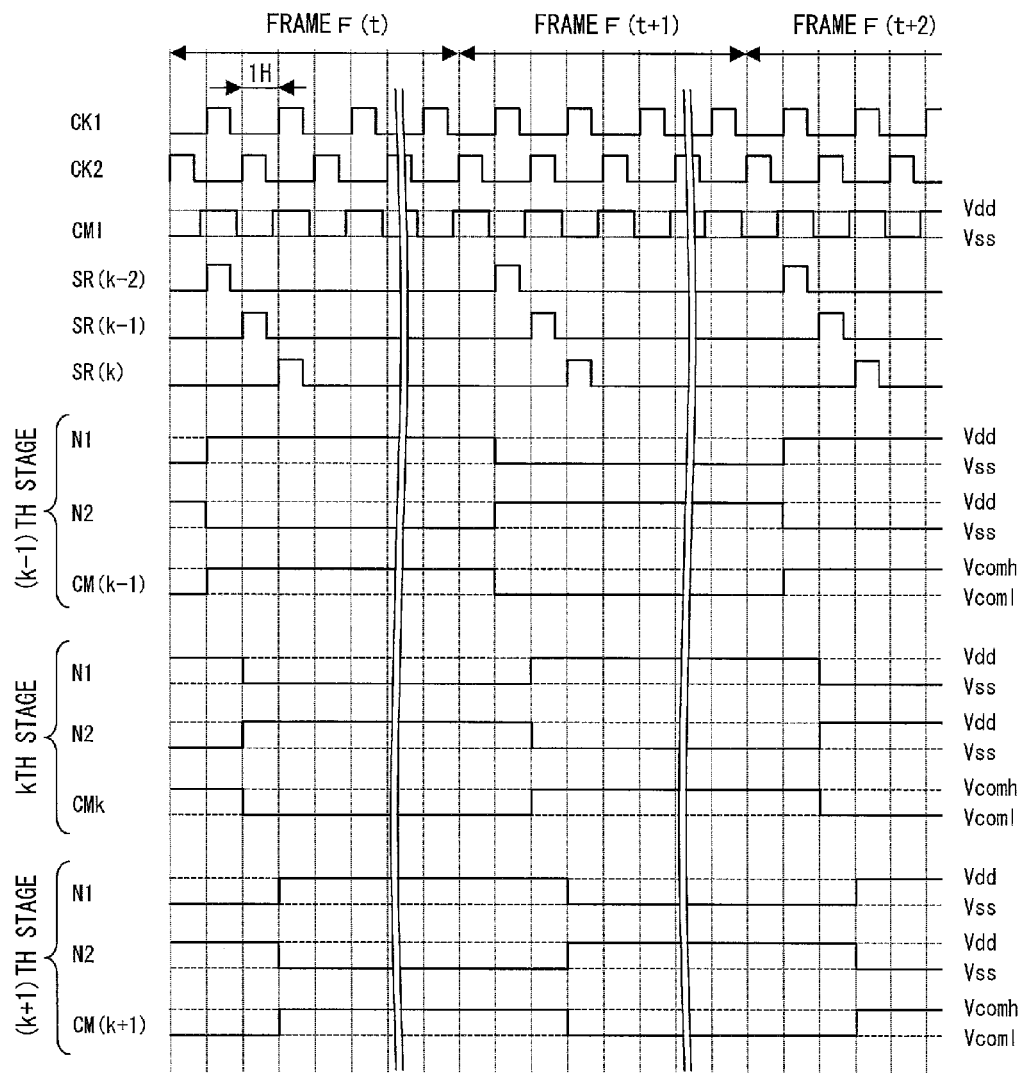

FIG. 24 is a timing chart at the time of an operation of the common electrode driving circuit of Example 1.

Figure 25:
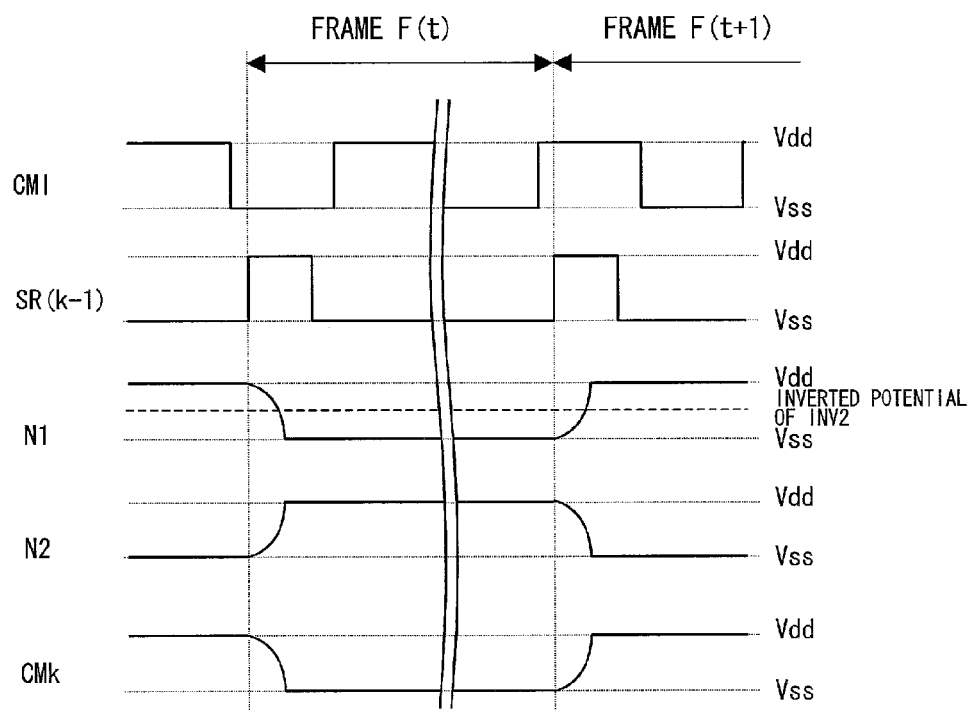

FIG. 25 is a schematic view showing a timing chart at the time of an operation of the common electrode driving circuit of Example 1.

Figure 26:
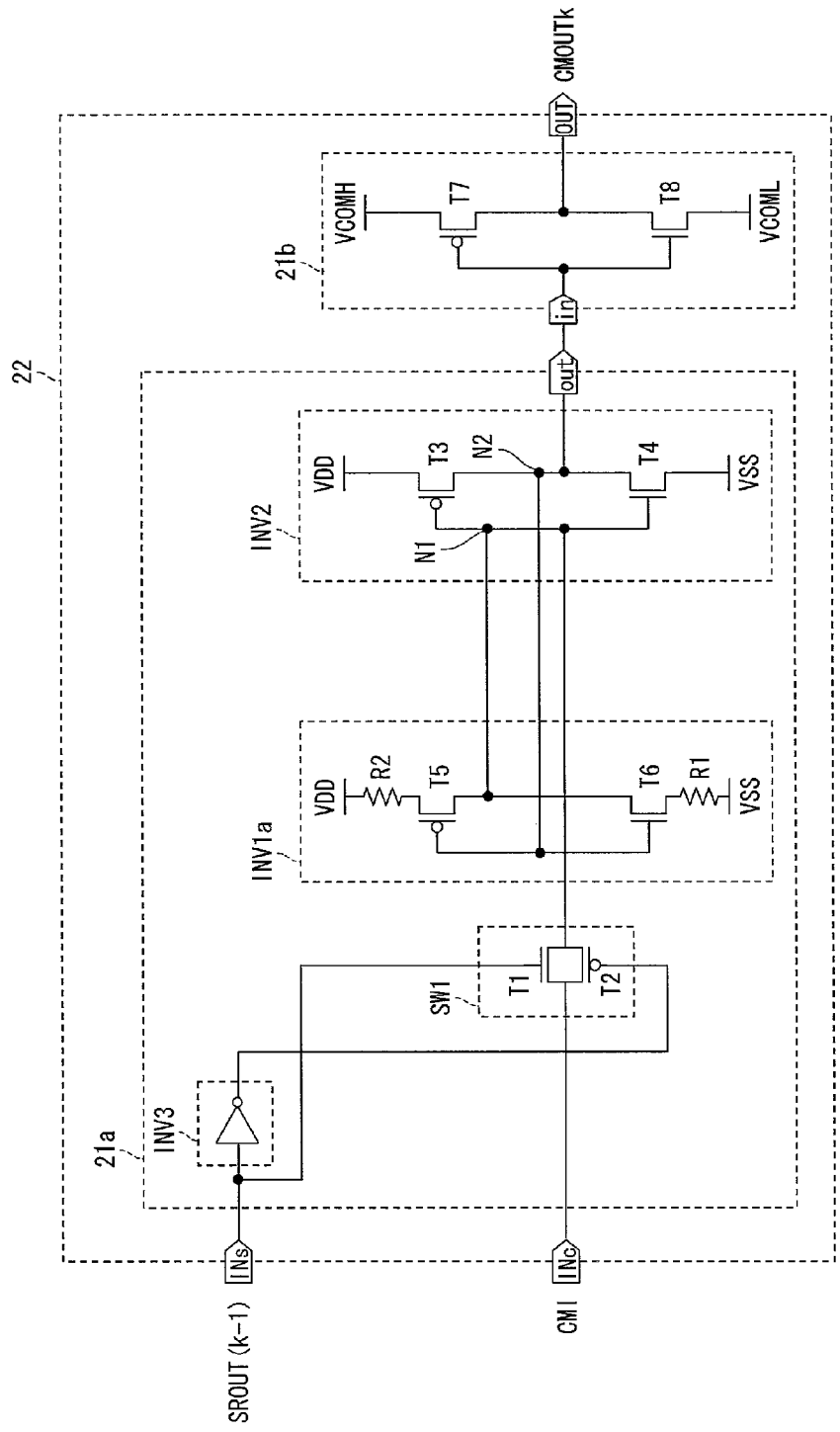

FIG. 26 is a circuit diagram of a unit circuit included in a common electrode driving circuit of Example 2.

Figure 27:
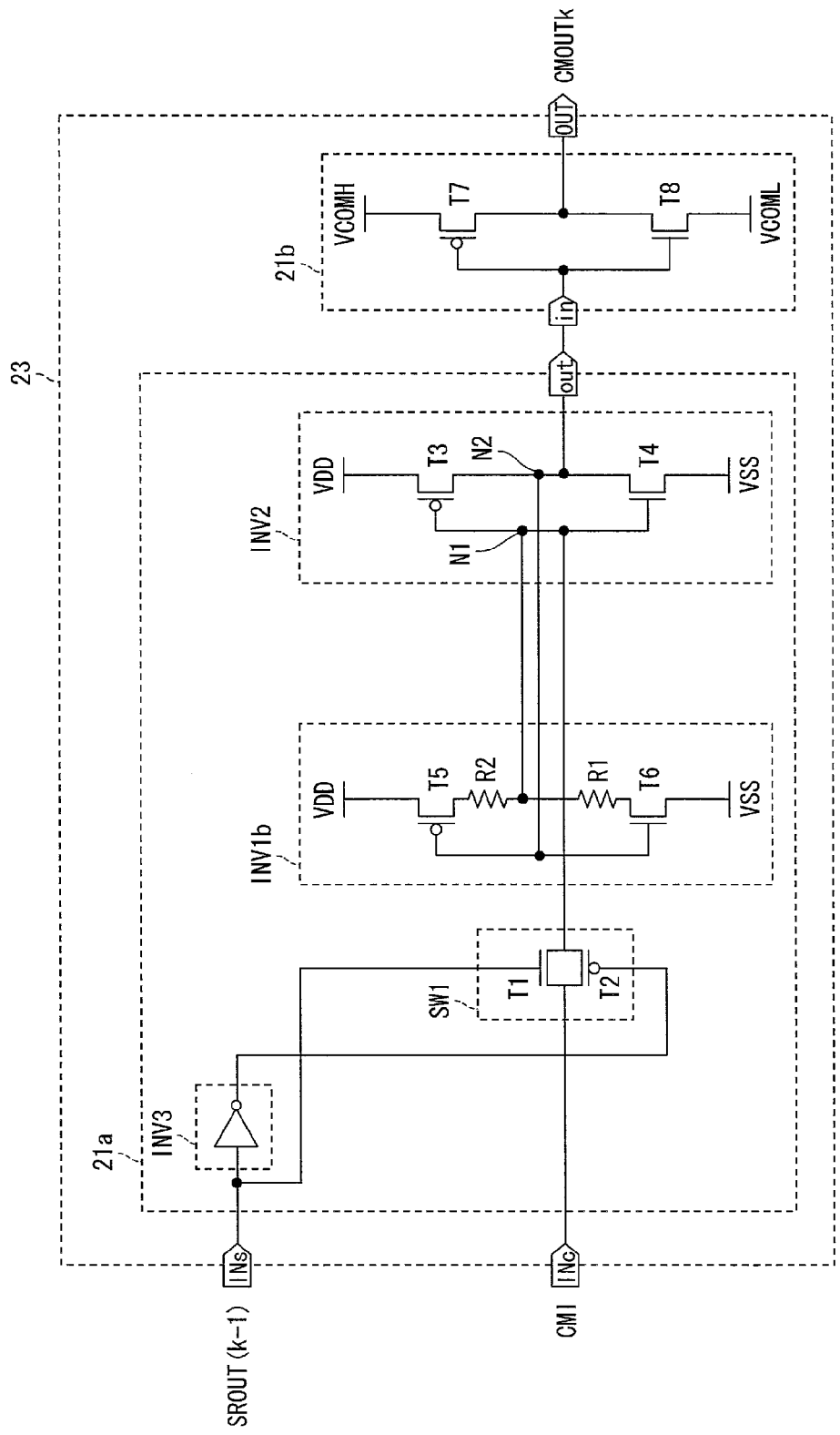

FIG. 27 is circuit diagram of a unit circuit included in a common electrode driving circuit of Example 3.

Figure 28:
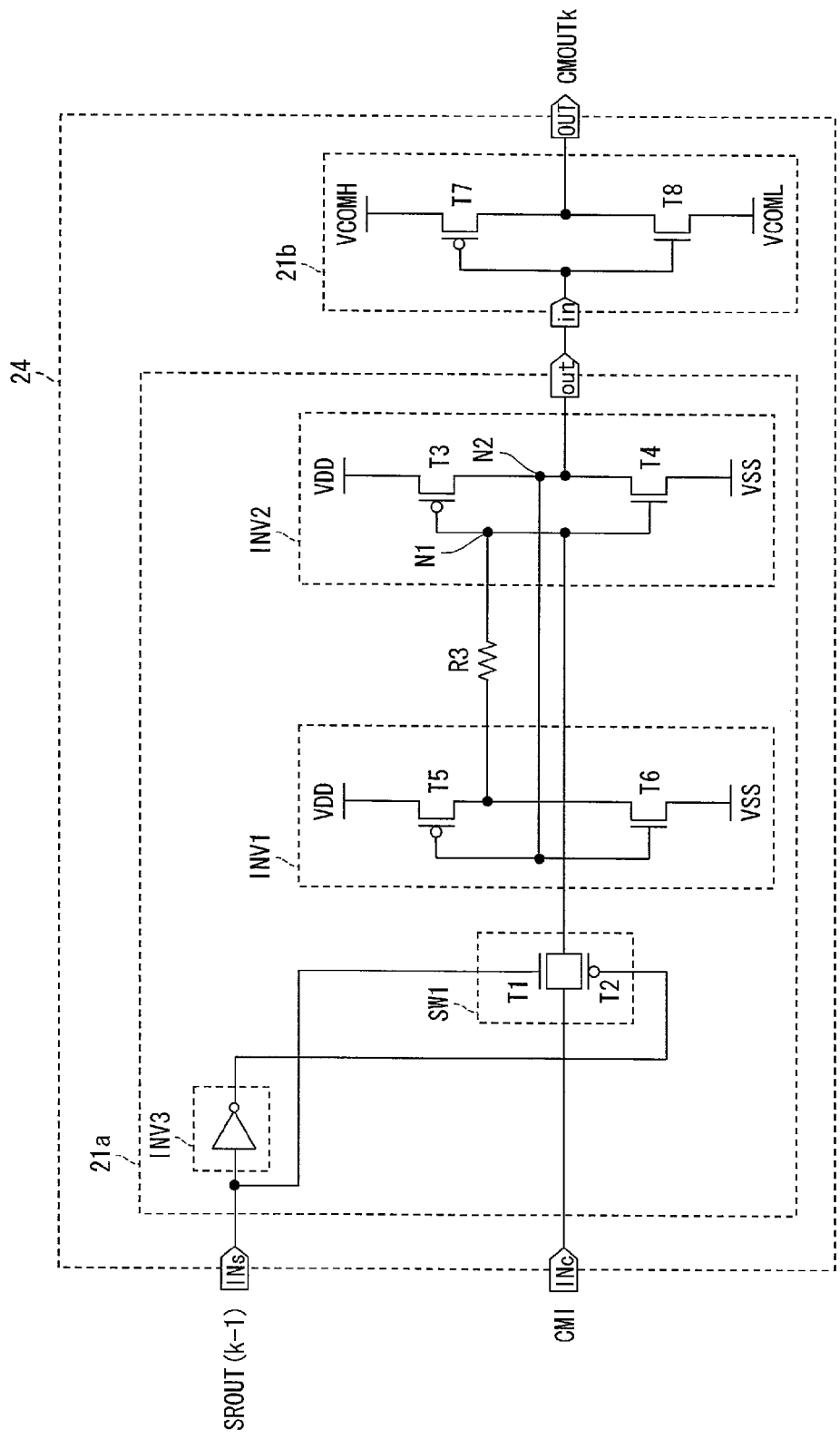

FIG. 28 is a circuit diagram of a unit circuit included in a common electrode driving circuit of Example 4.

Figure 29:
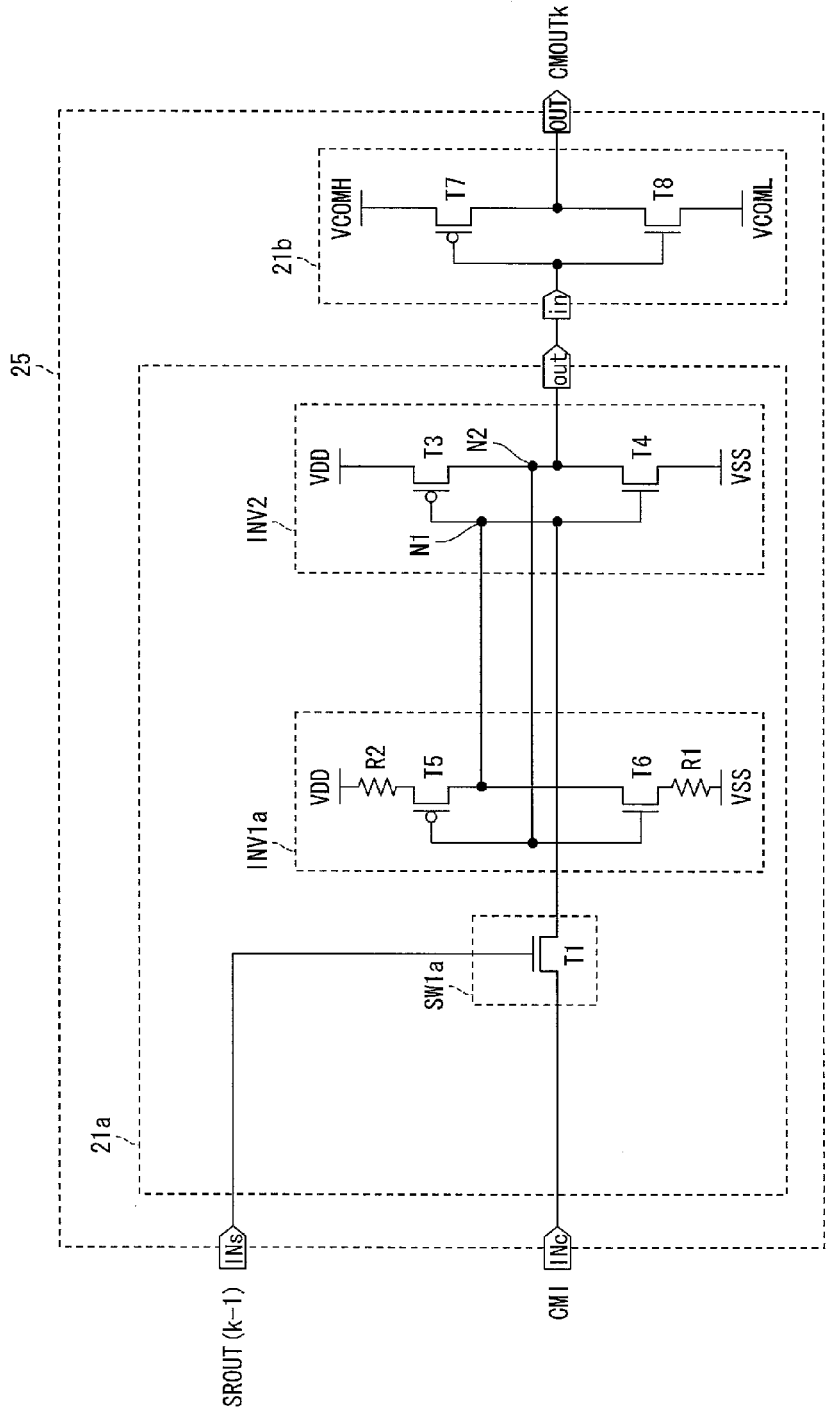

FIG. 29 is a circuit diagram of a unit circuit included in a common electrode driving circuit of Example 5.

Figure 30:
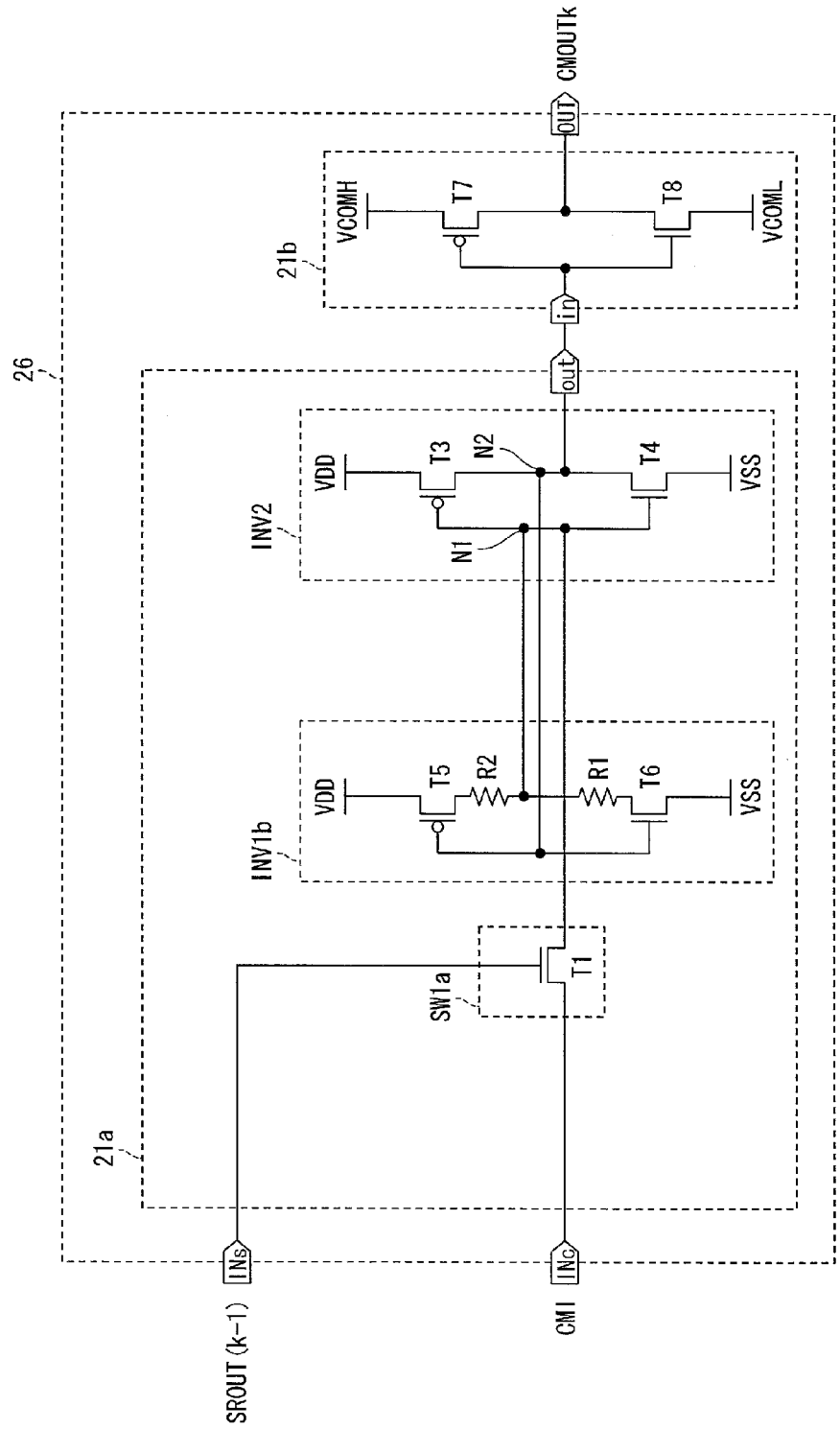

FIG. 30 is a circuit diagram of a unit circuit included in a common electrode driving circuit of Example 6.

Figure 31:
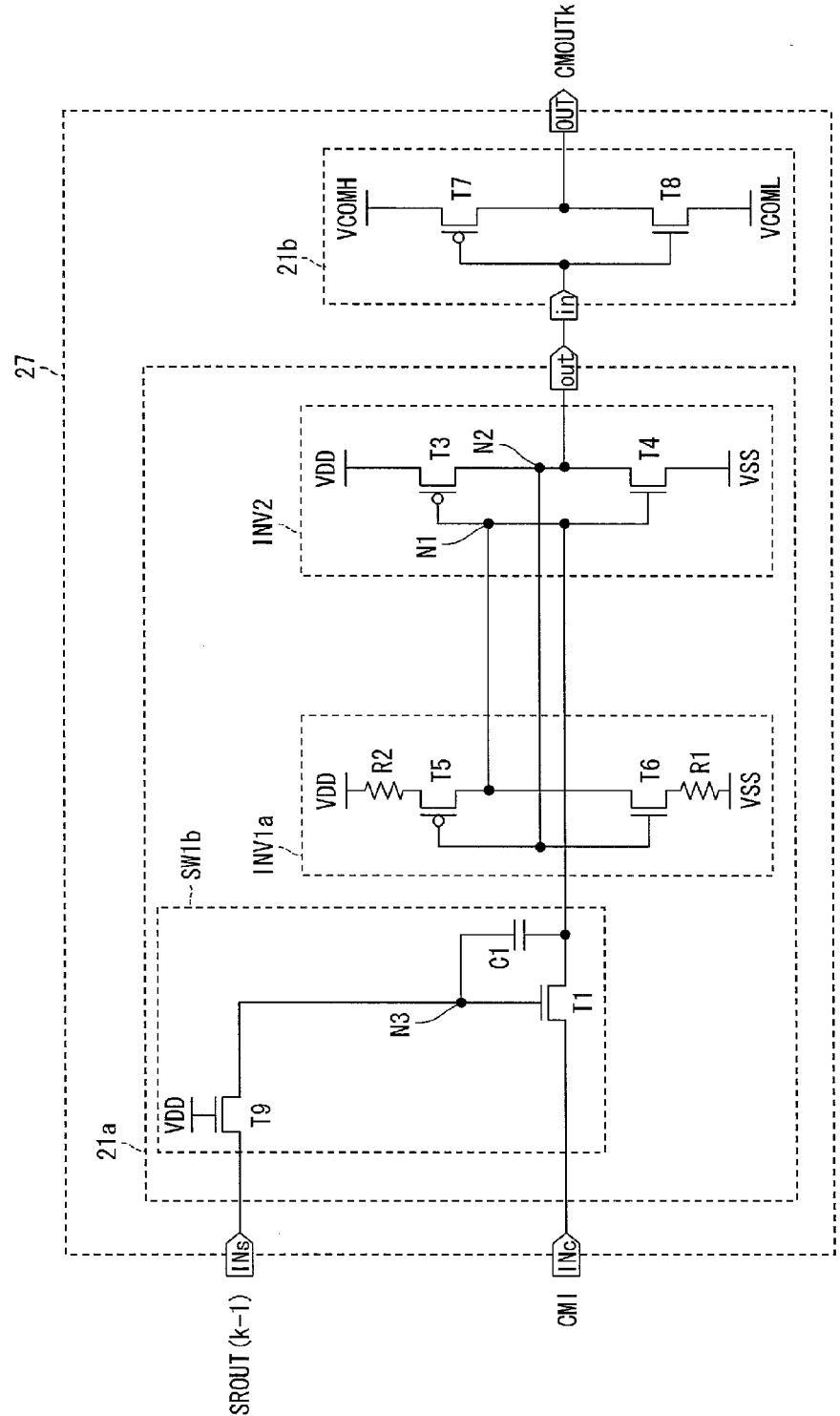

FIG. 31 is a circuit diagram of a unit circuit included in a common electrode driving circuit of Example 7.

Figure 32:
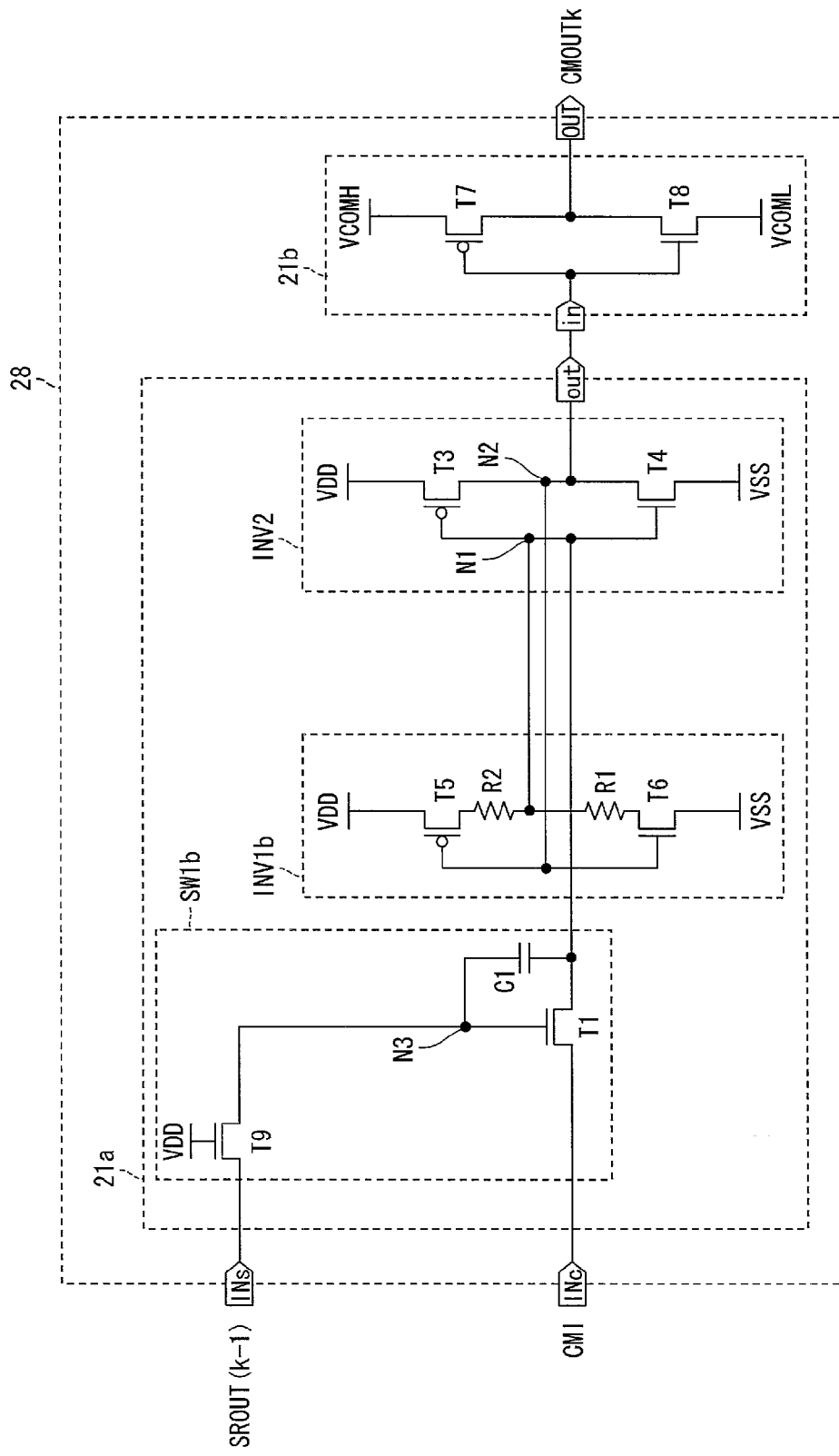

FIG. 32 is a circuit diagram of a unit circuit included in a common electrode driving circuit of Example 8.

Figure 33:
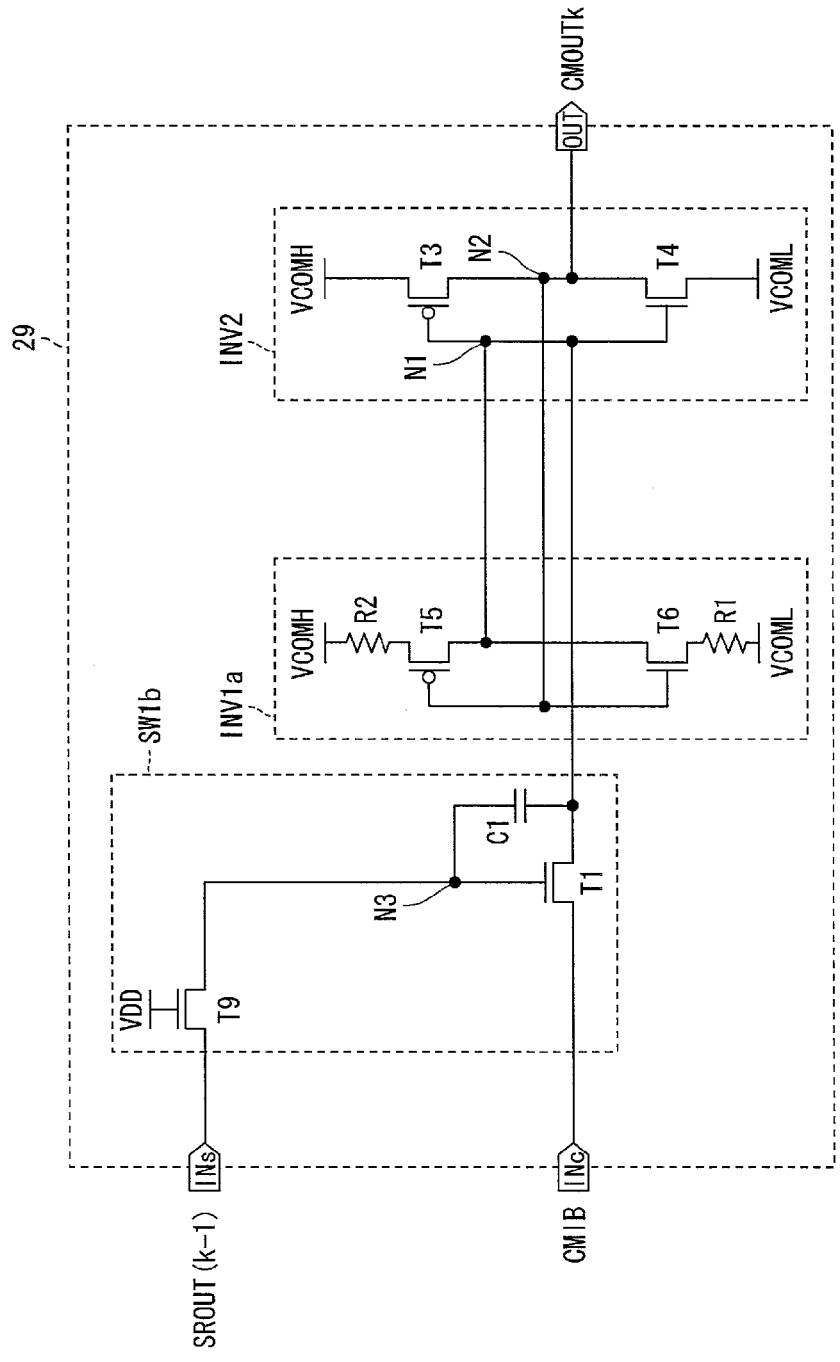

FIG. 33 is a circuit diagram of a unit circuit included in a common electrode driving circuit of Example 9.

Figure 34:
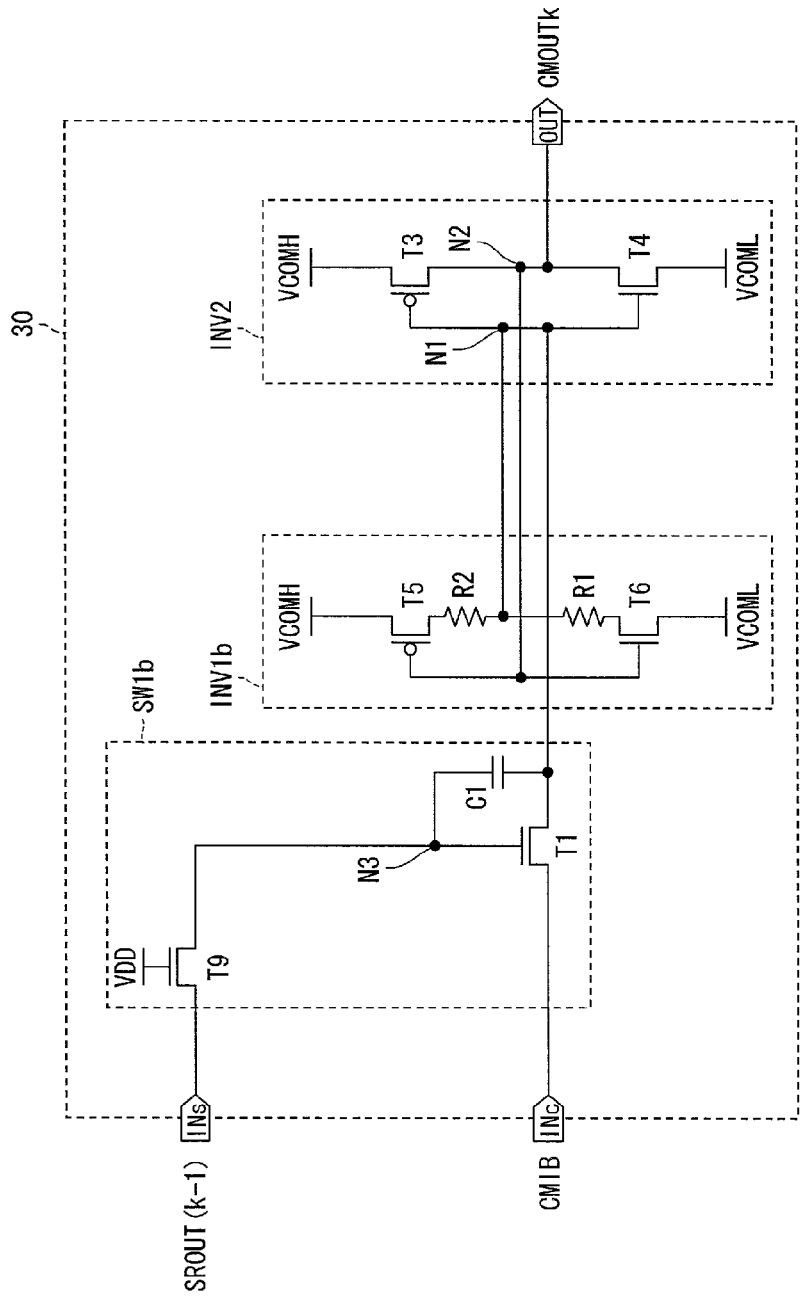

FIG. 34 is a circuit diagram of a unit circuit included in a common electrode driving circuit of Example 10.

Figure 35:
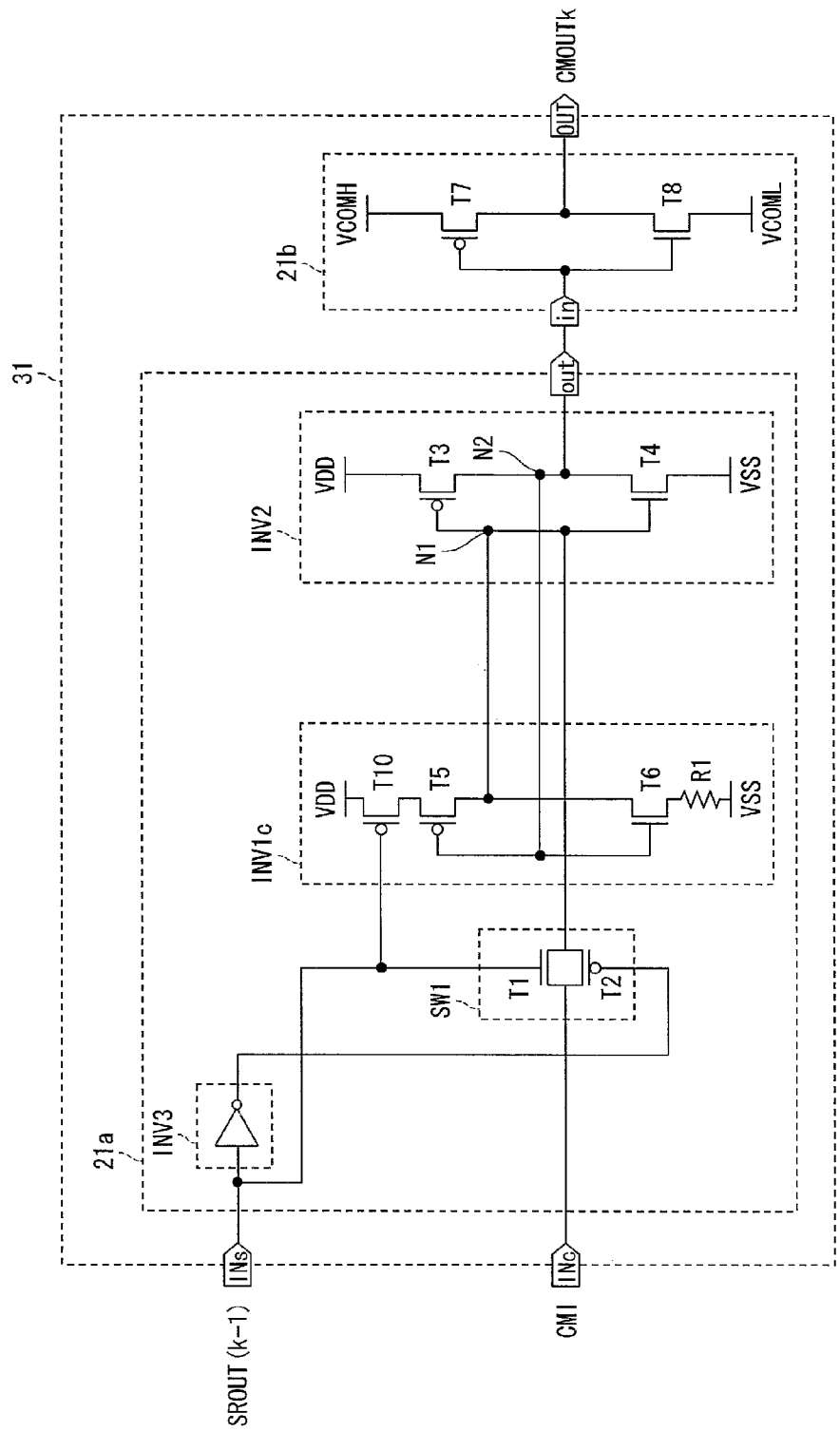

FIG. 35 is a circuit diagram of a unit circuit included in a common electrode driving circuit of Example 11.

Figure 36:
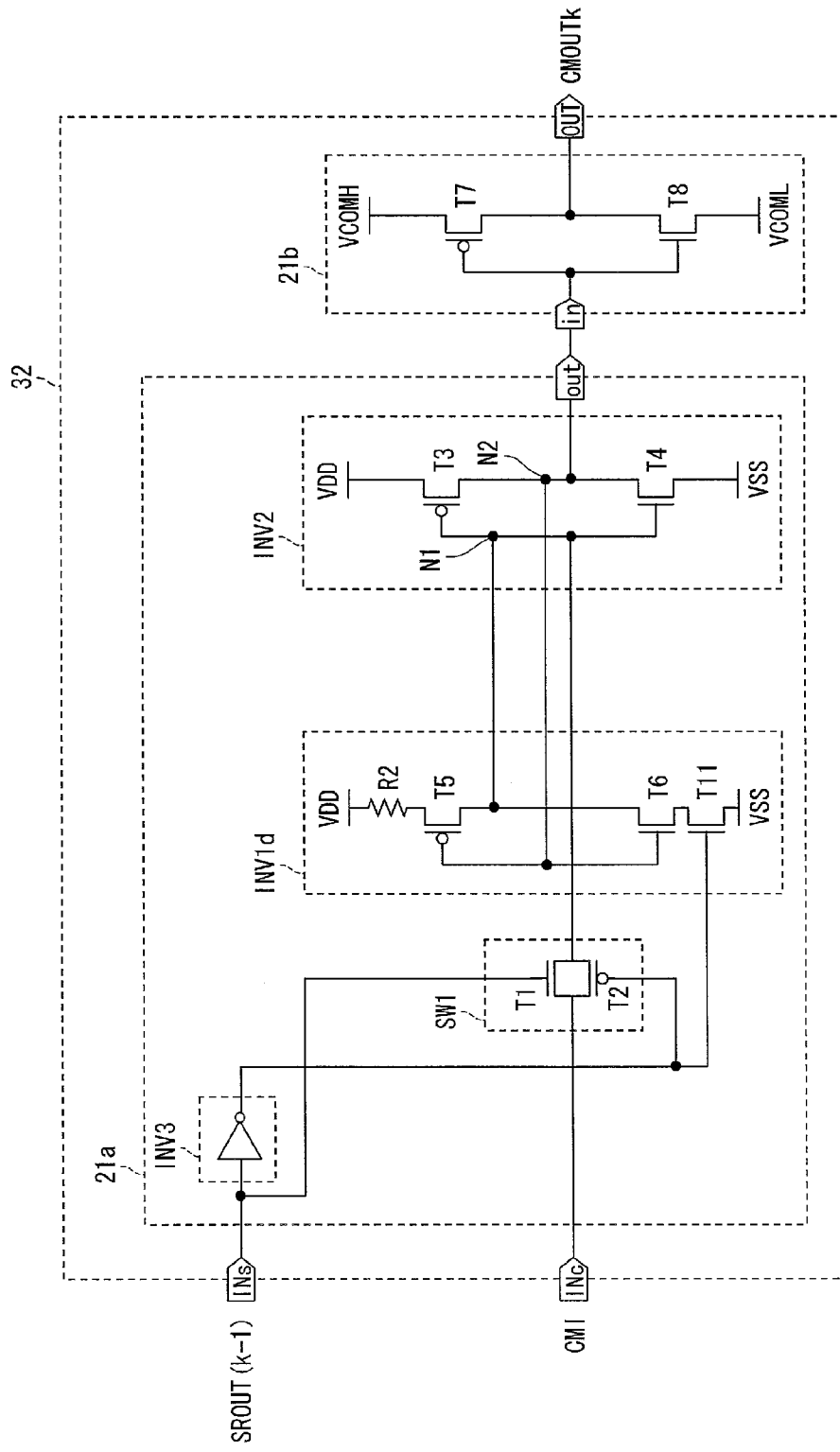

FIG. 36 is a circuit diagram of a unit circuit included in a common electrode driving circuit of Example 12.

Figure 37:
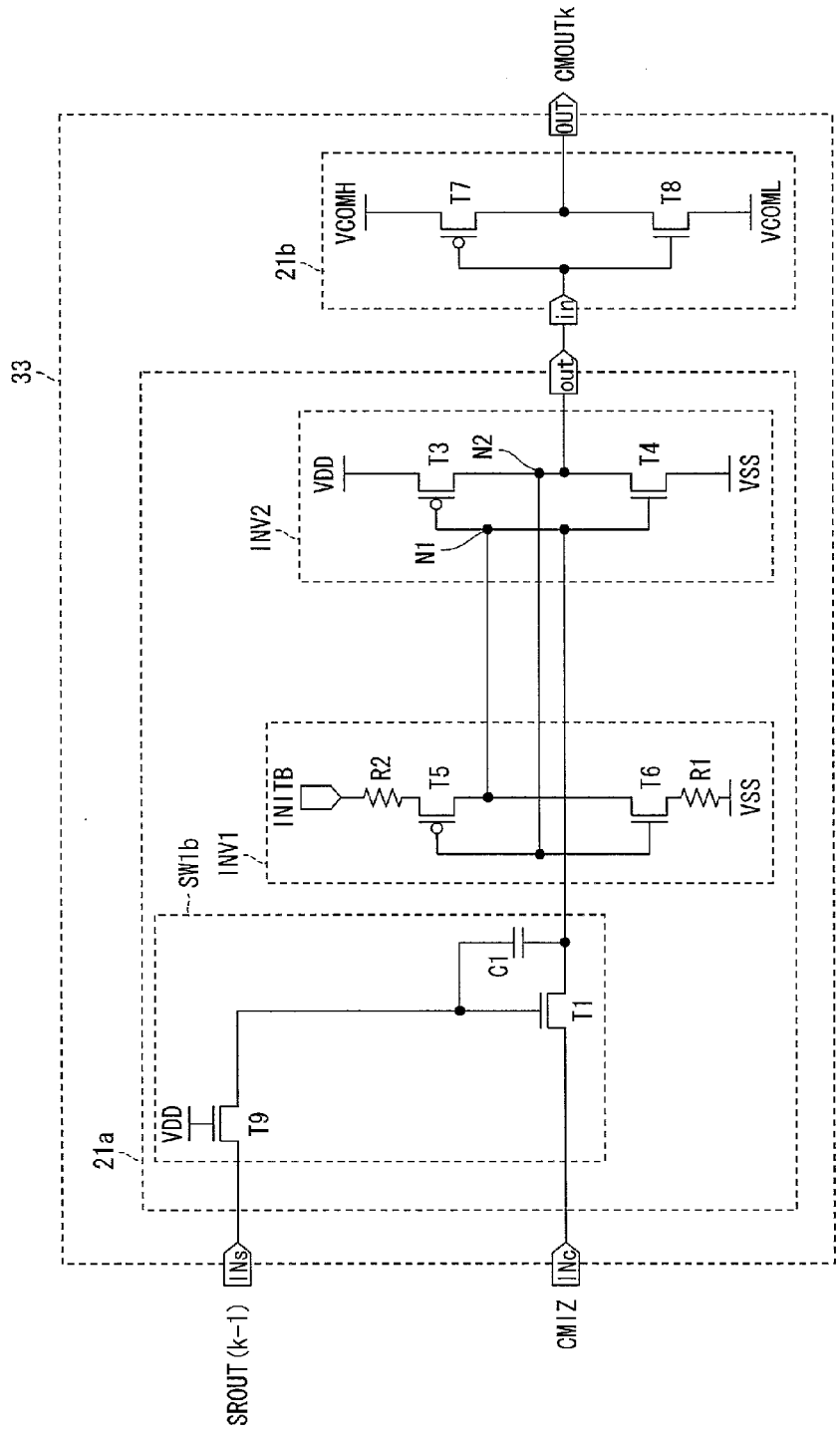

FIG. 37 is a circuit diagram of a unit circuit included in a common electrode driving circuit of Example 13.

Figure 38:
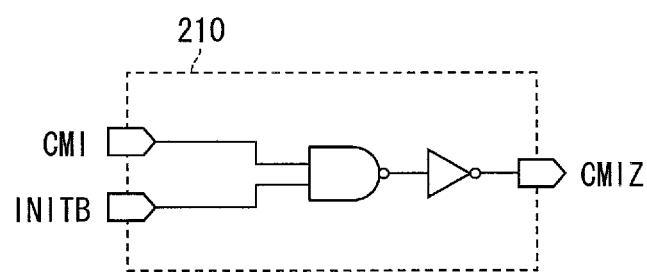

FIG. 38 is a circuit diagram of a generation circuit for generating a polarity signal CMIZ to be supplied to the common electrode driving circuit of Example 13.

Figure 39:
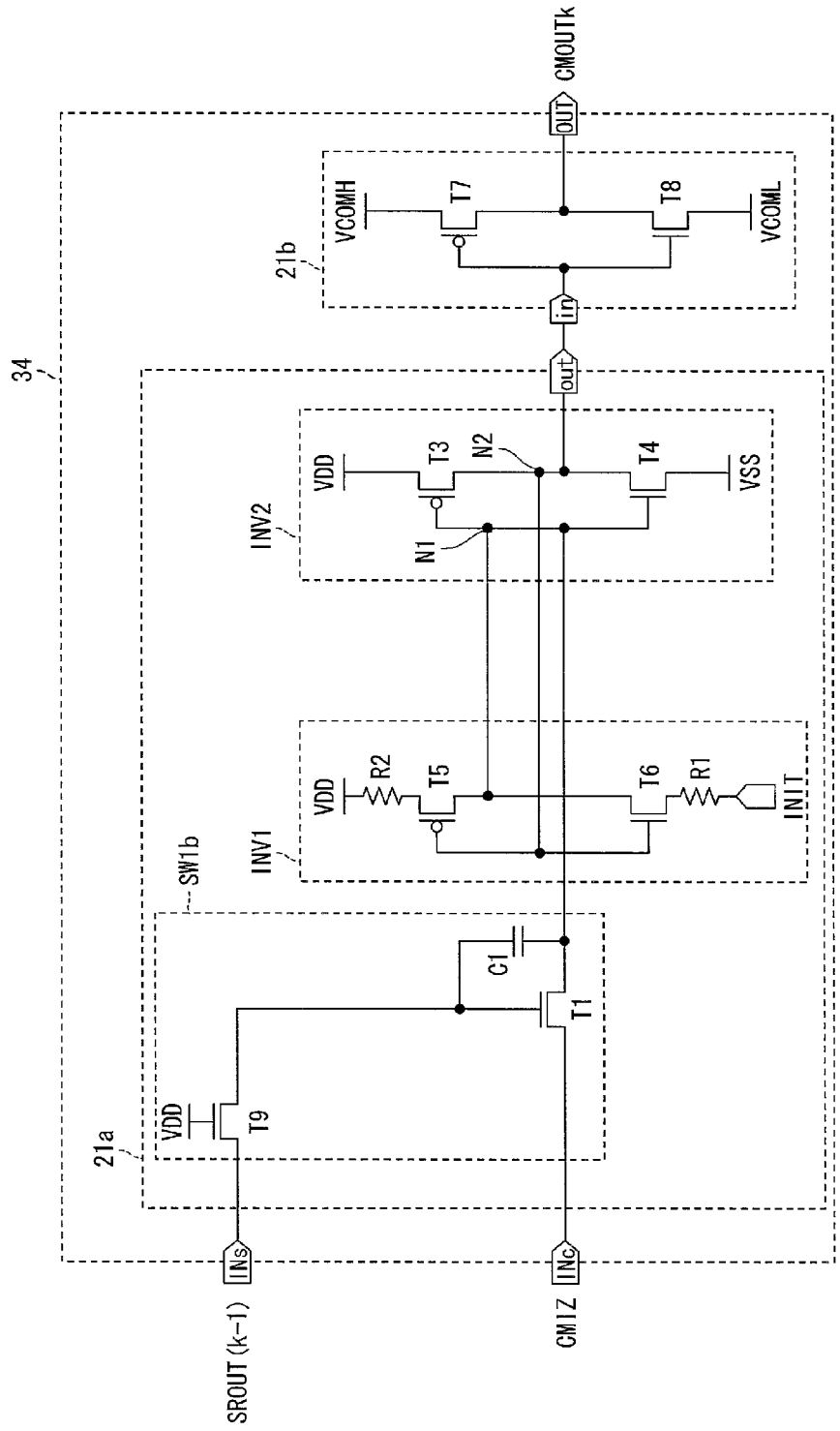

FIG. 39 is a circuit diagram of a unit circuit included in a common electrode driving circuit of Example 14.

Figure 40:
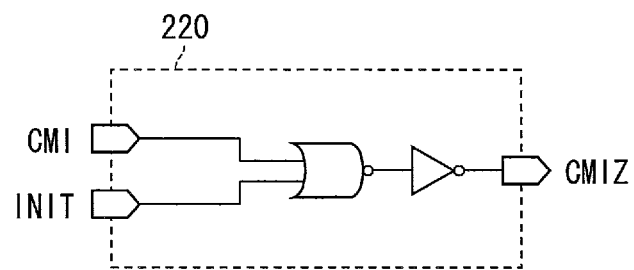

FIG. 40 is a circuit diagram of a generation circuit for generating a polarity signal CMIZ to be supplied to the common electrode driving circuit of Example 14.

Figure 41:
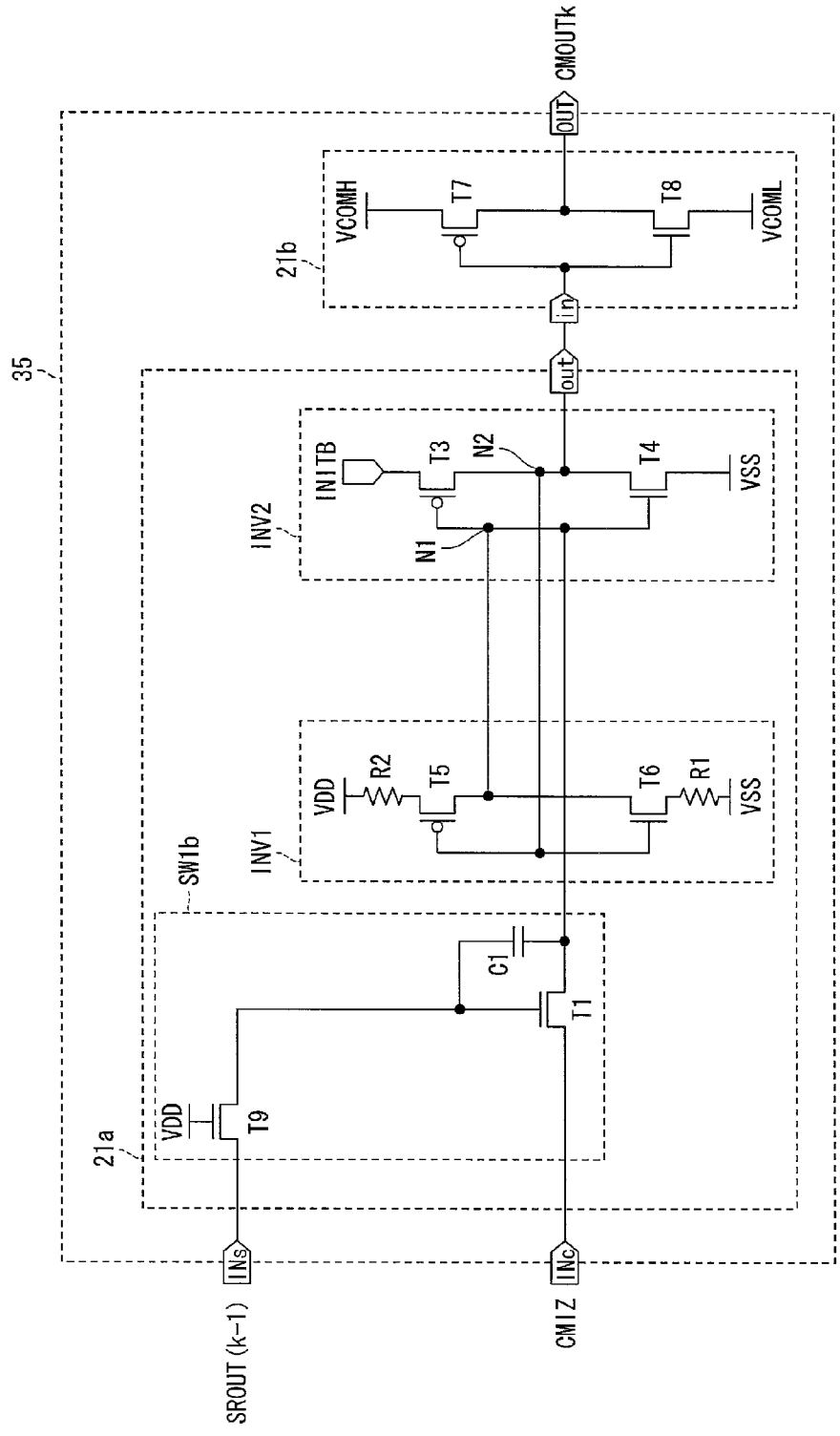

FIG. 41 is a circuit diagram of a unit circuit included in a common electrode driving circuit of Example 15.

Figure 42:
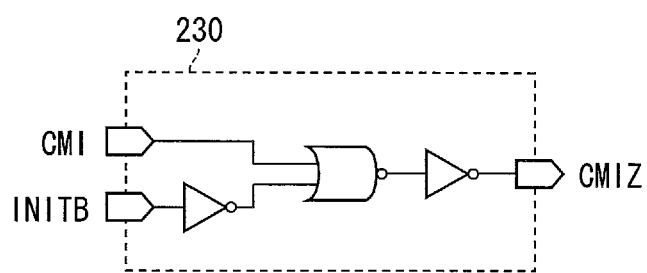

FIG. 42 is a circuit diagram of a generation circuit for generating a polarity signal CMIZ to be supplied to the common electrode driving circuit of Example 15.

Figure 43:
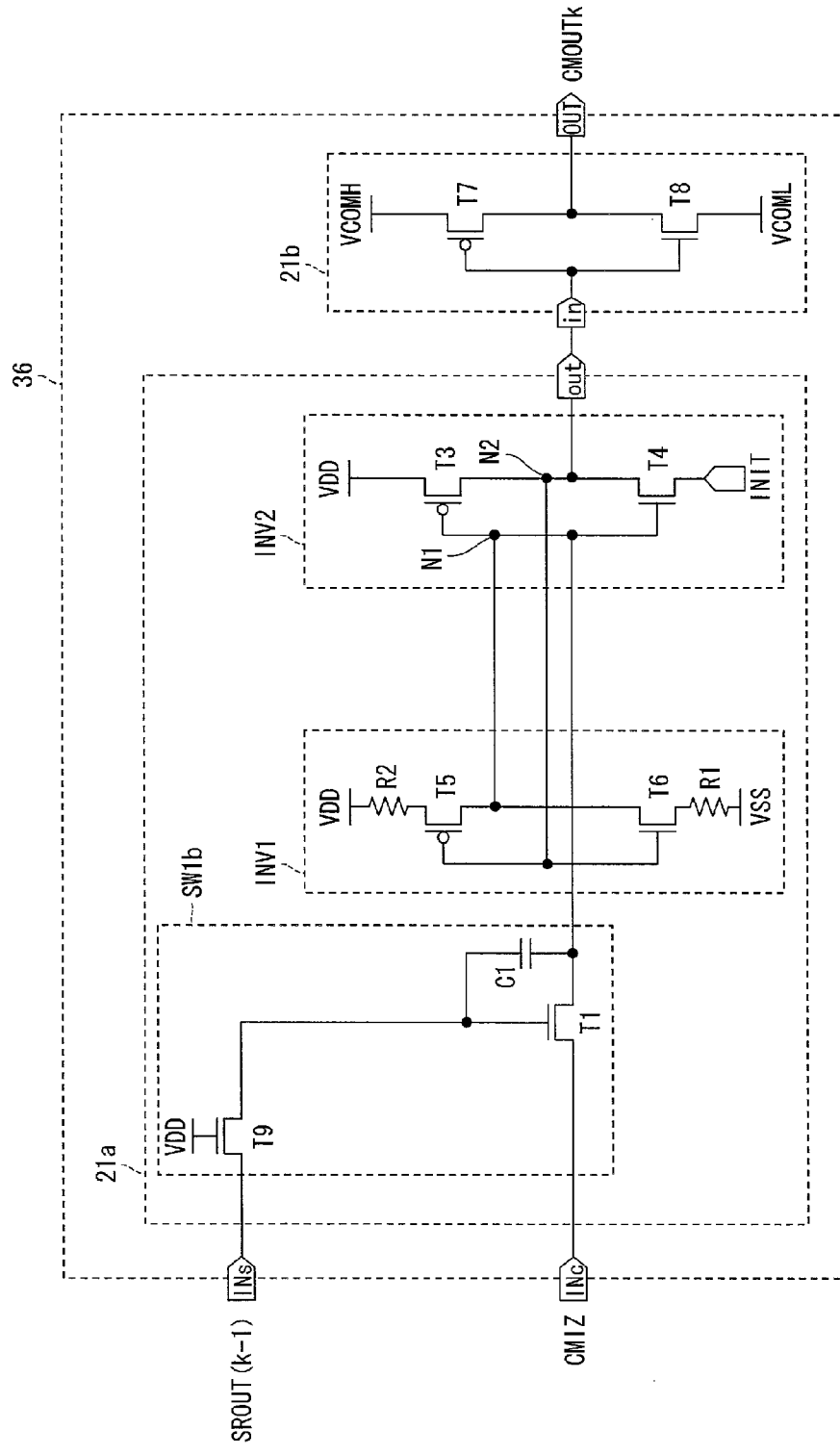

FIG. 43 is a circuit diagram of a unit circuit included in a common electrode driving circuit of Example 16.

Figure 44:
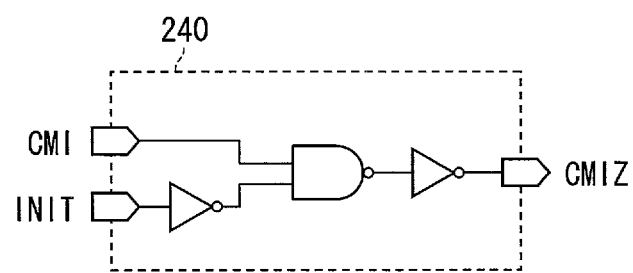

FIG. 44 is a circuit diagram of a generation circuit for generating a polarity signal CMIZ to be supplied to the common electrode driving circuit of Example 16.

Figure 45:
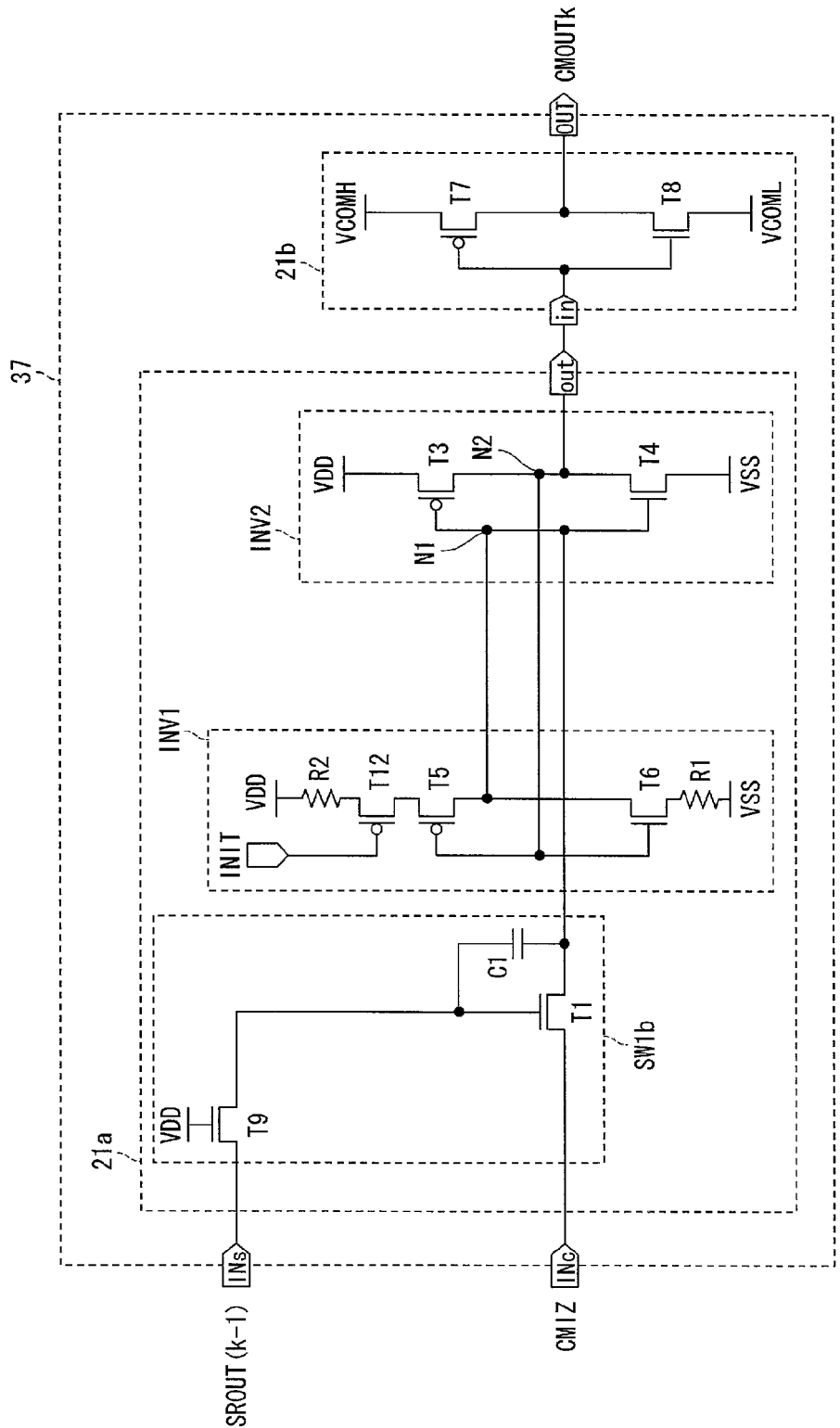

FIG. 45 is a circuit diagram of a unit circuit included in a common electrode driving circuit of Example 17.

Figure 46:
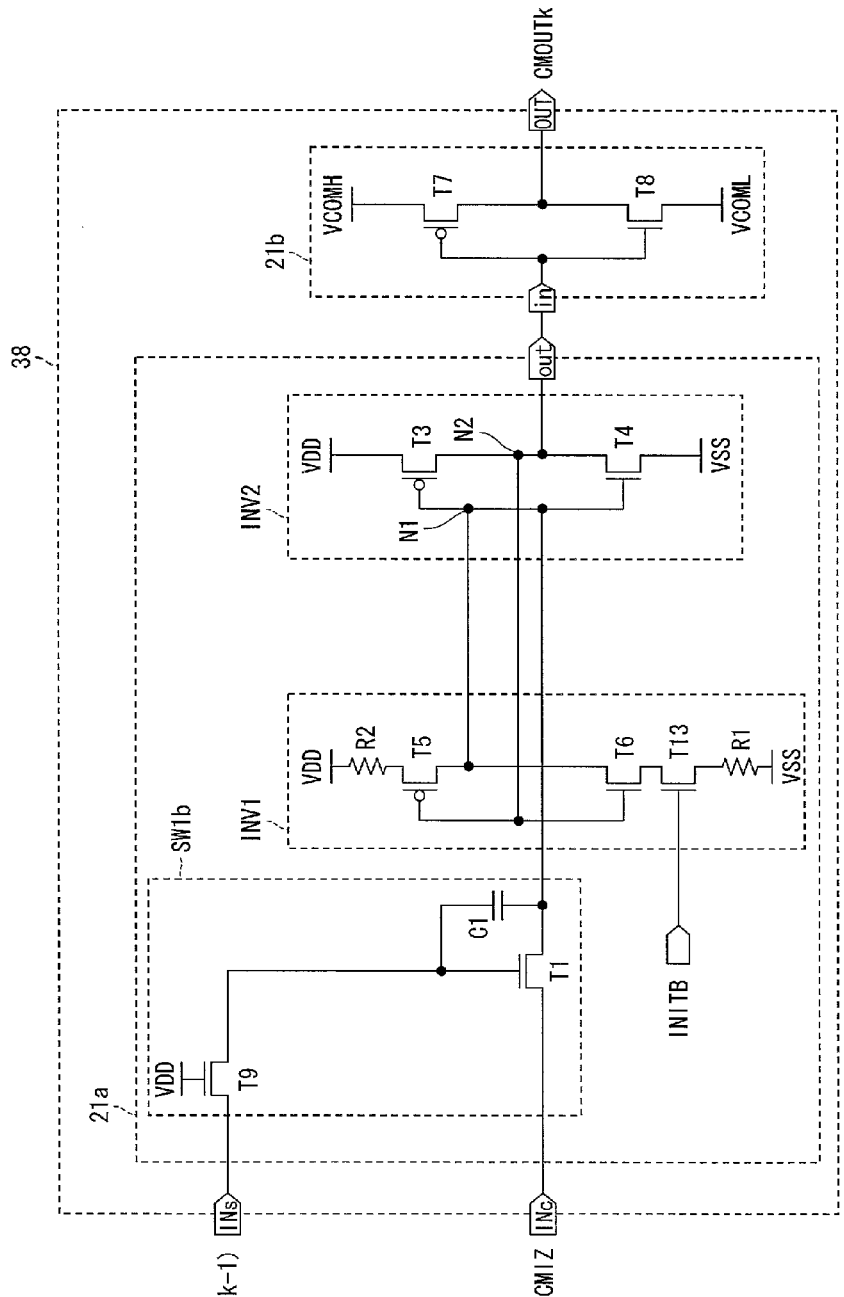

FIG. 46 is a circuit diagram of a unit circuit included in a common electrode driving circuit of Example 18.

Figure 47:
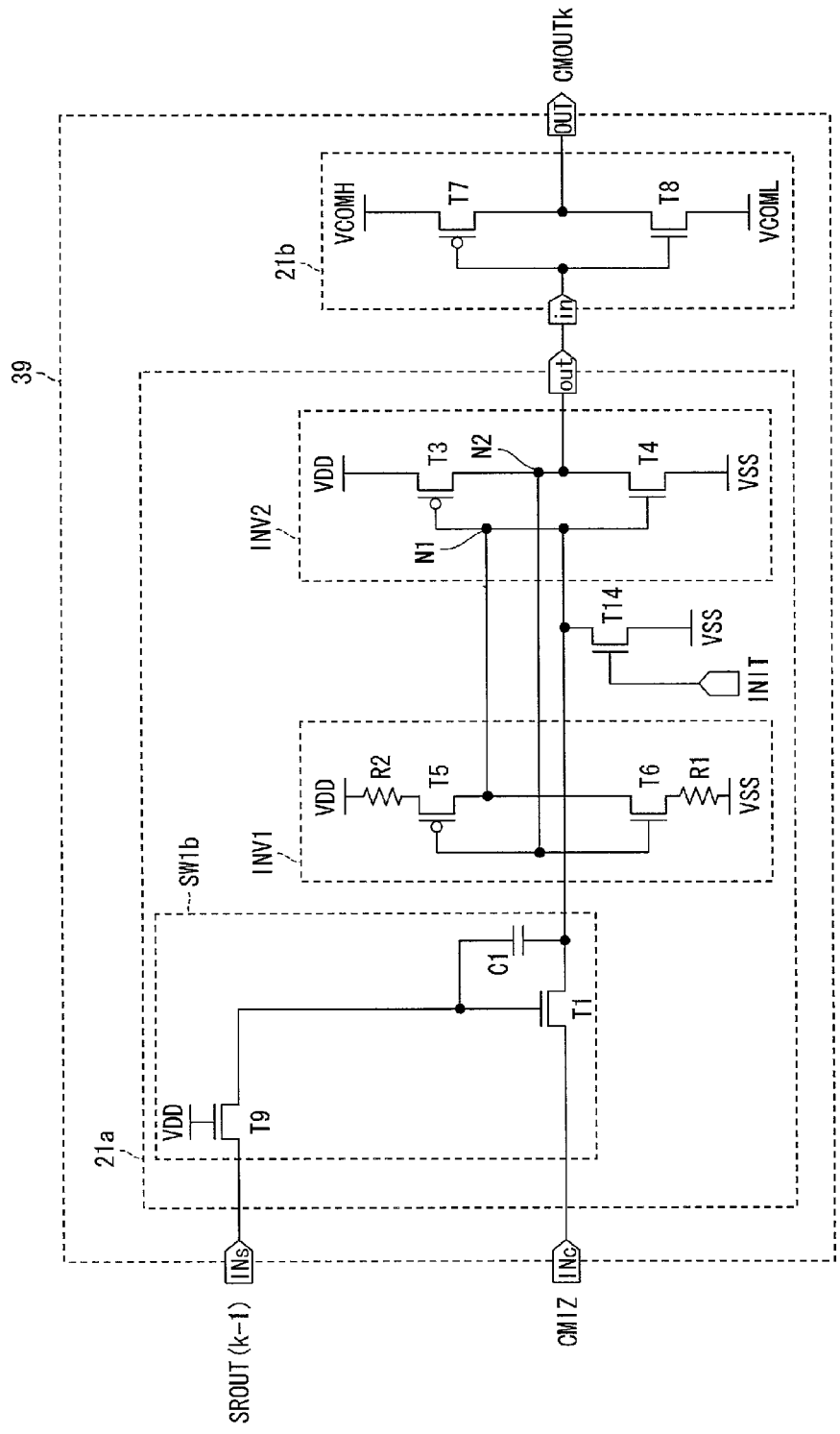

FIG. 47 is a circuit diagram of a unit circuit included in a common electrode driving circuit of Example 19.

Figure 48:
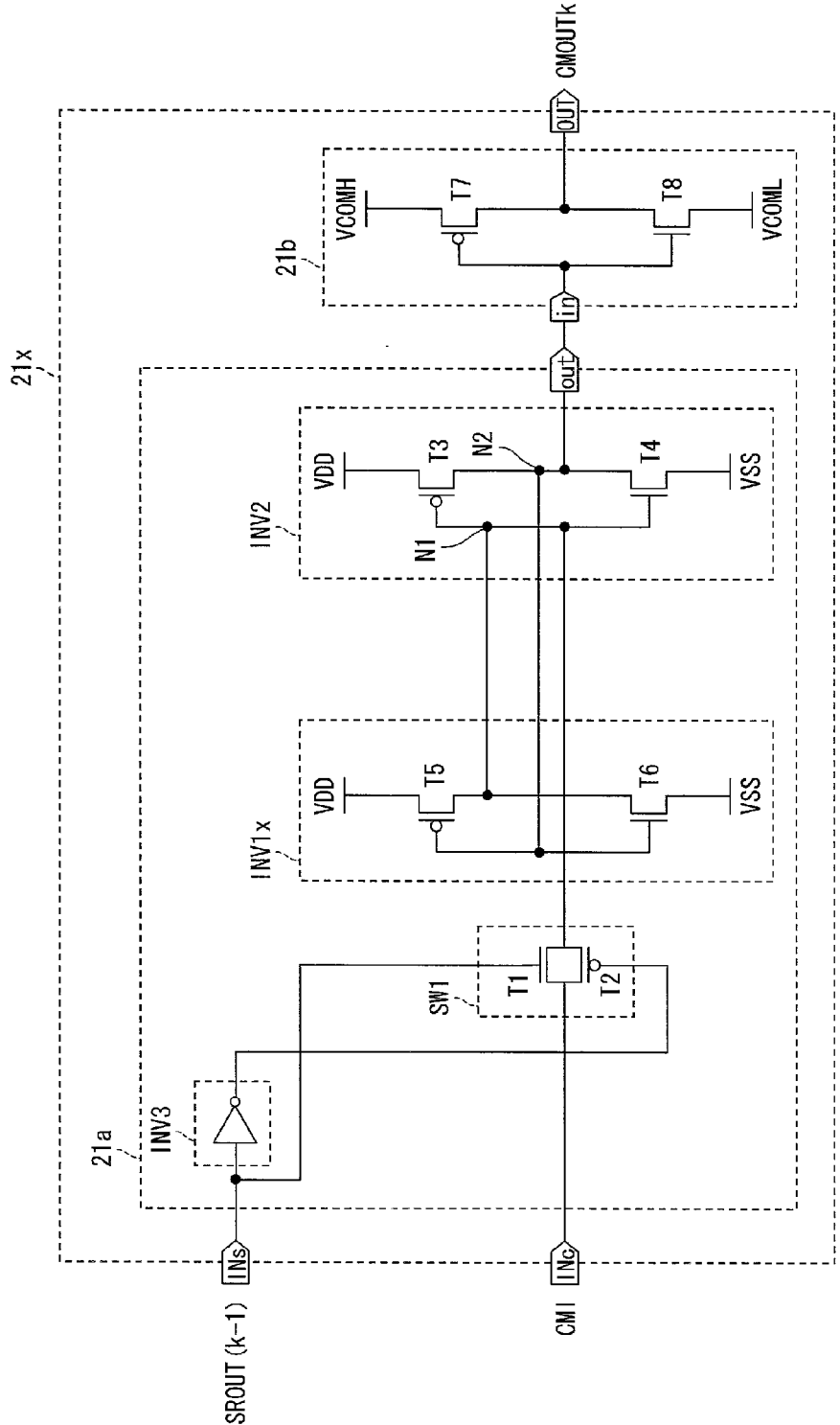

FIG. 48 is a circuit diagram of a unit circuit included in a common electrode driving circuit of Example 20.

Figure 49:
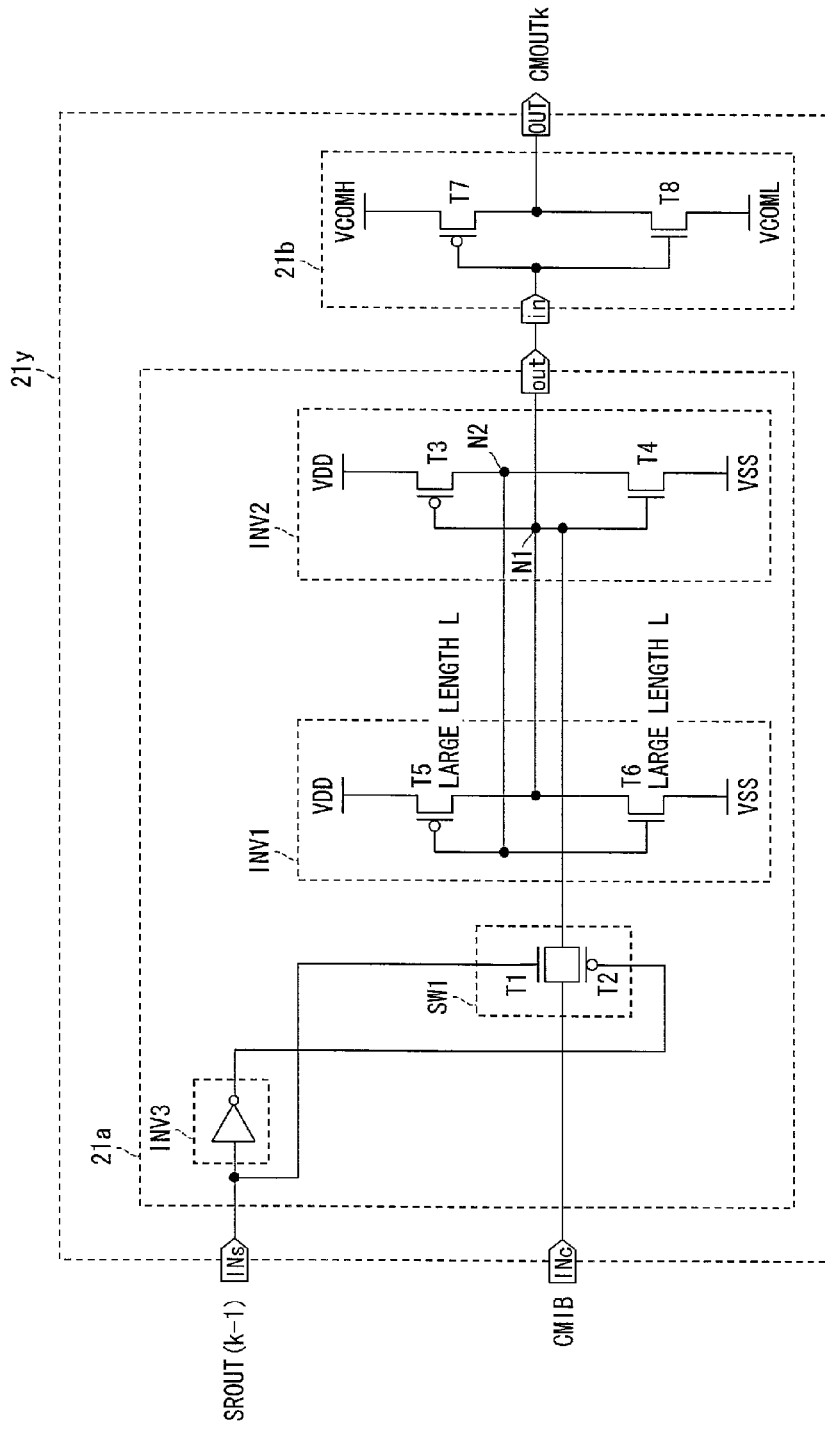

FIG. 49 is a circuit diagram of a unit circuit included in a common electrode driving circuit of Example 21.

Figure 50:
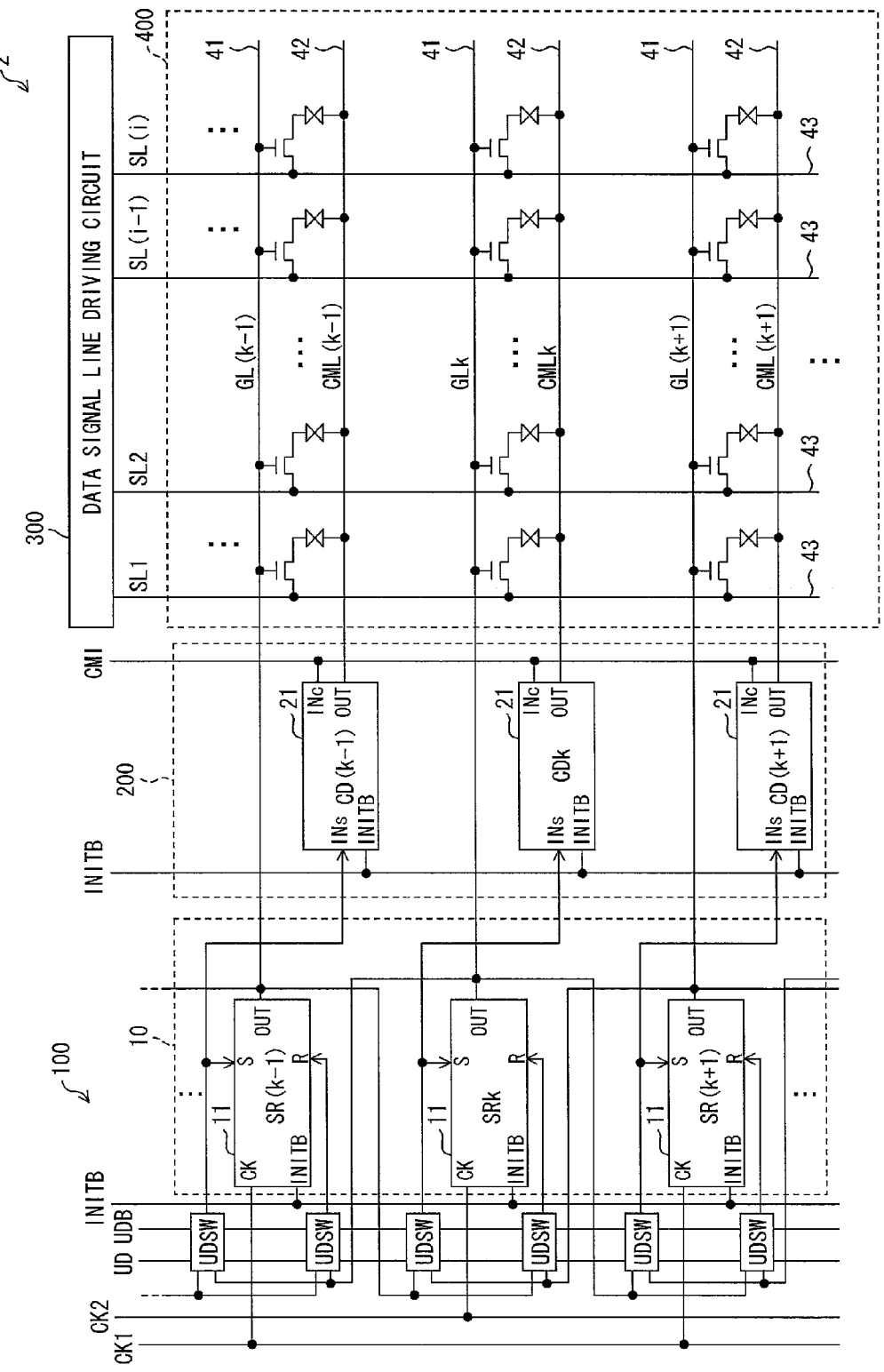

FIG. 50 is a block diagram illustrating a variation of the liquid crystal display device of Embodiment 2.

Figure 51:
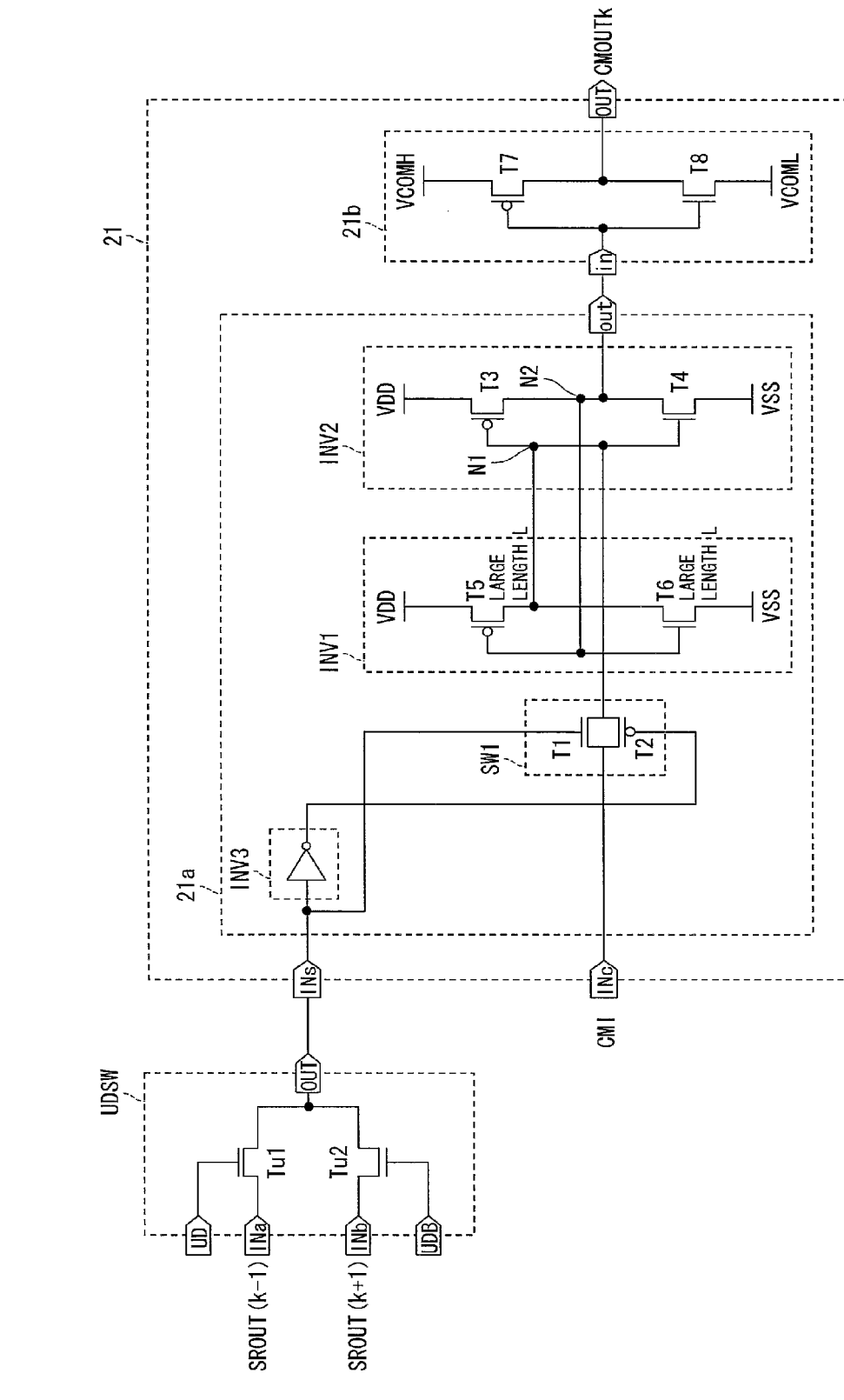

FIG. 51 is a circuit diagram illustrating a connection between a switch circuit UDSW and a kth unit circuit included in the common electrode driving circuit of Example 1.

Figure 52:
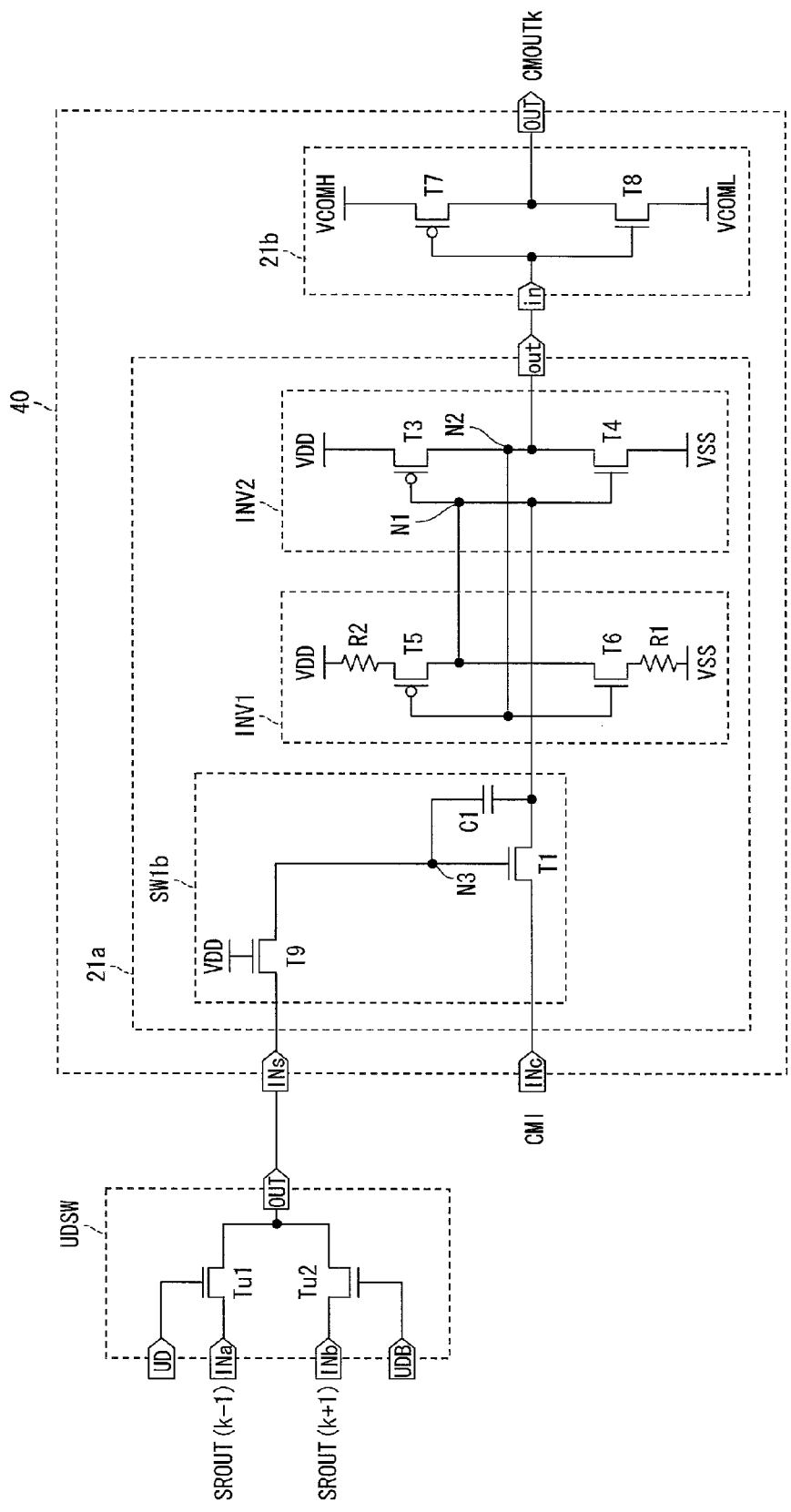

FIG. 52 is a circuit diagram of a unit circuit in which a switch circuit UDSW is provided to the unit circuit of Example 7.

Figure 53:
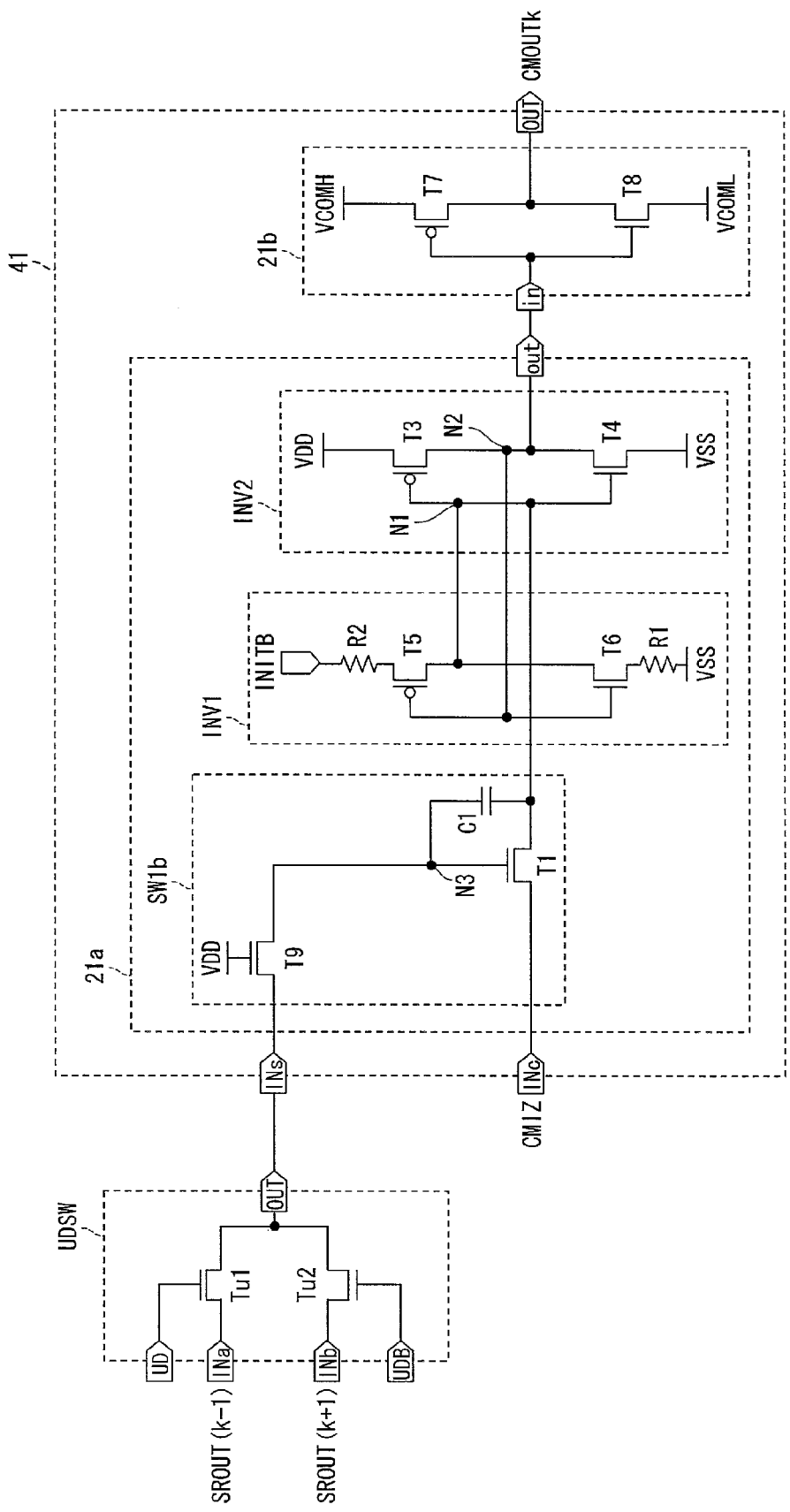

FIG. 53 is a circuit diagram of a unit circuit in which a switch circuit UDSW is provided to the unit circuit of Example 13.

Figure 54:
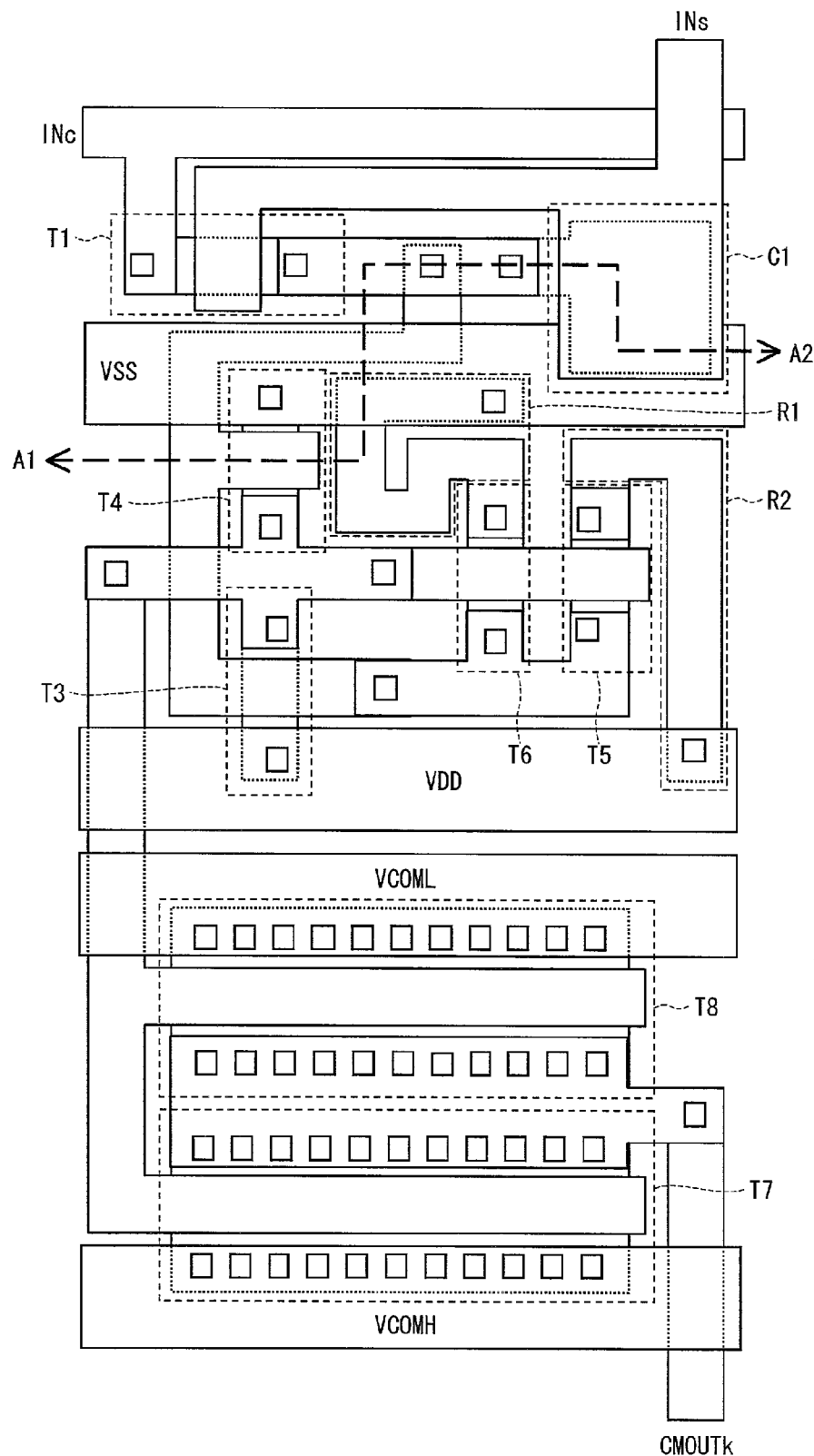

FIG. 54 is a view illustrating a planar layout of the unit circuit of FIG. 52.

Figure 55:
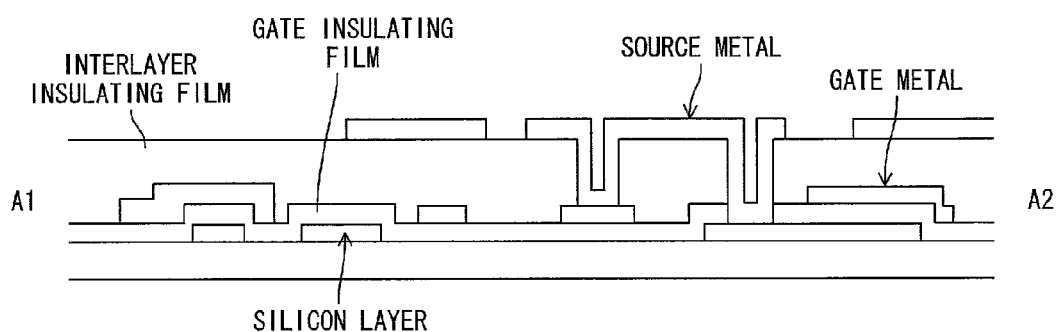

FIG. 55 is a cross-sectional view taken along the line A1-A2 of FIG. 54.

Figure 56:
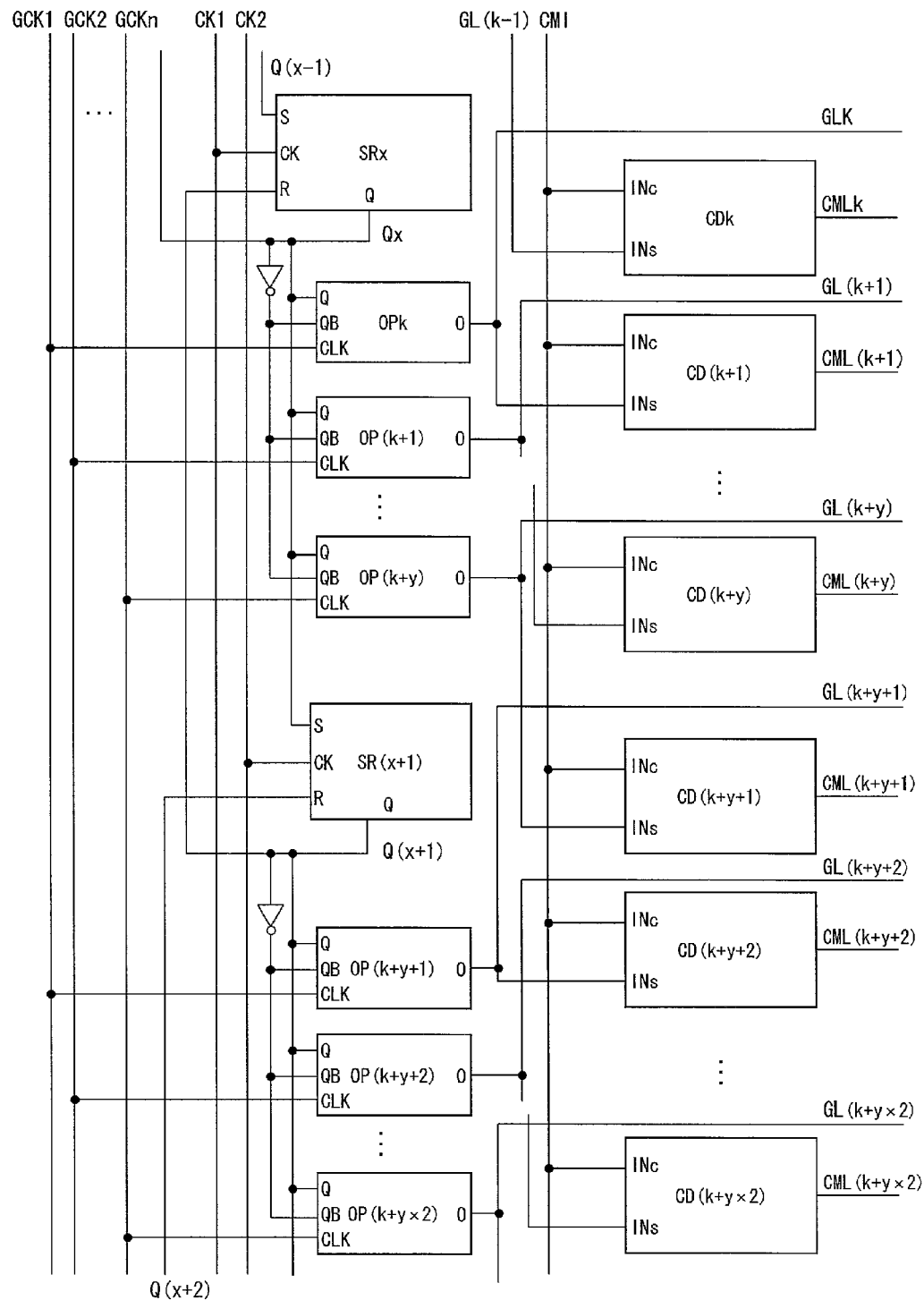

FIG. 56 is a block diagram illustrating another configuration of the common electrode driving circuit of Embodiment 1.

Figure 57:
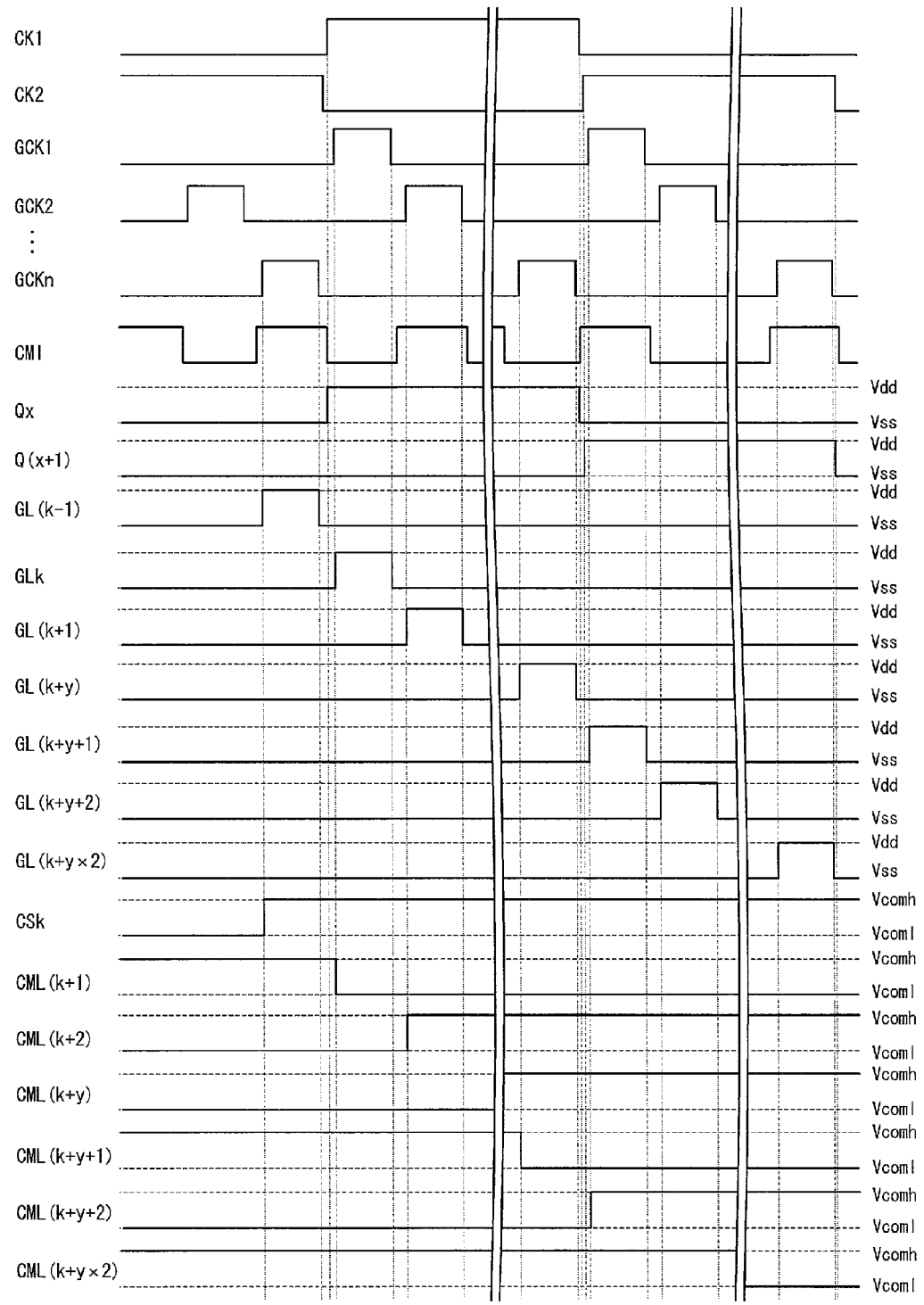

FIG. 57 is a timing chart at the time of an operation of the common electrode driving circuit of FIG. 56.

Figure 58:
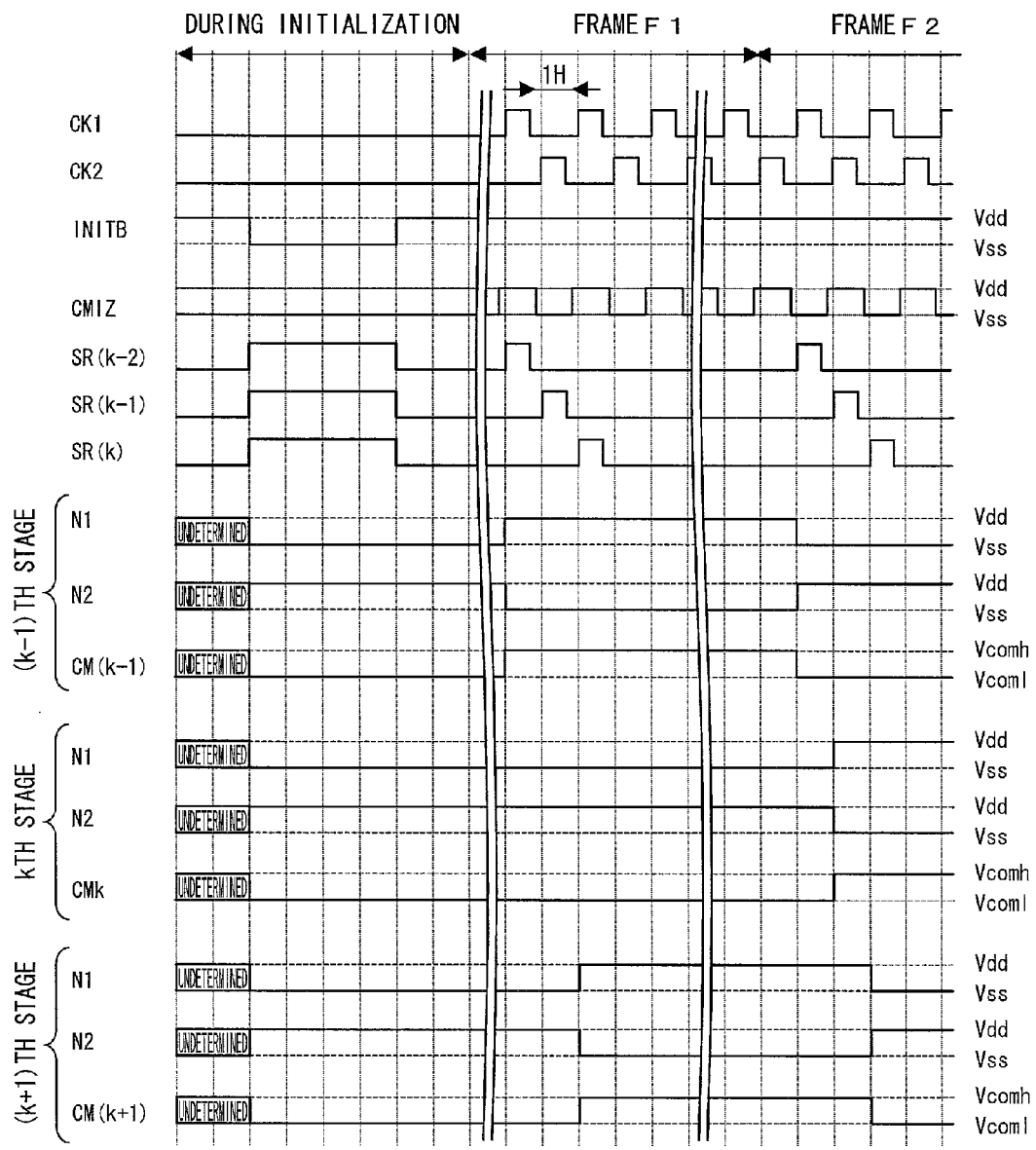

FIG. 58 is a timing chart at the time of an operation of the common electrode driving circuit of FIG. 37.

Figure 59:
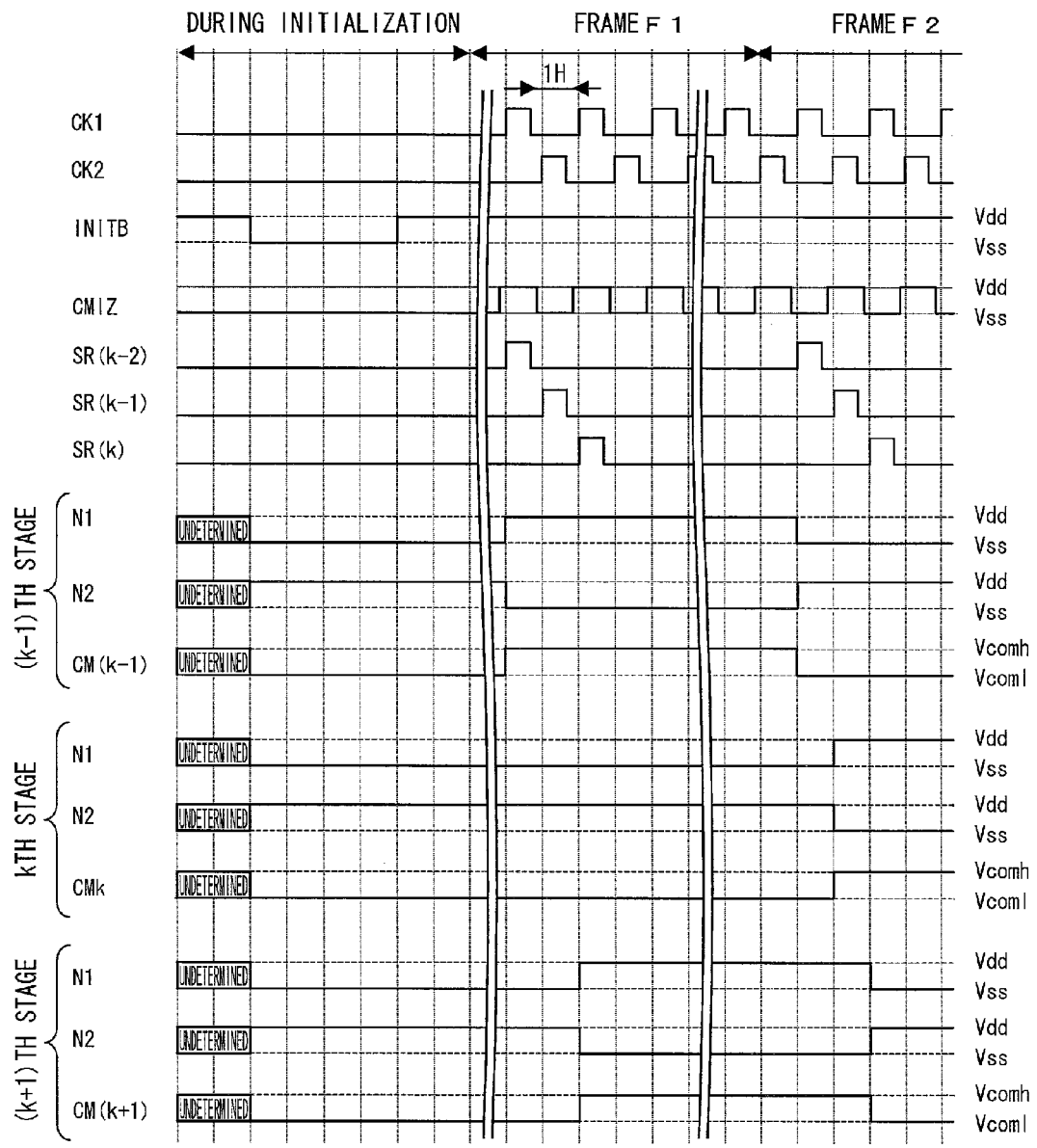

FIG. 59 is a timing chart at the time of an operation of the common electrode driving circuit of FIG. 37.

Figure 60:
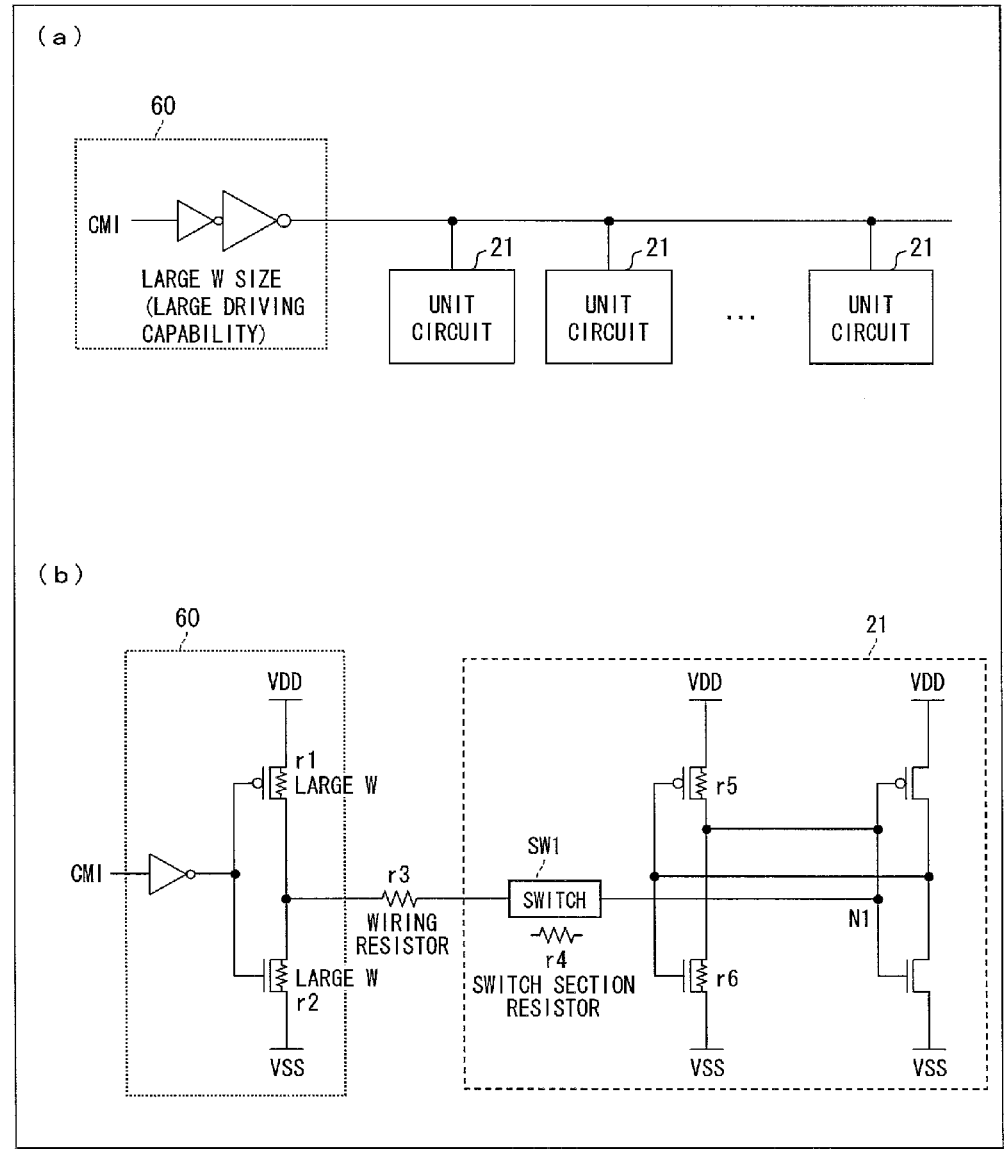

(a) of FIG. 60 is a block diagram illustrating a unit circuit and a CMI buffer section, and (b) of FIG. 60 is a circuit diagram thereof.

Figure 61:
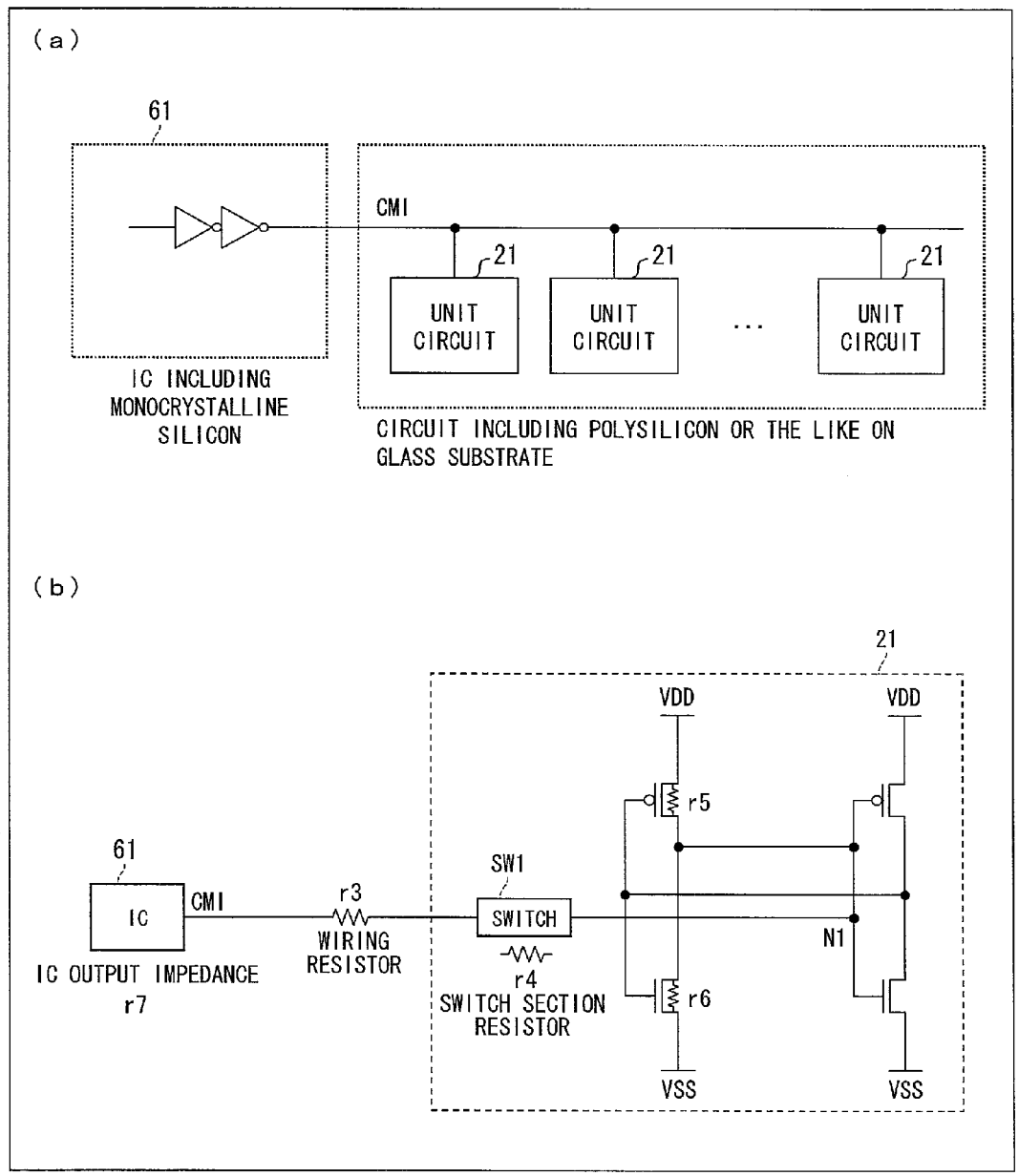

(a) of FIG. 61 is a block diagram illustrating a unit circuit and an IC circuit, and (b) of FIG. 61 is a circuit diagram thereof.

Figure 62:
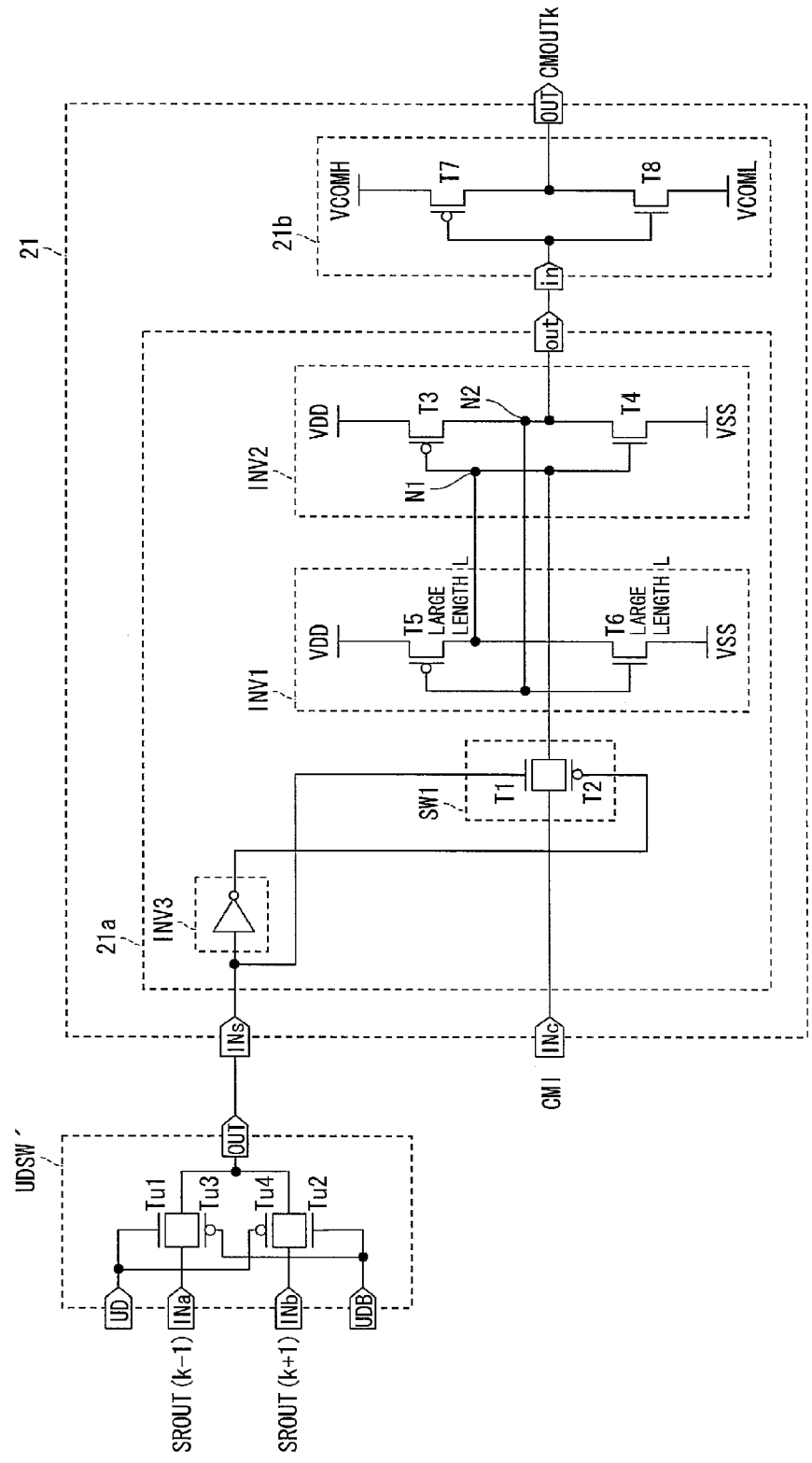

FIG. 62 is a view illustrating another configuration of the switch circuit UDSW shown in FIG. 51.

Figure 63:
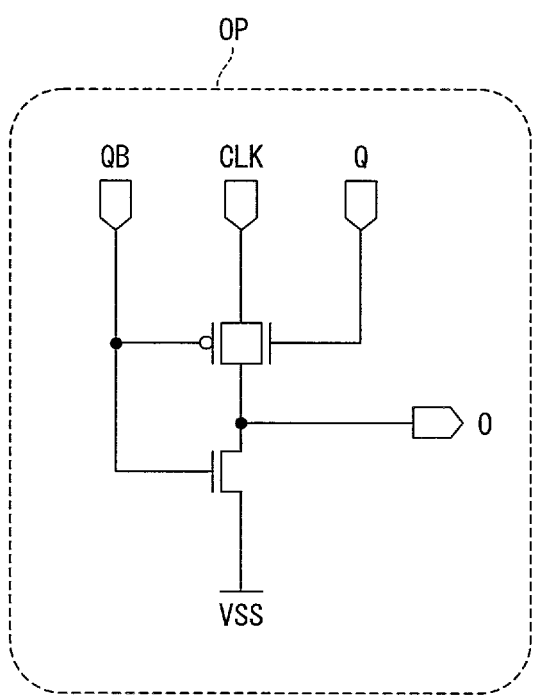

FIG. 63 is a circuit diagram illustrating a pulse output section for generating a signal to be supplied to the unit circuit of FIG. 56.

Figure 64:
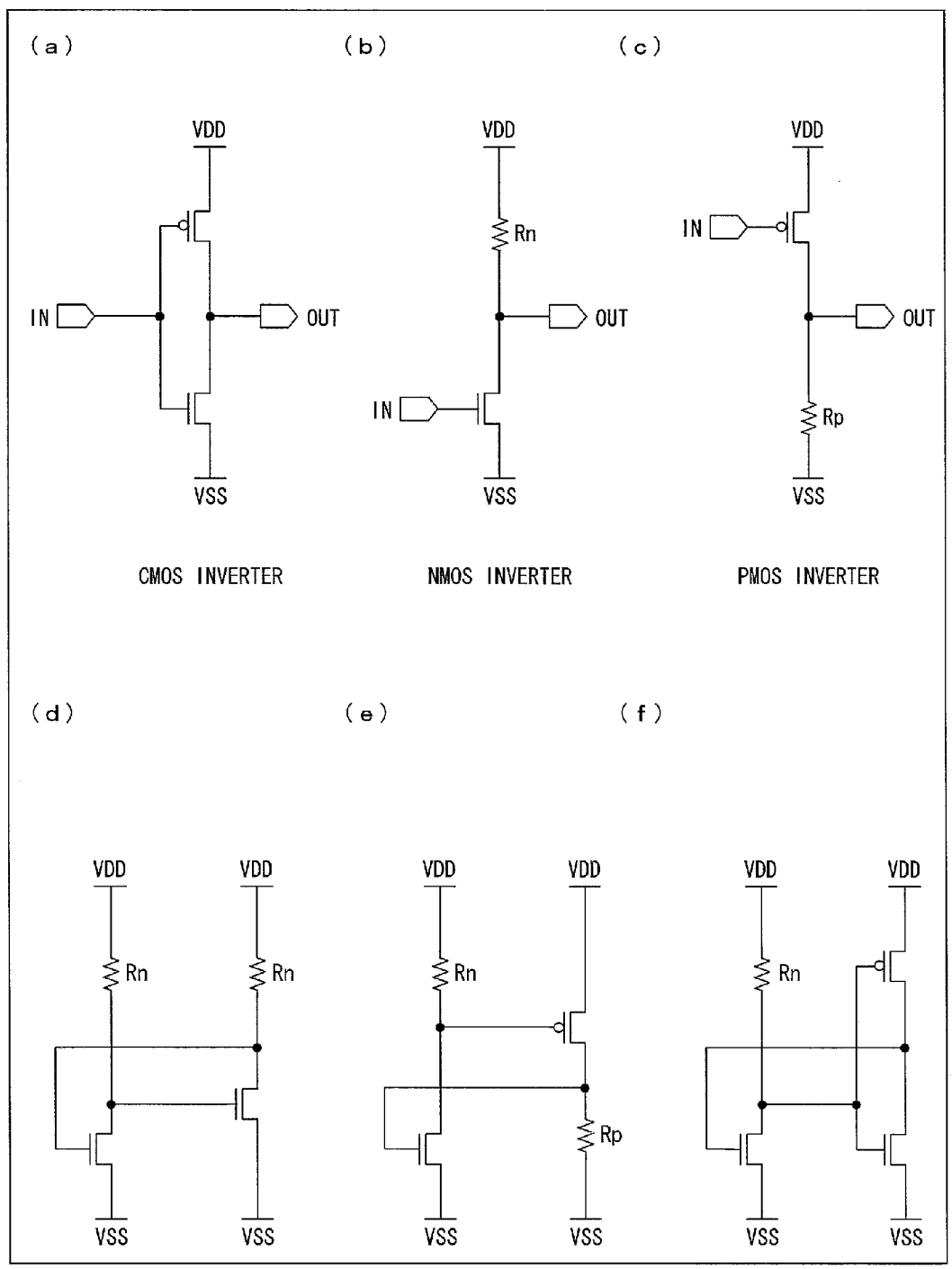

FIG. 64 is circuit diagrams of example configurations of inverters INV1 and INV2 of a unit circuit of a common electrode driving circuit; (a) illustrates a CMOS inverter; (b) illustrates an NMOS inverter; (c) illustrates a PMOS inverter; and (d) to (f) illustrate example configurations of the inverters INV1 and INV2.

Figure 65:
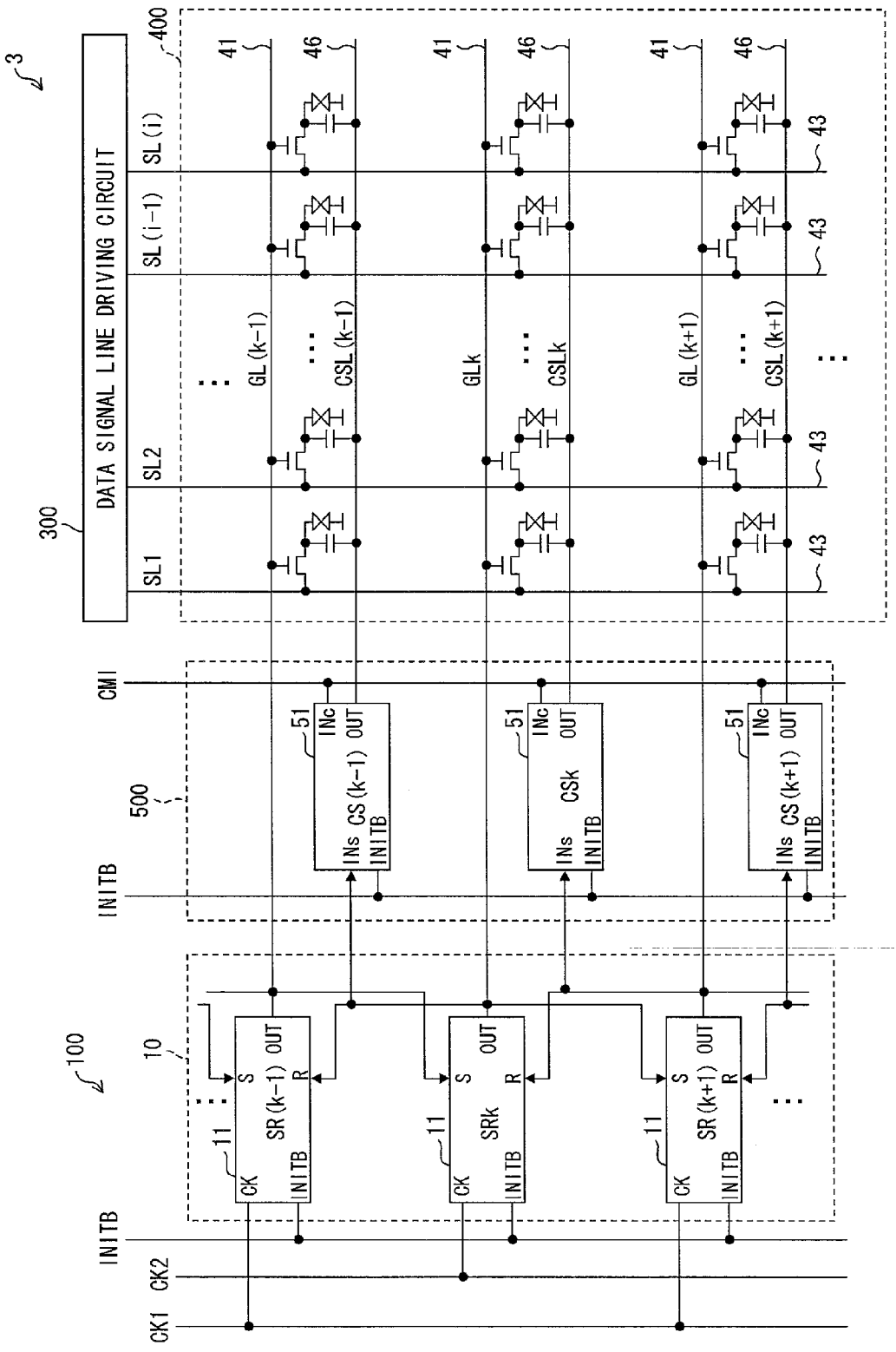

FIG. 65 is a block diagram illustrating a schematic configuration of a liquid crystal display device of Embodiment 3.

Figure 66:
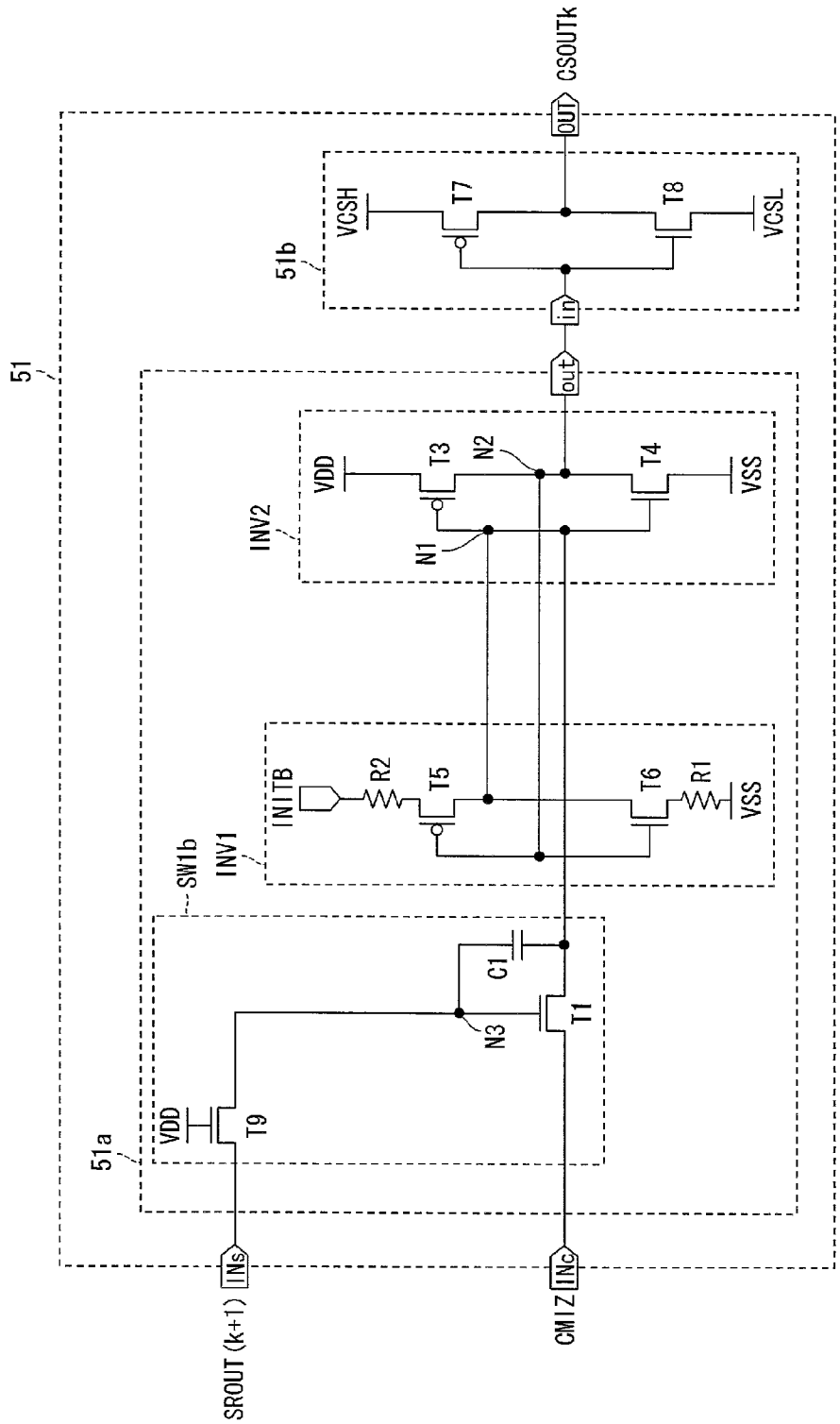

FIG. 66 is a circuit diagram of a unit circuit included in a retention capacitor line driving circuit of Example 1.

Figure 67:
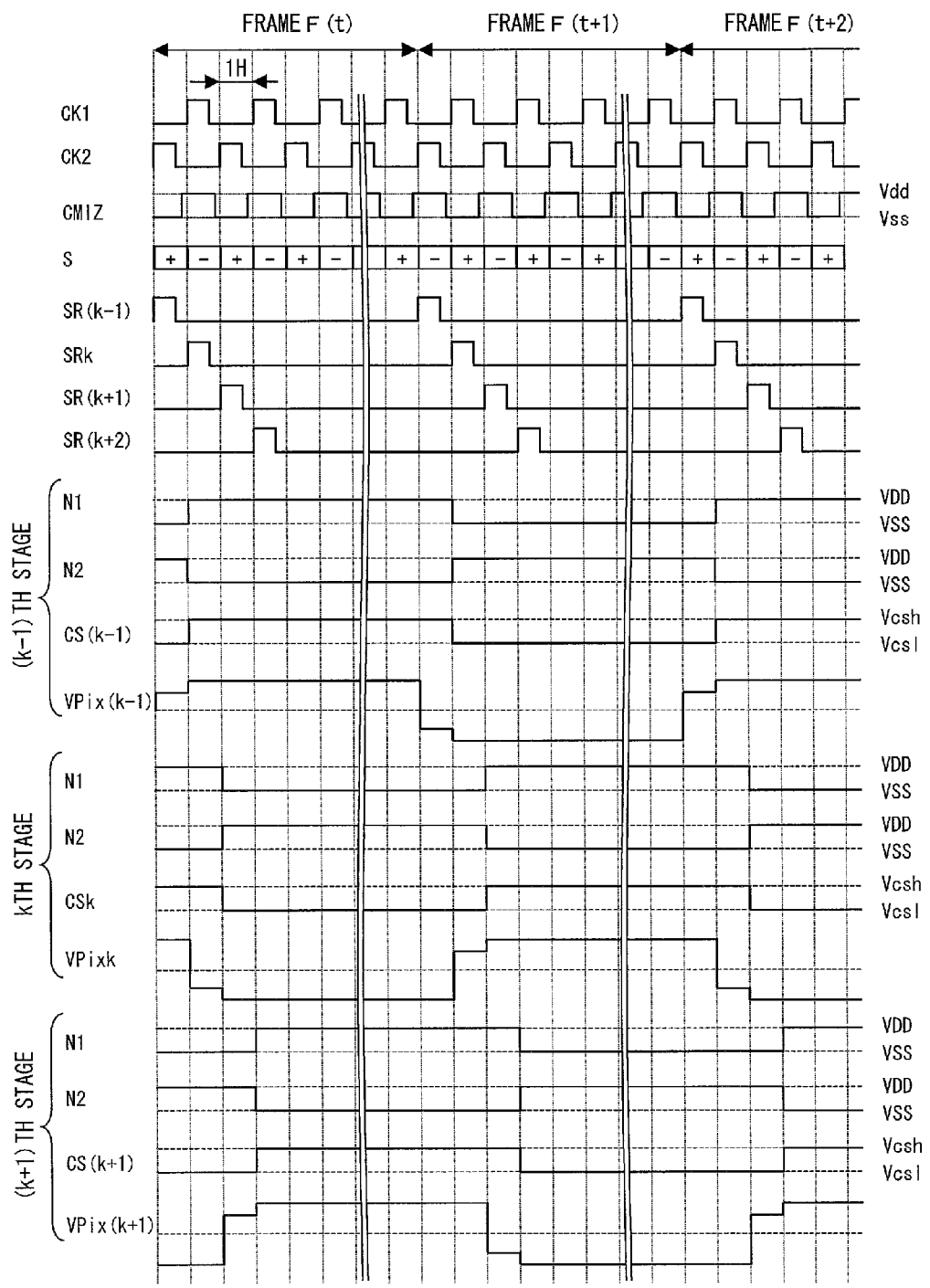

FIG. 67 is a timing chart at the time of an operation of the retention capacitor line driving circuit of Example 1.

Figure 68:
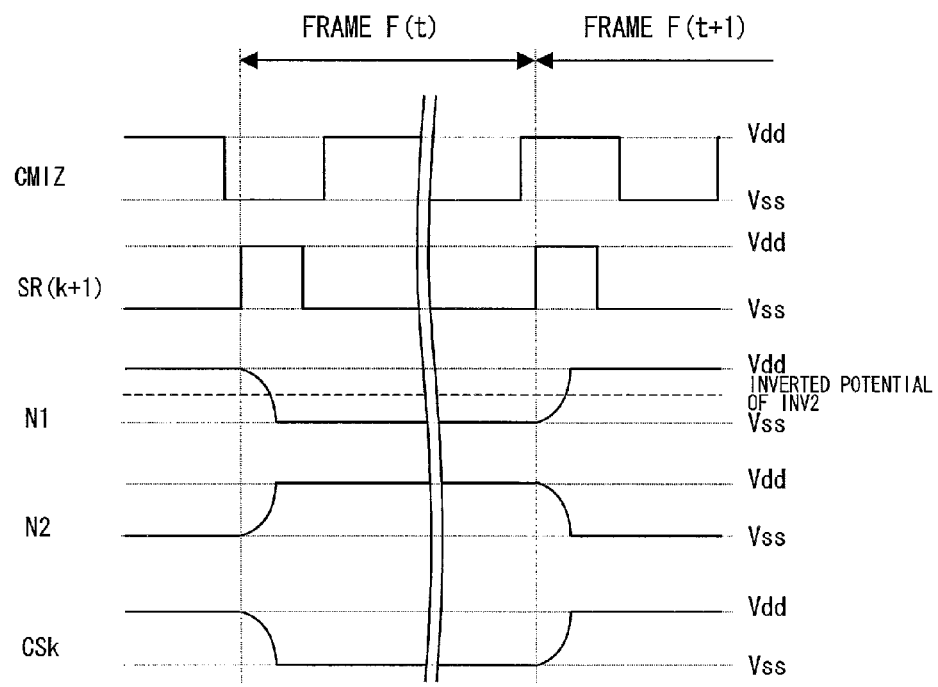

FIG. 68 is a schematic view showing a timing chart at the time of the operation of the retention capacitor line driving circuit of Example 1.

Figure 69:
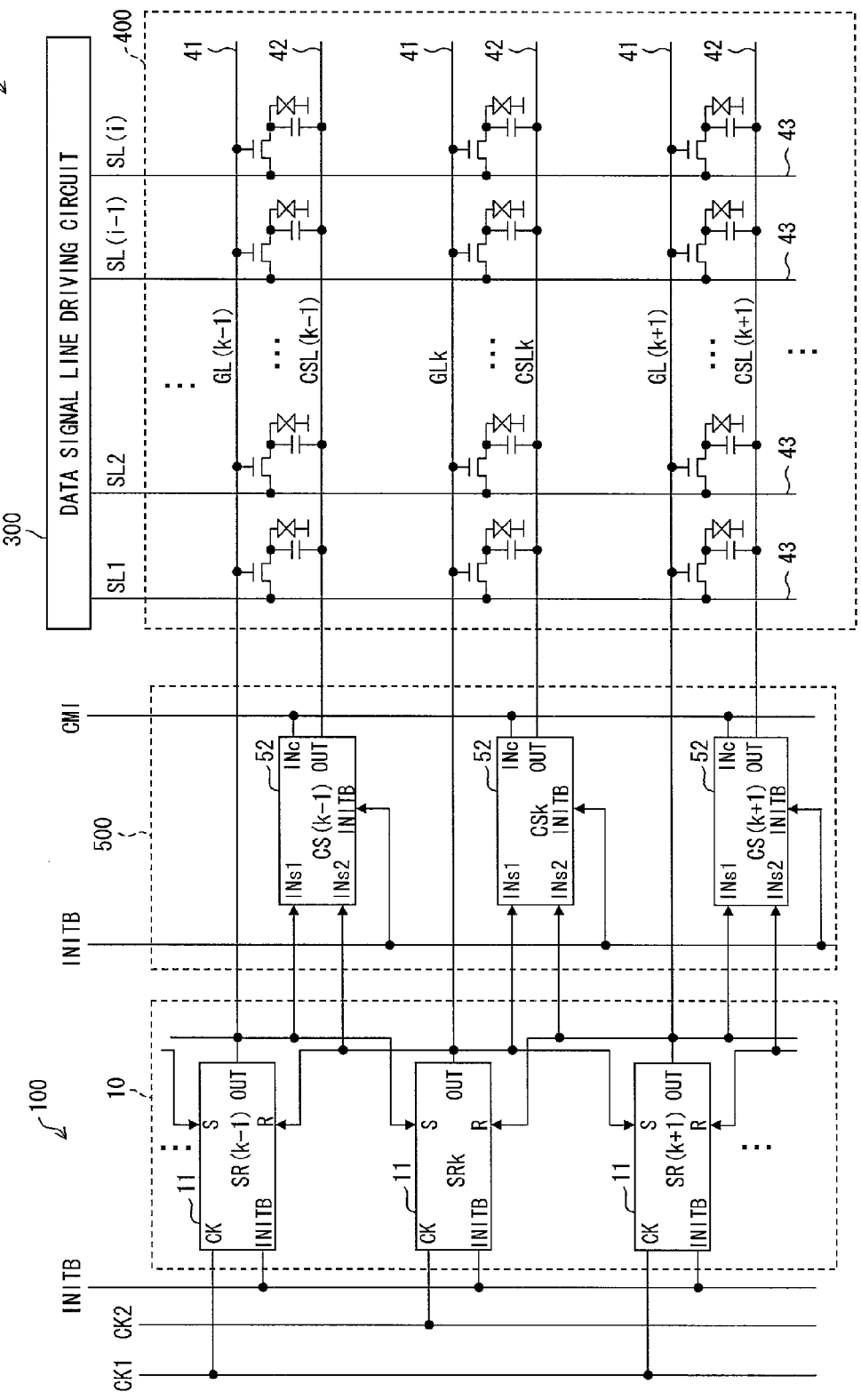

FIG. 69 is a block diagram illustrating a schematic configuration of a variation of the liquid crystal display device of Embodiment 3.

Figure 70:
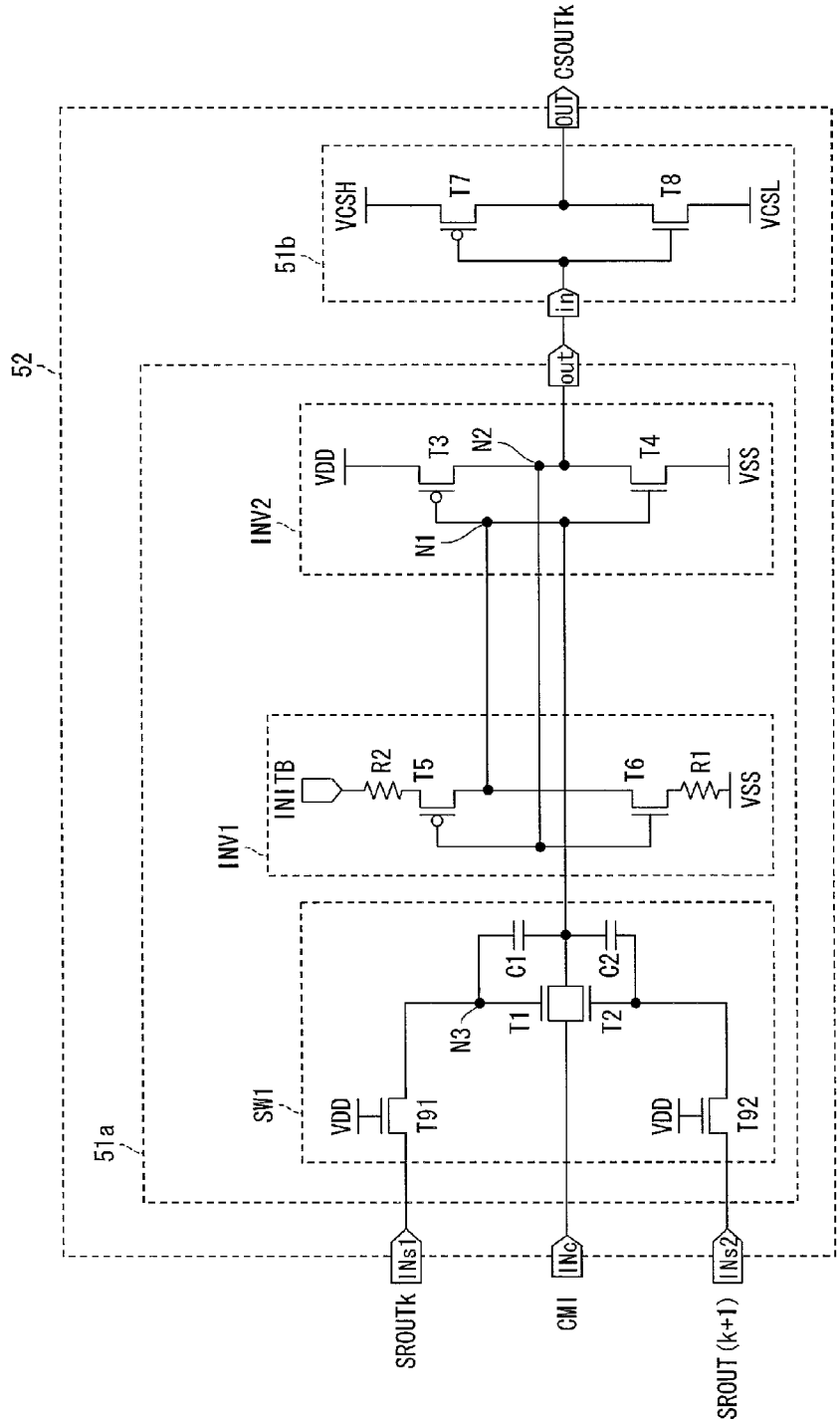

FIG. 70 is a circuit diagram of a unit circuit included in a retention capacitor line driving circuit shown in FIG. 69.

Figure 71:
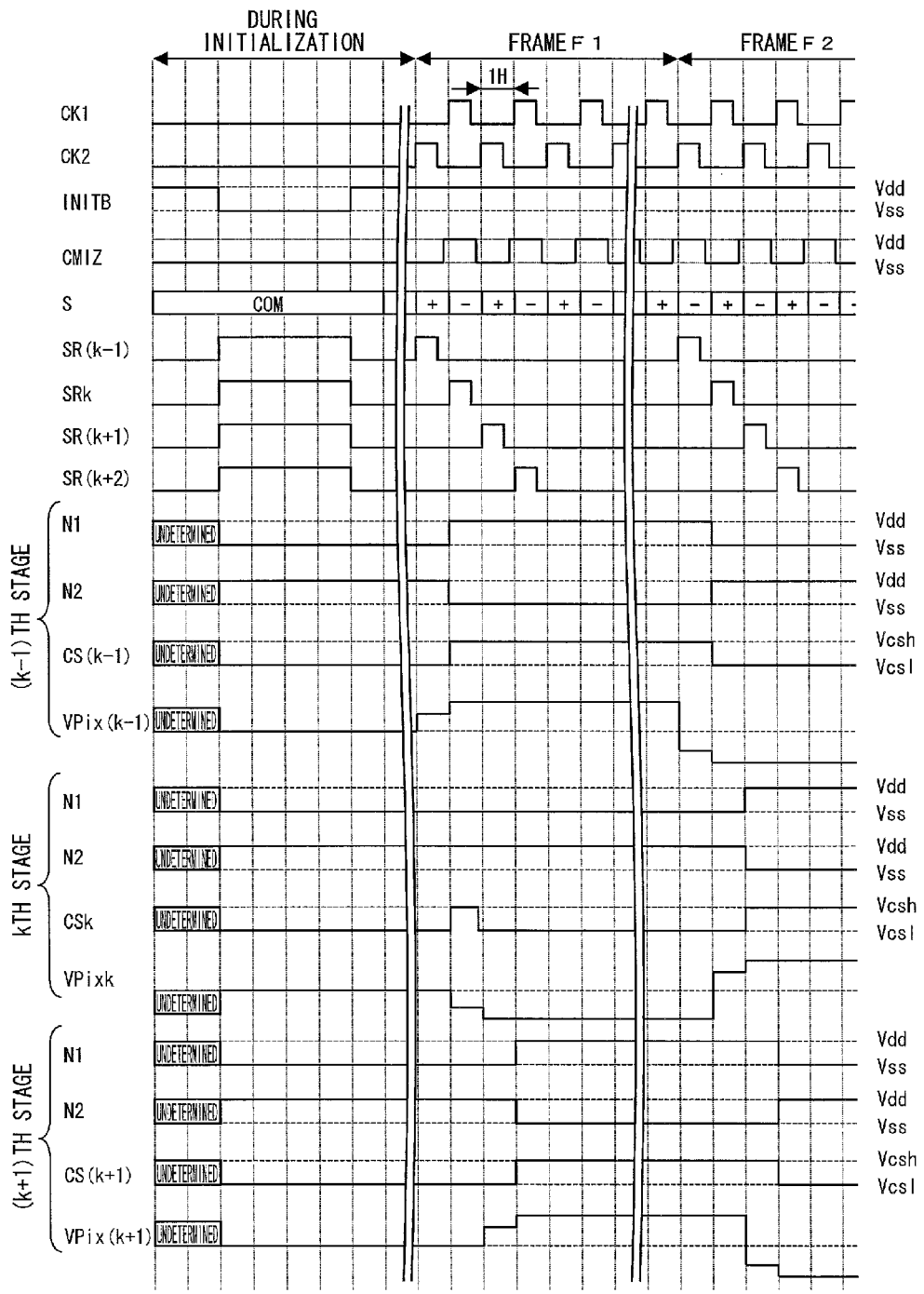

FIG. 71 is a timing chart at the time of an operation of the retention capacitor line driving circuit of FIG. 69.

Figure 72:
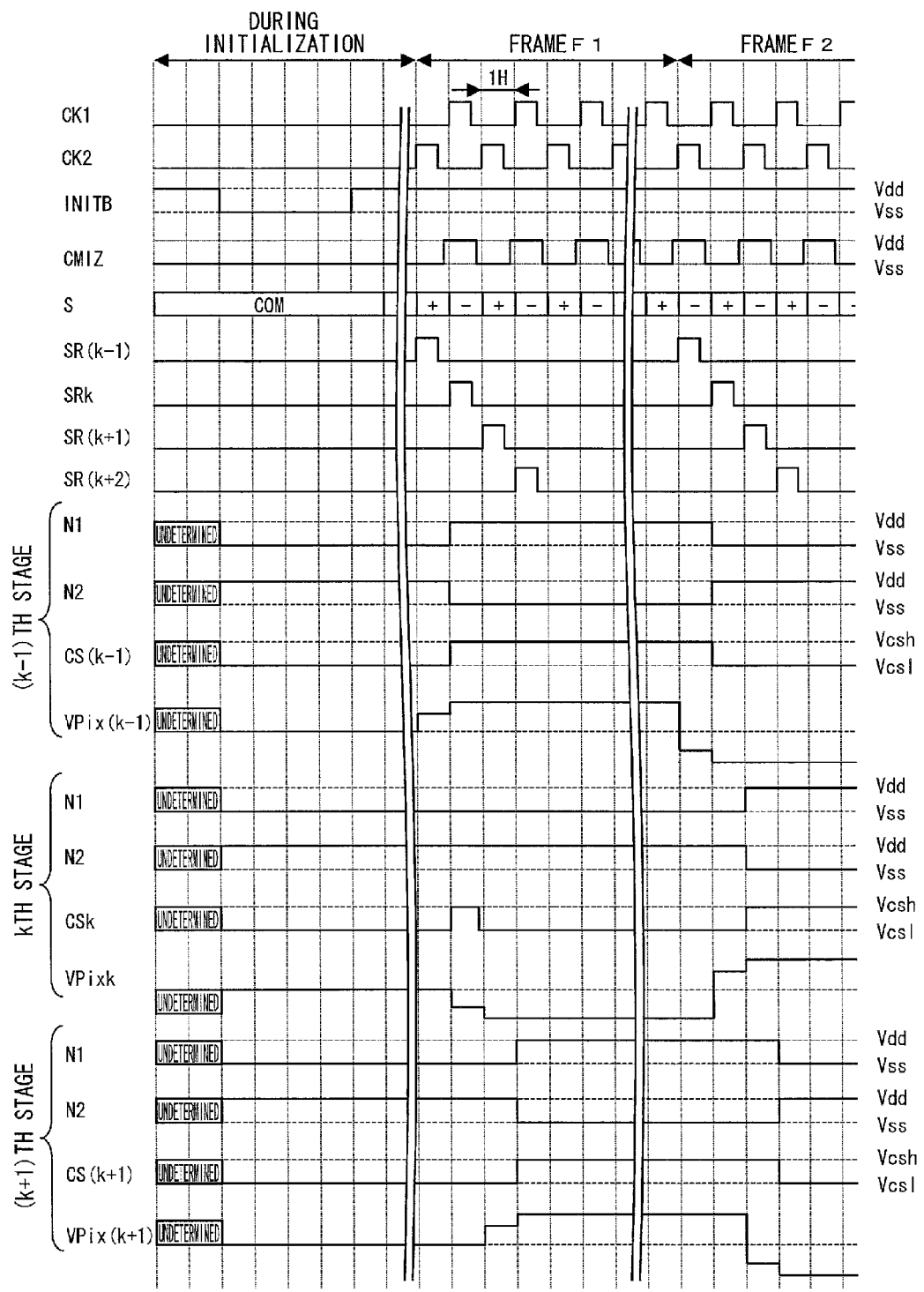

FIG. 72 is a timing chart at the time of an operation of the retention capacitor line driving circuit of FIG. 69.

Figure 73:
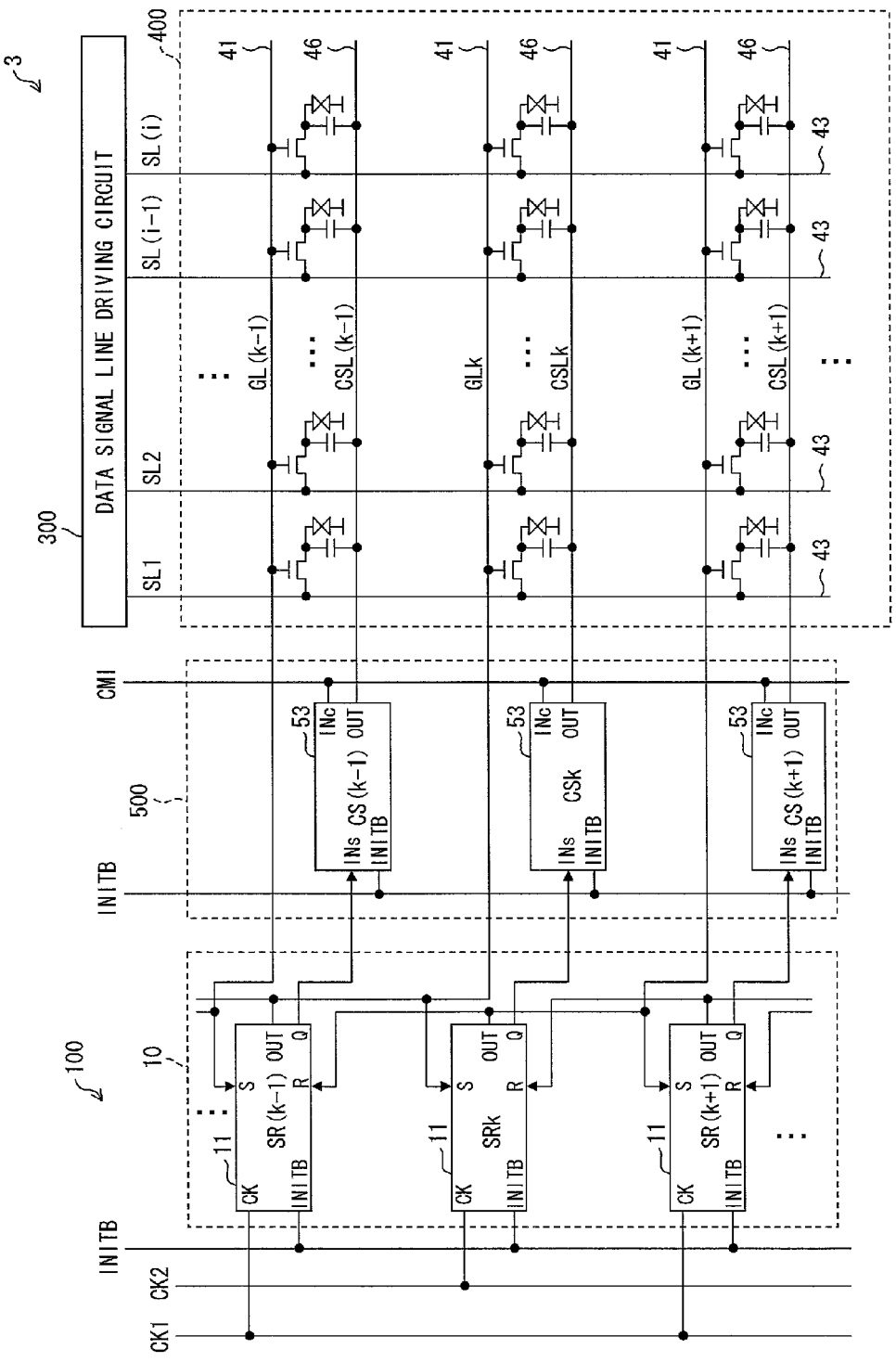

FIG. 73 is a block diagram illustrating a schematic configuration of a liquid crystal display device of Example 3.

Figure 74:
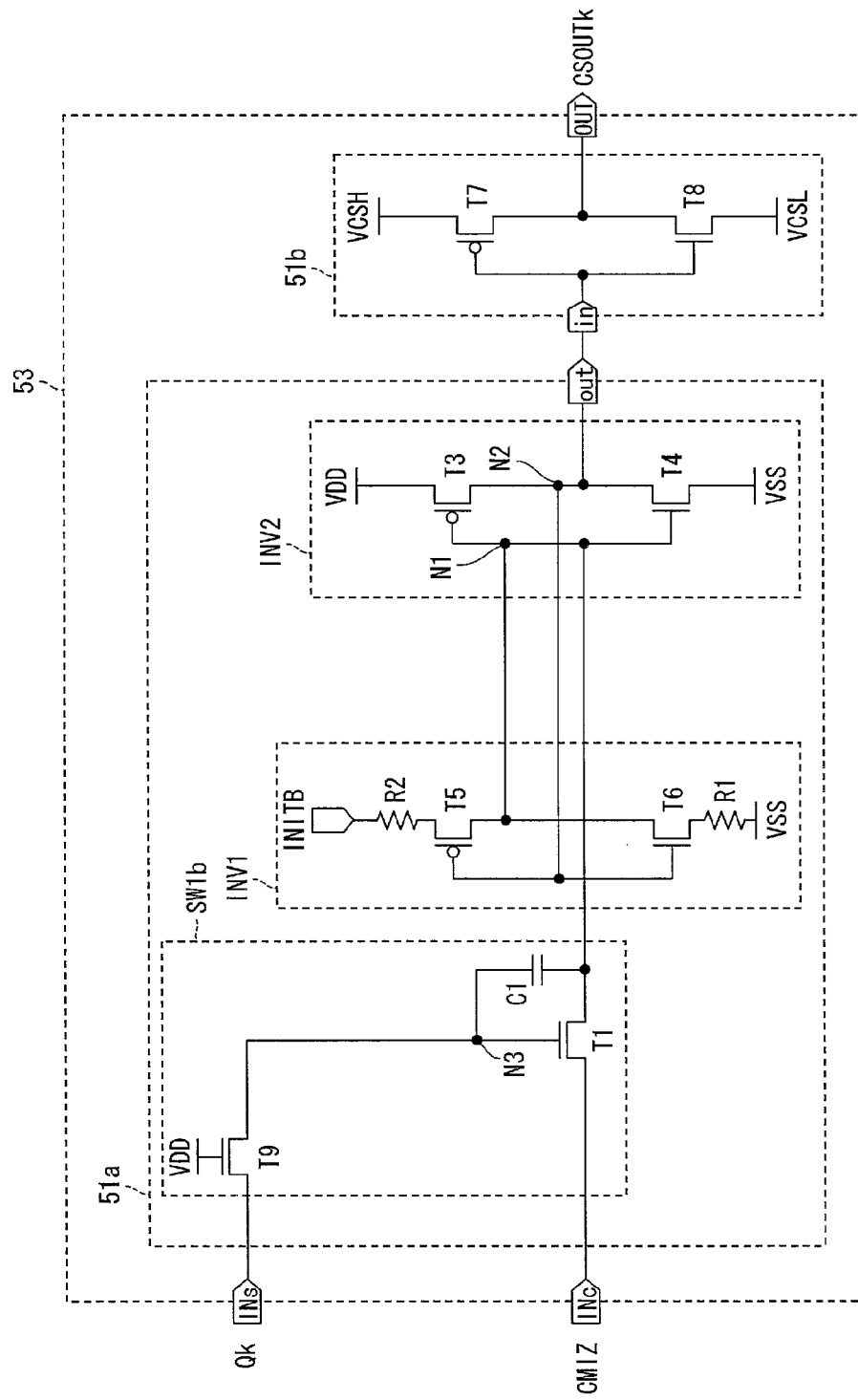

FIG. 74 is a circuit diagram of a unit circuit included in a retention capacitor line driving circuit of Example 3.

Figure 75:
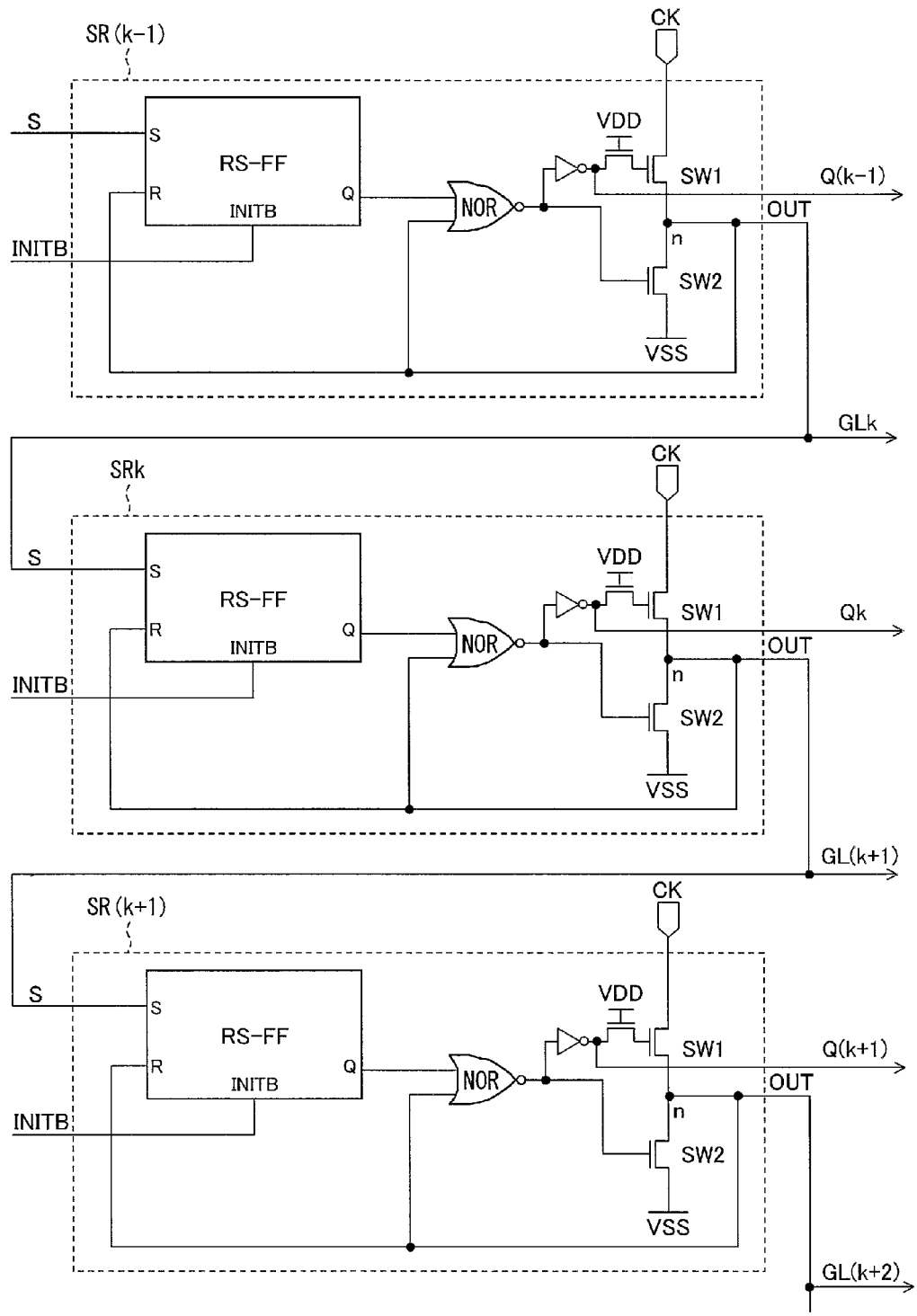

FIG. 75 is a circuit diagram illustrating a unit circuit of a shift register of the liquid crystal display device shown in FIG. 73.

Figure 76:
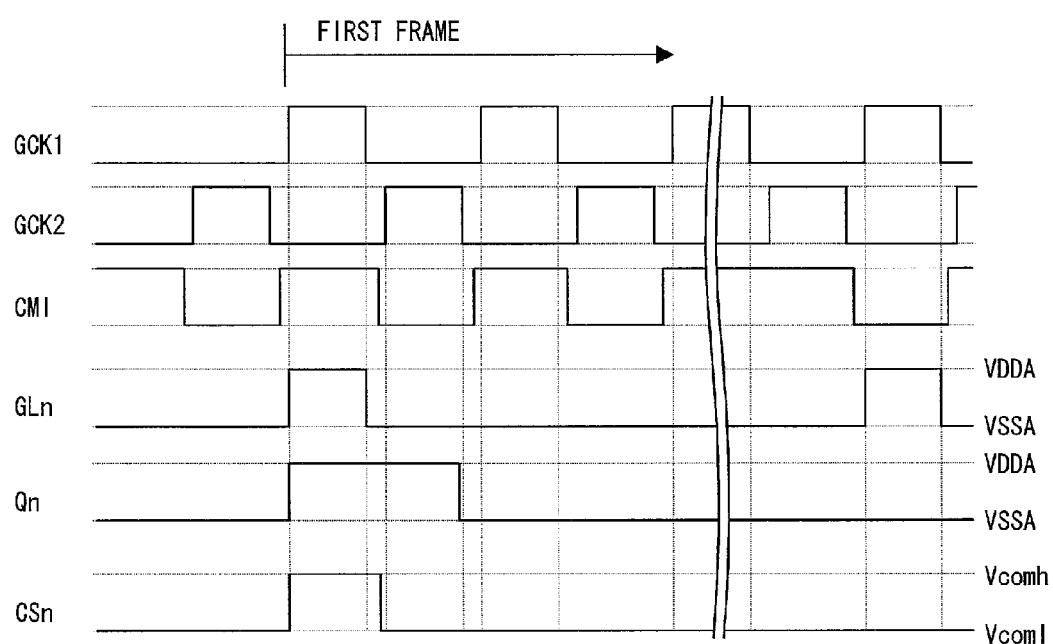

FIG. 76 is a timing chart of an output signal Q of a flip-flop circuit RS-FF shown in FIG. 75 and a CS signal outputted from a unit circuit.

Figure 77:
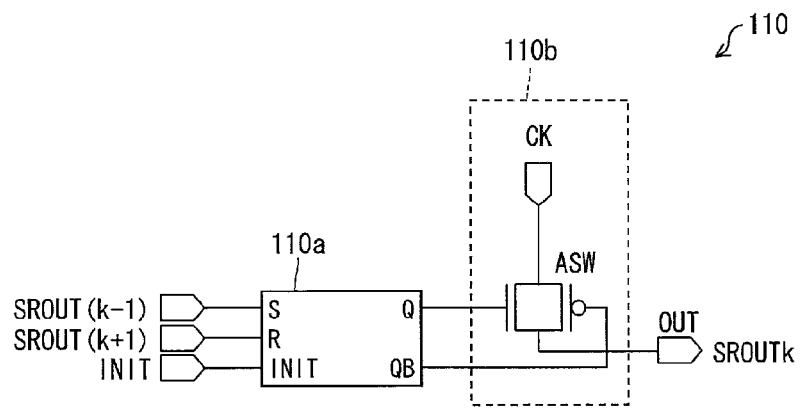

FIG. 77 is a block diagram illustrating a schematic configuration of each stage of a shift register for use in a conventional scanning signal line driving circuit.

Figure 78:
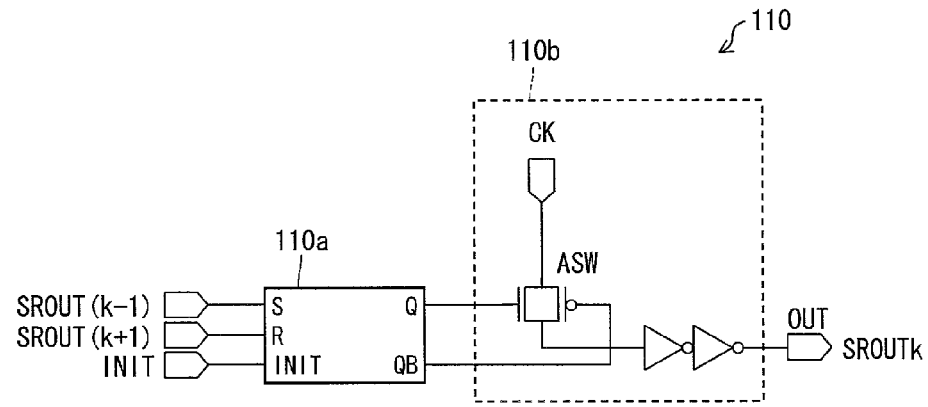

FIG. 78 is a block diagram illustrating a schematic configuration of each stage of a shift register for use in a conventional scanning signal line driving circuit.

DESCRIPTION OF EMBODIMENTS

Embodiment 1

Figure 1:
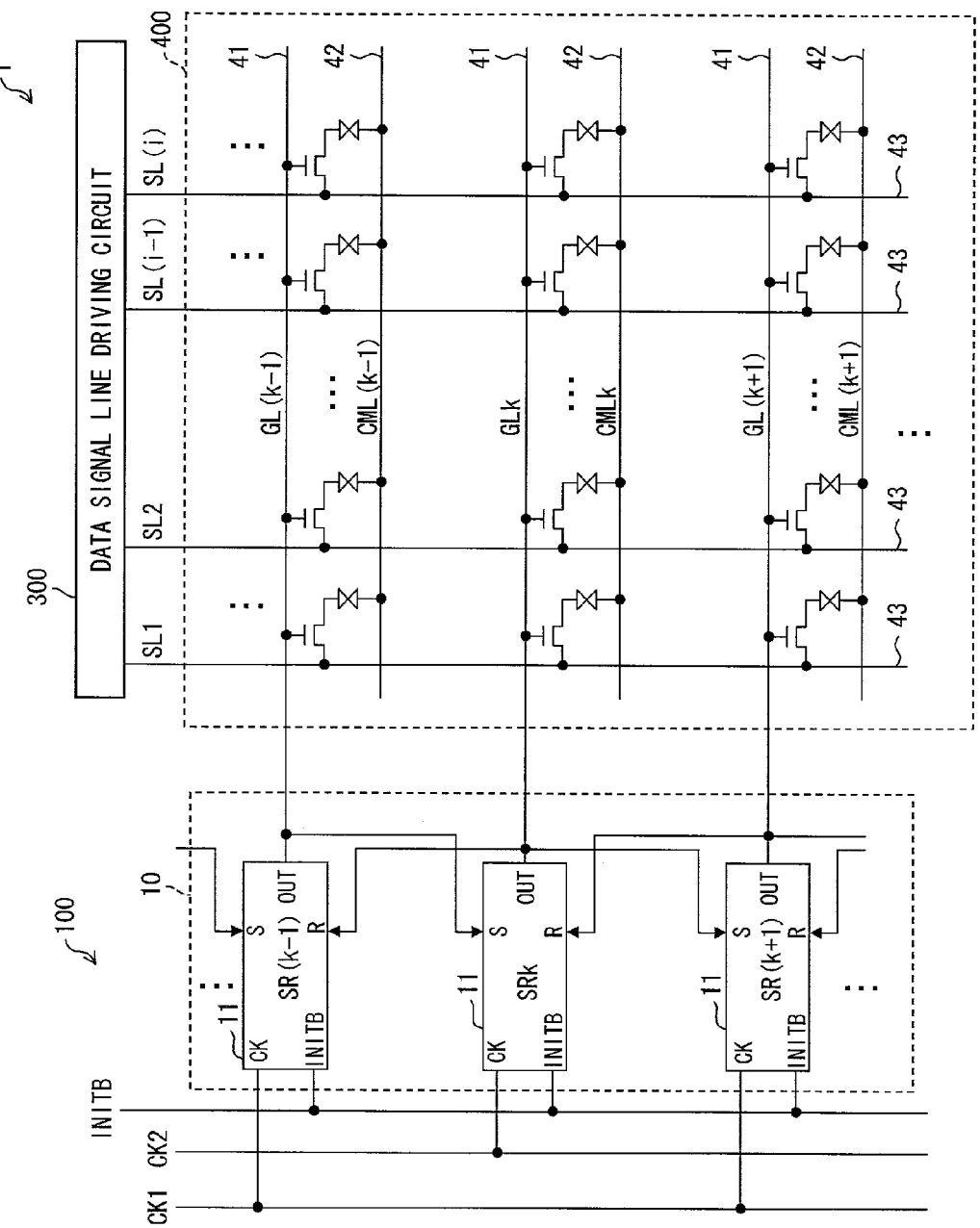
FIG. 1 is a block diagram illustrating a schematic configuration of a liquid crystal display device of Embodiment 1.
Figure 2:
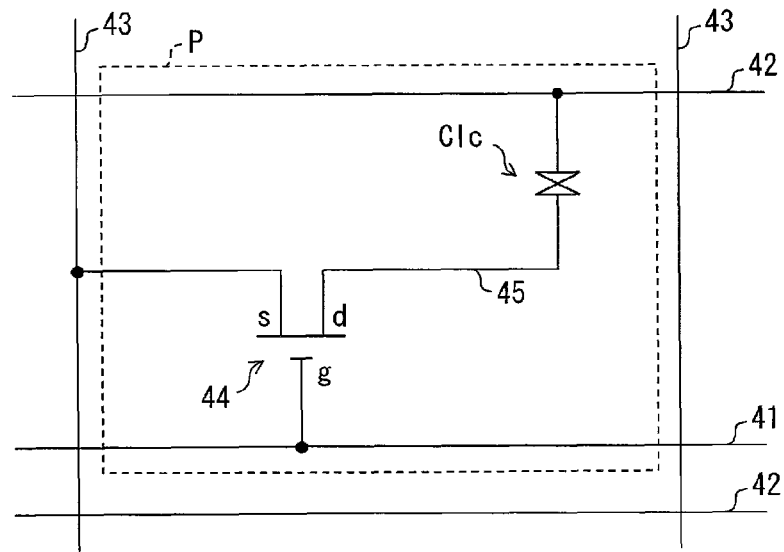
FIG. 2 is an equivalent circuit diagram of an electric configuration of a pixel of the liquid crystal display device shown in FIG. 1.

The following description will discuss Embodiment 1 according to the present invention. FIG. 1 is a block diagram illustrating a schematic configuration of a liquid crystal display device 1 of Embodiment 1, and FIG. 2 is an equivalent circuit diagram of an electric configuration of a pixel of the liquid crystal display device 1.

First, the schematic configuration of the liquid crystal display device 1 will be described with reference to FIG. 1 and FIG. 2. The liquid crystal display device 1 includes a scanning signal line driving circuit 100, a data signal line driving circuit 300, and a display panel 400. Further, the liquid crystal display device 1 also includes control circuits (not shown) for controlling respective driving circuits. Note that, the driving circuits may be monolithically formed on an active matrix substrate.

The display panel 400 is configured such that a liquid crystal (not shown) is sandwiched between an active matrix substrate (not shown) and a counter substrate (not shown), and has a large number of pixels P (FIG. 2) arrayed in matrix.

The display panel 400 includes, on the active matrix substrate, scanning signal lines 41 (GLn), data signal lines 43 (SLi), thin film transistors (hereinafter, also referred to as "TFT") 44, and pixel electrodes 45, and includes common lines (common electrode lines) 42 (CMLn) on a counter substrate. Note that "i" and "n" are integers of 2 or more.

The scanning signal lines 41 are formed to be parallel to each other in a row direction (horizontal direction) so that one line is provided in each row. The data signal lines 43 are formed to be parallel to each other in a column direction (vertical direction) so that one line is provided in each column. As illustrated in FIG. 2, each of the TFTs 44 and each of the pixel electrodes 45 correspond to an intersection of ones of the scanning signal lines 41 and the data signal lines 43, and a gate electrode g of the TFT 44 is connected to a corresponding scanning signal line 41, a source electrode s thereof is connected to a corresponding data signal line 43, and a drain electrode d thereof is connected to a corresponding pixel electrode 45. The pixel electrode 45 and the common line 42 form a capacitor C1c therebetween via a liquid crystal.

Therefore, gradation can be displayed in accord with a source signal by (i) switching on the gate of the TFT 44 with use of a gate signal (scanning signal) supplied to the scanning signal line 41, (ii) writing the source signal (data signal) of the data signal line 43 to the pixel electrodes 45 so as to set a potential of the pixel electrode 45 in accord with the source signal, and (iii) applying a voltage in accord with the source signal to a liquid crystal provided between the pixel electrode 45 and the common line 42.

The display panel 400 as configured above is driven by the scanning signal line driving circuit 100, the data signal line driving circuit 300, and control circuits for controlling those circuits 100 and 300.

In Embodiment 1, in an active period (effective scanning period) of a vertical scanning period which is periodically repeated, horizontal scanning periods in rows are subsequently allotted and the rows are subsequently scanned.

Therefore, the scanning signal line driving circuit 100 synchronizes gate signals for switching on the TFTs 44 with horizontal scanning periods in respective rows, thereby supplying the gate signals sequentially to the scanning signal lines 41 in the rows.

The data signal line driving circuit 300 supplies a source signal to each data signal line 43. The source signal is obtained by (i) allotting an image signal, which has been supplied to the data signal line driving circuit 300 via the control circuit from the outside of the liquid crystal display device 1, to each row of the data signal line driving circuit 300, and (ii) subjecting the image signal to voltage increase etc.

The control circuits control the scanning signal line driving circuit 100 and the data signal line driving circuit 300, which have been described above, to output gate signals, source signals, and common signals.

The liquid crystal display device 1 of Embodiment 1 is configured to carry out a stable operation by preventing a decrease in potential level of an output signal of the scanning signal line driving circuit 100 while reducing a circuit area. The following description will discuss a specific configuration of a shift register 10 configuring the scanning signal line driving circuit 100.

The shift register 10 is configured by connecting multiple m (where m is an integer of 2 or more) unit circuits 11. As shown in FIG. 1, each of the unit circuits 11 is made up of a clock terminal (CK terminal), a set terminal (S terminal), a reset terminal (R terminal), an initialization terminal (INITB terminal), and an output terminal OUT. Hereinafter, signals inputted and outputted via those terminals will be referred to with use of names of the terminals (e.g., a signal inputted via a clock terminal CK will be referred to as "clock signal CK").

To the shift register 10, a start pulse (not shown) and double-phase clock signals CK1 and CK2 are supplied from the outside. The start pulse is supplied to an S terminal of a first unit circuit 11. The clock signals CK1 are supplied to CK terminals of (odd-number)th unit circuits 11, meanwhile, the clock signals CK2 are supplied to CK terminals of (even-number)th unit circuits 11. An output of each unit circuit 11, which is as an output signal SROUT, is supplied, via an output terminal OUT, to a corresponding scanning signal line GL, to an S terminal of a subsequent unit circuit 11, and to an R terminal of a preceding unit circuit 11.

Specifically, an output signal SROUT(k−1) of the (k−1)th unit circuit 11 is supplied to the S terminal of the kth unit circuit 11 (where k is an integer of not less than 1 and not more than m) of the shift register 10, and the kth unit circuit 11 supplies an output signal SROUTk to a scanning signal line GLk (see FIG. 1). In this manner, the shift register 10 supplies output signals SROUT1 to SROUTn sequentially to the scanning signal lines GL1 to GLn in accordance with a shift operation. Note that the output signal SROUTk of the kth unit circuit 11 is supplied to the R terminal of the (k−1)th unit circuit 11 and the S terminal of the (k+1)th unit circuit 11.

The following description will discuss a detailed configuration of the shift register 10.

Example 1

Figure 4:
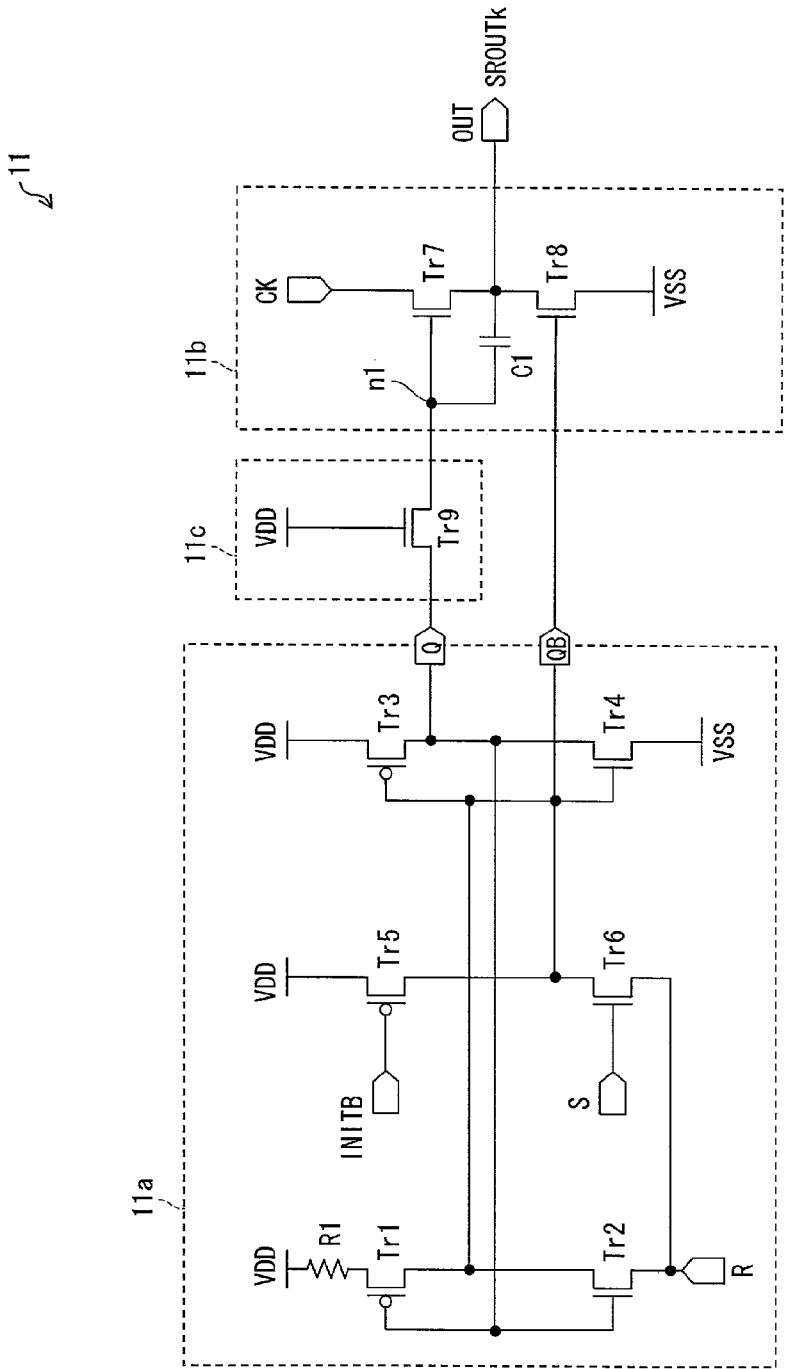
FIG. 4 is a circuit diagram of the unit circuit included in the shift register of Example 1.

FIGS. 3 and 4 are circuit diagrams of the unit circuit 11 which constitutes each stage of a shift register 10 of Example 1. The unit circuit 11 includes (i) a set-reset flip-flop circuit 11a, (ii) a switch circuit 11b (signal generation circuit), and (iii) a floating control circuit 11c (see FIGS. 3 and 4). It is supposed that (i) a set terminal (S terminal or SB terminal) of the flip-flop circuit 11a is supplied with a set signal (S signal or SB signal), (ii) a reset terminal (R terminal or RB terminal) is supplied with a reset signal (R signal or RB signal), and (iii) an initialization terminal (INIT terminal or INITB terminal) is supplied with an initialization signal (INIT signal or INITB signal). Further, it is also supposed that the output terminal (Q terminal: first output terminal) outputs a Q signal, and (ii) the inversion output terminal (QB terminal: second output terminal) outputs a QB signal. Note that the S signal (set signal), the R signal (reset signal), the INIT signal (initialization signal), and the Q signal (output signal) are at a high level when active. The SB signal (set-bar signal), the RB signal (reset-bar signal), the INITB signal (initial-bar signal), and the QB signal (inversion output signal) are at a low level when active.

The flip-flop circuit 11a illustrated in FIG. 4 includes (i) a P channel type transistor Tr1 (first transistor) and an N channel type transistor Tr2 (second transistor) which constitute a CMOS circuit (first CMOS circuit), (ii) a P channel type transistor Tr3 (third transistor) and an N channel type transistor Tr4 (fourth transistor) which constitute a CMOS circuit (second CMOS circuit), (iii) a P channel type transistor Tr5 and an N channel type transistor Tr6 which constitute a CMOS circuit, and (iv) a resistor R1. The switch circuit 11c includes (i) N channel type transistors Tr7 (output transistor) and Tr8 and (ii) a capacitor C1. The floating control circuit 11c includes an N channel type transistor Tr9 (control transistor). Note that the capacitor C1 may be provided as an element, or formed as a parasitic capacitor.

The transistor Tr6 has a gate terminal connected to the S terminal, a source terminal connected to the R terminal, and a drain terminal connected to the respective gate terminals of the transistors Tr3 and Tr4. The transistor Tr5 has a gate terminal connected to the INITB terminal, a source terminal supplied with a power supply voltage VDD, and a drain terminal connected to the respective gate terminals of the transistors Tr3 and Tr4. The transistor Tr3 has a gate terminal connected to the respective drain terminals of the transistors Tr5 and Tr6, a source terminal supplied with a power supply voltage VDD, and a drain terminal connected to the Q terminal. The transistor Tr4 has a gate terminal connected to the respective drain terminals of the transistors Tr5 and Tr6, a source terminal supplied with a power supply voltage VSS, and a drain terminal connected to the Q terminal. One end of the resistor R1 is supplied with a power supply voltage VDD. The transistor Tr1 has a gate terminal connected to the respective drain terminals of the transistors Tr3 and Tr4 and the Q terminal, a source terminal connected to the other end of the resister R1, and a drain terminal connected to the respective gate terminals of the transistors Tr3 and Tr4 and the QB terminal. The transistor Tr2 has a gate terminal connected to the respective drain terminals of the transistors Tr3 and Tr4 and the Q terminal, a source terminal connected to the R terminal, and a drain terminal connected to the respective gate terminals of the transistors Tr3 and Tr4 and the QB terminal.

The transistor Tr9 of the floating control circuit 11c has a gate terminal supplied with a power supply voltage VDD and a source terminal connected to the Q terminal. The transistor Tr7 of the switch circuit 11b has a gate terminal connected to the drain terminal of the transistor Tr9, a source terminal connected to the CK terminal, and a drain terminal connected to the output terminal OUT. The transistor Tr8 has a gate terminal connected to the QB terminal, a source terminal supplied with a power supply voltage VSS, and a drain terminal connected to the output terminal OUT. The capacitor C1 is provided between the gate terminal and drain terminal of the transistor Tr7. Note that a connection point of the capacitor C1, the gate terminal of the transistor Tr7, and the drain terminal of the transistor Tr9 is referred to as "node n1".

Accordingly, the output signal SROUT(k−1) of the (k−1)th unit circuit 11 is supplied to the S terminal of the kth unit circuit 11, and the output signal SROUTk is supplied from the output terminal OUT of the kth unit circuit 11 to the scanning signal line GLk in the kth row. Further, the output signal SROUTk is supplied to the S terminal of the (k+1)th unit circuit 11 and the R terminal of the (k−1)th unit circuit 11.

(Operation)

Figure 5:
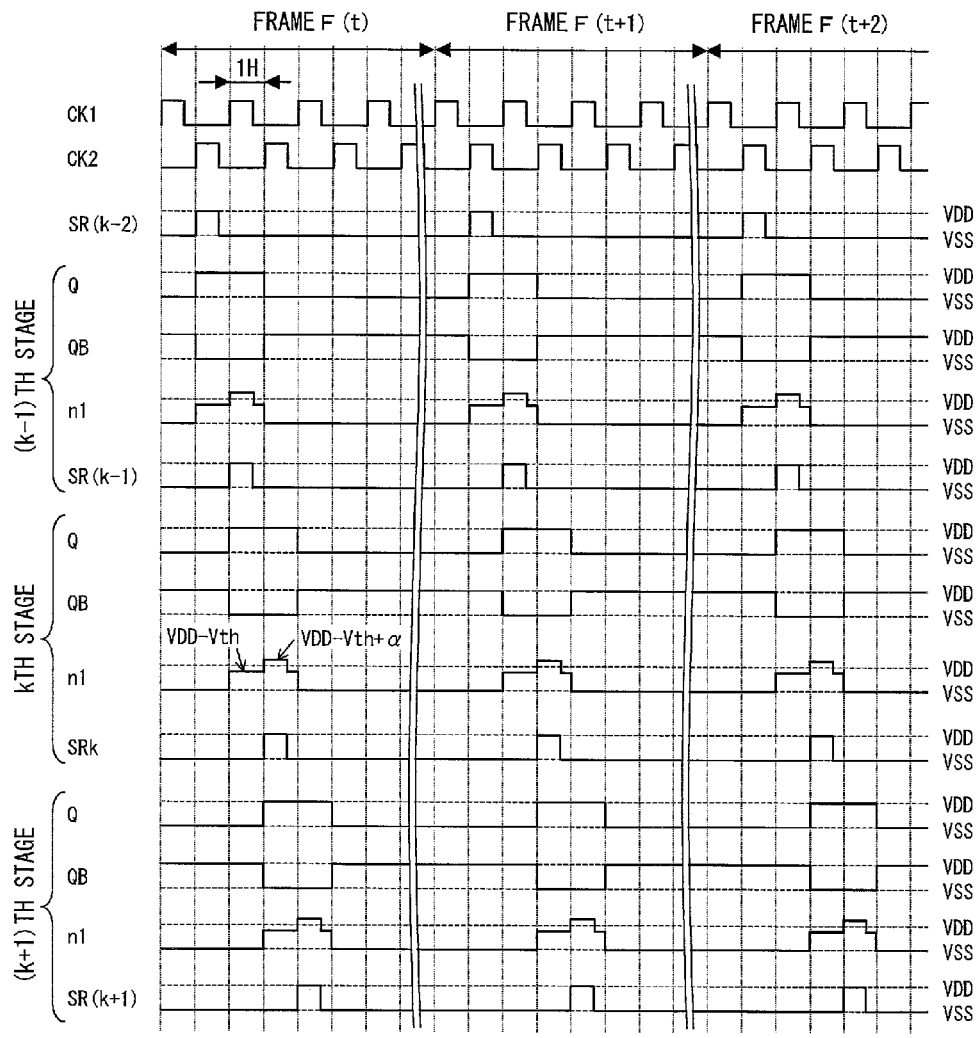
FIG. 5 is a timing chart at the time of an operation of the shift register of Example 1.

An operation of the shift register 10 will be described with reference to FIG. 5. FIG. 5 is a timing chart at the time of an operation of the shift register 10. FIG. 5 indicates input/output signals in the (k−1)th unit circuit 11, the kth unit circuit 11, and the (k+1)th unit circuit 11.

SR(k−2), SR(k−1), SRk, and SR(k+1) indicate potentials of the output signals SROUT(k−2), SROUT(k−1), and SROUTk of a (k−2)th unit circuit 11, the (k−1)th unit circuit 11, and the kth unit circuit 11, respectively, of the shift register 10. n1 indicates a potential of the node n1 of FIG. 4. Note that a period after the output signal SROUT(k−2) is outputted but until the next output signal SROUT(k−2) is outputted corresponds to one vertical scanning period (1 frame). Further, FIG. 5 shows arbitrary sequential frames F(t), F(t+1), and F(t+2).

The respective unit circuits 11 have the same operation. Thus, an operation of the kth unit circuit 11 is described below.

First, the following description deals with a set operation. In a frame F1, the output signal SROUT(k−1) (high level (active)) of the (k−1)th unit circuit 11 of the shift register 10 is supplied to the S terminal of the kth unit circuit 11 (see FIG. 4). Here, before the output signal SROUT(k−1) at a high level is inputted, the Q signal is at a low level, the QB signal is at a high level, and the drain terminal of the transistor Tr6 and the power supply voltage VDD are short-circuited. Thus, in a case where a potential of SROUT(k−1) supplied to the S terminal is lower than the power supply voltage VDD due to a threshold (Vth) drop (see FIG. 17 referred to later), the transistor Tr6 is not reliably turned on. As to this point, the resistor R1 is provided between the drain terminal of the transistor Tr6 and the power supply voltage VDD in the unit circuit 11. This reduces the driving capability of the transistor Tr1, and thus allows the transistor Tr1 to be switched on and a potential of the drain terminal to decrease to a potential (potential lower than an inversion level of an inverter) which is close to VSS (low level). Therefore, it is possible to prevent the flip-flop circuit 11*a* from malfunctioning.

When the output signal SROUT(k−1) is at a high level (active), the output signal SROUT(k+1) of the (k+1)th unit circuit 11 is at a low level (non-active). Accordingly, the transistor Tr3 is switched on, and the transistor Tr4 is switched off, whereas the Q signal becomes a high level and the QB signal becomes a low level. When the Q signal is at a high level, a potential of the node n1 is charged to VDD-Vth (threshold), and then the transistor Tr9 is switched off. Accordingly, the transistor Tr7 which is supplied with VDD-Vth is switched on.

Thereafter, when the output signal SROUT(k−1) of the S terminal is at a low level (non-active), the transistor Tr6 is switched off. Here, the Q signal (high level) is supplied (fed back) to the respective gate terminals of the transistors Tr1 and Tr2 so that the transistor Tr2 is switched on. Thus, a low level of the R terminal is supplied to the respective gate terminals of the transistor Tr3 and Tr4 via the transistor Tr2. This allows the output (Q signal) of the flip-flop circuit 11*a* to be kept at a high level.

Subsequently, when the clock signal CK2 is at a high level (VDD), the drain terminal of the transistor Tr7 becomes VDD-Vth. At this time, because the transistor Tr9 is in an OFF state, and the node n1 is in the floating state, a potential of the node n1 is caused to rise to VDD-Vth+α by the capacitor C1. Because of this, the gate terminal of the transistor Tr7 has a potential of not less than VDD, so that VDD of the clock signal CK2 passes the transistor Tr7 without a threshold drop (bootstrap operation). As a result, the output signal SROUTk at a high level (VDD) is outputted without any change. Thereafter, since the transistor Tr9 is in an OFF state, a potential of the node n1 is retained at VDD-Vth+α, and the output signal SROUTk is kept at a high level (VDD). Note that the output signal SROUTk is supplied to the R terminal of the (k−1)th unit circuit 11 and the S terminal of the (k+1)th unit circuit 11. Further, since the transistor Tr9 is in the OFF state, the output (Q signal) of the flip-flop circuit 11*a* does not have a high voltage at a high level or more even when the node n1 has the high voltage. This makes it possible to prevent a voltage breakdown to the transistors Tr2 and Tr4 which constitute the flip-flop circuit 11*a*.

Thereafter, when the clock signal CK2 is at a low level (VSS), the output signal SROUTk is also at a low level (VSS). At this time, a potential of the node n1 becomes VDD-Vth.

In the (k+1)th unit circuit 11, when the output signal SROUTk at a high level (VDD) is inputted from the kth unit circuit 11, the operation same as that for the kth unit circuit 11 is carried out, and then the output signal SROUT(k+1) at a high level (VDD) is outputted from the (k+1)th unit circuit 11. This output signal SROUT (k+1) is supplied to the R terminal of the kth unit circuit 11 and the S terminal of the (k+2)th unit circuit 11.

Next, the following description deals with a reset operation of the kth unit circuit 11.

When the output signal SROUT(k+1) at a high level (VDD) is supplied to the R terminal of the kth unit circuit 11, the QB terminal is switched from a low level to a high level via the transistor Tr2. This is because the transistor Tr2 is in an ON state due to the Q signal (high level) at this time. Further, because the transistor Tr4 is concurrently switched on, the Q signal is switched from a high level to a low level. When the Q signal is at a low level, and the QB signal is at a high level, the node n1 becomes a low level (VSS), the transistor Tr7 is switched off, and the transistor Tr8 is switched on. As a result, the output signal SROUTk is switched from a high level (VDD) to a low level (VSS).

Here, the Q signal (low level) is supplied to the respective gate terminals of the transistors Tr1 and Tr2 so that the transistor Tr2 is switched off and that the transistor Tr1 is switched on. Accordingly, the power supply voltage VDD is supplied to the respective gate terminals of the transistors Tr3 and Tr4. As a result, the output (Q signal) of the flip-flop circuit 11*a* is kept at a low level. Because of this, even in a case where the output signal SROUT(k+1) becomes a low level (non-active) later, the output signal SROUTk is kept at a low level (VSS).

In a frame F2, the output signal SROUT(k−1) (high level (active)) of the (k−1)th unit circuit 11 is supplied to the S terminal of the kth unit circuit 11, so the above operations (set operation and reset operation) are carried out again. In this manner, the output signals SROUT1 to SROUTn are supplied sequentially to the scanning signal lines GL1 to GLn, respectively.

(Initialization Operation)

Note here that the initialization signal INITB is a signal that is at a high level (VDD) in a regular operation and that is at a low level (VSS) during initialization. In initialization, a signal at a low level is supplied to the respective gate terminals of the transistors Tr5 of the respective unit circuits 11, whereby the transistor Tr5 is switched on, and the power supply voltage VDD is supplied to the gate terminal of the transistor Tr4. Accordingly, the Q signal becomes VSS (low level), the QB signal becomes VDD (high level), the transistor Tr7 is switched off, and the transistor Tr8 is switched on. As a result, the output signals SROUT1 to SROUTn of all the unit circuits 11 of the shift register 10 are fixed at a low level. This initialization operation applies also to any of the Examples below.

Next, another embodiment of the scanning signal line driving circuit 100 of Embodiment 1 is described below. Note that the following description mainly deals with a difference between the scanning signal line driving circuit 100 of the Example 1 and that of the present Example, and members that are identical in function to their respective corresponding members described in Example 1 are each given an identical reference numeral, and are not described here.

Example 2

Figure 6:
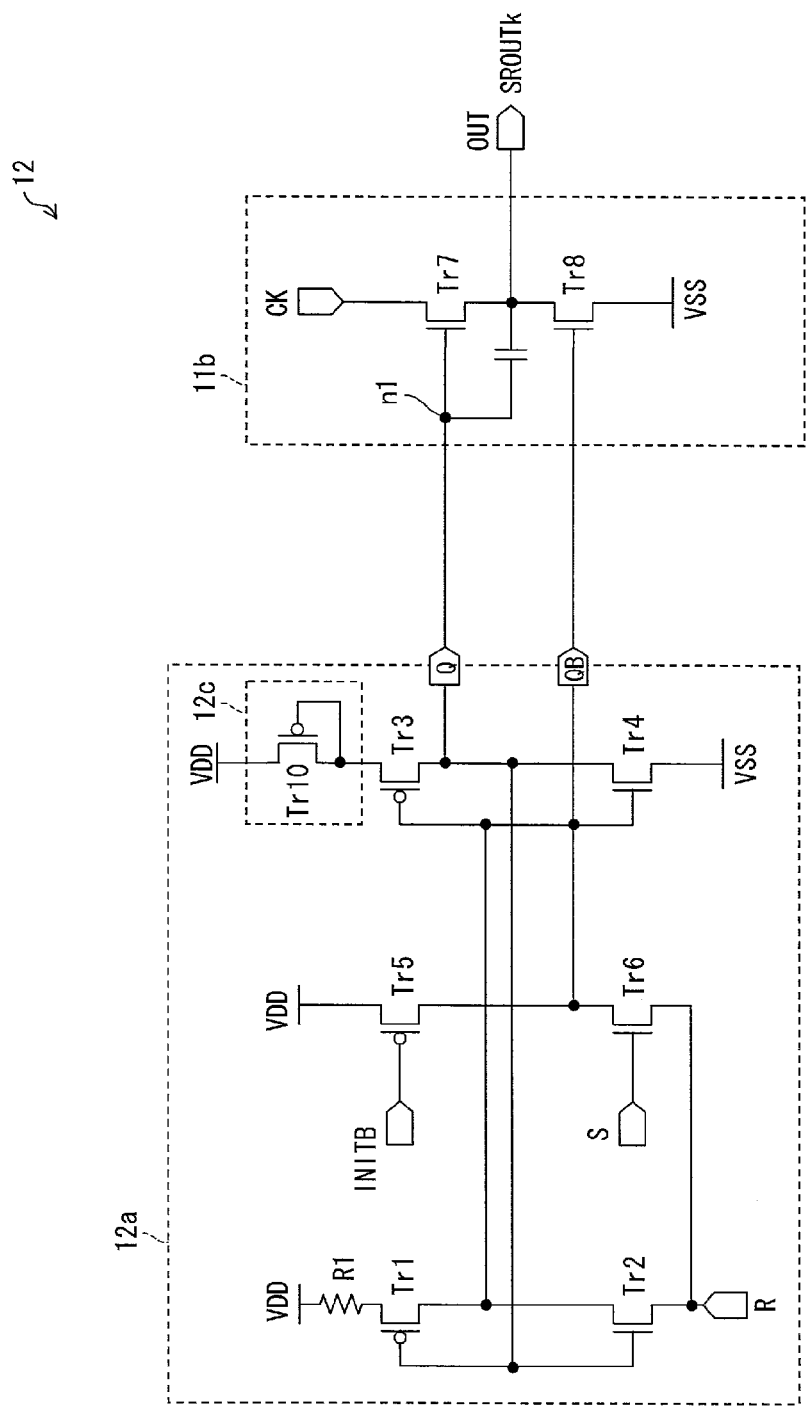
FIG. 6 is a circuit diagram of a unit circuit included in a shift register of Example 2.

FIG. 6 is a circuit diagram of a unit circuit 12 included in the shift register 10 of Example 2. The unit circuit 12 includes a set-reset flip-flop circuit 12a, a switch circuit 11b, and a floating control circuit 12c (see FIG. 6).

The floating control circuit 12c includes a P channel type transistor Tr10 (control transistor). The transistor Tr10 has a source terminal supplied with a power supply voltage VDD and a drain terminal connected to a source terminal of the transistor Tr3 of the flip-flop circuit 12a, and its gate terminal and drain terminal are connected to each other.

(Operation)

Before an output signal SROUT(k−1) (high level (active)) of the (k−1)th unit circuit 12 is supplied to the S terminal of the kth unit circuit 12, the Q signal is at a low level, and the QB signal is at a high level. In this state, when the output signal SROUT(k−1) at a high level is supplied to the unit circuit 12, the transistor Tr6 is switched on. At this time, since the output signal SROUT(k+1) of the (k+1)th unit circuit 12 is at a low level (non-active), the transistor Tr3 is switched on, and the transistor Tr4 is switched off. As a result, the Q signal becomes a high level (VDD-Vth) and the QB signal becomes a low level via the transistor Tr10. When the Q signal becomes VDD-Vth, a potential of the node n1 is charged to VDD-Vth, and then the transistor Tr10 is switched off, and the node n1 is in the floating state.

Thereafter, when the output signal SROUT(k−1) of the S terminal is at a low level (non-active), the transistor Tr6 is switched off. Here, the Q signal (high level) is supplied to the respective gate terminals of the transistors Tr1 and Tr2, and the transistor Tr2 is switched on, so that a low-level signal of the R terminal is supplied to the respective gate terminals of the transistors Tr3 and Tr4. At this point, since the transistor Tr10 is in an OFF state, the output (Q signal) of the flip-flop circuit 12a is retained at a potential (VDD-Vth) of the node n1.

Subsequently, when the clock signal CK2 is at a high level (VDD), the drain terminal of the transistor Tr7 becomes VDD-Vth. At this time, because the transistor Tr10 is in an OFF state, and the node n1 is in the floating, the potential of the node n1 is caused to rise to VDD-Vth+α by the capacitor C1. Because of this, the gate terminal of the transistor Tr7 has a potential of not less than VDD, so that VDD of the clock signal CK2 passes the transistor Tr7 without a threshold drop (bootstrap operation). As a result, the output signal SROUTk at a high level (VDD) is outputted without any change. Thereafter, since the transistor Tr10 is in an OFF state, the potential of the node n1 is retained at VDD-Vth+α, and the output signal SROUTk is kept at a high level (VDD). Note that the output signal SROUTk is supplied to the R terminal of the (k−1)th unit circuit 12 and the S terminal of the (k+1)th unit circuit 12.

Thereafter, when the clock signal CK2 is at a low level (VSS), the output signal SROUTk is at a low level (VSS). At this time, the potential of the node n1 becomes VDD-Vth.

In the (k+1)th unit circuit 12, when the output signal SROUTk at a high level (VDD) is inputted from the kth unit circuit 12, the operation same as that for the kth unit circuit 12 is carried out, and then the output signal SROUT (k+1) at a high level (VDD) is outputted from the (k+1)th unit circuit 12. This output signal SROUT(k+1) is supplied to the R terminal of the kth unit circuit 12 and the S terminal of the (k+2)th unit circuit 12.

Next, the following description deals with a reset operation of the kth unit circuit 12.

When the output signal SROUT(k+1) at a high level (VDD) is supplied to the R terminal of the kth unit circuit 12, the QB terminal is switched from a low level to a high level via the transistor Tr2. This is because the transistor Tr2 is in an ON state due to the Q signal (high level) at this time. Concurrently, the transistor Tr4 is switched on. The Q signal is thus switched from a high level to a low level. When the Q signal is at a low level, and the QB signal is at a high level, the node n1 is at a low level (VSS), the transistor Tr7 is switched off, and the transistor Tr8 is switched on. As a result, the output signal SROUTk is switched from a high level (VDD) to a low level (VSS).

Here, the Q signal (low level) is supplied to the respective gate terminals of the transistors Tr1 and Tr2 so that the transistor Tr2 is switched off and that the transistor Tr1 is switched on. Accordingly, the power supply voltage VDD is supplied to the respective gate terminals of the transistors Tr3 and Tr4. As a result, the output (Q signal) of the flip-flop circuit 12a is kept at a low level. Because of this, even in a case where the output signal SROUT(k+1) is at a low level (non-active) later, the output signal SROUTk is kept at a low level (VSS).

In the frame F2, the output signal SROUT(k−1) (high level (active)) of the (k−1)th unit circuit 12 is supplied to the S terminal of the kth unit circuit, so the above operations (set operation and reset operation) are carried out again. In this manner, the output signals SROUT1 to SROUTn are supplied sequentially to the scanning signal lines GL1 to GLn, respectively.

Example 3

Figure 7:
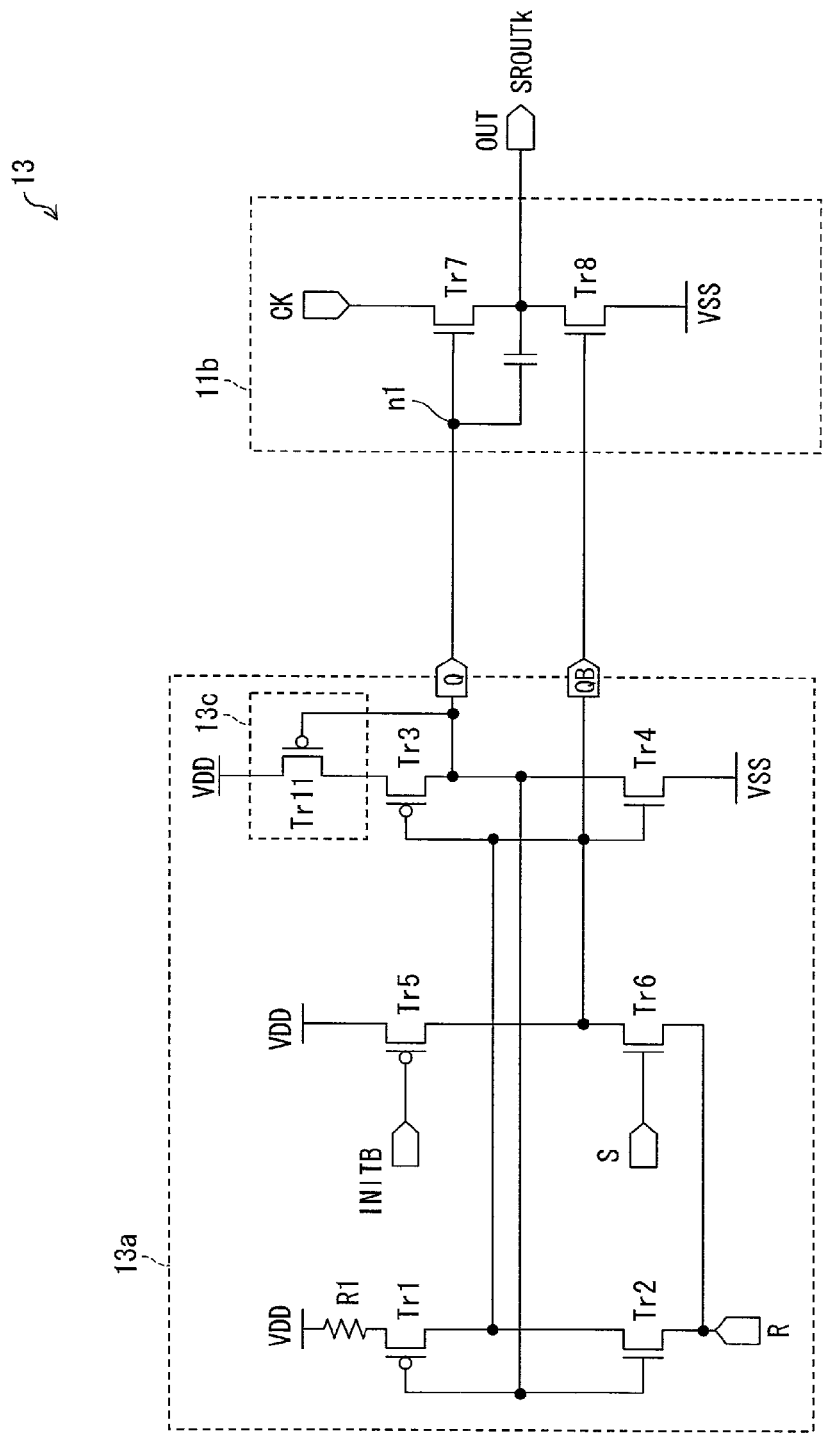
FIG. 7 is a circuit diagram of a unit circuit included in a shift register of Example 3.

FIG. 7 is a circuit diagram of a unit circuit 13 included in the shift register 10 of Example 3. The unit circuit 13 includes a set-reset flip-flop circuit 13a, a switch circuit 11b, and a floating control circuit 13c (see FIG. 7).

The floating control circuit 13c includes a P channel type transistor Tr11 (control transistor). The transistor Tr11 has a source terminal supplied with a power supply voltage VDD, a drain terminal connected to a source terminal of the transistor Tr3 of the flip-flop circuit 13a, and a gate terminal connected to the Q terminal. The operation of the shift register 10 which includes the unit circuit 13 is the same as that in Example 2.

Example 4

A configuration of a flip-flop circuit included in a unit circuit of the shift register 10 is not particularly limited. Another configuration of the flip-flop circuit is described below. (a) of FIG. 8 is a circuit diagram illustrating a configuration of a flip-flop circuit 14a.

The flip-flop circuit 14a includes a P channel type transistor Tr12 and an N channel type transistor Tr13 which constitute a CMOS circuit (first CMOS circuit), a P channel type transistor Tr14 and an N channel type transistor Tr15 which constitute a CMOS circuit (second CMOS circuit), a P channel type transistor Tr16, an N channel type transistor Tr17, a resistor R2a, an S terminal, an R terminal, an INITB terminal, a Q terminal, and a QB terminal.

A gate terminal of the transistor Tr12, a gate terminal of the transistor Tr13, a drain terminal of the transistor Tr14, a drain terminal of the transistor Tr15, a drain terminal of the transistor Tr16, a drain terminal of the transistor Tr17, and the QB terminal are connected to each other. A drain terminal of the transistor Tr12, a drain terminal of the transistor Tr13, a gate terminal of the transistor Tr14, a gate terminal of the transistor Tr15, and the Q terminal are connected to each other. The S terminal is connected to a gate terminal of the transistor Tr17. The R terminal is connected to a source terminal of the transistor Tr17 and a source terminal of the transistor Tr15. The INITB terminal is connected to a gate terminal of the transistor Tr16. One end of the resistor R2a is connected to a source terminal of the transistor Tr14, and the other end of the resistor R2a is connected to a power supply VDD (high power supply voltage). A source terminal of the transistor Tr13 is connected to a power supply VSS (low power supply voltage). A source terminal of the transistor Tr12 is connected to a power supply VDD. A source terminal of the transistor Tr16 is connected to a power supply VDD.

The transistors Tr12, Tr13, Tr14, and Tr15 constitute a latch circuit LC. The resistor R2a constitutes a latch regulator circuit RC (regulator circuit). The transistor Tr17 serves as a set transistor ST.

(b) of FIG. 8 is a timing chart of an S signal, an R signal, and a Q signal of the flip-flop circuit 14a, and (c) of FIG. 8 is a truth table of the flip-flop circuit 14a (for a case where the INITB signal is non-active).

The following description will discuss an operation of the flip-flop circuit 14a for a case where the S signal is active (high level) and the R signal is non-active (low level) (time period t1). In a case where the Q signal is at a low level and the QB signal is at a high level before the S signal becomes active (high level), the drain terminal of the transistor Tr17 and the power supply VDD of Vdd supplied to the source terminal of the transistor Tr14 are short-circuited. As to this point, the resistor R2a is provided between the drain terminal of the transistor Tr17 and the power supply VDD. This reduces the driving capability of the transistor Tr14, and thus the QB terminal decreases to a potential (potential lower than an inversion level of an inverter) which is close to Vss (low level) even in a case where the S signal is lower than, for example, the power supply voltage Vdd.

When the QB terminal has a potential which is close to VSS, the transistor Tr12 is switched on, and the transistor Tr13 is switched off. Accordingly, the Q signal becomes a high level. Since the Q terminal is connected to the gate terminal of the transistor Tr14 and the gate terminal of the transistor Tr15, the transistor Tr14 is switched off and the transistor Tr15 is switched on when the Q signal is at a high level. When the transistor Tr15 is switched on, the QB signal is also at a low level (Vss) since the R signal is VSS (low level). Note that when the QB signal is at a low level, the transistor Tr12 is in an ON state and the transistor Tr13 is in an OFF state, so that the Q terminal is disconnected from VSS and outputs a high-level signal (Vdd).

The following description will discuss an operation of the flip-flop circuit 14a for a case where the S signal is non-active (low level) and the R signal is non-active (low level) (time period t2). When the S signal becomes non-active (low level) and the R signal becomes non-active (low level), the transistor Tr17 is switched off. Thus, a state in which the S signal was before being changed is retained, and thus the state of the time period t1 (in which state the Q signal is at a high level and the QB signal is at a low level) is retained during the time period t2.

The following description will discuss an operation of the flip-flop circuit 14a for a case where the S signal is non-active (low level) and the R signal is active (high level) (time period t3). In a case where the Q signal is at a high level and the QB signal is at a low level before the R signal becomes active (high level), the transistor Tr15 is in an ON state. Thus, the QB terminal increases to a potential which is close to Vdd (high level) (a potential higher than an inversion level of an inverter).

When the QB terminal has a potential which is close to Vdd, the transistor Tr12 is switched off and the transistor Tr13 is switched on. Accordingly, the Q signal becomes a low level. Since the Q terminal is connected to the gate terminal of the transistor Tr14 and the gate terminal of the transistor Tr15, the transistor Tr14 is switched on and the transistor Tr15 is switched off when the Q signal is at a low level. The transistor Tr14 is switched on, so that the QB signal becomes a high level (Vdd). Note that when the QB signal is at a high level, the transistor Tr12 is in an OFF state and the transistor Tr13 is in an ON state, so that the Q terminal is disconnected from the power supply VDD and outputs a low-level signal (Vss).

The following description will discuss an operation of the flip-flop circuit 14a for a case where the S signal is non-active (low level) and the R signal is non-active (low level) (time period t4). When the S signal is non-active (low level) and the R signal is non-active (low level), the latch circuit LC is switched on. Therefore, a state in which the R signal was before being changed is retained, and thus the state of the time period t3 (in which state the Q signal is at a low level and the QB signal is at a high level) is retained during the time period t4.

Note here that a location where the resistor R2a is provided is not limited to (a) FIG. 8. Assuming that (i) a connection point of the drain terminal of the transistor 14, the drain terminal of the transistor Tr15, and the QB terminal is a node n10, and (ii) a connection point of the drain terminal of the transistor Tr17, the gate terminal of the transistor Tr12, and the gate terminal of the transistor Tr13 is a node n20, the resistor R2a may be provided between the drain terminal of the transistor Tr14 and the node n10 as illustrated in (a) of FIG. 9, or may be provided between the node n10 and the node n20 as illustrated in (b) of FIG. 9. That is, the resistor R2a may be provided between the power supply VDD and the node n20. Furthermore, as shown in FIG. 10, the resistor R2a may be omitted and the transistor Tr14 may have a larger channel length L or smaller channel width W. In this case, the transistor Tr14 constitutes a latch regulator circuit RC (regulator circuit). It is possible to reduce the driving capability of the transistor Tr14 in the configurations of FIGS. 9 and 10, so that an effect similar to that described above can be obtained.

Example 5

(a) of FIG. 11 is a circuit diagram illustrating a configuration of a flip-flop circuit 15a.

The flip-flop circuit 15a includes a P channel type transistor Tr12 and an N channel type transistor Tr13 which constitute a CMOS circuit, a P channel type transistor Tr14 and an N channel type transistor Tr15 which constitute a CMOS circuit, an N channel type transistor T18, a P channel type transistor Tr19, a resistor R2b (regulator circuit), a SB terminal, a RB terminal, an INIT terminal, a Q terminal, and a QB terminal.

The respective gate terminals of the transistors Tr12 and Tr13, the respective drain terminals of the transistors Tr14 and Tr15, the drain terminal of the transistor Tr18, the drain terminal of the transistor Tr19, and the Q terminal are connected to each other. The respective drain terminals of the transistors Tr12 and Tr13, the respective gate terminals of the transistors Tr14 and Tr15, and the QB terminal are connected to each other. The gate terminal of the transistor Tr18 is connected to an INIT terminal, and the source terminal of the transistor Tr18 is supplied with a power supply voltage VSS. The gate terminal of the transistor Tr19 is connected to a SB terminal, and the source terminal of the transistor Tr19 is connected to a RB terminal. The source terminal of the transistor Tr14 is connected to a RB terminal. One end of the resistor R2b is connected to a power supply voltage VSS, while the other end is connected to a source terminal of the transistor Tr15.

The transistors Tr12, Tr13, Tr14, and Tr15 constitute the latch circuit LC. The resistor R2b constitutes a latch regulator circuit RC (regulator circuit). The transistor Tr19 serves as a set transistor ST.

(b) of FIG. 11 is a timing chart of an SB signal, an RB signal, and a Q signal of the flip-flop circuit 15a, and (c) of FIG. 11 is a truth table of the flip-flop circuit 15a (for a case where an INIT signal is non-active). As illustrated in (c) of FIG. 11, the Q signal of the flip-flop circuit 15a is (i) at a low level (L: non-active) during a period in which the SB signal is at a low level (L: active) and the RB signal is at a low level (L: active), (ii) at a high level (H: active) during a period in which the SB signal is at a low level (L: active) and the RB signal is at a high level (H: non-active), (iii) at a low level (L: non-active) during a period in which the SB signal is at a high level (H: non-active) and the RB signal is at a low level (L: active), and (iv) retained during a period in which the SB signal is at a high level (H: non-active) and the RB signal is at a high level (H: non-active).

Example 6

(a) of FIG. 12 is a circuit diagram illustrating a configuration of a flip-flop circuit 16a.

The flip-flop circuit 16a includes a P channel type transistor Tr12 and an N channel type transistor Tr13 which constitute a CMOS circuit, a P channel type transistor Tr14 and an N channel type transistor Tr15 which constitute a CMOS circuit, N channel type transistors Tr17 and Tr20, resistors R2a and R4a, an S terminal, an R terminal, a INIT terminal, a Q terminal, and a QB terminal.

The respective gate terminals of the transistors Tr12 and Tr13, the respective drain terminals of the transistors Tr14 and Tr15, the drain terminal of the transistor Tr17, and the QB terminal are connected to each other. The respective drain terminals of the transistors Tr12 and Tr13, the respective gate terminals of the transistors Tr14 and Tr15, the drain terminal of the transistor Tr20, and the Q terminal are connected to each other. The gate terminal of the transistor Tr20 is connected to the R terminal, and the source terminal of the transistor Tr20 is supplied with a power supply voltage VSS. The source terminal of the transistor Tr15 is connected to the INIT terminal. One end of the resistor R4a is connected to a power supply voltage VDD, while the other end is connected to a source terminal of the transistor Tr12.

The transistors Tr12, Tr13, Tr14, and Tr15 constitute the latch circuit LC. The resistors R2a and R4a constitute the latch regulator circuit RC (regulator circuit). The transistor Tr17 serves as a set transistor ST.

(b) of FIG. 12 is a timing chart of an S signal, an R signal, and a Q signal of the flip-flop circuit 16a, and (c) of FIG. 12 is a truth table of the flip-flop circuit 16a (for a case where an INITB signal is non-active). As illustrated in (c) of FIG. 12, the Q signal of the flip-flop circuit 16a is (i) retained during a period in which the S signal is at a low level (L: non-active) and the R signal is at a low level (L: non-active), (ii) at a low level (L: non-active) during a period in which the S signal is at a low level (L: non-active) and the R signal is at a high level (H: active), (iii) at a high level (H: active) during a period in which the S signal is at a high level (H: active) and the R signal is at a low level (L: non-active), and (iv) at a low level (L: non-active) during a period in which the S signal is at a high level (H: active) and the R signal is at a high level (H: active).

Example 7

(a) of FIG. 13 is a circuit diagram illustrating a configuration of a flip-flop circuit 17a.

The flip-flop circuit 17a includes a P channel type transistor T12 and an N channel type transistor Tr13 which constitute a CMOS circuit, a P channel type transistor Tr14 and an N channel type transistor Tr15 which constitute a CMOS circuit, P channel type transistors Tr19 and Tr21, resistors R2b and R4b, a SB terminal, a RB terminal, an INITB terminal, a Q terminal, and a QB terminal.

The respective gate terminals of the transistors Tr12 and Tr13, the respective drain terminals of the transistors Tr14 and Tr15, the drain terminal of the transistor Tr21, and the QB terminal are connected to each other. The respective drain terminals of the transistors Tr12 and Tr13, the respective gate terminals of the transistors Tr14 and Tr15, the drain terminal of the transistor Tr19, and the Q terminal are connected to each other. The gate terminal of the transistor Tr19 is connected to the SB terminal, and the source terminal of the transistor Tr19 is connected to the RB terminal. The gate terminal of the transistor Tr21 is connected to the RB terminal, and the source terminal of the transistor Tr21 is connected to a power supply voltage VDD. The source terminal of the transistor Tr12 is connected to the INITB terminal. One end of the resistor R2b is connected to a power supply voltage VSS, while the other end is connected to the source terminal of the transistor Tr15. One end of the resistor R4b is connected to a power supply voltage VSS, while the other end is connected to the source terminal of the transistor Tr13.

The transistors Tr12, Tr13, Tr14 and Tr15 constitute the latch circuit LC. The resistors R2b and R4b constitute the latch regulator circuit RC (regulator circuit). The transistor Tr19 serves as a set transistor ST.

(b) of FIG. 13 is a timing chart of an SB signal, an RB signal, a Q signal of the flip-flop circuit 17a, and (c) of FIG. 13 is a truth table of the flip-flop circuit 17a (for a case where an INIT signal is non-active). As illustrated in (c) of FIG. 13, the Q signal of the flip-flop circuit 17a is (i) at a low level (L: active) during a period in which the SB signal is at a low level (L: active) and the RB signal is at a low level (L: active), (ii) at a high level (H: active) during a period in which the SB signal is at a low level (L: active) and the RB signal is at a high level (H: non-active), (iii) at a low level (L: non-active) during a period in which the SB signal is at a high level (H: non-active) and the RB signal is at a low level (L: active), and (iv) retained during a period in which the SB signal is at a high level (H: non-active) and the RB signal is at a high level (H: non-active).

Example 8

A unit circuit included in the shift register 10 of the present embodiment may be configured as in the case illustrated in FIG. 14. FIG. 14 is a circuit diagram illustrating a configuration of a unit circuit 14. As illustrated in FIG. 14, the unit circuit 14 is configured by the unit circuit 11 shown in FIG. 4 including all-ON circuits 11d1 and 11d2. FIG. 15 is a timing chart showing an operation of the unit circuit 14 in accordance with an input of an all-ON signal AON.

In a case where the all-ON signal AON is at a low level, the QB terminal and the gate terminal of the transistor Tr8 are connected to each other via the all-ON circuit 11*d*2. Further, in the case where the all-ON signal AON is at a low level, the all-ON circuit 11*d*1 is in an OFF state. Thus, in a case where an INITB signal is at a high level, the unit circuit 14 is subsequently driven according to CK1 and CK2 in a manner similar to the unit circuit 11 (Example 1).

In a case where the all-ON signal AON is at a high level, the all-ON circuit 11*d*2 disconnects the QB terminal from the gate terminal of the transistor Tr8 and switches the transistor Tr8 off. Further, since the all-ON circuit 11*d*1 is switched on, a gate line at each stage becomes active. At this time, inputs S and R of the flip-flop circuit 11*a* are at a high level. However, in the case of the circuit configuration in which a reset signal is prioritized as shown in FIG. 14, the Q signal is at a low level, and thus all shift registers can be initialized.

When the all-ON signal AON is at a high level, the INITB signal can also be concurrently at a low level. Further, as shown in FIG. 15, by making a period in which the INITB signal is at a low level longer than a period in which the all-ON signal AON is non-active, it is possible to (i) prevent each stage of the shift register 10 from being active due to waveform distortion of the gate signal when an all-ON state is reset and to (ii) initialize each stage of the shift resister 10 without fail. This allows all gate lines to be active when the all-ON signal AON is at a high level.

(Switching of Scanning Direction)

The liquid crystal display device 1 may include a switch circuit UDSW for switching a scanning direction (shift direction) of the shift register 10. FIG. 16 is a block diagram illustrating a variation of the liquid crystal display device 1. FIG. 17 is a circuit diagram illustrating how the switch circuit UDSW is connected to a kth unit circuit 11 included in the shift register 10 of Example 1. Note that a common electrode driving circuit 200 is also illustrated in FIG. 16.

The switch circuits 12*a* and 12*b* (UDSW) each include N channel type transistors Ts1 and Ts2, and serves as NMOS switch circuits (see FIG. 17). In the switch circuit 12*a*, the transistor Ts1 has a source terminal connected to an input terminal INa, a drain terminal connected to an output terminal OUT, and a gate terminal supplied with a switching signal UD. The transistor Ts2 has a source terminal connected to an input terminal INb, a drain terminal connected to the output terminal OUT, and a gate terminal supplied with a switching signal UDB (inversion signal of UD). In the switch circuit 12*b*, the transistor Ts1 has a source terminal connected to an input terminal INb, a drain terminal connected to an output terminal OUT, and a gate terminal supplied with a switching signal UD. The transistor Ts2 has a source terminal connected to an input terminal INa, a drain terminal connected to an output terminal OUT, and a gate terminal supplied with a switching signal UDB (inversion signal of UD). The output terminal OUT of the switch circuit 12*a* is connected to the S terminal of the unit circuit 11, and the output terminal OUT of the switch circuit 12*b* is connected to the R terminal of the unit circuit 11.

The output signal SROUT(k−1) of the (k−1)th unit circuit 11 of the shift resister 10 is supplied to the respective input terminals INa of the switch circuits 12*a* and 12*b* of the kth unit circuit 11, and the output signal SROUT(k+1) of the (k+1)th unit circuit 11 of the shift resister 10 is supplied to the respective input terminals INb of the switch circuits 12*a* and 12*b*.

The switching signals UD and UDB are opposite to each other in polarity. Thus, in a case where the switching signal UD is at a high level (the switching signal UDB is at a low level), the transistors Ts1 of the switch circuits 12*a* and 12*b* are in an ON state, the output signal SROUT(k−1) is supplied from the switch circuit 12*a* to the S terminal of the kth unit circuit 11, and the output signal SROUT(k+1) is supplied from the switch circuit 12*b* to the R terminal of the kth unit circuit 11. In a case where the switching signal UDB is at a high level (the switching signal UD is at a low level), the transistor Ts2 of the switch circuits 12*a* and 12*b* is in an ON state, the output signal SROUT(k+1) is supplied from the switch circuit 12*a* to the S terminal of the kth unit circuit 11, and the output signal SROUT(k−1) is supplied from the switch circuit 12*b* to the R terminal of the kth unit circuit 11.

The above arrangement allows switching the scanning direction of the shift register 10 between a first direction (from the first stage to an nth stage) and a second direction (from the nth stage to the first stage). Note that the switch circuits 12*a* and 12*b* are applicable to any of the above Examples.

Note here that the output signal SROUT(k−1) or SROUT(k+1) which is outputted from the switch circuits 12*a* and 12*b* has a potential (VDD-Vth) with a threshold (Vth) drop. However, as described earlier, the unit circuit 11 (see FIG. 4) including the resistor R1 can switch on the transistor Tr6 so that a potential of the drain terminal can be reduced to a potential which is close to VSS (low level) (a potential lower than an inversion level of an inverter). Therefore, it is possible to prevent the flip-flop circuit 11*a* from malfunctioning.

The switch circuits 12*a* and 12*b* of FIG. 17 may each be configured as a CMOS switch circuit (see FIG. 18). According to the configuration of FIG. 18, the output signal SROUT(k−1) or SROUT(k+1) which is outputted from the switch circuits 12*a* and 12*b* can be supplied to the flip-flop circuit 11*a* without a threshold (Vth) drop.

FIG. 19 illustrates a configuration where the unit circuit 14 shown in FIG. 14 includes switch circuits 12*a* and 12*b*. According to this configuration, it is possible to carry out switching of scanning directions and an all-ON operation.

Note that the switch circuits and all-ON circuits described earlier are applicable to the unit circuits of any of the Examples.

Note here that the unit circuit 11 illustrated in FIG. 3 may be configured as shown in FIG. 20. (a) of FIG. 20 is a block diagram illustrating Variation 1 of the unit circuit 11, and (b) of FIG. 20 is a timing chart of the unit circuit 11. In the configuration of FIG. 20, an output (SROUTk) of a current unit circuit (kth unit circuit 11) is supplied to the R terminal of the current unit circuit, and then a reset operation in the current unit circuit is carried out. Accordingly, the shift register 10 serves as a so-called self-resetting shift register.

Further, the unit circuit 11 illustrated in FIG. 3 may be configured as shown in FIG. 21. (a) of FIG. 21 is a block diagram illustrating Variation 2 of the unit circuit 11, and (b) of FIG. 21 is a timing chart of the unit circuit 11. In the configuration of FIG. 21, the switch circuit 11*b* includes a P channel type transistor, and an output (SROUTk) is low active.

Next, the following description deals with an example configuration of a common electrode driving circuit (COM driver) and a retention capacitor line driving circuit (CS driver) which are driven with use of an output signal of the shift register 10. For convenience, in the description below, the common electrode driving circuit is described in Embodiment 2, the retention capacitor line driving circuit is described in Embodiment 3, and a detailed description of the shift register 10 is omitted.

Embodiment 2

The description below deals with Embodiment 2 of the present invention with reference to drawings. For convenience of explanation, members of Embodiment 2 that are identical in function with their respective corresponding members of Embodiment 1 above are each assigned an identical reference sign, and are not described here. Further, the terms defined in Embodiment 1 are also used in Embodiment 2 as so defined unless otherwise stated.

FIG. 22 is a block diagram illustrating a schematic configuration of a liquid crystal display device 2 of Embodiment 2. The liquid crystal display device 2 includes a scanning signal line driving circuit 100 (gate driver), a common electrode driving circuit 200 (COM driver), a data signal line driving circuit 300 (source driver), and a display panel 400. The liquid crystal display device 2 also includes control circuits (not illustrated) for controlling respective driving circuits. Note that the driving circuits and pixel circuits may be monolithically formed on an active matrix substrate.

The display panel 400 is driven by the scanning signal line driving circuit 100, the common electrode driving circuit 200, the data signal line driving circuit 300, and the control circuits for controlling these members.

The common electrode driving circuit 200 supplies a high-level signal (Vcomh) (first potential) or low-level signal (Vcoml) (first potential) to each common line 42 in response to the output signal (SROUT) of the shift register 10 which constitutes the scanning signal line driving circuit 100 of the liquid crystal display device 1 of Embodiment 1.

The control circuits control the scanning signal line driving circuit 100, the common electrode driving circuit 200, and the data signal line driving circuit 300 to output gate signals, source signals, and common signals respectively.

The liquid crystal display device 2 of the present embodiment is configured to carry out a stable operation by preventing a decrease in potential level of an output signal of the scanning signal line driving circuit 100 and the common electrode driving circuit 200 while reducing a circuit area. The following description will discuss a specific configuration of the scanning signal line driving circuit 100 and the common electrode driving circuit 200.

As described in Examples of Embodiment 1, the shift register 10 which constitutes the scanning signal line driving circuit 100 is configured by connecting multiple m (where m is an integer of 2 or more) unit circuits 11. Each of the unit circuits 11 includes a clock terminal (CK terminal), a set terminal (S terminal), a reset terminal (R terminal), an initialization terminal (INITB terminal), and an output terminal OUT.

To the shift register 10, a start pulse (not shown) and double-phase clock signals CK1 and CK2 are supplied from the outside. The start pulse is supplied to an S terminal of a first unit circuit 11. The clock signals CK1 are supplied to respective CK terminals of (odd-number)th unit circuits 11. Meanwhile, the clock signals CK2 are supplied to respective CK terminals of (even-number)th unit circuits 11. An output of each unit circuit 11, which is as an output signal SROUT, is supplied, via an output terminal OUT, to a corresponding scanning signal line GL, to an S terminal of a subsequent unit circuit 11, and to an R terminal of a preceding unit circuit 11. The output signal SROUT of the unit circuit 11 is supplied to the unit circuit 21 of a corresponding common electrode driving circuit 200.

Specifically, as shown in FIG. 22, the output signal SROUT (k−1) of the (k−1)th unit circuit 11 is supplied to the S terminal of the kth (where k is an integer of not less than 1 and not more than m) unit circuit 11 of the shift register 10, and the kth unit circuit 11 supplies the output signal SROUTk to the scanning signal line GLk. In this manner, the shift register 10 supplies the output signals SROUT1 to SROUTm sequentially to the scanning signal lines GL1 to GLm, respectively, in accordance with a shift operation. Note that the output signal SROUTk of the kth unit circuit 11 is supplied to the R terminal of the (k−1)th unit circuit 11 and the S terminal of the (k+1)th unit circuit 11.

The common electrode driving circuit 200 is configured by connecting multiple n (where n is an integer of 2 or more) unit circuits 21 (retention circuits). Each of the unit circuits 21 is made up of input terminals INs, INc, and an output terminal OUT. The output signal SROUT of the shift register 10 is supplied to the input terminal INs of the unit circuit 21, a polarity signal CMI (retention target signal) is supplied to the input terminal INc of the unit circuit 21, and an output from the unit circuit 21 is sequentially supplied, as output signals CMOUT1-CMOUTn, to common lines (COM lines) CML1 to CMLn, respectively.

Specifically, as shown in FIG. 22, an output signal SROUT (k−1) of a (k−1)th unit circuit 11 of the shift register 10 is supplied to a kth (where k is an integer of 1 or more but n or less) unit circuit 21 of the common electrode driving circuit 200, and the kth unit circuit 21 supplies an output signal CMOUTk to a common line CMLk. As described above, the common electrode driving circuit 200 supplies output signals CMOUT1 to CMOUTn sequentially to common lines CML1 to CMLn, respectively, in accordance with a shift operation of the shift register 10. Note that, to a first unit circuit 21, a start pulse of the shift register 10 is supplied.

As the shift register 10 of the liquid crystal display device 2, any one of the shift registers of Examples described in Embodiment 1 is applicable. The following description will mainly discuss the common electrode driving circuit 200.

Example 1

FIG. 23 is a circuit diagram of the unit circuit 21 included in the common electrode driving circuit 200 of Example 1. As illustrated in FIG. 23, the unit circuit 21 (retention circuit) includes a latch through circuit 21a and a buffer 21b. The latch through circuit 21a includes inverters INV1, INV2, and INV3, and an analog switch circuit SW1. The buffer 21b includes two transistors. Hereinafter, in the inverter INV2, a connection point between an output of the inverter INV1 and an input of the inverter INV2 is defined as a node N1 and a connection point between an input of the inverter INV1 and an output of the inverter INV2 is defined as a node N2 (see FIG. 23).

An input terminal of the inverter INV3 is connected to the input terminal INs of the unit circuit 21. The analog switch circuit SW1 includes an N channel type transistor T1 and a P channel transistor T2. The transistor T1 has a gate terminal connected to the input terminal INs, and a source terminal connected to the input terminal INc of the unit circuit 21. The transistor T2 has a gate terminal connected to an output terminal of the inverter INV3, and a source terminal connected to the input terminal INc. An output signal SROUT of a unit circuit (e.g., the unit circuit 11 of FIG. 4) of the shift register 10 of Embodiment 1 is supplied to the input terminal INs, meanwhile, a polarity signal CMI is supplied to the input terminal INc.

The inverter INV2 is made up of a P channel type transistor T3 and an N channel type transistor T4. An input terminal (connection point (node N1) between a gate terminal of the transistor T3 and a gate terminal of the transistor T4) of the inverter INV2 is connected to an output terminal (drain terminals of the transistors T1 and T2) of the analog switch circuit SW1. A power supply voltage Vdd is supplied to a source terminal of the transistor T3, meanwhile, a drain terminal of the transistor T3 is connected to an output terminal (connection point (node N2) between the drain terminal of the transistor T3 and a drain terminal of the transistor T4) of the inverter INV2. A power supply voltage Vss is supplied to the source terminal of the transistor T4, meanwhile, the drain terminal of the transistor T4 is connected to the output terminal (node N2) of the inverter INV2. The node N2 is connected to an output terminal out of the latch through circuit 21a and an input terminal (gate terminals of transistor T5, T6) of the inverter INV1.

The inverter INV1 includes a P channel type transistor T5 and an N channel type transistor T6. The input terminal (gate terminals of the transistors T5 and T6) of the inverter INV1 is connected to the output terminal (node N2) of the inverter INV2. A power supply voltage Vdd is supplied to a source terminal of the transistor T5, and a drain terminal of the transistor T5 is connected to an output terminal (connection point between the drain terminal of the transistor T5 and a drain terminal of the transistor T6) of the inverter INV1. A power supply voltage Vss is supplied to a source terminal of the transistor T6, and the drain terminal of the transistor T6 is connected to the output terminal of the inverter INV1. The output terminal of the inverter INV1 is connected to the input terminal (node N1) of the inverter INV2. The output terminal out of the latch through circuit 21a is connected to an input terminal in of the buffer 21b. Here, the transistors T5 and T6 have respective channel lengths L longer than those of the transistors T3 and T4 so as to have driving capabilities smaller than those of the transistors T3 and T4.

The buffer 21b includes a P channel type transistor T7 and an N channel type transistor T8. Gate terminals of the transistors T7 and T8 are connected to the input terminal in. A power supply voltage Vcomh is supplied to a source terminal of the transistor T7, and a drain terminal of the transistor T7 is connected to the output terminal OUT of the unit circuit 21. A power supply voltage Vcoml is supplied to a source terminal of the transistor T8, and a drain terminal of the transistor T8 is connected to the output terminal OUT of the unit circuit 21.

Therefore, the output signal SROUT(k−1) of the (k−1)th unit circuit 11 of the shift register 10 is supplied to the input terminal INs of the kth unit circuit 21, and the output signal CMOUTk is supplied to the kth common line CMLk via the output terminal OUT of the kth unit circuit 21.

The common electrode driving circuit 200, including the unit circuit 21 configured as described above, sequentially outputs output signals CMOUT1 to CMOUTn one by one, whose voltages are alternately changed (high level (Vcomh) or low level (Vcoml)) in each frame. Hereinafter, potentials of signals inside the common electrode driving circuit 200, including the clock signals CK1 and CK2, and potentials of input and output signals are defined to be Vdd in the case where the potentials are at a high level, and are defined to be Vss in the case where the potentials are at a low level, unless otherwise specified. Further, a potential of the polarity signal CMI is also defined to be Vdd in the case where the potential is at a high level, and is defined to be Vss in the case where the potential is at a low level. Note, however, that a potential level of the polarity signal CMI is not limited thereto, and "high level" only needs to be higher than an inverted potential of the inverter INV2, whereas "low level" only needs to be lower than the inverted potential of the inverter INV2.

(Operation)

An operation of the common electrode driving circuit 200 will be described with reference to FIG. 24 and FIG. 25. FIG. 24 is a timing chart at the time of an operation of the common electrode driving circuit 200. FIG. 25 is a schematic view showing a timing chart at the time of an operation of the common electrode driving circuit 200. In FIG. 24, input and output signals are illustrated in the (k−1)th unit circuit 21, the kth unit circuit 21, and a (k+1)th unit circuit 21.

CK1 is a clock signal to be supplied to each of the CK terminals of the (odd-number)th unit circuits 11, meanwhile, CK2 is a clock signal to be supplied to each of the CK terminals of the (even-number)th unit circuits 11. CMI is a signal (polarity signal) whose polarity is inverted in each horizontal scanning period (1H). SR(k−2), SR(k−1), and SRn indicate potentials of output signals SROUT(k−2), SROUT(k−1), and SROUTk of a (k−2)th unit circuit 11, the (k−1)th unit circuit 11, and the kth unit circuit 11, respectively, of the shift register 10. N1 and N2 indicate a potential of the node N1 and a potential of the node N2, respectively, of FIG. 23. CM(k−1), CMk, and CM(k+1) indicate output signals CMOUT(k−1), CMOUTk, and CMOUT(k+1) of the (k−1)th unit circuit 21, the kth unit circuit 21, and the (k+1)th unit circuit 21, respectively, of the common electrode driving circuit 200. Note that a period after the output signal SROUT(k−2) is outputted but until the next output signal SROUT(k−2) is outputted corresponds to one vertical scanning period (1 frame: 1 V). Further, FIG. 24 shows arbitrary sequential frames F(t), F(t+1), and F(t+2).

First, the following description will discuss operations in the frames F(t), F(t+1) of the kth unit circuit 21.

In the frame F(t), an output signal SROUT(k−1) (high level (active)) of the (k−1)th unit circuit 11 of the shift register 10 is supplied to the input terminal INs of the kth unit circuit 21. This switches on the analog switch circuit SW1, with the result that a polarity signal CMI (low level; Vss) is received by the latch through circuit 21a.

Immediately before the output signal SROUT(k−1) becomes a high level (active), a potential of the node N1 is retained at Vdd (high level) and the transistor T5 is in an ON state. Therefore, when the output signal SROUT(k−1) becomes the high level (active), Vss (low level) of the polarity signal CMI and a power supply VDD (high level) are short-circuited. As to this point, the transistor T5 of the inverter INV1 is set to have a long channel length L and therefore has a low driving capability. Therefore, a potential of the node N1 is made closer to that of the polarity signal CMI, thereby decreasing to a potential (potential lower than an inverted potential of the inverter INV2) which is close to Vss (low level) of the polarity signal CMI (see FIG. 25).

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMI to Vss (see FIG. 25).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 21a. In addition, in the buffer 21b, to which Vdd (high level) is supplied, the transistor T7 is switched off, whereas the transistor T8 is switched on. As such, Vcoml is outputted from the buffer 21b and is supplied to a kth common line CMLk.

Then, the output signal SROUT(k−1) of the shift register 10 changes from the high level (active) to the low level (non-active), the analog switch circuit SW1 is switched off, and therefore an input of the polarity signal CMI is interrupted, with the result that the node N1 retains the potential (Vss (low level)) which has been retained, immediately before such interruption, by a latch operation of the inverters INV1, INV2, and the buffer 21b keeps supplying the Vcoml to the kth common line CMLk until the output signal SROUT(k−1) becomes the high level (active) in the frame F(t+1).

Next, in the frame F(t+1), when the output signal SROUT (k−1) of the (k−1)th unit circuit 11 of the shift register 10 becomes the high level (active), the analog switch circuit SW1 switched on, with the result that a polarity signal CMI (high level; Vdd) is received by the latch through circuit 21a.

Immediately before the output signal SROUT(k−1) becomes the high level (active) (in the frame F(t)), the potential of the node N1 is retained at Vss (low level) and the transistor T6 is in an ON state, which causes short circuit between Vdd (high level) of the polarity signal CMI and the power supply Vss (low level) in the case where the output signal SROUT(k−1) becomes the high level (active). As to this point, because the transistor T6 of the inverter INV1 is set to have a long channel length L and therefore has a low driving capability, the potential of the node N1 is made closer to that of the polarity signal CMI, which results in increasing to a potential close to Vdd (high level) of the polarity signal CMI (potential higher than the inverted potential of the inverter INV2) (see FIG. 25).

Thereafter, the output (node N2; Vss (low level)) of the inverter INV2 is fed back to the input of the inverter INV1, which switching on the transistor T5 and switching off the transistor T6. This further increases the potential of the node N1 from the potential close to Vdd of the polarity signal CMI to Vdd (see FIG. 25).

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to become Vss (low level), which results in outputting Vss (low level) from the latch through circuit 21a. Then, in the buffer 21b to which Vss (low level) is supplied, the transistor T8 is switched off and the transistor T7 is switched on, which in turn supplies the Vcomh from the buffer 21b to the kth common line CMLk.

Then, when the output signal SROUT(k−1) of the shift register 10 is changed from the high level (active) to the low level (non-active), the analog switch circuit SW1 is switched off, and, therefore, an input of the polarity signal CMI is interrupted, with the result that the node N1 retains the potential (Vdd (high level)) which has been retained, immediately before such interruption, by a latch operation of the inverters INV1 and INV2, and the buffer 21b keeps supplying the Vcomh to the kth common line CMLk until the output signal SROUT(k−1) becomes the high level (active) in a frame F(t+2) kth. After the frame F(t+2), the operations in the frames F(t), F(t+1) are repeated.

The following description will discuss operations in the frames F(t), F(t+1) in the (k+1)th unit circuit 21.

In the frame F(t), an output signal SROUTk (high level (active)) of the kth unit circuit 11 of the shift register 10 is supplied to the input terminal INs of the k+1 th unit circuit 21. This switches on the analog switch circuit SW1, with the result that a polarity signal CMI (high level; Vdd) is received by the latch through circuit 21a.

Immediately before the output signal SROUTk becomes a high level (active), a potential of the node N1 is retained at Vss (low level) and the transistor T6 is in an ON state. Therefore, when the output signal SROUTk becomes the high level (active), Vdd (high level) of the polarity signal CMI and a power supply VSS (low level) are short-circuited. As to this point, the transistor T6 of the inverter INV1 is set to have a long channel length L and therefore has a low driving capability. Therefore, a potential of the node N1 is made closer to that of the polarity signal CMI, thereby increasing to a potential (potential higher than an inverted potential of the inverter INV2) which is close to Vdd (high level) of the polarity signal CMI.

Thereafter, the transistor T4 is switched on, and an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMI to Vdd.

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 21a. In addition, in the buffer 21b, to which Vss (low level) is supplied, the transistor T8 is switched off, whereas the transistor T7 is switched on. As such, Vcomh is outputted from the buffer 21b and is supplied to a (k+1)th common line CML(k+1).

Then, the output signal SROUTk of the shift register 10 changes from the high level (active) to the low level (non-active), the analog switch circuit SW1 is switched off, and therefore an input of the polarity signal CMI is interrupted, with the result that the node N1 retains the potential (Vdd (high level)) which has been retained, immediately before such interruption, by a latch operation of the inverters INV1 and INV2, and the buffer 21b keeps supplying the Vcomh to the (k+1)th common line CML(k+1) until the output signal SROUTk becomes the high level (active) in the frame F(t+1).

Next, in the frame F(t+1), when the output signal SROUTk of the kth unit circuit 11 of the shift register 10 becomes the high level (active), the analog switch circuit SW1 switched on, with the result that a polarity signal CMI (low level; Vss) is received by the latch through circuit 21a.

Immediately before the output signal SROUTk becomes the high level (active) (in the frame F(t)), the potential of the node N1 is retained at Vdd (high level) and the transistor T5 is in an ON state, which causes short circuit between Vss (low level) of the polarity signal CMI and the power supply VDD (high level) in the case where the output signal SROUTk becomes the high level (active). As to this point, because the transistor T5 of the inverter INV1 is set to have a long channel length L and therefore has a low driving capability, the potential of the node N1 is made closer to that of the polarity signal CMI, which results in decreasing to a potential close to Vss (low level) of the polarity signal CMI (potential lower than the inverted potential of the inverter INV2).

Thereafter, the transistor T3 is switched on, and an output (node N2; Vdd (high level)) of the inverter INV2 is fed back to an input of the inverter INV1, which switching off the transistor T5 and switching on the transistor T6. This further decreases the potential of the node N1 from the potential close to Vss of the polarity signal CMI to Vss.

The potential of the node N1 becomes close to Vss (low level) or becomes Vss (low level), which results in switching on the transistor T3 of the inverter INV2 and switching off the transistor T4. This switching on of the transistor T3 causes the potential of the node N2 to become Vdd (high level), which results in outputting Vdd (high level) from the latch through circuit 21a. Then, in the buffer 21b to which Vdd (high level) is supplied, the transistor T7 is switched off and the transistor T8 is switched on, which in turn supplies the Vcoml from the buffer 21b to the (k+1)th common line CML(k+1).

Then, when the output signal SROUTk of the shift register 10 is changed from the high level (active) to the low level (non-active), the analog switch circuit SW1 is switched off, and, therefore, an input of the polarity signal CMI is interrupted, with the result that the node N1 retains the potential (Vss (low level)) which has been retained, immediately before such interruption, by a latch operation of the inverters INV1 and INV2, and the buffer 21b keeps supplying the Vcoml to the (k+1)th common line CML(k+1) until the output signal SROUTk becomes the high level (active) in a frame F(t+2) kth. After the frame F(t+2), the operations in the frames F(t), F(t+1) are repeated.

As compared with the conventional unit circuit (retention circuit), the number of transistors can be reduced. This reduces the circuit scale of the common electrode driving circuit 200. Therefore, it is possible to achieve further slim bezel of the liquid crystal display device. Further, no malfunction is caused by the reduction in circuit scale.

In configuration shown in FIG. 23, the transistors T5 and T6 are individually increased in channel lengths. However, as another configuration, for example, the channel lengths L may be substantially increased by connecting plural stages of transistors in series and connecting the gate terminals to each other. In this case, the gate terminals can be shared by the transistors T5 and T6. It is therefore possible to reduce the circuit scale.

The following description will discuss another form of the common electrode driving circuit (COM driver). Note that, in the following description, differences between the other form and the common electrode driving circuit 200 of Example 1 will be mainly described. Therefore, members having the like functions as the figures described in Example 1 are denoted by the like reference signs and the detailed description thereof is omitted.

Example 2

FIG. 26 is a circuit diagram of a unit circuit 22 included in a common electrode driving circuit 200 of Example 2. As shown in FIG. 26, an inverter INV1a of the unit circuit 22 is configured by adding a resistor R1 and a resistor R2 to the inverter INV1 of the unit circuit 21 (see FIG. 23) in Example 1. Further, transistors T5 and T6 configuring the inverter INV1a of the unit circuit 22 are set to have channel lengths L identical with those of transistors T3 and T4 of an inverter INV2.

In the inverter INV1a, the resistor R2 is connected to a power supply VDD at one terminal thereof and is connected to a source terminal of the transistor T5 at the other terminal thereof, meanwhile, the resistor R1 is connected to a power supply VSS at one terminal thereof and is connected to a source terminal of the transistor T6 at the other terminal thereof. Note that the resistors R1 and R2 have several 1a2 to several MS2.

(Operation)

An operation of the common electrode driving circuit 200 will be described. A timing chart used is identical with that of FIG. 24. The following description will mainly discuss differences between Examples 1 and 2 by exemplifying operations of a kth unit circuit 22 in frames F(t), F(t+1).

First, in the frame F(t), when an output signal SROUT(k−1) (high level (active)) is supplied to an input terminal INs of the kth unit circuit 22, the analog switch circuit SW1 is switched on, with the result that a polarity signal CMI (low level; Vss) is received by latch through circuit 21a.

Immediately before the output signal SROUT(k−1) becomes a high level (active), a potential of the node N1 is retained at Vdd (high level) and the transistor T5 is in an ON state. Therefore, when the output signal SROUT(k−1) becomes the high level (active), Vss (low level) of the polarity signal CMI and a power supply VDD (high level) are short-circuited. As to this point, because the resistor R2 is provided between the power supply VDD and the node N1, a potential of the node N1 is made closer to that of the polarity signal CMI, thereby decreasing to a potential (potential lower than an inverted potential of the inverter INV2) which is close to Vss (low level) of the polarity signal CMI (see FIG. 25).

Thereafter, the transistor T3 is switched on, and an output (node N2; Vdd (high level)) of the inverter INV2 is fed back to the input of the inverter INV1a, which results in switching off the transistor T5 and switching on the transistor T6. This further decreases the potential of the node N1 from the potential close to Vss of the polarity signal CMI to Vss (see FIG. 25).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 21a. In addition, in the buffer 21b, to which Vdd (high level) is supplied, the transistor T7 is switched off, whereas the transistor T8 is switched on. As such, Vcoml is outputted from the buffer 21b and is supplied to a kth common line CMLk.

Then, the output signal SROUT(k−1) of the shift register 10 changes from the high level (active) to the low level (non-active), the analog switch circuit SW1 is switched off, and therefore an input of the polarity signal CMI is interrupted, with the result that the node N1 retains the potential (Vss (low level)), and the buffer 21b keeps supplying the Vcoml to the kth common line CMLk until the output signal SROUT(k−1) becomes the high level (active) in the frame F(t+1).

Next, in the frame F(t+1), when the output signal SROUT (k−1) becomes the high level (active), the analog switch circuit SW1 switched on, with the result that a polarity signal CMI (high level; Vdd) is received by the latch through circuit 21a.

Immediately before the output signal SROUT(k−1) becomes the high level (active) (in the frame F(t)), the potential of the node N1 is retained at Vss (low level) and the transistor T6 is in an ON state, which causes short circuit between Vdd (high level) of the polarity signal CMI and the power supply VSS (low level) in the case where the output signal SROUT(k−1) becomes the high level (active). As to this point, because the resistor R1 is provided between the power supply VSS and the node N1, the potential of the node N1 is made closer to that of the polarity signal CMI, which results in increasing to a potential close to Vdd (high level) of the polarity signal CMI (potential higher than the inverted potential of the inverter INV2) (see FIG. 25).

Thereafter, the transistor T4 is switched on, and an output (node N2; Vss (low level)) of the inverter INV2 is fed back to the input of the inverter INV1a, which switching on the transistor T5 and switching off the transistor T6. This further increases the potential of the node N1 from the potential close to Vdd of the polarity signal CMI to Vdd (see FIG. 25).

The potential of the node N1 becomes close to Vdd (high level) or becomes Vdd (high level), which results in switching on the transistor T4 and switching off the transistor T3 of the inverter INV2. This switching on of the transistor T4 causes the potential of the node N2 to become Vss (low level), which results in outputting Vss (low level) from the latch through circuit 21a. Then, in the buffer 21b to which Vss (low level) is supplied, the transistor T8 is switched off and the transistor T7 is switched on, which in turn supplies the Vcomh from the buffer 21b to the kth common line CMLk.

Then, when the output signal SROUT(k−1) of the shift register 10 is changed from the high level (active) to the low level (non-active), the analog switch circuit SW1 is switched off, and, therefore, an input of the polarity signal CMI is interrupted, with the result that the node N1 retains Vdd (high level) and the buffer 21b keeps supplying the Vcomh to the kth common line CMLk until the output signal SROUT(k−1) becomes the high level (active) in a frame F(t+2) kth. After the frame F(t+2), the operations in the frames F(t), F(t+1) are repeated.

As such, Example 2 can obtain an effect similar to that of Example 1. Further, in Example 2, resistors are used. Resistors can be arbitrarily changed in shape. This makes it possible to locate resistors effectively and to further reduce a circuit scale.

Note that, in FIG. 26, in order to reduce a through current occurring when an output signal of the inverter INV2 is changed, for example, a resistor may be provided between the transistor T3 and the power supply VDD and another resistor may be provided between the transistor T4 and the power supply VSS. Therefore, it is unnecessary to directly connect the source terminals of transistors T3 and T4 to the power supplies VDD, VSS, respectively, and it is only necessary to supply a high potential signal to the source terminal of the transistor T3 and supply a low potential signal to the source terminal of the transistor T4.

Example 3

FIG. 27 is a circuit diagram of a unit circuit 23 included in a common electrode driving circuit 200 of Example 3. As shown in FIG. 27, resistors R1 and R2 of an inverter INV1b in the unit circuit 23 are provided in different locations from those in the inverter INV1a in the unit circuit 22 (see FIG. 26) of Example 2.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1.

With this configuration, as well as in Example 2, even in a case where an output signal SROUT(k−1) is at a high level (active) and thus Vss (low level) of a polarity signal CMI and a power supply VDD (high level) are short-circuited, a potential of the node N1 is made closer to that of the polarity signal CMI since the resistor R2 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to that of the polarity signal CMI since the resistor R1 is provided between the power supply VSS and the node N1. Therefore, the potential of the node N1 increases to a potential close to Vdd of the polarity signal CMI (potential higher than an inverted potential of the inverter INV2), and thereafter increases to Vdd due to feedback of an output (Vss) of the inverter INV2.

With this, it is possible to achieve a similar effect to that of Example 2. Note that the configuration of FIG. 27 may include additional resistors on the sides of source terminals of transistors T5 and T6 (see Example 2).

Example 4

FIG. 28 is a circuit diagram of a unit circuit 24 included in a common electrode driving circuit 200 of Example 4. As shown in FIG. 28, the unit circuit 24 corresponds to the unit circuit 21 (see FIG. 23) of Example 1 additionally including a resistor R3 between an output terminal of an inverter INV1 and an input terminal (node N1) of an inverter INV2. In the unit circuit 24, the transistors T5 and T6 configuring the inverter INV1 are set to have channel lengths L identical to those of transistors T3 and T4 configuring the inverter INV2.

Specifically, one terminal of the resistor R3 is connected to an output terminal (i.e., a connection point between a drain terminal of the transistor T5 and a drain terminal of the transistor T6) of the inverter INV1, and the other terminal of the resistor R3 is connected to an input terminal (i.e., the node N1) of the inverter INV2. Note that the resistor R3 has a resistance from several kΩ to several MΩ.

With this configuration, as well as in Examples 2 and 3, even in a case where an output signal SROUT(k−1) is at a high level (active) and thus Vss (low level) of a polarity signal CMI and a power supply VDD (high level) are short-circuited, a potential of the node N1 is made closer to that of the polarity signal CMI since the resistor R3 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to that of the polarity signal CMI since the resistor R3 is provided between the power supply VSS and the node N1. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

With this, it is possible to achieve a similar effect to that of Example 2.

Example 5

FIG. 29 is a circuit diagram of a unit circuit 25 included in a common electrode driving circuit 200 of Example 5. As shown in FIG. 29, the unit circuit 25 corresponds to the unit circuit 22 (see FIG. 26) of Example 2 in which the inverter INV3 is omitted and the analog switch circuit SW1 is constituted only by an N channel type transistor T1.

Specifically, an analog switch circuit SW1a includes a transistor T1 whose gate terminal is connected to an input terminal INs of the unit circuit 25, whose source terminal is connected to an input terminal INc of the unit circuit 25, and whose drain terminal is connected to a node N1.

With this configuration, upon input of an output signal SROUT(k−1) (high level (active)) to the input terminal INs of a kth unit circuit 25, the analog switch circuit SW1a is switched on. In a case where a polarity signal CMI is at a low level (Vss), a potential of the node N1 becomes Vss. In a case where the polarity signal CMI is at a high level (Vdd), a potential of the node N1 becomes Vdd−Vth (threshold value).

Here, even in a case where the output signal SROUT(k−1) becomes a high level (active) and thus the low level (Vss) of the polarity signal CMI and a power supply VDD (high level) are short-circuited, a potential of the node N1 is made closer to that of the polarity signal CMI since a resistor R2 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd-Vth of the polarity signal CMI and a power supply VSS (low level) are short-circuited, a potential of the node N1 is made closer to that of the polarity signal CMI since a resistor R1 is provided between the power supply VSS and the node N1. Thus, the potential of the node N1 increases to a potential close to Vdd-Vth of the polarity signal CMI (potential higher than an inverted potential of the inverter INV2), and thereafter increases to Vdd due to feedback of an output (Vss) of the inverter INV2.

In a case where the polarity signal CMI is at a high level (Vdd), an output of the analog switch circuit SW1a is Vdd-Vth. This causes the transistor T1 in the analog switch circuit SW1a to have a relatively high resistance. This makes the potential of the node N1 difficult to increase, which causes an operation delay and/or a reduction in an operation margin. In order to avoid this, the unit circuit 25 is preferably configured such that, e.g., (i) the resistor R1 has a higher resistance (alternatively, a transistor T6 in the inverter INV1a is set to have a longer channel length L so as to have a reduced driving capability) and/or (ii) a transistor T4 in the inverter INV2 is set to have an increased size so that an inverted potential of the inverter INV2 is reduced.

In a case where (i) an output signal of the shift register 10 is an inversion signal of SROUT(k−1) or (ii) SROUT(k−1) is at a low level while SROUT(k−1) is active, the unit circuit 25 only needs to be configured such that the analog switch circuit SW1a is constituted by a P channel transistor T2 (see FIG. 26).

With this, it is possible to achieve a similar effect to that of Example 2. Further, since Example 5 omits the inverter INV3 and includes the analog switch circuit SW constituted only by the transistor T1, it is possible to further reduce the number of elements, thereby further reducing the circuit scale.

Example 6

FIG. 30 is a circuit diagram of a unit circuit 26 included in a common electrode driving circuit 200 of Example 6. As shown in FIG. 30, resistors R1 and R2 of an inverter INV1b in the unit circuit 26 are provided in different locations from those in the inverter INV1a in the unit circuit 25 (see FIG. 29) of Example 5.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1.

With this configuration, as well as in Example 5, even in a case where an output signal SROUT(k−1) is at a high level (active) and thus a low level (Vss) of a polarity signal CMI and a power supply VDD (high level) are short-circuited, a potential of the node N1 is made closer to that of the polarity signal CMI since the resistor R2 is provided between the power supply VDD and the node N1. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd-Vth of the polarity signal CMI and a power supply VSS (low level) are short-circuited, a potential of the node N1 is made closer to that of the polarity signal CMI since the resistor R1 is provided between the power supply VSS and the node N1. Therefore, the potential of the node N1 increases to a potential close to Vdd-Vth of the polarity signal CMI (potential higher than an inverted potential of the inverter INV2), and thereafter increases to Vdd due to feedback of an output (Vss) of the inverter INV2.

With this, it is possible to achieve a similar effect to that of Example 5.

Example 7

FIG. 31 is a circuit diagram of a unit circuit 27 included in a common electrode driving circuit 200 of Example 7. As shown in FIG. 31, the unit circuit 27 corresponds to the unit circuit 25 (see FIG. 29) of Example 5 whose analog switch circuit SW1a additionally includes an N channel type transistor T9 and a capacitor C1.

Specifically, in an analog switch circuit SW1b of the unit circuit 27, the transistor T9 has a gate terminal supplied with a power supply voltage Vdd, a source terminal connected to an input terminal INs, and a drain terminal connected to a gate terminal of a transistor T1. Further, in the analog switch circuit SW1b, the capacitor C1 is provided between the gate terminal and a drain terminal of the transistor T1. Note that a connection point between the capacitor C1 and the gate terminal of the transistor T1 is defined as a node N3.

With this configuration, upon input of an output signal SROUT(k−1) (high level (active)) to the input terminal INs of a kth unit circuit 27, a potential of the node N3 is charged to Vdd-Vth, and thereafter the transistor T9 is switched off. The node N1 is supplied with Vdd (high level) of a polarity signal CMI, since the transistor T1 is switched on by the output signal SROUT(k−1) (high level). Consequently, a potential of the node N1 starts to increase from Vss (low level) to Vdd (high level). Due to the change in the potential of the node N1, a potential of the node N3 is caused to rise to Vdd-Vth+α via the capacitor C1. As a result, the polarity signal CMI (Vdd) is supplied to the node N1 without a threshold (Vth) drop. Thus, the potential of the node N1 becomes Vdd (bootstrap operation).

Here, according to the unit circuit 25 of Example 5, in a case where a polarity signal CMI is at a high level (Vdd), a potential of the node N1 is Vdd-Vth until an output (Vss) of the inverter INV2 is fed back. On the contrary, according to the unit circuit 27 of Example 7, it is possible to set the potential of the node N1 at Vdd due to the bootstrap operation, thereby enabling to secure an operation margin. Except for the above operation, the unit circuit 27 operates in the same manner as the unit circuit 25 of Example 5.

In a case where (i) an output signal of the shift register 10 is an inversion signal of SROUT(k−1) or (ii) SROUT(k−1) is at a low level while SROUT(k−1) is active, the unit circuit 27 of Example 7 only needs to be configured such that the analog switch circuit SW1b is constituted by a P channel type transistor and the power supply is fixed at VSS.

Example 8

FIG. 32 is a circuit diagram of a unit circuit 28 included in a common electrode driving circuit 200 of Example 8. As shown in FIG. 32, resistors R1 and R2 of an inverter INV1b in the unit circuit 28 are provided in different locations from those in the inverter INV1a in the unit circuit 27 (see FIG. 31) of Example 7.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1. The unit circuit 28 operates in the same manner as the unit circuit 27 of Example 7.

Example 9

FIG. 33 is a circuit diagram of a unit circuit 29 included in a common electrode driving circuit 200 of Example 9. As shown in FIG. 33, the unit circuit 29 corresponds to the unit circuit 27 (see FIG. 31) of Example 7 in which the buffer 21b is omitted and which is constituted only by the latch through circuit 21a. In the unit circuit 29, an input terminal INc is supplied with a polarity signal CMIB (inversion signal of CMI), and inverters INV1a and INV2 are supplied with a power supply voltage Vcomh or Vcoml. The inverter INV2 includes an output terminal (connection point (node N2) between a drain terminal of a transistor T3 and a drain terminal of a transistor T4) connected to an output terminal OUT of the unit circuit 29. In the unit circuit 29, the inverter INV2 functions as a buffer.

With this configuration, upon input of an output signal SROUT(k−1) (high level (active)) to an input terminal INs of a kth unit circuit 29, the analog switch circuit SW1b is switched on. In a case where a polarity signal CMIB is at a low level, a potential of a node N1 becomes a low level. In a case where the polarity signal CMIB is at a high level, the potential of the node N1 becomes a high level.

Even in a case where an output signal SROUT(k−1) of the shift register 10 is at a high level (active) and thus a low level of the polarity signal CMIB and a power supply VCOMH are short-circuited, a potential of the node N1 is made closer to that of the polarity signal CMIB since the resistor R2 is provided between the power supply VCOMH and the node N1. Thus, the potential of the node N1 decreases to a potential close to the low level of the polarity signal CMIB (potential lower than an inverted potential of the inverter INV2), and thereafter decreases to Vcoml due to feedback of an output (Vcomh) of the inverter INV2. Even in a case where a high level of the polarity signal CMIB and a power supply VCOML are short-circuited, a potential of the node N1 is made closer to that of the polarity signal CMIB since the resistor R1 is provided between the power supply VCOML and the node N1. Thus, the potential of the node N1 increases to a potential close to the high level of the polarity signal CMIB (potential higher than an inverted potential of the inverter INV2), and thereafter increases to Vcomh due to feedback of an output (Vcoml) of the inverter INV2. The output of the inverter INV2 is supplied to a kth common line CMLk via the output terminal OUT.

Subsequently, in a case where the output signal SROUT (k−1) of the shift register 10 is changed from the high level (active) to a low level (non-active), the analog switch circuit SW1b is switched off, and thus the polarity signal CMIB is shut off and is not inputted. Further, in a case where the node N1 retains Vcoml, the unit circuit 29 outputs Vcomh. In a case where the node N1 retains Vcomh, the unit circuit 29 outputs Vcoml.

In a case where (i) an output signal of the shift register 10 is an inversion signal of SROUT(k−1) or (ii) SROUT(k−1) is at a low level while SROUT(k−1) is active, the unit circuit 29 only needs to be configured such that the analog switch circuit SW1b is constituted by a P channel type transistor and the power supply is fixed at VSS.

Here, since the output terminal of the inverter INV2 is connected to the common line CMLk, writing display data from a source line involves a large noise generated from (i) an intersection between the common line CMLk and the source line and/or (ii) a plurality of pixels connected to the common line CMLk. If no resistors R1 and R2 are provided, the following case may occur: this noise is transmitted to an input terminal of the inverter INV1a (gate terminals of transistors T5 and T6), and thus the transistors T5 and T6 in the inverter INV1a are switched on for a moment, with the result that a through current occurs. In some cases, this noise may invert a potential level of retained data, thereby causing a malfunction. However, since the configuration of FIG. 33 includes the resistors R1 and R2, it is possible to reduce the through current caused by the noise, thereby preventing the malfunction.

Example 10

FIG. 34 is a circuit diagram of a unit circuit 30 included in a common electrode driving circuit 200 of Example 10. As shown in FIG. 34, resistors R1 and R2 of an inverter INV1b in the unit circuit 30 are provided in different locations from those in the inverter INV1a in the unit circuit 29 (see FIG. 33) of Example 9.

Specifically, in the inverter INV1b, one terminal of the resistor R2 is connected to a drain terminal of a transistor T5 and the other terminal of the resistor R2 is connected to a node N1, whereas one terminal of the resistor R1 is connected to a drain terminal of a transistor T6 and the other terminal of the resistor R1 is connected to the node N1. The unit circuit 30 operates in the same manner as the unit circuit 29 of Example 9.

Example 11

FIG. 35 is a circuit diagram of a unit circuit 31 included in a common electrode driving circuit 200 of Example 11. As shown in FIG. 35, the unit circuit 31 includes an inverter INV1c corresponding to the inverter INV1 in the unit circuit 21 (see FIG. 23) of Example 1 additionally including a resistor R1 and a P channel type transistor T10. Note that, in the unit circuit 31, transistors T5 and T6, and T10 configuring the inverter INV1c are set to have channel lengths L identical to those of transistors T3 and T4 configuring an inverter INV2.

In the inverter INV1c, the transistor T10 has a gate terminal connected to an input terminal INs and a source terminal connected to a power supply VDD; the transistor T5 has a gate terminal connected to a node N2, a source terminal connected to a drain terminal of the transistor T10, and a drain terminal connected to a node N1; one terminal of the resistor R1 is connected to a power supply VSS; the transistor T6 has a gate terminal connected to the node N2, and a source terminal connected to the other terminal of the resistor R1, and a drain terminal connected to the node N1. Note that the resistor R1 has a resistance from several kΩ to several MΩ.

With this configuration, upon input of an output signal SROUT(k−1) (high level (active)) to the input terminal INs of a kth unit circuit 31, an analog switch circuit SW1 is switched on and the transistor T10 is switched off.

Upon input of Vss (low level) of a polarity signal CMI in this state, a potential of the node N1 maintained at Vdd decreases to Vss. During this, the polarity signal CMI (Vss)

and the power supply VDD are not short-circuited, since the node N1 is disconnected from the power supply VDD due to switching-off of the transistor T10.

On the contrary, upon input of Vdd (high level) of the polarity signal CMI, the polarity signal CMI (Vdd) and the power supply VSS are short-circuited. However, since the resistor R1 is provided between the power supply VSS and the node N1, a potential of the node N1 is made closer to that of the polarity signal CMI. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

Example 12

FIG. 36 is a circuit diagram of a unit circuit 32 included in a common electrode driving circuit 200 of Example 12. As shown in FIG. 36, the unit circuit 32 includes an inverter INV1d corresponding to the inverter INV1 in the unit circuit 21 (see FIG. 23) of Example 1 additionally including a resistor R2 and an N channel type transistor T11. Note that, in the unit circuit 32, transistors T5 and T6, and T11 configuring the inverter INV1d are set to have channel lengths L identical to those of transistors T3 and T4 configuring an inverter INV2.

In the inverter INV1d, one terminal of the resistor R2 is connected to a power supply VDD; the transistor T5 has a gate terminal connected to a node N2, a source terminal connected to the other terminal of the resistor R2, and a drain terminal connected to a node N1; the transistor T11 has a gate terminal connected to an output terminal of an inverter INV3 and a source terminal connected to a power supply VSS; the transistor T6 has a gate terminal connected to the node N2, a source terminal connected to a drain terminal of the transistor T11, and a drain terminal connected to the node N1. Note that the resistor R1 has a resistance ranging from several kΩ to several MΩ.

With this configuration, upon input of an output signal SROUT(k−1) (high level (active)) to an input terminal INs of a kth unit circuit 32, an analog switch circuit SW1 is switched on and the transistor T11 is switched off.

Upon input of Vss (low level) of a polarity signal CMI in this state, the polarity signal CMI (Vss) and the power supply VDD are short-circuited. However, since the resistor R2 is provided between the power supply VDD and the node N1, a potential of the node N1 is made closer to that of the polarity signal CMI. Thus, the potential of the node N1 decreases to a potential close to Vss of the polarity signal CMI (potential lower than an inverted potential of the inverter INV2), and thereafter decreases to Vss due to feedback of an output (Vdd) of the inverter INV2.

On the contrary, upon input of Vdd (high level) of the polarity signal CMI, a potential of the node N1 maintained at Vss increases to Vdd. During this, the polarity signal CMI (Vdd) and the power supply VSS are not short-circuited, since the node N1 is disconnected from the power supply VSS due to switching-off of the transistor T11.

Example 13

FIG. 37 is a circuit diagram of a unit circuit 33 included in a common electrode driving circuit 200 of Example 13.

The unit circuit 33 corresponds to the unit circuit 27 of Example 7 additionally having a function for initializing the common electrode driving circuit 200. Specifically, the unit circuit 33 corresponds to the unit circuit 27 (see FIG. 31) of Example 7 in which the power supply VDD in the inverter INV1 is omitted and an initialization terminal (INITB terminal) is provided. An initialization signal INITB is inputted to a source terminal of a transistor T5 via a resistor R2.

The initialization signal INITB is a signal that is at a high level (Vdd) during a regular operation and that is at a low level (Vss) during initialization (active). A polarity signal CMIZ is a signal that has a polarity inverted for each horizontal scanning period (1 H) as well as the polarity signal CMI of the unit circuit 27 during a regular operation and that is at a low level during initialization. The polarity signal CMIZ is inputted to the unit circuit 33 at each stage. The polarity signal CMIZ is generated by a generation circuit 210 constituted by a NAND circuit and an inverter as shown in FIG. 38, and is supplied from the outside of the common electrode driving circuit 200.

(Operation)

In a case where output signals SROUT of the unit circuits 11 at all the stages in the shift register 10 are at a high level during initialization, an operation is carried out as follows (see FIG. 58).

First, in a case where the output signals SROUT become a high level, the transistors T1 are switched on in the unit circuits 33 at all the stages, and the nodes N1 at all the stages are supplied with (short-circuited to) the polarity signal CMIZ. During an undetermined state immediately before initialization, potentials retained at the nodes N1 are also undetermined. Therefore, whether an output of the inverter INV2, connected to the polarity signal CMIZ, at each stage is Vdd (high level) or Vss (low level) is not determined, either.

Here, assuming that the initialization signal INITB connected to the nodes N1 is Vdd, the polarity signal CMIZ is supplied simultaneously to (i) the nodes N1 which are connected to the power supplies VDD of the inverters INV1 and (ii) the nodes N1 which are connected to the power supplies VSS. This causes the power supplies VDD and the power supplies VSS to be short-circuited via the polarity signal CMIZ, thereby generating a large current. As a result, the potentials of the nodes N1 become a midpoint potential. Thus, it is impossible to carry out initialization normally.

However, according to the configuration of the unit circuit 33 of Example 13, both of the polarity signal CMIZ and the initialization signal INITB are regulated to be Vss (low level) during initialization. Therefore, the potentials of the nodes N1 necessarily become Vss (low level). Thus, it is possible to carry out initialization without fail.

On the contrary, in a case where output signals SROUT of the unit circuits 11 at all the stages in the shift register 10 are at a low level during initialization, an operation is carried out as follows (see FIG. 59).

In a case where potentials of the nodes N1 are Vdd (high level) during an undetermined state before initialization, the respective gate terminals of the transistors T5 are Vss (low level) and the transistors T5 are in an ON state. Here, since the initialization signal INITB is Vss (low level) during initialization, the potentials of the nodes N1 become a low level (Vss+Vth) via the transistors T5, which means that the potentials of the nodes N1 drop by a threshold value (Vth). Outputs of the inverter INV1 are supplied to the inverters INV2, so that the inverters INV2 output Vdd. Since the output (nodes N2) of the inverters INV2 are connected to the input of the inverters INV1, outputs (Vdd) of the inverters INV2 are fed back to the inverters INV1, so that the transistors T6 are switched on. As a result, the nodes N1 at Vss+Vth become Vss (low level). Thus, it is possible to carry out initialization without fail.

In a case where potentials of the nodes N1 are Vss (low level) during an undetermined state before initialization, the initialization signal INITB is not supplied to the nodes N1 since the transistors T5 are in an OFF state. However, in this case, the nodes N1 are already at a desired potential (Vss). Thus, this state corresponds to an initialized state.

During a regular operation, the initialization signal INITB is Vdd (high level) and thus the initialization signal INITB carries out the same function as the power supply VDD. Therefore, it is possible to carry out the same operation as the unit circuit 27 of Example 7.

Thus, with the unit circuit 33, it is possible to achieve not only the effect given by the unit circuit 27 of Example 7 but also an effect of initializing the common electrode driving circuit 200 in a stable manner.

The above description has been made for the configuration corresponding to the unit circuit 27 of Example 7 to which the function for initialization is added. However, the function for initialization is applicable to any of the above-described Examples.

Example 14

FIG. 39 is a circuit diagram of a unit circuit 34 included in a common electrode driving circuit 200 of Example 14.

As well as the unit circuit 33 of Example 13, the unit circuit 34 has a function for initializing the common electrode driving circuit 200. Specifically, the unit circuit 34 corresponds to the unit circuit 27 (see FIG. 31) of Example 7 in which the power supply VSS of the inverter INV1 is omitted and an initialization terminal (INIT terminal) is provided. An initialization signal INIT is inputted to a source terminal of a transistor T6 via a resistor R1.

The initialization signal INIT is a signal that is at a low level (Vss) during a regular operation and that is at a high level (Vdd) during initialization (active). A polarity signal CMIZ is a signal that has a polarity inverted for each horizontal scanning period (1 H) as well as the polarity signal CMI of the unit circuit 27 during a regular operation and that is at a high level during initialization. The polarity signal CMIZ is inputted to the unit circuit 34 at each stage. The polarity signal CMIZ is generated by a generation circuit 220 constituted by a NOR circuit and an inverter as shown in FIG. 40, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs of the inverters INV2 are undetermined. However, both of the polarity signal CMIZ and the initialization signal INIT are regulated to be Vdd (high level) during initialization. Therefore, the potentials of the nodes N1 necessarily become Vdd (high level). Thus, it is possible to carry out initialization without fail.

On the contrary, in a case where output signals SROUT of the unit circuits 11 at all the stages in the shift register 10 are at a low level during initialization, an operation is carried out as follows.

In a case where potentials of the nodes N1 are Vss (low level) during an undetermined state before initialization, the respective gate terminals of the transistors T6 are Vdd (high level) and the transistors T6 are in an ON state. Here, since the initialization signal INIT is Vdd (high level) during initialization, the potentials of the nodes N1 become a high level (Vdd-Vth) via the transistors T6, which means that the potentials of the nodes N1 drop to below a threshold value (Vth). Outputs of the inverters INV1 are supplied to the inverters INV2, so that the inverters INV2 output Vss. Since the outputs (nodes N2) of the inverters INV2 are connected to the inputs of the inverters INV1, outputs (Vss) of the inverters INV2 are fed back to the inverters INV1, so that the transistors T5 are switched on. As a result, the nodes N1 at Vdd-Vth become Vdd (high level). Thus, it is possible to carry out initialization without fail.

In a case where potentials of the nodes N1 are Vdd (high level) during an undetermined state before initialization, the initialization signal INIT is not supplied to the nodes N1 since the transistors T6 are in an OFF state. However, in this case, the nodes N1 are already at a desired potential (Vdd). Thus, this state corresponds to an initialized state.

During a regular operation, the initialization signal INIT is Vss (low level) and thus the initialization signal INIT carries out the same function as that of the power supply VSS. Therefore, it is possible to carry out the same operation as the unit circuit 27 of Example 7.

Thus, with the unit circuit 34, it is possible to achieve not only the effect given by the unit circuit 27 of Example 7 but also an effect of initializing the common electrode driving circuit 200 in a stable manner.

Example 15

FIG. 41 is a circuit diagram of a unit circuit 35 included in a common electrode driving circuit 200 of Example 15.

The unit circuit 35 corresponds to the unit circuit 27 of Example 7 additionally having a function for initializing the common electrode driving circuit 200. Specifically, the unit circuit 35 corresponds to the unit circuit 27 (see FIG. 31) of Example 7 in which the power supply VDD of the inverter INV2 is omitted and an initialization terminal (INITB terminal) is provided. An initialization signal INITB is inputted to a source terminal of a transistor T3.

The initialization signal INITB is a signal that is at a high level (Vdd) during a regular operation and that is at a low level (Vss) during initialization (active). A polarity signal CMIZ is a signal that has a polarity inverted for each horizontal scanning period (1 H) as well as the polarity signal CMI of the unit circuit 27 during a regular operation and that is at a high level during initialization. The polarity signal CMIZ is inputted to the unit circuit 35 at each stage. The polarity signal CMIZ is generated by a generation circuit 230 constituted by a NOR circuit and an inverter as shown in FIG. 42, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs (nodes n2) of the inverters INV2 are undetermined. However, during initialization, the polarity signal CMIZ is regulated to be Vdd (high level) and the initialization signal INITB is regulated to be Vss (low level). Therefore, potentials of the nodes N2 become Vss (low level), and outputs (Vss) of the inverters INV2 are fed back to the inverters INV1, so that the transistors T5 are switched on. As a result, the nodes N1 become Vdd. Thus, it is possible to carry out initialization without fail.

On the contrary, in a case where output signals SROUT of the unit circuits 11 at all the stages in the shift register 10 are at a low level during initialization, an operation is carried out as follows.

In a case where potentials of the nodes N2 are Vdd (high level) during an undetermined state before initialization, the respective gate terminals of the transistors T3 are Vss (low level) and the transistors T3 are in an ON state. Here, since the initialization signal INITB is Vss (low level) during initialization, the potentials of the nodes N2 become a low level (Vss+Vth) via the transistors T3, which means that the potentials of the nodes N2 drop to below a threshold value (Vth). Since the outputs (nodes N2) of the inverters INV2 are connected to the inputs of the inverters INV1, outputs (Vss+Vth) of the inverters INV2 are fed back to the inverters INV1, so that the transistors T5 are switched on. As a result, the nodes N1 become Vdd (high level), the transistors T4 are switched on, and the nodes N2 at Vss+Vth become Vss (low level). Thus, it is possible to carry out initialization without fail.

In a case where potentials of the nodes N2 are Vss (low level) during an undetermined state before initialization, the initialization signal INITB is not supplied to the nodes N2 since the transistors T3 are in an OFF state. However, in this case, the nodes N2 are already at a desired potential (Vss). Thus, this state corresponds to an initialized state.

During a regular operation, the initialization signal INITB is Vdd (high level) and thus the initialization signal INITB carries out the same function as that of the power supply VDD. Therefore, it is possible to carry out the same operation as the unit circuit 27 of Example 7.

Thus, with the unit circuit 35, it is possible to achieve not only the effect given by the unit circuit 27 of Example 7 but also an effect of initializing the common electrode driving circuit 200 in a stable manner.

Example 16

FIG. 43 is a circuit diagram of a unit circuit 36 included in a common electrode driving circuit 200 of Example 16.

The unit circuit 36 corresponds to the unit circuit 27 of Example 7 additionally having a function for initializing the common electrode driving circuit 200. Specifically, the unit circuit 36 corresponds to the unit circuit 27 (see FIG. 31) of Example 7 in which the power supply VSS of the inverter INV2 is omitted and an initialization terminal (INIT terminal) is provided. An initialization signal INIT is inputted to a source terminal of a transistor T4.

The initialization signal INIT is a signal that is at a low level (Vss) during a regular operation and that is at a high level (Vdd) during initialization (active). A polarity signal CMIZ is a signal that has a polarity inverted for each horizontal scanning period (1 H) as well as the polarity signal CMI of the unit circuit 27 during a regular operation and that is at a low level during initialization. The polarity signal CMIZ is inputted to the unit circuit 36 at each stage. The polarity signal CMIZ is generated by a generation circuit 240 constituted by a NOR circuit and an inverter as shown in FIG. 44, and is supplied from the outside of the common electrode driving circuit 200.

(Operation)

In a case where output signals SROUT of the unit circuits 11 at all the stages in the shift register 10 are at a high level during initialization, an operation is carried out as follows.

During an undetermined state immediately before initialization, both of (i) potentials of the nodes N1 and (ii) outputs (nodes n2) of the inverters INV2 are undetermined. However, during initialization, the polarity signal CMIZ is regulated to be Vss (low level) and the initialization signal INIT is regulated to be Vdd (high level). Therefore, the potentials of the nodes N2 become Vdd (high level). Thus, outputs (Vdd) of the inverters INV2 are fed back to the inverters INV1, so that the transistors T6 are switched on. As a result, the nodes N1 become Vss. Thus, it is possible to carry out initialization without fail.

On the contrary, in a case where output signals SROUT of the unit circuits 11 at all the stages in the shift register 10 are at a low level during initialization, an operation is carried out as follows.

In a case where potentials of the nodes N2 are Vss (low level) during an undetermined state before initialization, the respective gate terminals of the transistors T4 are Vdd (high level) and the transistors T4 are in an ON state. Here, since the initialization signal INIT is Vdd (high level) during initialization, the potentials of the nodes N2 become a high level (Vdd-Vth) via the transistors T4, which means that the potentials of the nodes N2 drop to below a threshold value (Vth). Since the outputs (nodes N2) of the inverters INV2 are connected to the inputs of the inverters INV1, outputs (Vdd-Vth) of the inverters INV2 are fed back to the inverters INV1, so that the transistors T6 are switched on. As a result, the nodes N1 become Vss (low level), the transistors T3 are switched on, and the nodes N2 at Vdd-Vth become Vdd (high level). Thus, it is possible to carry out initialization without fail.

In a case where potentials of the nodes N2 are Vdd (high level) during an undetermined state before initialization, the initialization signal INIT is not supplied to the nodes N2 since the transistors T4 are in an OFF state. However, in this case, the nodes N2 are already at a desired potential (Vdd). Thus, this state corresponds to an initialized state.

During a regular operation, the initialization signal INIT is Vss (low level) and thus the initialization signal INIT carries out the same function as that of the power supply VSS. Therefore, it is possible to carry out the same operation as the unit circuit 27 of Example 7.

Thus, with the unit circuit 36, it is possible to achieve not only the effect given by the unit circuit 27 of Example 7 but also an effect of initializing the common electrode driving circuit 200 in a stable manner.

Example 17

FIG. 45 is a circuit diagram of a unit circuit 37 included in a common electrode driving circuit 200 of Example 17.

The unit circuit 37 corresponds to the unit circuit 27 of Example 7 additionally having a function for initializing the common electrode driving circuit 200. Specifically, the unit circuit 37 corresponds to the unit circuit 27 (see FIG. 31) of Example 7 in which a P channel type transistor T12 is added and an initialization terminal (INIT terminal) is provided in the inverter INV1. The transistor T12 has a gate terminal supplied with an initialization signal INIT, a source terminal connected to one terminal of a resistor R2, and a drain terminal connected to a source terminal of a transistor T5.

The initialization signal INIT is a signal that is at a low level (Vss) during a regular operation and that is at a high level (Vdd) during initialization (active). A polarity signal CMIZ is a signal that has a polarity inverted for each horizontal scanning period (1 H) as well as the polarity signal CMI of the unit circuit 27 during a regular operation and that is at a low level during initialization. The polarity signal CMIZ is inputted to the unit circuit 37 at each stage. The polarity signal CMIZ is generated by the generation circuit 240 shown in FIG. 44, and is supplied from the outside of the common electrode driving circuit 200.

With this configuration, during initialization, the initialization signal INIT is at a high level, and therefore the transistors T12 are switched off, so that the nodes N1 are disconnected from the power supplies VDD. As a result, the nodes N1 are fixed at a low level (Vss) of the polarity signal CMIZ. Thus, it is possible to carry out initialization without fail.

During a regular operation, the initialization signal INIT is at a low level, and therefore the power supplies VDD are connected to the transistors T5 via the resistors R2 and the transistors T12 which are switched on. Therefore, it is possible to carry out the same operation as the unit circuit 27 of Example 7.

Thus, with the unit circuit 37, it is possible to achieve not only the effect given by the unit circuit 27 of Example 7 but also an effect of initializing the common electrode driving circuit 200 in a stable manner.

Example 18

FIG. 46 is a circuit diagram of a unit circuit 38 included in a common electrode driving circuit 200 of Example 18.

The unit circuit 38 corresponds to the unit circuit 27 of Example 7 additionally having a function for initializing the common electrode driving circuit 200. Specifically, the unit circuit 38 corresponds to the unit circuit 27 (see FIG. 31) of Example 7 in which an N channel type transistor T13 is added and an initialization terminal (INITB terminal) is provided in the inverter INV1. The transistor T13 has a gate terminal supplied with an initialization signal INITB, a source terminal connected to one terminal of a resistor R1, and a drain terminal connected to a source terminal of a transistor T6.

The initialization signal INITB is a signal that is at a high level (Vdd) during a regular operation and that is at a low level (Vss) during initialization (active). A polarity signal CMIZ is a signal that has a polarity inverted for each horizontal scanning period (1 H) as well as the polarity signal CMI of the unit circuit 27 during a regular operation and that is at a high level during initialization. The polarity signal CMIZ is inputted to the unit circuit 38 at each stage. The polarity signal CMIZ is generated by the generation circuit 230 shown in FIG. 42, and is supplied from the outside of the common electrode driving circuit 200.

With this configuration, during initialization, the initialization signal INITB is at a low level, and therefore the transistors T13 are switched off, so that the nodes N1 are disconnected from the power supplies VSS. As a result, the nodes N1 are fixed at a high level (Vdd) of the polarity signal CMIZ. Thus, it is possible to carry out initialization without fail.

During a regular operation, the initialization signal INITB is at a high level, and therefore the power supplies VSS are connected to the transistors T6 via the resistors R1 and the transistors T13 which are switched on. Therefore, it is possible to carry out the same operation as the unit circuit 27 of Example 7.

Thus, with the unit circuit 38, it is possible to achieve not only the effect given by the unit circuit 27 of Example 7 but also an effect of initializing the common electrode driving circuit 200 in a stable manner.

Example 19

FIG. 47 is a circuit diagram of a unit circuit 39 included in a common electrode driving circuit 200 of Example 19.

The unit circuit 39 corresponds to the unit circuit 27 of Example 7 additionally having a function for initializing the common electrode driving circuit 200. Specifically, the unit circuit 39 corresponds to the unit circuit 27 (see FIG. 31) of Example 7 in which an N channel type transistor T14 is added for the node N1 and an initialization terminal (INIT terminal) is provided. The transistor T14 has a gate terminal supplied with an initialization signal INIT, a source terminal supplied with a power supply voltage Vss, and a drain terminal connected to the node N1.

The initialization signal INIT is a signal that is at a low level (Vss) during a regular operation and that is at a high level (Vdd) during initialization (active). A polarity signal CMIZ is a signal that has a polarity inverted for each horizontal scanning period (1 H) as well as the polarity signal CMI of the unit circuit 27 during a regular operation and that is at a low level during initialization. The polarity signal CMIZ is inputted to the unit circuit 39 at each stage. The polarity signal CMIZ is generated by the generation circuit 240 shown in FIG. 44, and is supplied from the outside of the common electrode driving circuit 200.

With this configuration, during initialization, the initialization signal INIT is at a high level, and therefore the transistors T14 are switched on, so that potentials of the nodes N1 are made closer to a power supply voltage Vss. This makes it possible to forcibly fix the nodes N1 at a low level (Vss). Thus, it is possible to carry out initialization without fail.

During a regular operation, the initialization signal INIT is at a low level, and therefore the nodes N1 are disconnected from the power supplies VSS. Therefore, it is possible to carry out the same operation as the unit circuit 27 of Example 7.

Thus, with the unit circuit 39, it is possible to achieve not only the effect given by the unit circuit 27 of Example 7 but also an effect of initializing the common electrode driving circuit 200 in a stable manner.

Example 20

FIG. 48 is a circuit diagram of a unit circuit 21x included in a common electrode driving circuit 200 of Example 20. In the unit circuit 21x, transistors T5 and T6 configuring an inverter INV1x are set to have channel lengths L identical with those of transistors T3 and T4 configuring an inverter INV2. In other words, all transistors configuring the inverters INV1 and INV2 are set to have identical sizes. Further, the unit circuit 21x is set so that a polarity signal CMI to be supplied to an input terminal INc has an increased driving capability. The unit circuit 21x is configured, for instance, so that an input line of the polarity signal CMI has a wiring resistor smaller than that of a connection line of the inverters INV1 and INV2.

According to this configuration, even in a case where an output signal SROUT(k−1) is at a high level (active) and thus Vss (low level) of a polarity signal CMI and a power supply VDD (high level) are short-circuited, a potential of the node N1 is made closer to the polarity signal CMI since the polarity signal CMI has a high driving capability. Thus, the potential of the node N1 decreases to a potential close to Vss (low level) of the polarity signal CMI (potential lower than an inverted potential of the inverter INV2), and thereafter decreases to Vss due to feedback of an output (Vdd) of the inverter INV2. Further, even in a case where Vdd (high level) of the polarity signal CMI and a power supply VSS (low level) are short-circuited, a potential of the node N1 is made closer to the polarity signal CMI since the polarity signal CMI has a high driving capability. Thus, the potential of the node N1 increases to a potential close to Vdd of the polarity signal CMI (potential higher than an inverted potential of the inverter INV2), and thereafter increases to Vdd due to feedback of an output (Vss) of the inverter INV2.

As such, Example 20 can obtain an effect similar to that of Example 1 and the like. The configuration of Example 20 is applicable to any of the above-described Examples.

The following description will discuss specific configurations for increasing the driving capability of the polarity signal CMI.

(a) of FIG. 60 is a block diagram illustrating unit circuits 21 and a CMI buffer section 60. (b) of FIG. 53 is a circuit diagram thereof. The unit circuits 21 may each be a unit circuit of any of the above-described Examples. FIG. 60 schematically illustrates the unit circuits 21 in a simplified manner for convenience. The polarity signal CMI is supplied to the unit circuits 21 via the CMI buffer section 60. Referring now to (b) of FIG. 60, in a case where a polarity signal CMI is to be written to the unit circuits 21, if the relations below hold for a unit circuit 21 of which the analog switch circuit SW1 is in an ON state, that unit circuit 21 can retain a desired value.

r2+r3+r4<r5 (for a case where a polarity signal CMI at a low level is to be written to a node N1)

r1+r3+r4<r6 (for a case where a polarity signal CMI at a high level is to be written to a node N1)

Thus, for an increased driving capability of the polarity signal CMI, it is simply necessary that (i) the CMI buffer section 60 be configured so that a channel width W is increased for decreased resistance values of the resistors r1 and r2, that (ii) a resistance value of a wiring resistor r3 be decreased, or that (iii) a resistance value of a resistor r4 of the analog switch circuit SW1 be decreased. Alternatively, a channel length L may be increased or a resistor may be inserted as in other Examples for increased resistance values of resistors r5 and r6.

The above-described relations apply to a case where an inverted potential of the inverter section INV2 is at a center between the power supply Vss and the power supply Vdd. In a case where the inverted potential is not at the center, respective resistance values of the resistors r1, r3, and r4 may simply be decreased so that the inverted potential exceeds the center.

(a) of FIG. 61 is a block diagram illustrating unit circuits 21 and an IC circuit 61. (b) of FIG. 61 is a circuit diagram thereof. The unit circuits 21 are supplied with an output signal of the IC circuit 61 as a polarity signal CMI. In a case where the unit circuits 21 each include, for example, a transistor that includes polysilicon, amorphous silicon, IGZO or the like on, for example, a glass substrate and that has a relatively low electron or positive hole carrier mobility, the unit circuit 21 includes a transistor having an extremely high resistance value. Thus, the relations below easily hold in a case where a line of the polarity signal CMI is to be driven with use of a circuit that includes, for example, monocrystalline silicon and that has an extremely low output impedance.

r7+r3+r4<r5 (for a case where a polarity signal CMI at a low level is to be written to a node N1)

r7+r3+r4<r6 (for a case where a polarity signal CMI at a high level is to be written to a node N1)

In addition, for an increased driving capability of the polarity signal CMI, (i) a resistance value of a wiring resistor r3 may be decreased, or (ii) a resistance value of a resistor r4 of the analog switch circuit SW1 may be decreased. Alternatively, a channel length L may be increased or a resistor may be inserted as in other Examples for increased resistance values of resistors r5 and r6.

The above-described relations apply to a case where an inverted potential of the inverter section INV2 is at a center between the power supply Vss and the power supply Vdd. In a case where the inverted potential is not at the center, respective resistance values of the resistors r7, r3, and r4 may simply be decreased so that the inverted potential exceeds the center.

Example 21

FIG. 49 is a circuit diagram of a unit circuit 21y included in a common electrode driving circuit 200 of Example 21. The unit circuit 21y is identical in configuration with the unit circuit 21 of Example 1 (see FIG. 23) except that an output terminal 'out' of a latch circuit 21a is connected to a node N1 and that an input terminal INc is supplied with a polarity signal CMIB (an inversion signal of CMI).

According to this configuration, even in a case where an output signal SROUT(k−1) is at a high level (active) and thus Vss (low level) of a polarity signal CMIB and a power supply VDD (high level) are short-circuited, a potential of the node N1 is made closer to the polarity signal CMIB since the transistor T5 of the inverter INV1 is set to have a long channel length L and therefore has a low driving capability. Thus, the potential of the node N1 decreases to a potential close to Vss (low level) of the polarity signal CMIB (potential lower than an inverted potential of the inverter INV2), and thereafter decreases to Vss due to feedback of an output (Vdd) of the inverter INV2. Further, even in a case where Vdd (high level) of the polarity signal CMIB and a power supply VSS (low level) are short-circuited, a potential of the node N1 is made closer to the polarity signal CMIB since the transistor T6 of the inverter INV1 is set to have a long channel length L and therefore has a low driving capability. Thus, the potential of the node N1 increases to a potential close to Vdd of the polarity signal CMIB (potential higher than an inverted potential of the inverter INV2), and thereafter increases to Vdd due to feedback of an output (Vss) of the inverter INV2. In a case where the polarity signal CMIB is Vss (low level), Vcomh is outputted via a buffer 21b, whereas in a case where the polarity signal CMIB is Vdd (high level), Vcoml is outputted via a buffer 21b.

As such, Example 21 can obtain an effect similar to that of Example 1 and the like. The configuration of Example 21 is applicable to any of the above-described Examples.

(Switching of Scanning Direction)

The liquid crystal display device 2 may, similarly to the liquid crystal display device 1 of Embodiment 1, further include switch circuits UDSW each for switching a scanning direction (shift direction) of a shift register 10. FIG. 50 is a block diagram illustrating a variation of the liquid crystal display device 2. FIG. 51 is a circuit diagram illustrating how the switch circuit UDSW is connected to a kth unit circuit 21 included in the common electrode driving circuit 200 of Example 1.

The switch circuit UDSW includes N channel type transistors Tu1 and Tu2. The transistor Tu1 has a source terminal connected to an input terminal INa, a drain terminal connected to an output terminal OUT, and a gate terminal supplied with a switching signal UD. The transistor Tu2 has a source terminal connected to an input terminal INb, a drain terminal connected to an output terminal OUT, and a gate terminal supplied with a switching signal UDB (an inversion signal of UD). The switch circuit UDSW has an output terminal connected to an input terminal INs of the unit circuit 21. For the kth unit circuit 21, the input terminal INa of the switch circuit UDSW is supplied with an output signal SROUT(k−1) of a (k−1)th unit circuit 11 of the shift register 10, whereas the input terminal INb of the switch circuit UDSW is supplied with an output signal SROUT(k+1) of a (k+1)th unit circuit 11 of the shift register 10.

The switching signals UD and UDB are opposite to each other in polarity. In a case where the switching signal UD is at a high level (the switching signal UDB is at a low level), the transistor Tu1 is in an ON state, and the output signal SROUT (k−1) is supplied from the switch circuit UDSW to the kth unit circuit 21. In a case where the switching signal UDB at a high level (the switching signal UD is at a low level), the transistor Tu2 is in an ON state, and the output signal SROUT (k+1) is supplied from the switch circuit UDSW to the kth unit circuit 21.

The above arrangement allows switching the scanning direction of the shift register 10 between a first direction (from the first stage to an nth stage) and a second direction (from the nth stage to the first stage). The switch circuit UDSW may be used in any of the above-described Examples. As examples, FIG. 52 illustrates a unit circuit 40 that corresponds to the unit circuit 27 of Example 7 and that further includes a switch circuit UDSW, and FIG. 53 illustrates a unit circuit 41 that corresponds to the unit circuit 33 of Example 13 and that further includes a switch circuit UDSW. Including a switch circuit UDSW increases a difference between (i) a potential raised by a bootstrap operation and (ii) a potential of a gate terminal of a transistor in the switch circuit UDSW which transistor has a gate terminal supplied with a low-level signal. In each of the unit circuits 40 and 41 of FIGS. 52 and 53, however, a transistor T9 functions as a pressure-resistant transistor.

FIG. 62 is a diagram illustrating another configuration of the switch circuit UDSW. FIG. 62 illustrates a switch circuit UDSW' including N channel type transistors Tu1 and Tu2 and P channel type transistors Tu3 and Tu4. The switch circuit UDSW' allows an inverter INV3 to receive a signal free from a threshold drop.

FIG. 54 illustrates a planar layout of the unit circuit 40 of FIG. 52. FIG. 55 illustrates a cross-sectional view of the unit circuit 40 taken along line A1-A2 in FIG. 54. As shown in FIGS. 54 and 55, making the resistors R1 and R2 of a portion (silicon) forming a channel of a transistor allows the resistors R1 and R2 to be positioned below a source metal and laid out in any pattern unlike a transistor. In addition, a silicon semiconductor has a sheet resistance value that is approximately tens of thousands times larger than that of a gate or a source. This allows a layout area to be reduced greatly.

In the above-described Examples, a single unit circuit of the common electrode driving circuit 200 is provided corresponding to a single unit circuit 11 of the shift register 10. However, the present invention is not limited thereto. Plural unit circuits of the common electrode driving circuit 200 may be provided corresponding to a single unit circuit 11 of the shift register 10. FIG. 56 is a block diagram illustrating another configuration of the common electrode driving circuit 200. FIG. 57 is a timing chart at the time of an operation of the common electrode driving circuit 200. As shown in FIG. 56, plural unit circuits 21 are provided corresponding to a single unit circuit 11, and are each supplied with an output of a pulse output section OP (see FIGS. 56 and 63). This can reduce the number of unit circuits 11 included in the shift register 10, thereby further reducing the circuit scale.

In the common electrode driving circuit 200 of each of the above-described Examples, the inverters INV1 and INV2 configuring a unit circuit (retention circuit) are each a CMOS inverter (see (a) of FIG. 64). However, the unit circuit of the present invention is not limited thereto. The inverters INV1 and INV2 may each be a NMOS inverter (see (b) of FIG. 64) or a PMOS inverter (see (c) of FIG. 64). (d) to (f) of FIG. 64 are each a diagram illustrating another example configuration of the inverters INV1 and INV2 of the unit circuit of the present invention.

Assuming that, when a transistor is ON, a threshold value of a next transistor to be connected is Vth, the NMOS inverter can be used as an inverter by having such a sufficiently high resistance value Rn that an output OUT is lower than Vss+ Vth. Assuming that, when a transistor is ON, a threshold value of a next transistor to be connected is Vth, the PMOS inverter can be used as an inverter by having such a sufficiently high resistance value Rp that an output OUT is higher than Vdd-Vth. Including a NMOS inverter or a PMOS inverter can reduce the number of transistors, thereby reducing the circuit scale.

Further, in a case where, for instance, the resistors R1 and R2 are provided as in FIG. 26, using a NMOS inverter allows a resistor Rn to further serve a function of the resistor R2, whereas using a PMOS inverter allows a resistor Rp to further serve a function of the resistor R1. This can reduce the circuit scale (layout scale).

Embodiment 3

The description below deals with Embodiment 3 of the present invention with reference to drawings. For convenience of explanation, members of Embodiment 3 that are identical in function with their respective corresponding members of Embodiments 1 and 2 above are each assigned an identical reference numeral, and are not described here. Further, the terms defined in Embodiments 1 and 2 are also used in Embodiment 3 as so defined unless otherwise stated.

FIG. 65 is a block diagram illustrating a schematic configuration of a liquid crystal display device 3 of Embodiment 3. The liquid crystal display device 3 includes a scanning signal line driving circuit 100, a retention capacitor line driving circuit 500, a data signal line driving circuit 300, and a display panel 400. Note that the driving circuits and pixel circuits may be monolithically formed on an active matrix substrate.

The display panel 400 is driven by the scanning signal line driving circuit 100, the retention capacitor line driving circuit 500, the data signal line driving circuit 300, and control circuits for controlling those circuits 100, 500, and 300.

The retention capacitor line driving circuit 500 supplies each retention capacitor line 46 with a high-level signal (Vcsh) (modulation signal) or a low-level signal (Vcsl) (modulation signal) on the basis of an output signal (SROUT) of a shift register 10 included in the scanning signal line driving circuit 100 of the liquid crystal display device 1 of Embodiment 1.

The control circuits control the scanning signal line driving circuit 100, the retention capacitor line driving circuit 500, and the data signal line driving circuit 300 to output gate signals, source signals, and CS signals.

The liquid crystal display device 3 of Embodiment 3 is configured to carry out a stable operation by preventing a decrease in potential level of respective output signals of the scanning signal line driving circuit 100 and the retention capacitor line driving circuit 500 while reducing a circuit area. The following description will discuss specific configurations of the scanning signal line driving circuit 100 and the retention capacitor line driving circuit 500.

The shift register 10 configuring the scanning signal line driving circuit 100 is, as described in the Examples of Embodiment 1, configured by connecting multiple m (where m is an integer of 2 or more) unit circuits 11. Each of the unit circuits 11 is made up of a clock terminal (CK terminal), a set terminal (S terminal), a reset terminal (R terminal), an initialization terminal (INITB terminal), and an output terminal OUT.

To the shift register 10, a start pulse (not shown) and double-phase clock signals CK1 and CK2 are supplied from the outside. The start pulse is supplied to an S terminal of a first unit circuit 11. The clock signals CK1 are supplied to CK terminals of (odd-number)th unit circuits 11, meanwhile, the clock signals CK2 are supplied to CK terminals of (even-number)th unit circuits 11. An output of each unit circuit 11, which is as an output signal SROUT, is supplied, via an output terminal OUT, to a corresponding scanning signal line GL, to an S terminal of a subsequent unit circuit 11, and to an R terminal of a preceding unit circuit 11. Further, the output signal SROUT of the each unit circuit 11 is supplied to a corresponding unit circuit 51 of the retention capacitor line driving circuit 500.

Specifically, as shown in FIG. 65, an output signal SROUT (k−1) of a (k−1)th unit circuit 11 is supplied to an S terminal of a kth (where k is an integer of 1 or more but m or less) unit circuit 11 of the shift register 10, and the kth unit circuit 11 supplies an output signal SROUTk to a scanning signal line GLk. As described above, the shift register 10 outputs output signals SROUT1 to SROUTm sequentially to scanning signal lines GL1 to GLm, respectively, in accordance with a shift operation.

The retention capacitor line driving circuit 500 is configured by connecting multiple n (where n is an integer of 2 or more) unit circuits 51 (retention circuits). Each of the unit circuits 51 is made up of input terminals INs, INc and an output terminal OUT. The output signal SROUT of the shift register 10 is supplied to the input terminal INs of the unit circuit 51, a polarity signal CMI is supplied to the input terminal INc of the unit circuit 51, and an output from the unit circuit 51 is supplied, as output signals CSOUT1 to CSOUTn, sequentially to retention capacitor lines (CS lines) CSL1 to CSLn, respectively.

Specifically, as shown in FIG. 65, an output signal SROUT (k+1) of a (k+1)th unit circuit 11 of the shift register 10 is supplied to a kth (where k is an integer of 1 or more but n or less) unit circuit 51 of the retention capacitor line driving circuit 500, and the kth unit circuit 51 supplies an output signal CSOUTk to a retention capacitor line CSLk. As described above, the retention capacitor line driving circuit 500 supplies output signals CSOUT1 to CSOUTn sequentially to retention capacitor lines CSL1 to CSLn, respectively, in accordance with a shift operation of the shift register 10.

As the shift register 10 of the liquid crystal display device 3, any one of the shift registers of Examples described in Embodiment 1 is applicable. The following description will mainly discuss the retention capacitor line driving circuit 500.

Example 1

FIG. 66 is a circuit diagram of the unit circuit 51 included in the retention capacitor line driving circuit 500 of Example 1. The unit circuit 51 (retention circuit) includes a latch through circuit 51a and a buffer 51b. The latch through circuit 51a includes inverters INV1 and INV2, and an analog switch circuit SW1b. The buffer 51b includes two transistors. The inverter INV1 is provided with resistors R1 and R2. Hereinafter, in the inverter INV2, a connection point between an output of the inverter INV1 and an input of the inverter INV2 is defined as a node N1 and a connection point between an input of the inverter INV1 and an output of the inverter INV2 is defined as a node N2 (see FIG. 66).

The analog switch circuit SW1b includes an N channel type transistor T1, a transistor T9, and a capacitor C1. The transistor T9 has a gate terminal supplied with a power supply voltage Vdd, a source terminal connected to an input terminal INs, and a drain terminal connected to a gate terminal of a transistor T1. The capacitor C1 is provided between the gate terminal and drain terminal of the transistor T1. Note that a connection point between the capacitor C1 and the gate terminal of the transistor T1 is defined as a node N3. The transistor T1 has a source terminal connected to an input terminal INc. An output signal SROUT of the unit circuit 11 of the shift register 10 is supplied to the input terminal INs, meanwhile, a polarity signal CMIZ is supplied to the input terminal INc.

The inverter INV2 is made up of a P channel type transistor T3 and an N channel type transistor T4. An input terminal (connection point (node N1) between a gate terminal of the transistor T3 and a gate terminal of the transistor T4) of the inverter INV2 is connected to an output terminal (drain terminal of the transistor T1) of the analog switch circuit SW1b. A power supply voltage Vdd is supplied to a source terminal of the transistor T3, meanwhile, a drain terminal of the transistor T3 is connected to an output terminal (connection point (node N2) between the drain terminal of the transistor T3 and a drain terminal of the transistor T4) of the inverter INV2. A power supply voltage Vss is supplied to the source terminal of the transistor T4, meanwhile, the drain terminal of the transistor T4 is connected to the output terminal (node N2) of the inverter INV2. The node N2 is connected to an output terminal 'out' of the latch through circuit 51a and an input terminal (gate terminals of transistors T5 and T6) of the inverter INV1.

The inverter INV1 includes a P channel type transistor T5, an N channel type transistor T6, and resistors R1 and R2, and is further provided with an initialization terminal (INITB terminal). The input terminal (gate terminals of the transistors T5 and T6) of the inverter INV1 is connected to the output terminal (node N2) of the inverter INV2. An initialization signal INITB is supplied to a source terminal of the transistor T5 via the resistor R2, and a drain terminal of the transistor T5 is connected to an output terminal (connection point between the drain terminal of the transistor T5 and a drain terminal of the transistor T6) of the inverter INV1. A power supply voltage Vss is supplied to a source terminal of the transistor T6 via the resistor R1, and the drain terminal of the transistor T6 is connected to the output terminal of the inverter INV1. The output terminal of the inverter INV1 is connected to the input terminal (node N1) of the inverter INV2. The output terminal 'out' of the latch through circuit 51a is connected to an input terminal 'in' of the buffer 51b.

The buffer 51b includes a P channel type transistor T7 and an N channel type transistor T8. Gate terminals of the transistors T7 and T8 are connected to the input terminal 'in'. A power supply voltage Vcsh is supplied to a source terminal of the transistor T7, and a drain terminal of the transistor T7 is connected to the output terminal OUT of the unit circuit 51. A power supply voltage Vcsl is supplied to a source terminal of the transistor T8, and a drain terminal of the transistor T8 is connected to the output terminal OUT of the unit circuit 51.

Therefore, the output signal SROUT(k+1) of the (k+1)th unit circuit 11 of the shift register 10 of Embodiment 1 is supplied to the input terminal INs of the kth unit circuit 51, and the output signal CSOUTk is supplied to the kth retention capacitor line CSLk via the output terminal OUT of the kth unit circuit 51.

The retention capacitor line driving circuit 500, including the unit circuit 51 configured as described above, sequentially outputs output signals CSOUT1 to CSOUTn one by one, whose voltages are alternately changed (high level (Vcsh) or low level (Vcsl)) in each frame. Hereinafter, potentials of signals inside the retention capacitor line driving circuit 500, including the clock signals CK1 and CK2, and potentials of input and output signals are defined to be Vdd in the case where the potentials are at a high level, and are defined to be Vss in the case where the potentials are at a low level, unless otherwise specified. The initialization signal INITB is a signal that is at a high level (Vdd) during a regular operation and that is at a low level (Vss) during initialization. Further, a potential of the polarity signal CMIZ is also defined to be Vdd in the case where the potential is at a high level, and is defined to be Vss in the case where the potential is at a low level. Note, however, that a potential level of the polarity signal CMIZ is not limited thereto, and "high level" only needs to be higher than an inverted potential of the inverter INV2, whereas "low level" only needs to be lower than the inverted potential of the inverter INV2.

(Operation)

An operation of the retention capacitor line driving circuit 500 will be described with reference to FIGS. 67 and 68. FIG. 67 is a timing chart at the time of an operation of the retention capacitor line driving circuit 500. FIG. 68 is a schematic view showing a timing chart at the time of an operation of the retention capacitor line driving circuit 500. In FIG. 67, input and output signals are illustrated in the (k−1)th unit circuit 51, the kth unit circuit 51, and a (k+1)th unit circuit 51, as well as a potential of a pixel P corresponding to each stage.

CK1 is a clock signal to be supplied to each of the CK terminals of the (odd-number)th unit circuits 51, meanwhile, CK2 is a clock signal to be supplied to each of the CK terminals of the (even-number)th unit circuits 51. CMIZ is a signal (polarity signal) whose polarity is inverted in each horizontal scanning period (1 H) during a regular operation similarly to CMI and is at a low level during initialization. SR(k−1), SRk, SR(k+1), and SR(k+2) indicate potentials of output signals SROUT(k−1), SROUTk, SROUT(k+1), and SROUT(k+2) of a (k−1)th unit circuit 11, a kth unit circuit 11, a (k+1)th unit circuit 11, and a (k+2)th unit circuit 11, respectively, of the shift register 10. N1 and N2 indicate a potential of the node N1 and a potential of the node N2, respectively, of FIG. 66. CS(k−1), CSk, and CS(k+1) indicate output signals CSOUT(k−1), CSOUTk, and CSOUT(k+1) of the (k−1)th unit circuit 51, the kth unit circuit 51, and the (k+1)th unit circuit 51, respectively, of the retention capacitor line driving circuit 500. S indicates a data signal having a waveform in which its polarity is identical for all pixels in a row and reversed for each row (horizontal scanning period) (one line (1 H) inversion driving). Note that a period after the output signal SROUTk is outputted but until the next output signal SROUTk is outputted corresponds to one vertical scanning period (1 frame: 1 V). Further, FIG. 67 shows arbitrary sequential frames F(t), F(t+1), and F(t+2). Note that the initialization signal INITB is at a high level (Vdd).

First, the following description will discuss a kth pixel Pk (one of the pixels connected to a scanning signal line GLk) and operations in the frames F(t), F(t+1) of the kth unit circuit 51.

In the frame F(t), when the output signal SROUTk of the kth unit circuit 11 of the shift register 10 becomes the high level (active), the scanning signal line GLk becomes active, thereby writing a data signal S (negative polarity) to the pixel Pk. Then, when the output signal SROUT(k+1) of the (k+1)th unit circuit 11 of the shift register 10 becomes the high level (active), the output signal SROUT(k+1) (high level) is supplied to an input terminal INs of the kth unit circuit 51, with the result that a polarity signal CMIZ (low level; Vss) is received by the latch through circuit 51a.

Immediately before the output signal SROUT(k+1) becomes a high level (active), a potential of the node N1 is retained at Vdd (high level) and the transistor T5 is in an ON state. Therefore, when the output signal SROUT(k+1) becomes the high level (active), Vss (low level) of the polarity signal CMIZ and an INITB terminal (high level) are short-circuited. As to this point, a resistor R2 is provided between the INITB terminal and the node N1. Therefore, a potential of the node N1 is made closer to that of the polarity signal CMIZ, thereby decreasing to a potential (potential lower than an inverted potential of the inverter INV2) which is close to Vss (low level) of the polarity signal CMIZ (see FIG. 68).

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMIZ to Vss (see FIG. 68).

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 51a. In addition, in the buffer 51b, to which Vdd (high level) is supplied, the transistor T7 is switched off, whereas the transistor T8 is switched on. As such, Vcsl is outputted from the buffer 51b and is supplied to a kth retention capacitor line CSLk. Immediately before the output signal SROUT(k+1) becomes a high level (active), the potential of the node N1 is retained at Vdd (high level), and the kth retention capacitor line CSLk thus has a potential of Vcsh. Therefore, a potential of the kth retention capacitor line CSLk changes from Vcsh to Vcsl, thereby causing a floating potential of the pixel Pk to fall (potential shift).

Then, the output signal SROUT(k+1) of the shift register 10 changes from the high level (active) to the low level (non-active), the transistor T1 is switched off, and therefore an input of the polarity signal CMIZ is interrupted, with the result that the node N1 retains the potential (Vss (low level)) which has been retained, immediately before such interruption, by a latch operation of the inverters INV1 and INV2, and the buffer 51b keeps supplying the Vcsl to the kth retention capacitor line CSLk until the output signal SROUT(k+1) becomes the high level (active) in the frame F(t+1). The pixel Pk retains a potential achieved after the fall (shift).

Next, in the frame F(t+1), when the output signal SROUTk of the kth unit circuit 11 of the shift register 10 becomes the high level (active), the scanning signal line GLk becomes active, thereby writing a data signal S (positive polarity) to the pixel Pk. Then, when the output signal SROUT(k+1) of the (k+1)th unit circuit 11 of the shift register 10 becomes the high level (active), a potential of the node N3 is charged to Vdd-Vth, and thereafter the transistor T9 is switched off. The node N1 is supplied with Vdd (high level) of a polarity signal CMIZ, since the transistor T1 is switched on by the output signal SROUT(k+1) (high level). Consequently, the potential of the node N1 starts to increase from Vss (low level) to Vdd (high level). Due to the change in the potential of the node N1, a potential of the node N3 is caused to rise to Vdd-Vth+α via the capacitor C1. As a result, the polarity signal CMIZ (Vdd) is inputted to the node N1 without a threshold (Vth) drop. Thus, the potential of the node N1 becomes Vdd (bootstrap operation).

Immediately before the output signal SROUT(k+1) becomes a high level (active) (frame F(t)), the potential of the node N1 is retained at Vss (low level) and the transistor T6 is in an ON state. Therefore, when the output signal SROUT(k+1) becomes the high level (active), Vdd (high level) of the polarity signal CMIZ and a power supply Vss (low level) are short-circuited. As to this point, a resistor R1 is provided between the power supply VSS and the node N1. Therefore, the potential of the node N1 is made closer to that of the polarity signal CMIZ, thereby increasing to a potential (potential lower than an inverted potential of the inverter INV2) which is close to Vdd (high level) of the polarity signal CMIZ (see FIG. 68).

Thereafter, an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMIZ to Vdd (see FIG. 68).

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 51a. In addition, in the buffer 51b, to which Vss (low level) is supplied, the transistor T8 is switched off, whereas the transistor T7 is switched on. As such, Vcsh is outputted from the buffer 51b and is supplied to a kth retention capacitor line CSLk. Immediately before the output signal SROUT(k+1) becomes a high level (active) (frame F(t)), the potential of the node N1 is retained at Vss (low level), and the kth retention capacitor line CSLk thus has a potential of Vcsl. Therefore, a potential of the kth retention capacitor line CSLk changes from Vcsl to Vcsh, thereby causing a floating potential of the pixel Pk to rise (potential shift).

Then, the output signal SROUT(k+1) of the shift register 10 changes from the high level (active) to the low level (non-active), the analog switch circuit SW1 is switched off, and therefore an input of the polarity signal CMIZ is interrupted, with the result that the node N1 retains the potential (Vdd (high level)) which has been retained, immediately before such interruption, by a latch operation of the inverters INV1 and INV2, and the buffer 51b keeps supplying the Vcsh to the kth retention capacitor line CSLk until the output signal SROUT(k+1) becomes the high level (active) in the frame F(t+2). The pixel Pk retains a potential achieved after the rise (shift). After the frame F(t+2), the operations in the frames F(t), F(t+1) are repeated.

Next, the following description will discuss a (k+1)th pixel Pk and operations in the frames F(t), F(t+1) of the kth unit circuit 51.

In the frame F(t), when the output signal SROUT(k+1) of the (k+1)th unit circuit 11 of the shift register 10 becomes the high level (active), the scanning signal line GL(k+1) becomes active, thereby writing a data signal S (positive polarity) to the pixel P(k+1). Then, when the output signal SROUT(k+2) of the (k+2)th unit circuit 11 of the shift register 10 becomes the high level (active), the output signal SROUT(k+2) (high level) is supplied to an input terminal INs of the (k+1) unit circuit 51, with the result that a potential of the node N3 is charged to Vdd-Vth, and thereafter the transistor T9 is switched off. The node N1 is supplied with Vdd (high level) of a polarity signal CMIZ, since the transistor T1 is switched on by the output signal SROUT(k+2) (high level). Consequently, the potential of the node N1 starts to increase from Vss (low level) to Vdd (high level). Due to the change in the potential of the node N1, a potential of the node N3 is caused to rise to Vdd-Vth+α via the capacitor C1. As a result, the polarity signal CMIZ (Vdd) is inputted to the node N1 without a threshold (Vth) drop. Thus, the potential of the node N1 becomes Vdd (bootstrap operation).

Immediately before the output signal SROUT(k+2) becomes a high level (active), the potential of the node N1 is retained at Vss (low level) and the transistor T6 is in an ON state. Therefore, when the output signal SROUT(k+2) becomes the high level (active), Vdd (high level) of the polarity signal CMIZ and a power supply Vss (low level) are short-circuited. As to this point, a resistor R1 is provided between the power supply VSS and the node N1. Therefore, the potential of the node N1 is made closer to that of the polarity signal CMIZ, thereby increasing to a potential (potential lower than an inverted potential of the inverter INV2) which is close to Vdd (high level) of the polarity signal CMIZ.

Thereafter, the transistor T4 is switched on, and an output (node N2; Vss (low level)) of the inverter INV2 is fed back to the input of the inverter INV1, which results in switching on the transistor T5 and switching off the transistor T6. This further increases the potential of the node N1 from the potential close to Vdd of the polarity signal CMIZ to Vdd.

The potential of the node N1 becomes close to Vdd (high level) or becomes Vdd (high level), which results in switching on the transistor T4 of the inverter INV2 and switching off the transistor T3 of the inverter INV2. This switching on of the transistor T4 causes the potential of the node N2 to be Vss (low level), and Vss (low level) is outputted from the latch through circuit 51a. In addition, in the buffer 51b, to which Vss (low level) is supplied, the transistor T8 is switched off, whereas the transistor T7 is switched on. As such, Vcsh is outputted from the buffer 51b and is supplied to a (k+1)th retention capacitor line CSL(k+1). Immediately before the output signal SROUT(k+2) becomes a high level (active) (frame F(t)), the potential of the node N1 is retained at Vss (low level), and the (k+1)th retention capacitor line CSL(k+1) thus has a potential of Vcsl. Therefore, a potential of the (k+1)th retention capacitor line CSL(k+1) changes from Vcsl to Vcsh, thereby causing a floating potential of the pixel P(k+1) to rise (potential shift).

Then, the output signal SROUT(k+2) of the shift register 10 changes from the high level (active) to the low level (non-active), the analog switch circuit SW1 is switched off, and therefore an input of the polarity signal CMIZ is interrupted, with the result that the node N1 retains the potential (Vdd (high level)) which has been retained, immediately before such interruption, by a latch operation of the inverters INV1 and INV2, and the buffer 51b keeps supplying the Vcsh to the (k+1)th retention capacitor line CSL(k+1) until the output signal SROUT(k+2) becomes the high level (active) in the frame F(t+1). The pixel P(k+1) retains a potential achieved after the rise (shift).

Next, in the frame F(t+1), when the output signal SROUT(k+1) of the (k+1)th unit circuit 11 of the shift register 10 becomes the high level (active), the scanning signal line GL(k+1) becomes active, thereby writing a data signal S (negative polarity) to the pixel P(k+1). Then, when the output signal SROUT(k+2) of the (k+2)th unit circuit 11 of the shift register 10 becomes the high level (active), a polarity signal CMIZ (low level; Vss) is received by the latch through circuit 51a.

Immediately before the output signal SROUT(k+2) becomes a high level (active) (frame F(t)), the potential of the node N1 is retained at Vdd (high level) and the transistor T5 is in an ON state. Therefore, when the output signal SROUT(k+2) becomes the high level (active), Vss (low level) of the polarity signal CMIZ and a power supply VDD (high level) are short-circuited. As to this point, a resistor R2 is provided between the INITB terminal and the node N1. Therefore, the potential of the node N1 is made closer to that of the polarity signal CMIZ, thereby decreasing to a potential (potential lower than an inverted potential of the inverter INV2) which is close to Vss (low level) of the polarity signal CMIZ.

Thereafter, the transistor T3 is switched on, and an output (node N2; Vdd (high level)) of the inverter INV2 is fed back to the input of the inverter INV1, which results in switching off the transistor T5 and switching on the transistor T6. This further decreases the potential of the node N1 from the potential close to Vss of the polarity signal CMIZ to Vss.

The potential of the node N1 becomes close to Vss (low level) or becomes Vss (low level), which results in switching on the transistor T3 of the inverter INV2 and switching off the transistor T4 of the inverter INV2. This switching on of the transistor T3 causes the potential of the node N2 to be Vdd (high level), and Vdd (high level) is outputted from the latch through circuit 51a. In addition, in the buffer 51b, to which Vdd (high level) is supplied, the transistor T7 is switched off, whereas the transistor T8 is switched on. As such, Vcsl is outputted from the buffer 51b and is supplied to a (k+1)th retention capacitor line CSLk. Immediately before the output signal SROUT(k+2) becomes a high level (active), the potential of the node N1 is retained at Vdd (high level), and the (k+1)th retention capacitor line CSL(k+1) thus has a potential of Vcsh. Therefore, a potential of the (k+1)th retention capacitor line CSL(k+1) changes from Vcsh to Vcsl, thereby causing a floating potential of the pixel P(k+1) to fall (potential shift).

Then, the output signal SROUT(k+2) of the shift register 10 changes from the high level (active) to the low level (nonactive), the analog switch circuit SW1 is switched off, and therefore an input of the polarity signal CMIZ is interrupted, with the result that the node N1 retains the potential (Vss (low level)) which has been retained, immediately before such interruption, by a latch operation of the inverters INV1 and INV2, and the buffer 51b keeps supplying the Vcsl to the (k+1)th retention capacitor line CSL(k+1) until the output signal SROUT(k+2) becomes the high level (active) in the frame F(t+2). The pixel P(k+1) retains a potential achieved after the fall (shift). After the frame F(t+2), the operations in the frames F(t), F(t+1) are repeated.

The use of the unit circuit 51 of Example 1 reduces the circuit scale of the retention capacitor line driving circuit 500. Therefore, it is possible to achieve further slim bezel of the liquid crystal display device. Further, no malfunction is caused by the reduction in circuit scale.

The unit circuit 51, during initialization (INITB: low level), carries out an operation identical with that of the unit circuit 27 (Example 13) included in the common electrode driving circuit 200 of Embodiment 2.

(Variation)

The unit circuit 51 included in the retention capacitor line driving circuit 500 has a circuit configuration identical with that of the unit circuit 33 included in the common electrode driving circuit 200 of Embodiment 2 excerpt for the power supplies VCSH and VCSL of the buffer 51b. In other words, the unit circuit included in the retention capacitor line driving circuit 500 can have a circuit configuration identical with that of any of the unit circuits (unit circuits 21 to 41) included in the common electrode driving circuit 200 of Embodiment 2. Each unit circuit of the retention capacitor line driving circuit 500 carries out an operation identical with that of each unit circuit of the common electrode driving circuit 200.

The unit circuits 21 to 40 of the common electrode driving circuit 200 are each configured so that the current stage (for example, a kth stage) is supplied with an output SROUT(k−1) of a preceding ((k−1)th) unit circuit of the shift register 10 (see, for example, FIG. 23). However, the present embodiment is not limited thereto. The unit circuits 21 to 40 may each be configured so that the current stage is supplied with an output (SROUT(k−2) or SROUT(k−3)) of a unit circuit (for example, a (k−2)th unit circuit or (k−3)th unit circuit) preceding the (k−1)th unit circuit. Each unit circuit of the retention capacitor line driving circuit 500 is configured so that the current stage (for example, the kth stage) is supplied with an output SROUT(k+1) of a subsequent ((k+1)th) unit circuit of the shift register 10 (see FIG. 66). However, the present embodiment is not limited thereto. Each unit circuit of the retention capacitor line driving circuit 500 may be configured so that the current stage is supplied with an output (SROUT(k+2) or SROUT(k+3)) of a unit circuit (for example, a (k+2)th unit circuit or (k+3)th unit circuit) subsequent to the (k+1)th unit circuit.

Example 2

Each unit circuit of the retention capacitor line driving circuit 500 is configured so that the current stage is supplied with an output SROUT(k+1) of a subsequent ((k+1)th) unit circuit 11 (see, for example, FIG. 23) of the shift register 10. Each unit circuit of the retention capacitor line driving circuit 500 may alternatively be configured so that the current stage is further supplied with an output SROUTk of the unit circuit 11 (FIG. 23) of the current (kth) stage of the shift register 10. FIG. 69 is a block diagram illustrating a schematic configuration of a variation of a liquid crystal display device 3 of Embodiment 3. FIG. 70 is a circuit diagram of a unit circuit 52 included in a retention capacitor line driving circuit 500. As shown in FIGS. 69 and 70, a kth output SROUTk is supplied to an input terminal INs1 of the kth unit circuit 52, and a (k+1)th output SROUT(k+1) is supplied to an input terminal INs 2 of the kth unit circuit 52.

FIG. 71 is a timing chart at the time of an operation of the retention capacitor line driving circuit 500 illustrated in FIG. 69. The timing chart illustrates a first frame (frame F1), during which a regular operation starts after power starts to be supplied, and a second frame (frame F2) subsequent to F1. An initialization operation carried out immediately after power starts to be supplied will be described later.

In the frame F1, when the output signal SROUTk of the kth unit circuit 11 of the shift register 10 becomes the high level (active), the scanning signal line GLk becomes active, thereby writing a data signal S (negative polarity) to the pixel Pk. At the same time, an output signal SROUTk (high level) is supplied to the input terminal INs1 of the kth unit circuit 52, and a polarity signal CMIZ (high level; Vdd) is received by a latch through circuit 51a due to the above-described bootstrap operation. The unit circuit 52 thereafter operates similarly to that illustrated in FIG. 67. This causes the unit circuit 52 to supply Vcsh to a kth retention capacitor line CSLk. Then, when the output signal SROUT(k+1) of the (k+1)th unit circuit 11 of the shift register 10 becomes the high level (active), the output signal SROUT(k+1) (high level) is supplied to an input terminal INs2 of the kth unit circuit 52, with the result that a polarity signal CMIZ (low level; Vss) is received by the latch through circuit 51a. This causes the unit circuit 52 to supply Vcsl to the kth retention capacitor line CSLk. Then, a potential of the kth retention capacitor line CSLk changes from Vcsh to Vcsl, thereby causing a floating potential of the pixel Pk to fall (potential shift).

A known problem is that since respective potentials (CS signals) of all retention capacitor lines CSL are each set to a low level in an initial state during which power starts to be supplied, a potential shift of a CS signal is not carried out appropriately in even-numbered rows (or odd-numbered rows) in the first frame, thereby causing lateral stripes to appear in a display image. In a case where, for instance, the kth unit circuit 52 receives a (k+1)th output signal SROUT (k+1) to generate a CS signal in the configuration illustrated in FIG. 66, the CS signal is at a low level constantly during the first frame, with the result that it is impossible to shift a potential of the pixel Pk to which a data signal having a negative polarity has been written. In contrast, for pixels P(k−1) and P(k+1) on the preceding and subsequent rows, a CS signal is shifted from a low level to a high level, and a pixel potential thus rises appropriately. This causes lateral stripes to appear.

As to this point, according to the configuration of FIG. 70, the unit circuit 52 further receives an output signal SROUTk of the current stage (kth stage) and can thus generate an appropriate CS signal. This allows an appropriate potential shift in all pixels, and consequently prevent a decrease in display quality during the first frame.

(Initialization Operation)

The following description will discuss an initialization operation carried out immediately after power starts to be supplied. In a case where output signals SROUT of the unit circuits 11 at all the stages in the shift register 10 are at a high level during initialization, an operation is carried out as follows (see FIG. 71).

First, in a case where the output signals SROUT become a high level, the transistors T1 are switched on in the unit circuits 52 at all the stages, and the nodes N1 at all the stages are supplied with (short-circuited to) the polarity signal CMIZ. During an undetermined state immediately before initialization, potentials retained at the nodes N1 are also undetermined. Therefore, whether an output of the inverter INV2, connected to the polarity signal CMIZ, at each stage is Vdd (high level) or Vss (low level) is not determined, either.

Here, assume that the initialization signal INITB connected to the nodes N1 is Vdd. Then, the polarity signal CMIZ, which is connected to the nodes N1 at all the stages, is connected simultaneously to (i) inverters INV1 at stages connected to the power supplies VDD and (ii) inverters INV1 at stages connected to the power supplies VSS. This causes the power supplies VDD and the power supplies VSS to be short-circuited via the polarity signal CMIZ, thereby generating a large current. As a result, the potentials of the nodes N1 become a midpoint potential. Thus, it is impossible to carry out initialization normally.

However, according to the configuration of the unit circuit 52, both of the polarity signal CMIZ and the initialization signal INITB are regulated to be Vss (low level) during initialization. Therefore, the potentials of the nodes N1 necessarily become Vss (low level). Thus, it is possible to carry out initialization without fail.

On the other hand, in a case where output signals SROUT of the unit circuits 11 at all the stages in the shift register 10 are at a low level during initialization, an operation is carried out as follows (see FIG. 72).

In a case where potentials of the nodes N1 are Vdd (high level) during an undetermined state before initialization, the respective gate terminals of the transistors T5 are Vss (low level) and the transistors T5 are in an ON state. Here, since the initialization signal INITB is Vss (low level) during initialization, the potentials of the nodes N1 become a low level (Vss+Vth) via the transistors T5, Outputs of the inverter INV1 are supplied to the inverters INV2, so that the inverters INV2 output Vdd. Since the output terminals (nodes N2) of the inverters INV2 are connected to the input terminals of the inverters INV1, outputs (Vdd) of the inverters INV2 are fed back to the inverters INV1, so that the transistors T6 are switched on. As a result, the nodes N1 at Vss+Vth become Vss (low level). Thus, it is possible to carry out initialization without fail.

In a case where potentials of the nodes N1 are Vss (low level) during an undetermined state before initialization, the initialization signal INITB is not supplied to the nodes N1 since the transistors T5 are in an OFF state. However, in this case, the nodes N1 are already at a desired potential (Vss). Thus, this state corresponds to an initialized state.

Thus, with the unit circuit 52, it is possible to initialize the retention capacitor line driving circuit 500 in a stable manner. The above initialization operation is applicable to any unit circuit included in the retention capacitor line driving circuit 500.

Example 3

The following description will discuss a configuration that can prevent a decrease in display quality during the above-described first frame in the unit circuit 51 illustrated in FIG. 66. FIG. 73 is a block diagram illustrating a schematic configuration of a liquid crystal display device 3 of Example 3. FIG. 74 is a circuit diagram of a unit circuit 53 included in the retention capacitor line driving circuit 500. In a kth unit circuit 53, an input terminal INs is supplied with an internal signal Qk (an output signal Qk of a flip-flop circuit) of a (k+1)th unit circuit 11 of the shift register 10.

FIG. 75 is a circuit diagram illustrating a configuration of a unit circuit 11 of the shift register 10. FIG. 75 illustrates details of a (k−1)th, kth, and (k+1)th unit circuits 11 (SR(k−1), SRk, and SR(k+1).

The unit circuit SRk includes a RS type flip-flop circuit RS-FF, a NOR circuit, and switch circuits SW1 and SW2. An input terminal S of the flip-flop circuit RS-FF is supplied with, as a set signal, an output signal SROUT(k−1) of the preceding ((k−1)th) unit circuit SR(k−1). One input terminal of the NOR circuit is connected to an output terminal Q of the flip-flop circuit RS-FF, whereas the other input terminal is connected to an output terminal OUT of the unit circuit SRk. An output of the NOR circuit is connected to respective gate terminals of the analog switch circuits SW1 and SW2. A Q terminal is connected to an input terminal INs (see FIG. 74) of the kth unit circuit 53. A source terminal of the analog switch circuit SW1 is supplied with CK, and a drain terminal thereof is connected to a drain terminal of the analog switch circuit SW2. A source terminal of the analog switch circuit SW2 is supplied with a power supply VSS. A connection point n between the switch circuits SW1 and SW2 is connected to the output terminal OUT of the unit circuit SRk, the one input terminal of the NOR circuit, and an input terminal R of the flip-flop circuit RS-FF of the current (kth) stage. The output terminal OUT of the unit circuit SRk is connected to an input terminal S of a subsequent ((k+1)th) stage. This allows an output signal SROUTk of the current (kth) stage to be supplied as a set signal for the subsequent ((k+1)th) unit circuit SR(k+1).

With the above configuration, an output OUT of the unit circuit SRk is supplied as a reset signal to the input terminal R of the flip-flop circuit RS-FF. The unit circuit SRk thus functions as a self-resetting flip-flop.

FIG. 76 is a timing chart illustrating (i) an output signal Q of the kth flip-flop circuit RS-FF which output signal Q is supplied to the kth unit circuit 53 and (ii) a CS signal outputted from the kth unit circuit 53. As shown in FIG. 76, supplying a Q signal to a unit circuit 53 allows an appropriate CS signal to be generated similarly to the CS signals illustrated in FIGS. 71 and 72. This allows an appropriate potential shift in all pixels, and consequently prevent a decrease in display quality during the first frame.

The shift register of an embodiment of the present invention may be arranged such that a capacitor is present between the gate terminal of the output transistor and the drain terminal of the output transistor.

The shift register of an embodiment of the present invention may be arranged such that the signal generation circuit outputs the clock signal as the output signal for the corresponding stage in a case where the gate terminal of the output transistor is floating.

The shift register of an embodiment of the present invention may be arranged such that the floating control circuit has (i) an input terminal connected to the first output terminal or the second output terminal and (ii) an output terminal connected to the gate terminal of the output transistor.

The shift register of an embodiment of the present invention may be arranged such that the floating control circuit includes an N channel type control transistor; and the control transistor has a gate terminal connected to a high-potential-side power supply, a source terminal connected to the first output terminal, and a drain terminal connected to the gate terminal of the output transistor.

The shift register of an embodiment of the present invention may be arranged such that the floating control circuit includes a P channel type control transistor; and the control transistor has a gate terminal connected to a low-potential-side power supply, a source terminal connected to the second output terminal, and a drain terminal connected to the gate terminal of the output transistor.

The shift register of an embodiment of the present invention may be arranged such that the floating control circuit includes a P channel type control transistor; the control transistor has a source terminal connected to a power supply, a drain terminal connected to a source terminal of the third transistor, and a gate terminal connected to the drain terminal of the control transistor; the drain terminal of the third transistor is connected to the first output terminal; and the first output terminal is connected to the gate terminal of the output transistor.

The shift register of an embodiment of the present invention may be arranged such that the floating control circuit includes a P channel type control transistor; the control transistor has a source terminal connected to a power supply, a drain terminal connected to a source terminal of the third transistor, and a gate terminal connected to the first output terminal; the drain terminal of the third transistor is connected to the first output terminal; and the first output terminal is connected to the gate terminal of the output transistor.

A display driving circuit of an embodiment of the present invention is a display driving circuit provided with a common electrode line for forming a capacitor together with a pixel electrode included in a pixel, the display driving circuit supplying, to the common electrode line, a signal having a first potential or a second potential, the display driving circuit including the shift register, the shift register including plural stages provided corresponding to respective scanning signal lines, the display driving circuit further including at least one retention circuit provided corresponding to each of the plural stages of the shift register, the at least one retention circuit at a current stage being supplied with an output signal of a preceding stage of the shift register, the at least one retention circuit at the current stage, when the output signal of the preceding stage of the shift register has become active, receiving a retention target signal and retaining the retention target signal while supplying, to a common electrode line for forming a capacitor together with a pixel electrode of a pixel at the current stage, an output having the first potential or the second potential for the at least one retention circuit at the current stage.

A display driving circuit of an embodiment of the present invention is a display driving circuit provided with a retention capacitor line for forming a capacitor together with a pixel electrode included in a pixel, the display driving circuit supplying, to the retention capacitor line, a modulation signal corresponding to a polarity of a signal potential written to the pixel electrode, the display driving circuit including a shift register recited in any one of claims 1 to 8, the shift register including plural stages provided corresponding to respective scanning signal lines, the display driving circuit further including at least one retention circuit provided corresponding to each of the plural stages of the shift register, the at least one retention circuit at a current stage being supplied with an output signal of a subsequent stage of the shift register, the at least one retention circuit at the current stage, when the output signal of the subsequent stage of the shift register has become active, receiving a retention target signal and retaining the retention target signal while supplying, to a retention capacitor line for forming a capacitor together with a pixel electrode of a pixel at the current stage, an output for the at least one retention circuit at the current stage as a modulation signal.

A display panel of an embodiment of the present invention is a display panel including: any display driving circuit above; and a pixel circuit, the display driving circuit and the pixel circuit being monolithic with each other.

A display device of an embodiment of the present invention is a display device including the display driving circuit.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The present invention is suitably usable in driving circuits of display devices.

REFERENCE SIGNS LIST 1, 2, 3 liquid crystal display device (display device)
10 shift register
11 unit circuit of a shift register
11c, 12c, 13c floating control circuit
11b signal generation circuit
21-41 unit circuit (retention circuit) of a common electrode driving circuit
51-53 unit circuit (retention circuit) of a retention capacitor line driving circuit
41 scanning signal line (gate line)
42 common electrode line (common line)
43 data signal line (source line)
44 TFT
45 pixel electrode
100 scanning signal line driving circuit (gate driver)
200 common electrode driving circuit (COM driver)
300 data signal line driving circuit (source driver)
400 display panel
500 retention capacitor line driving circuit (CS driver)
Tr1 transistor (first transistor)
Tr2 transistor (second transistor)
Tr3 transistor (third transistor)
Tr4 transistor (fourth transistor)
Tr7 transistor (output transistor)

Tr8 transistor (output transistor)
Tr9 transistor (control transistor)
Tr10 transistor (control transistor)
Tr11 transistor (control transistor)
Q terminal (first output terminal)
QB terminal (second output terminal)

The invention claimed is:

1. A shift register for use in a display driving circuit, the shift register comprising flip-flops at respective stages, the flip-flops each including:
a first CMOS circuit including a P channel type first transistor and an N channel type second transistor, the first transistor having (i) a gate terminal connected to a gate terminal of the second transistor and (ii) a drain terminal connected to a drain terminal of the second transistor;
a second CMOS circuit including a P channel type third transistor and an N channel type fourth transistor, the third transistor having (i) a gate terminal connected to a gate terminal of the fourth transistor and (ii) a drain terminal connected to a drain terminal of the fourth transistor;
plural input terminals;
a first output terminal; and
a second output terminal,
a gate side of the first CMOS circuit, a drain side of the second CMOS circuit, and the first output terminal being connected to each other,
a drain side of the first CMOS circuit, a gate side of the second CMOS circuit, and the second output terminal being connected to each other,
the shift register further comprising signal generation circuits each for generating an output signal for a corresponding stage with use of an output of a corresponding one of the flip-flops,
the signal generation circuits each including an output transistor having a source terminal supplied with a clock signal and a drain terminal connected to an output terminal of the signal generation circuit,
the shift register further comprising floating control circuits each provided between a gate terminal of the output transistor and a source-side terminal of the first or second CMOS circuit,
each of the floating control circuits including (i) an input terminal connected to the first output terminal or the second output terminal and (ii) an output terminal connected to the gate terminal of the output transistor,
each of the floating control circuits including an N channel type control transistor, and
the control transistor having a gate terminal connected to a high-potential-side power supply having a constant potential, a source terminal connected to the first output terminal, and a drain terminal connected to the gate terminal of the output transistor.

2. The shift register according to claim 1, wherein:
a capacitor is present between the gate terminal of the output transistor and the drain terminal of the output transistor.

3. The shift register according to claim 1, wherein:
the signal generation circuit outputs the clock signal as the output signal for the corresponding stage in a case where the gate terminal of the output transistor is floating.

4. A display driving circuit provided with a common electrode line for forming a capacitor together with a pixel electrode included in a pixel, the display driving circuit supplying, to the common electrode line, a signal having a first potential or a second potential,
the display driving circuit comprising a shift register recited in claim 1, the shift register including plural stages provided corresponding to respective scanning signal lines,
the display driving circuit further comprising at least one retention circuit provided corresponding to each of the plural stages of the shift register,
the at least one retention circuit at a current stage being supplied with an output signal of a preceding stage of the shift register,
the at least one retention circuit at the current stage, when the output signal of the preceding stage of the shift register has become active, receiving a retention target signal and retaining the retention target signal while supplying, to a common electrode line for forming a capacitor together with a pixel electrode of a pixel at the current stage, an output having the first potential or the second potential for the at least one retention circuit at the current stage.

5. A display panel comprising:
a display driving circuit recited in claim 4; and
a pixel circuit,
the display driving circuit and the pixel circuit being monolithic with each other.

6. A display device comprising a display driving circuit recited in claim 4.

7. A display driving circuit provided with a retention capacitor line for forming a capacitor together with a pixel electrode included in a pixel, the display driving circuit supplying, to the retention capacitor line, a modulation signal corresponding to a polarity of a signal potential written to the pixel electrode,
the display driving circuit comprising a shift register recited in claim 1, the shift register including plural stages provided corresponding to respective scanning signal lines,
the display driving circuit further comprising at least one retention circuit provided corresponding to each of the plural stages of the shift register,
the at least one retention circuit at a current stage being supplied with an output signal of a subsequent stage of the shift register,
the at least one retention circuit at the current stage, when the output signal of the subsequent stage of the shift register has become active, receiving a retention target signal and retaining the retention target signal while supplying, to a retention capacitor line for forming a capacitor together with a pixel electrode of a pixel at the current stage, an output for the at least one retention circuit at the current stage as a modulation signal.

* * * * *